(12) United States Patent
Katayama et al.

(10) Patent No.: US 10,964,252 B2
(45) Date of Patent: Mar. 30, 2021

(54) DISPLAY DEVICE AND ELECTRONIC DEVICE

(71) Applicant: Semiconductor Energy Laboratory Co., Ltd., Atsugi (JP)

(72) Inventors: Masahiro Katayama, Tochigi (JP); Daisuke Kurosaki, Tochigi (JP); Kenichi Okazaki, Tochigi (JP); Junichi Koezuka, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/705,312

(22) Filed: Dec. 6, 2019

(65) Prior Publication Data
US 2020/0111407 A1    Apr. 9, 2020

Related U.S. Application Data

(63) Continuation of application No. 15/725,468, filed on Oct. 5, 2017, now Pat. No. 10,504,420.

(30) Foreign Application Priority Data

Oct. 7, 2016   (JP) .................................. 2016-199424
Oct. 7, 2016   (JP) .................................. 2016-199426

(51) Int. Cl.
*G09G 3/30*      (2006.01)
*G09G 3/36*      (2006.01)
(Continued)

(52) U.S. Cl.
CPC .......... *G09G 3/30* (2013.01); *H01L 27/1225* (2013.01); *H01L 27/1288* (2013.01);
(Continued)

(58) Field of Classification Search
CPC ...... G09G 3/30; G09G 3/3659; G09G 3/3677; G09G 2330/021; H01L 27/3244;
(Continued)

(56) References Cited

U.S. PATENT DOCUMENTS 8,854,286 B2   10/2014   Yamazaki et al.
8,890,781 B2   11/2014   Yamazaki et al.
(Continued)

FOREIGN PATENT DOCUMENTS

JP   2011-141522 A   7/2011
JP   2011-141524 A   7/2011
JP   2014-007399 A   1/2014

*Primary Examiner* — Robert J Michaud
(74) *Attorney, Agent, or Firm* — Fish & Richardson P.C.

(57) ABSTRACT

The number of lithography processes is reduced and a high-definition display device is provided. The display device includes a pixel portion and a driver circuit for driving the pixel portion. The pixel portion includes a first transistor and a pixel electrode electrically connected to the first transistor. The driver circuit includes a second transistor and a connection portion. The second transistor includes a metal oxide film, first and second gate electrodes that face each other with the metal oxide film positioned therebetween, source and drain electrodes over and in contact with the metal oxide film, and a first wiring connecting the first and second gate electrodes. The connection portion includes a second wiring on the same surface as the first gate electrode, a third wiring on the same surface as the source electrode and the drain electrode, and a fourth wiring connecting the second wiring and the third wiring. The pixel electrode, the first wiring, and the fourth wiring are formed using the same layer.

18 Claims, 76 Drawing Sheets

(51) Int. Cl.
  *H01L 27/32* (2006.01)
  *H01L 29/66* (2006.01)
  *H01L 27/12* (2006.01)
  *H01L 29/786* (2006.01)
  *H01L 29/417* (2006.01)

(52) U.S. Cl.
  CPC ...... *H01L 27/3244* (2013.01); *H01L 27/3262* (2013.01); *H01L 27/3276* (2013.01); *H01L 29/41733* (2013.01); *H01L 29/66969* (2013.01); *H01L 29/7869* (2013.01); *H01L 29/78693* (2013.01); *H01L 29/78696* (2013.01); *G09G 3/3659* (2013.01); *G09G 3/3677* (2013.01); *G09G 3/3688* (2013.01); *G09G 2330/021* (2013.01); *H01L 2227/323* (2013.01)

(58) Field of Classification Search
  CPC ........... H01L 27/3276; H01L 29/41733; H01L 29/66969; H01L 29/78693; H01L 29/78696
  See application file for complete search history.

(56) References Cited

U.S. PATENT DOCUMENTS

| | | |
|---|---|---|
| 9,165,502 B2 | 10/2015 | Yamazaki et al. |
| 9,293,480 B2 | 3/2016 | Yamazaki et al. |
| 9,337,343 B2 | 5/2016 | Yamazaki et al. |
| 9,368,082 B2 | 6/2016 | Yamazaki et al. |
| 9,482,919 B2 | 11/2016 | Shishido et al. |
| 9,490,268 B2 | 11/2016 | Yamazaki et al. |
| 9,496,408 B2 | 11/2016 | Yamazaki et al. |
| 9,553,205 B2 | 1/2017 | Yamazaki et al. |
| 9,741,865 B2 | 8/2017 | Yamazaki et al. |
| 2014/0374744 A1 | 12/2014 | Matsukura |
| 2015/0115259 A1* | 4/2015 | Yamazaki ............ H01L 27/1255 257/43 |
| 2016/0035275 A1 | 2/2016 | Yamazaki et al. |
| 2016/0232868 A1 | 8/2016 | Yamazaki et al. |
| 2017/0004788 A1 | 1/2017 | Yamazaki et al. |
| 2017/0047354 A1 | 2/2017 | Yamazaki et al. |
| 2017/0131607 A1 | 5/2017 | Yamazaki et al. |
| 2017/0309751 A1 | 10/2017 | Yamazaki et al. |

* cited by examiner

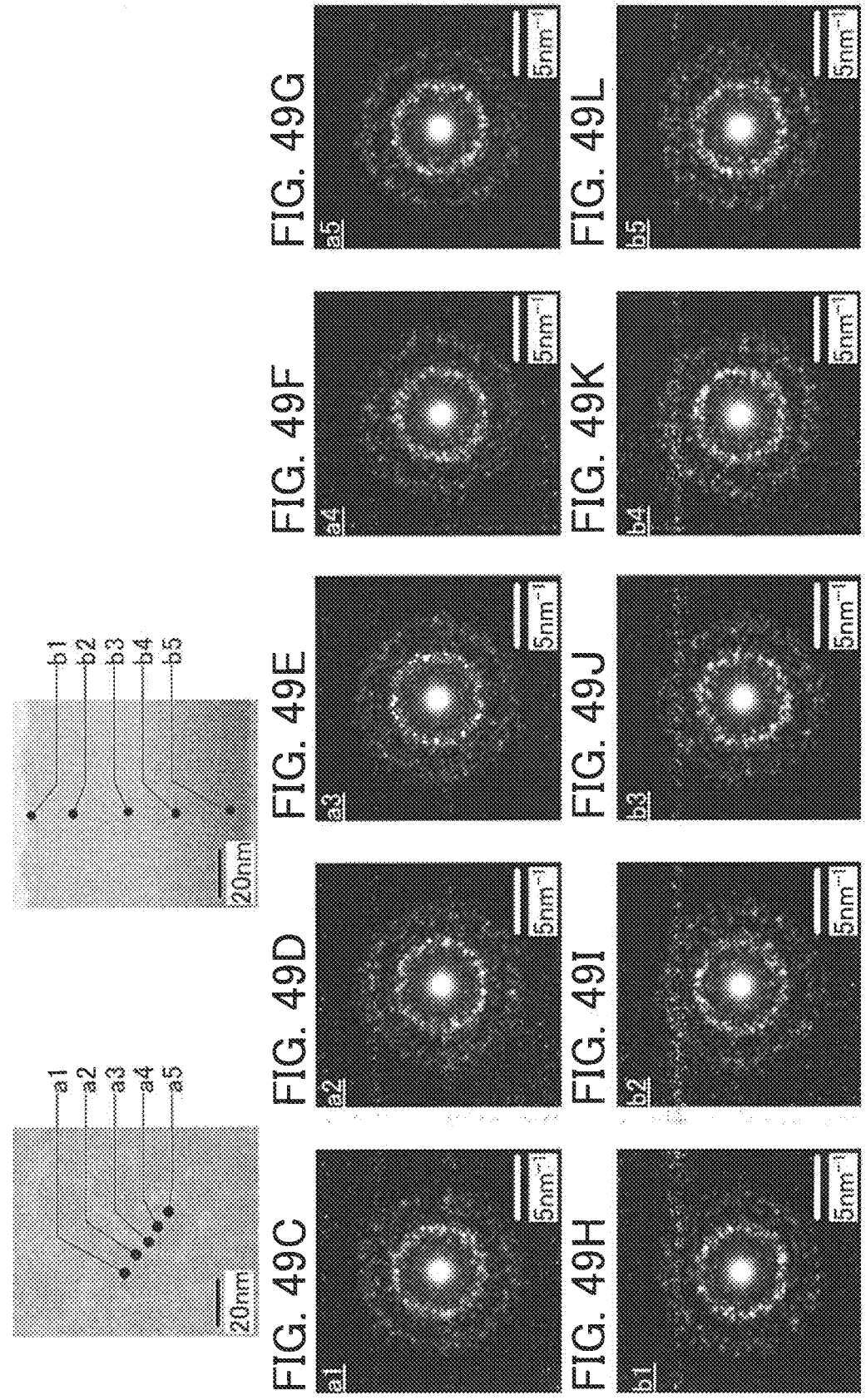

DISPLAY DEVICE AND ELECTRONIC DEVICE

CROSS-REFERENCE TO RELATED APPLICATIONS

This application is a continuation of U.S. application Ser. No. 15/725,468, filed Oct. 5, 2017, now allowed, which claims the benefit of foreign priority applications filed in Japan as Serial No. 2016-199424 on Oct. 7, 2016, and Serial No. 2016-199426 on Oct. 7, 2016, all of which are incorporated by reference.

BACKGROUND OF THE INVENTION

1. Field of the Invention

One embodiment of the present invention relates to a display device and an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

As a semiconductor material that can be used in a transistor, an oxide semiconductor has been attracting attention. For example, a semiconductor device whose field-effect mobility (in some cases, simply referred to as mobility or $\mu_{FE}$) is improved by stacking a plurality of oxide semiconductor layers, among which the oxide semiconductor layer serving as a channel contains indium and gallium where the proportion of indium is higher than the proportion of gallium is disclosed (see Patent Document 1).

A technique for using oxide semiconductor transistors for display devices such as liquid crystal displays and organic electroluminescent (EL) displays has been attracting attention. The off-state current of the oxide semiconductor transistors is extremely low. Patent Document 2 and Patent Document 3 each disclose a technique capitalizing on such an extremely low off-state current to reduce the refresh frequency at the time of displaying still images and the power consumption of liquid crystal displays or organic EL displays. Note that such a driving method that reduces the power consumption of display devices is referred to as idling stop (IDS) driving in this specification.

In recent years, the size and definition of display devices have been increased, and miniaturization of transistors has thus been required.

REFERENCE

Patent Document

[Patent Document 1] Japanese Published Patent Application No. 2014-007399
[Patent Document 2] Japanese Published Patent Application No. 2011-141522
[Patent Document 3] Japanese Published Patent Application No. 2011-141524

SUMMARY OF THE INVENTION

In miniaturization of transistors, high mask alignment accuracy is required in a lithography process. In addition, a margin is required between patterns for a transistor on the assumption of mask misalignment, which makes it difficult to miniaturize transistors. Furthermore, a process flow becomes complicated when the number of lithography processes is large, resulting in a reduction in a yield. Masks are very expensive because they have minute shapes and need to have highly accurate shapes. Moreover, long gate wirings, long source wirings, and the like are used for large display devices; thus, wiring resistance is increased, causing a problem of high power consumption.

In view of the above, an object of one embodiment of the present invention is to provide a high-definition display device. Another object of one embodiment of the present invention is to provide a display device with high display quality. Another object of one embodiment of the present invention is to provide a display device with low power consumption. Another object of one embodiment of the present invention is to provide a novel display device. Another object of one embodiment of the present invention is to provide a novel electronic device.

Note that the description of the above objects does not preclude the existence of other objects. In one embodiment of the present invention, there is no need to achieve all the objects. Objects other than the above objects will be apparent from and can be derived from the description of the specification and the like.

One embodiment of the present invention is a display device including a pixel portion and a driver circuit for driving the pixel portion. The pixel portion includes a first transistor and a pixel electrode electrically connected to the first transistor. The driver circuit includes a second transistor and a connection portion. The second transistor includes a metal oxide film, a first gate electrode and a second gate electrode that face each other with the metal oxide film positioned therebetween, a source electrode and a drain electrode over and in contact with the metal oxide film, and a first wiring connecting the first gate electrode and the second gate electrode. The connection portion includes a second wiring on the same surface as the first gate electrode, a third wiring on the same surface as the source electrode and the drain electrode, and a fourth wiring connecting the second wiring and the third wiring. The pixel electrode, the first wiring, and the fourth wiring are formed using the same layer.

The display device of one embodiment of the present invention preferably includes a first insulating film having a flat top surface between the first transistor and the pixel electrode, a second insulating film having a flat top surface between the second transistor and the first wiring, and a third insulating film having a flat top surface between the fourth wiring and each of the second wiring and the third wiring.

One embodiment of the present invention is a display device including a pixel portion and a driver circuit for driving the pixel portion. The pixel portion includes a first transistor and a pixel electrode electrically connected to the first transistor. The driver circuit includes a second transistor and a connection portion. The second transistor includes a metal oxide film, a gate electrode in a region overlapping with the metal oxide film, and a source electrode and a drain electrode over and in contact with the metal oxide film. The connection portion includes a first wiring on the same surface as the gate electrode, a second wiring on the same surface as the source electrode and the drain electrode, and a third wiring connecting the first wiring and the second wiring. The pixel electrode and the third wiring are formed using the same layer.

The display device of one embodiment of the present invention preferably includes a first insulating film having a flat top surface between the first transistor and the pixel electrode, and a third insulating film having a flat top surface between the third wiring and each of the first wiring and the second wiring.

One embodiment of the present invention is a display device including a pixel portion and a driver circuit for driving the pixel portion. The pixel portion includes a first transistor and a pixel electrode electrically connected to the first transistor. The driver circuit includes a second transistor and a connection portion. The second transistor includes a metal oxide film, a first gate electrode and a second gate electrode that face each other with the metal oxide film positioned therebetween, and a source electrode and a drain electrode over and in contact with the metal oxide film. The connection portion includes a first wiring and a second wiring over the first wiring. The first gate electrode and the second gate electrode are electrically connected to each other. The first wiring is on the same surface as the first gate electrode. The second wiring is on the same surface as the source electrode and the drain electrode. The pixel electrode and the second gate electrode are formed using the same layer.

The display device of one embodiment of the present invention preferably includes a first insulating film having a flat top surface between the first transistor and the pixel electrode, and a second insulating film having a flat top surface between the metal oxide film and the second gate electrode.

One embodiment of the present invention is a display device including a pixel portion and a driver circuit for driving the pixel portion. The pixel portion includes a first transistor and a pixel electrode electrically connected to the first transistor. The driver circuit includes a second transistor and a connection portion. The second transistor includes a metal oxide film, a gate electrode in a region overlapping with the metal oxide film, and a source electrode and a drain electrode over and in contact with the metal oxide film. The connection portion includes a first wiring and a second wiring over the first wiring. The first wiring is on the same surface as the gate electrode. The second wiring is on the same surface as the source electrode and the drain electrode.

The display device of one embodiment of the present invention preferably includes a first insulating film having a flat top surface between the first transistor and the pixel electrode.

In one embodiment of the present invention, an end portion of the source electrode and an end portion of the drain electrode may be inward from end portions of the metal oxide film.

In one embodiment of the present invention, the metal oxide film may contain indium, zinc, and oxygen.

In one embodiment of the present invention, the above metal oxide film may further contain an element M that is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

In one embodiment of the present invention, the above metal oxide film may include a region where an indium content accounts for 40% or higher and 50% or lower of the total sum of indium, element M, and zinc atoms and a region where an element M content accounts for 5% or higher and 30% or lower of the total sum of indium, element M, and zinc atoms.

In one embodiment of the present invention, when the atomic ratio of indium to the element M and zinc is 4:x:y, x may be greater than or equal to 1.5 and less than or equal to 2.5 and y may be greater than or equal to 2 and less than or equal to 4.

Another embodiment of the present invention is an electronic device including any of the above display devices and a receiver.

A reduction in the number of lithography processes can reduce a pattern arrangement margin and enables miniaturization of a transistor and an increase in the definition of a display device. Furthermore, a reduction in the number of lithography processes leads to a simple process flow and an improved yield. A reduction in the number of lithography processes can also reduce the cost for masks. When wirings are directly connected to each other in a connection portion, a favorable contact can be obtained and contact resistance can be reduced.

One embodiment of the present invention can provide a high-definition display device. One embodiment of the present invention can provide a display device with high display quality. One embodiment of the present invention can provide a display device with low power consumption. One embodiment of the present invention can provide a novel display device. One embodiment of the present invention can provide a novel electronic device.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 49A and 49B are TEM images of samples and FIGS. 49C to 49L are electron diffraction patterns thereof.

DETAILED DESCRIPTION OF THE INVENTION

Figure 1A:
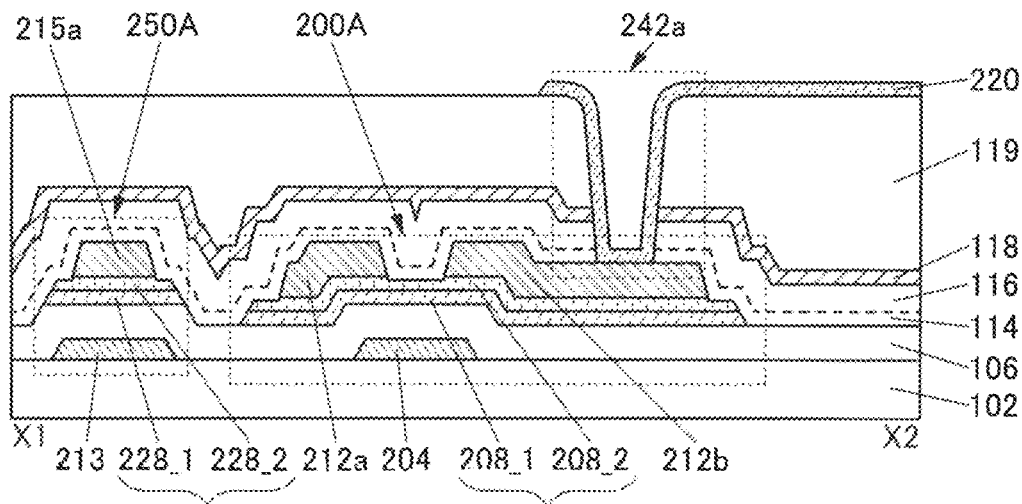
FIGS. 1A to 1C are cross-sectional views illustrating a display device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relation between components is changed as appropriate depending on a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an "object having any electric function." There is no particular limitation on the "object having any electric function" as long as electric signals can be transmitted and received between components that are connected through the object. Examples of an "object having any electric function" include, as well as an electrode and a wiring, a switching element such as a transistor, a resistor, an inductor, a capacitor, and an element with a variety of functions.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases, and the term "insulating film" can be changed into the term "insulating layer" in some cases.

Unless otherwise specified, the off-state current in this specification and the like refers to a drain current of a transistor in the off state (also referred to as non-conduction state or cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean there is a $V_{gs}$ at which the off-state current of the transistor is lower than or equal to I. The off-state current of a transistor may refer to off-state current at a given $V_{gs}$, at $V_{gs}$ in a given range, or at $V_{gs}$ at which sufficiently low off-state current is obtained, for example.

As an example, the assumption is made of an n-channel transistor where the threshold voltage $V_{th}$ is 0.5 V and the drain current is $1 \times 10^{-9}$ A at $V_{gs}$ of 0.5 V, $1 \times 10^{-13}$ A at $V_{gs}$ of 0.1 V, $1 \times 10^{-19}$ A at $V_{gs}$ of −0.5 V, and $1 \times 10^{-22}$ A at $V_{gs}$ of −0.8 V. The drain current of the transistor is $1 \times 10^{-19}$ A or lower at $V_{gs}$ of −0.5 V or at $V_{gs}$ in the range of −0.5 V to −0.8 V; therefore, it can be said that the off-state current of the transistor is $1 \times 10^{-19}$ A or lower. Since there is a $V_{gs}$ at which the drain current of the transistor is $1 \times 10^{-22}$ A or lower, it may be said that the off-state current of the transistor is $1 \times 10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., a temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like is used (e.g., a temperature in the range of 5° C. to 35° C.) is I or lower at a certain $V_{gs}$.

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. The state in which the off-state current of a transistor is lower than or equal to I may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like is lower than or equal to I at a certain $V_{gs}$.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0=0 A) and an extrapolated straight line that is tangent with the highest inclination to a plotted curve ($V_g$-$\sqrt{I_d}$ characteristics). Alternatively, the threshold voltage of a transistor may refer to a gate voltage ($V_g$) at which the value of $I_d$ [A]×L [μm]/W [μm] is 1×10$^{-9}$ [A] where L is channel length and W is channel width.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification and the like can be called a "semiconductor" in some cases.

In this specification and the like, an impurity in a semiconductor refers to an element that is not a main component of a semiconductor film. For example, an element with a concentration of lower than 0.1 atomic % is an impurity. If a semiconductor contains an impurity, the density of states (DOS) may be formed therein, the carrier mobility may be decreased, or the crystallinity may be decreased, for example In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples include hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, a metal oxide having at least one of an amplification function, a rectification function, and a switching function can be referred to as a metal oxide semiconductor (abbreviated to an OS). That is, an OS FET is a transistor including a metal oxide or an oxide semiconductor.

In this specification and the like, a metal oxide including nitrogen is also referred to as a metal oxide in some cases. Alternatively, a metal oxide including nitrogen may be referred to as a metal oxynitride.

Embodiment 1

In this embodiment, display devices of one embodiment of the present invention and methods for manufacturing the display devices will be described with reference to FIGS. 1A to 1C to FIGS. 46A to 46D.

<Structure Example 1 of Display Device>

Figure 1B:
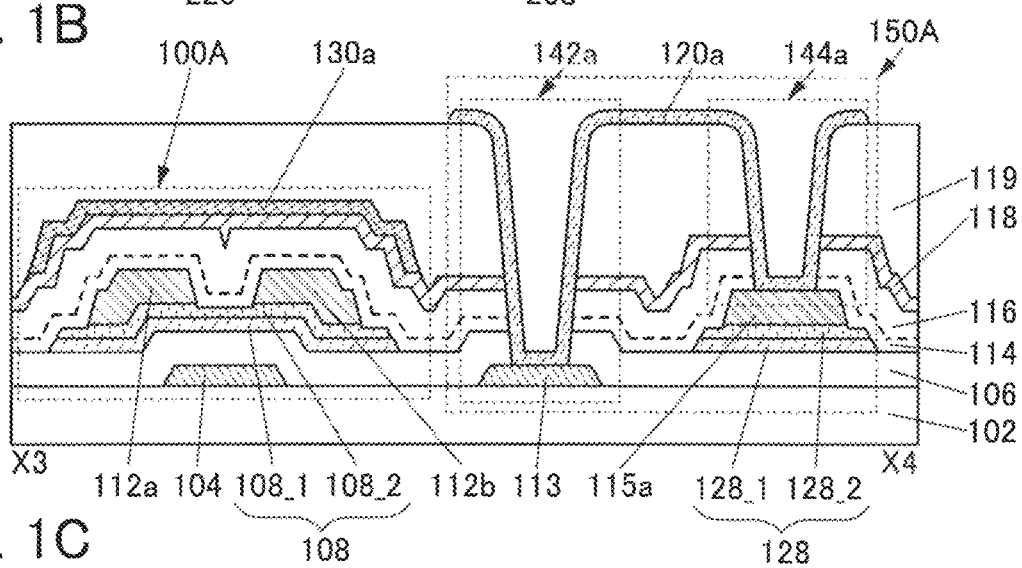
Figure 1C:
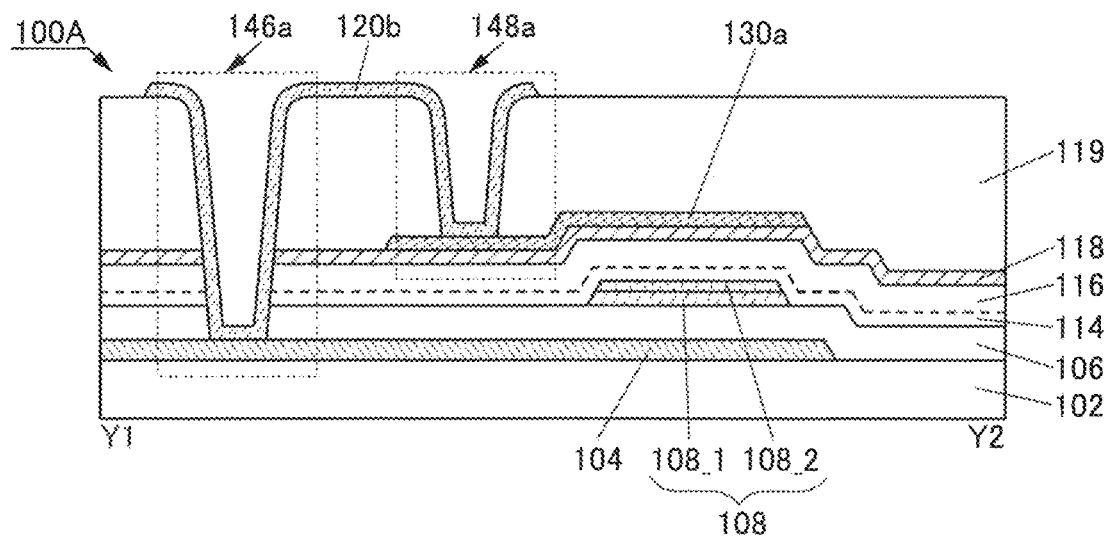
Figure 2A:
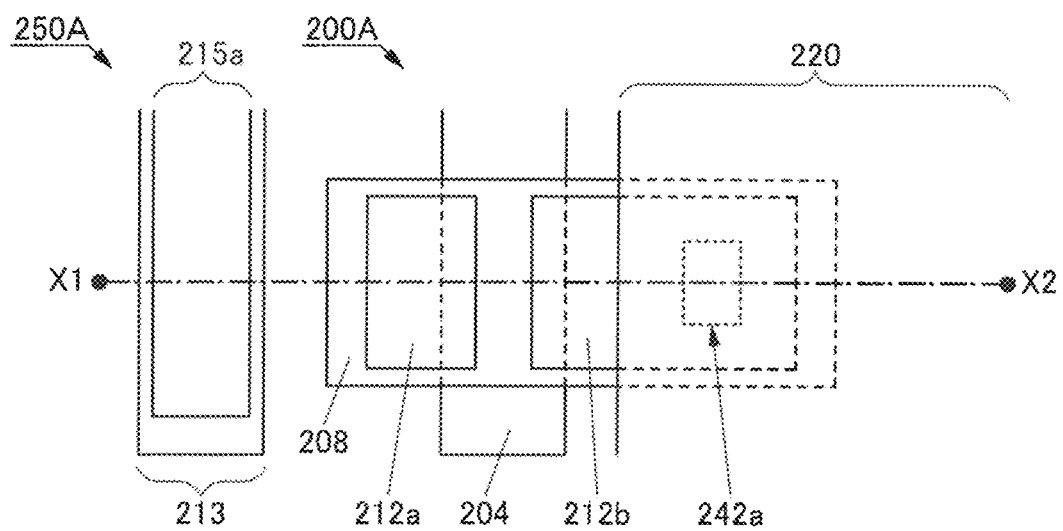
FIGS. 2A and 2B are top views illustrating a display device.
Figure 2B:
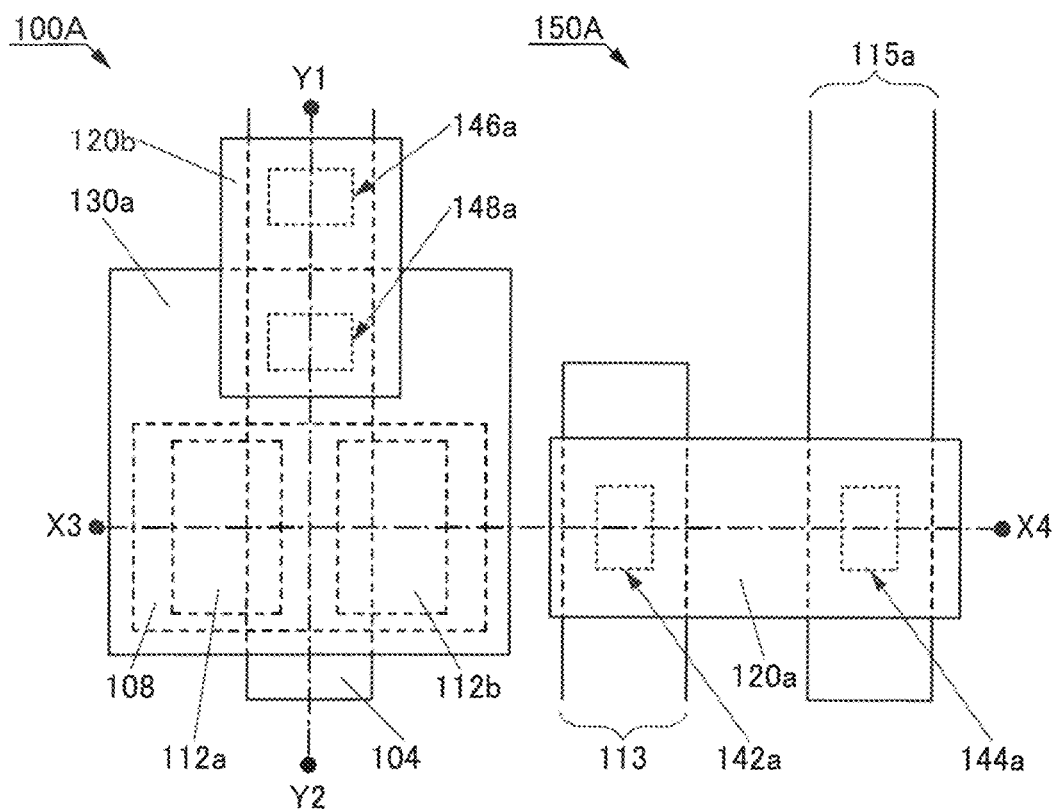

FIGS. 1A to 1C are cross-sectional views of transistors in a pixel portion and a driver circuit included in a display device of one embodiment of the present invention. FIGS. 2A and 2B are top views of the transistors.

The display device of one embodiment of the present invention includes a transistor 100A, a transistor 200A, a capacitor 250A, and a connection portion 150A.

FIG. 1A is a cross-sectional view of the transistor 200A and the capacitor 250A included in the pixel portion, which corresponds to a cross-sectional view taken along dashed-dotted line X1-X2 in FIG. 2A. FIG. 1B is a cross-sectional view of the transistor 100A and the connection portion 150A included in the driver circuit, which corresponds to a cross-sectional view taken along dashed-dotted line X3-X4 in FIG. 2B. FIG. 1C is a cross-sectional view of the transistor 100A included in the driver circuit, which corresponds to a cross-sectional view taken along dashed-dotted line Y1-Y2 in FIG. 2B. Note that in FIGS. 2A and 2B, some components of the transistors 100A and 200A and the capacitor 250A (e.g., an insulating film functioning as a gate insulating film) are not illustrated to avoid complexity. In the transistors, the direction of the dashed-dotted line X1-X2 is called a channel length direction, and the direction of the dashed-dotted line Y1-Y2 is called a channel width direction, in some cases. As in FIGS. 2A and 2B, some components of transistors described below are not illustrated in top views in some cases.

As illustrated in FIG. 1A, the pixel portion includes the transistor 200A, a conductive film 220 functioning as a pixel electrode, and the capacitor 250A. Note that the conductive film 220 functioning as the pixel electrode is electrically connected to the transistor 200A.

The transistor 200A includes a conductive film 204 over a substrate 102, an insulating film 106 over the substrate 102 and the conductive film 204, a metal oxide film 208 over the insulating film 106, a conductive film 212a over the metal oxide film 208, and a conductive film 212b over the metal oxide film 208.

In the transistor 200A, the insulating film 106 functions as a gate insulating film, the conductive film 204 functions as a gate electrode, the conductive film 212a functions as a source electrode, and the conductive film 212b functions as a drain electrode.

In the transistor 200A, end portions of the conductive films 212a and 212b are located inward from end portions of the metal oxide film 208.

An insulating film 114, an insulating film 116 over the insulating film 114, an insulating film 118 over the insulating film 116, and an insulating film 119 over the insulating film 118 are formed over the transistor 200A, specifically over the metal oxide film 208 and the conductive films 212a and 212b. In the transistor 200A, the insulating films 114, 116, and 118 collectively function as a protective insulating film of the transistor 200A. The insulating film 119 functions as a planarization film.

The insulating films 114, 116, 118, and 119 have an opening 242a in a region overlapping with the conductive film 212b. The conductive film 220 functioning as the pixel electrode is electrically connected to the conductive film 212b through the opening 242a.

Note that the transistor 200A is what is called a channel-etched transistor, and has a single-gate structure.

The capacitor 250A includes a conductive film 213, the insulating film 106, a metal oxide film 228, and a conductive film 215a. The conductive film 213 functioning as a capacitor wiring and conductive films 204, 104, and 113 are formed on the same plane in the same process. The conductive film 215a and conductive films 212a, 212b, 112a, 112b, and 115a are formed on the same plane in the same process.

In the capacitor 250A, an end portion of the conductive film 215a is located inward from an end portion of the metal oxide film 228.

The conductive film 220 functioning as the pixel electrode is formed over the insulating film 119. The conductive film 220 provided over the insulating film 119 functioning as the planarization film also has high planarity; thus, in the case where the display device is a liquid crystal display device, alignment defects in a liquid crystal layer can be reduced. Moreover, the insulating film 119 can widen the distance between the conductive film 204 functioning as a gate wiring and the conductive film 220 and the distance between the conductive film 212a functioning as a signal line and the conductive film 220, which enables a reduction in wiring delay.

As illustrated in FIGS. 1B and 1C, the driver circuit includes the transistor 100A and the connection portion 150A.

The transistor 100A includes the conductive film 104 over the substrate 102, the insulating film 106 over the substrate 102 and the conductive film 104, a metal oxide film 108 over the insulating film 106, the conductive film 112a over the metal oxide film 108, the conductive film 112b over the metal oxide film 108, the insulating film 114 over the metal oxide film 108 and the conductive films 112a and 112b, the insulating film 116 over the insulating film 114, the insulating film 118 over the insulating film 116, and a conductive film 130a over the insulating film 118.

In the transistor 100A, the insulating film 106 functions as a first gate insulating film, the insulating films 114, 116, and 118 collectively function as a second gate insulating film, the conductive film 104 functions as a first gate electrode, the conductive film 130a functions as a second gate electrode, the conductive film 112a functions as a source electrode, and the conductive film 112b functions as a drain electrode.

In the transistor 100A, end portions of the conductive films 112a and 112b are located inward from end portions of the metal oxide film 108.

The insulating film 119 is formed over the transistor 100A, specifically over the insulating film 118 and the conductive film 130a. In the transistor 100A, the insulating film 119 functions as a planarization film.

In the transistor 100A, the insulating films 106, 114, 116, 118, and 119 have an opening 146a in a region overlapping with the conductive film 104. Furthermore, the insulating film 119 has an opening 148a in a region overlapping with the conductive film 130a. A conductive film 120b functioning as a first wiring is electrically connected to the conductive film 130a and the conductive film 104 through the opening 146a and the opening 148a. Owing to the conductive film 120b, the conductive film 104 functioning as the first gate electrode of the transistor 100A and the conductive film 130a functioning as the second gate electrode of the transistor 100A are electrically connected to each other.

Note that the transistor 100A is what is called a channel-etched transistor, and has a dual-gate structure.

Furthermore, as illustrated in FIG. 1B, the metal oxide film 108 of the transistor 100A is positioned between the two conductive films functioning as the gate electrodes so as to face the conductive films 104 and 130a. The length of the conductive film 130a in the channel length direction and that in the channel width direction are longer than the length of the metal oxide film 108 in the channel length direction and that in the channel width direction, respectively. The metal oxide film 108 is entirely covered with the conductive film 130a with the insulating films 114, 116, and 118 positioned therebetween.

In other words, the conductive films 104 and 130a are connected to each other through the opening provided in the insulating films 106, 114, 116, 118, and 119, and each include a region positioned outside an edge portion of the metal oxide film 108.

With this structure, the metal oxide film 108 included in the transistor 100A can be electrically surrounded by electric fields of the conductive films 104 and 130a. A device structure of a transistor, such as the transistor 100A, in which electric fields of a first gate electrode and a second gate electrode electrically surround a metal oxide film where a channel region is formed can be referred to as a surrounded channel (S-channel) structure.

Since the transistor 100A has an S-channel structure, an electric field for inducing a channel can be effectively applied to the metal oxide film 108 by the conductive film 104 functioning as the first gate electrode; thus, the current drive capability of the transistor 100A can be improved and high on-state current characteristics can be obtained. Since the on-state current can be increased, it is possible to miniaturize the transistor 100A. In addition, since the transistor 100A has a structure where the metal oxide film 108 is surrounded by the conductive film 104 functioning as the first gate electrode and the conductive film 130a functioning as the second gate electrode, the mechanical strength of the transistor 100A can be increased.

In the transistor 100A, the metal oxide film 108 includes a metal oxide film 108_1 over the insulating film 106 and a metal oxide film 108_2 over the metal oxide film 108_1. In the transistor 200A, the metal oxide film 208 includes a metal oxide film 208_1 over the insulating film 106 and a metal oxide film 208_2 over the metal oxide film 208_1. The metal oxide films 108_1, 108_2, 208_1, and 208_2 contain the same element. For example, it is preferable that the metal oxide films 108_1, 108_2, 208_1, and 208_2 each independently contain In, M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium), and Zn.

Furthermore, it is preferable that the metal oxide films 108_1, 108_2, 208_1, and 208_2 each independently have a region in which the atomic proportion of In is higher than that of M. For example, the atomic ratio of In to M and Zn in each of the metal oxide films 108_1, 108_2, 208_1, and 208_2 is preferably In:M:Zn=4:2:3 or in its neighborhood. Note that the term "neighborhood" here includes the following: when In is 4, M is greater than or equal to 1.5 and less than or equal to 2.5 and Zn is greater than or equal to 2 and less than or equal to 4. Alternatively, the atomic ratio of In to M and Zn in each of the metal oxide films 108_1, 108_2, 208_1, and 208_2 is preferably 5:1:6 or in its neighborhood. The metal oxide films 108_1, 108_2, 208_1, and 208_2 having substantially the same composition as described above can be formed using the same sputtering target; thus, the manufacturing cost can be reduced. In the case of using the same sputtering target, the metal oxide films 108_1, 108_2, 208_1, and 208_2 can be successively formed in vacuum in the same chamber. This can prevent impurities from entering the interface between the metal oxide film 108_1 and the metal oxide film 108_2 and the interface between the metal oxide film 208_1 and the metal oxide film 208_2.

A metal oxide having a cloud-aligned composite (CAC) composition is suitably used for the metal oxide films 108_1, 108_2, 208_1, and 208_2. The metal oxide will be described with reference to FIG. 47.

Figure 47:
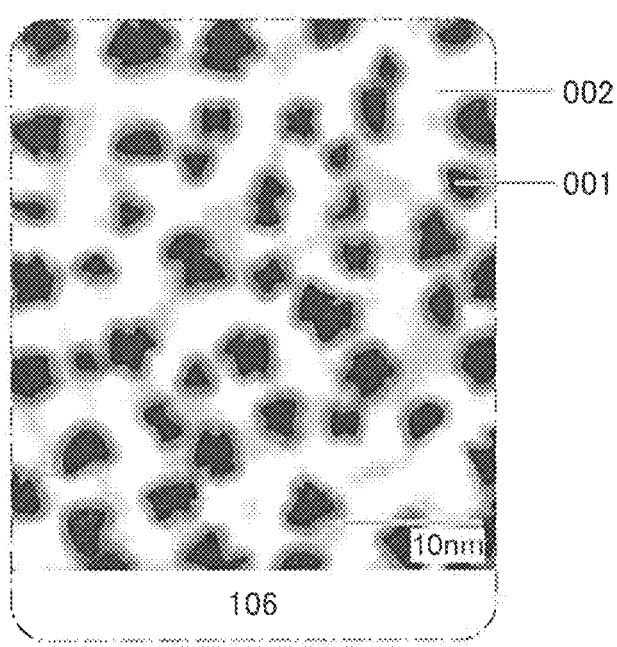
FIG. 47 is a conceptual diagram of a composition of a metal oxide.

FIG. 47 is a conceptual diagram of the metal oxide having a CAC composition. In this specification, when the metal oxide of one embodiment of the present invention has a semiconductor function, the metal oxide is defined as a cloud-aligned composite metal oxide semiconductor (CAC-MO) or a cloud-aligned composite oxide semiconductor (CAC-OS).

In the CAC-MO or the CAC-OS, as illustrated in FIG. 47 for example, elements contained in the metal oxide are unevenly distributed to form regions 001 and 002 each containing any of the elements as a main component. The regions are mixed to form or to be distributed in a mosaic pattern. In other words, the CAC-MO or the CAC-OS has a composition in which elements contained in the metal oxide are unevenly distributed in regions each having a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed in regions each having a size greater than or equal to 0.5 nm and less than or equal to 10 nm, preferably greater than or equal to 1 nm and less than or equal to 2 nm, or a similar size and the regions containing the metal element(s) are mixed is referred to as a mosaic pattern or a patch-like pattern.

The CAC-MO or the CAC-OS has a conducting function in a part of the material and has an insulating function in another part of the material; as a whole, the CAC-MO or the CAC-OS has a function of a semiconductor. In the case where the CAC-MO or the CAC-OS is used in a channel of a transistor, the conducting function is to allow electrons (or holes) serving as carriers to flow, and the insulating function is to not allow electrons serving as carriers to flow. By the complementary action of the conducting function and the insulating function, the CAC-MO or the CAC-OS can have a switching function (on/off function). In the CAC-MO or the CAC-OS, separation of the functions can maximize each function.

In this specification and the like, the CAC-MO or the CAC-OS includes conductive regions and insulating regions. For example, one of the regions 001 and 002 illustrated in FIG. 47 may be the conductive region and the other may be the insulating region. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

The CAC-MO or the CAC-OS may contain components having different bandgaps. For example, the CAC-MO or the CAC-OS contains a component having a wide gap due to the insulating region and a component having a narrow gap due to the conductive region. In the case of such a composition, carriers flow mainly in the component having a narrow gap. The component having a narrow gap complements the component having a wide gap, and carriers flow also in the component having a wide gap in conjunction with the component having a narrow gap. Therefore, in the case where the above-described CAC-MO or CAC-OS is used in a channel region of a transistor, high current drive capability in the on state of the transistor, that is, high on-state current and high field-effect mobility, can be obtained.

Note that the CAC-MO or the CAC-OS can also be referred to as a matrix composite or a metal matrix composite. The details of the CAC-MO or the CAC-OS will be described in Embodiment 2.

When the metal oxide films 108_1, 108_2, 208_1, and 208_2 each independently have a CAC composite and a region in which the atomic proportion of In is higher than the atomic proportion of M, the transistors 100A and 200A can have high field-effect mobility. Specifically, the transistors 100A and 200A can have field-effect mobility greater than 40 cm$^2$/Vs, preferably greater than 50 cm$^2$/Vs, further preferably greater than 100 cm$^2$/Vs.

Since the transistor 100A having an S-channel structure has high field-effect mobility and high driving capability, the use of the transistor 100A in the driver circuit, typified by a gate driver that generates a gate signal, allows the display device to have a narrow bezel width (narrow bezel). The use of the transistor 100A in a source driver (particularly in a demultiplexer connected to an output terminal of a shift register included in the source driver) that supplies a signal from a signal line included in the display device can reduce the number of wirings connected to the display device.

The transistors 100A and 200A are each a channel-etched transistor and thus can be fabricated through a smaller number of steps than a top-gate transistor. In addition, the metal oxide films are used for the channels of the transistors 100A and 200A; thus, a laser crystallization step is unnecessary unlike in the case of a transistor formed using low-temperature polysilicon. Accordingly, the manufacturing cost can be reduced even in the case of a display device formed using a large substrate. Transistors having high field-effect mobility like the transistors 100A and 200A are preferably used in a driver circuit and a display portion of a large display device having high resolution such as ultra high definition (4K resolution, 4K2K, or 4K) or super high definition (8K resolution, 8K4K, or 8K), in which case writing can be performed in a short time and display defects can be reduced.

The connection portion 150A includes the conductive film 113 functioning as a second wiring over the substrate 102; an opening 142a provided in the insulating films 106, 114, 116, 118, and 119 over the conductive film 113 functioning as the second wiring; the conductive film 115a functioning as a third wiring over a metal oxide film 128; an opening 144a provided in the insulating films 114, 116, 118, and 119 over the conductive film 115a functioning as the third wiring; and a conductive film 120a functioning as a fourth wiring that covers the openings 142a and 144a and connects the conductive film 113 functioning as the second wiring and the conductive film 115a functioning as the third wiring. Note that although FIG. 1B illustrates the openings 142a and 144a each having one step, the openings 142a and 144a may each have two or more steps.

In the connection portion 150A, an end portion of the conductive film 115a is located inward from an end portion of the metal oxide film 128.

The conductive film 113 functioning as the second wiring and the conductive film 104 functioning as the first gate electrode of the transistor 100A are formed on the same plane in the same process. The conductive film 115a functioning as the third wiring and the conductive films 112a and 112b functioning as the source and drain electrodes of the transistor 100A are formed on the same plane in the same process. The conductive film 120a functioning as the fourth wiring and the conductive film 220 functioning as the pixel electrode are formed on the same plane in the same process.

In other words, the conductive film 113 functioning as the second wiring is formed using the same layer as the conductive film 104 functioning as the first gate electrode of the transistor 100A. The conductive film 115a functioning as the third wiring is formed using the same layer as the conductive films 112a and 112b functioning as the source and drain electrodes of the transistor 100A. The conductive film 120a functioning as the fourth wiring is formed using the same layer as the conductive film 220 functioning as the pixel electrode.

The conductive film 220 functioning as the pixel electrode, the conductive film 120b functioning as the first wiring, and the conductive film 120a functioning as the fourth wiring are formed in the same process. In other words, the conductive film 220 functioning as the pixel electrode, the conductive film 120b functioning as the first wiring, and the conductive film 120a functioning as the fourth wiring are formed using the same layer. The conductive film 220 functioning as the pixel electrode, the conductive film 120b functioning as the first wiring, and the conductive film 120a functioning as the fourth wiring are in contact with the top surface of the insulating film 119 functioning as the planarization film.

<Components of Display Device>

Next, components of the display device of this embodiment will be described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the $6^{th}$ generation (1500 mm×1850 mm), the $7^{th}$ generation (1870 mm×2200 mm), the $8^{th}$ generation (2200 mm×2400 mm), the $9^{th}$ generation (2400 mm×2800 mm), and the $10^{th}$ generation (2950 mm×3400 mm). Thus, a large-sized display device can be fabricated.

Alternatively, a flexible substrate may be used as the substrate 102, and the transistors 100A and 200A may be provided directly on the flexible substrate. Alternatively, a separation layer may be provided between the substrate 102 and each of the transistors 100A and 200A. The separation layer can be used when part or the whole of a semiconductor device formed over the separation layer is separated from the substrate 102 and transferred onto another substrate. In such a case, the transistors 100A and 200A can be transferred to a substrate having low heat resistance or a flexible substrate as well.

[Conductive Film]

The conductive films 104 and 204 functioning as the gate electrodes, the conductive films 112a and 212a functioning as the source electrodes, and the conductive films 112b and 212b functioning as the drain electrodes can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

The conductive films 104, 112a, 112b, 204, 212a, and 212b can be formed using an oxide conductor or an oxide semiconductor such as an oxide containing indium and tin (In—Sn oxide), an oxide containing indium and tungsten (In—W oxide), an oxide containing indium, tungsten, and zinc (In—W—Zn oxide), and oxide containing indium and titanium (In—Ti oxide), an oxide containing indium, titanium, and tin (In—Ti—Sn oxide), an oxide containing indium and zinc (In—Zn oxide), an oxide containing indium, tin, and silicon (In—Sn—Si oxide), or an oxide containing indium, gallium, and zinc (In—Ga—Zn oxide).

Here, an oxide conductor is described. In this specification and the like, an oxide conductor may be referred to as OC. For example, an oxide conductor is obtained in the following manner. Oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. An oxide semiconductor generally transmits visible light because of its large energy gap. An oxide conductor is an oxide semiconductor having a donor level in the vicinity of the conduction band. Thus, the influence of absorption due to the donor level is small in an oxide conductor, and the oxide conductor has a visible light transmitting property comparable to that of an oxide semiconductor.

The hydrogen concentration of an oxide conductor is higher than that of a metal oxide (e.g., oxide semiconductor) functioning as a channel, and is typified by higher than or equal to $8\times10^{19}$ atoms/cm$^3$, preferably higher than or equal to $1\times10^{20}$ atoms/cm$^3$, and further preferably higher than or equal to $5\times10^{20}$ atoms/cm$^3$.

An oxide conductor contains defects and impurities and thus has conductivity. The resistivity of a conductive film containing an oxide conductor is preferably higher than or equal to $1\times10^{-3}$ Ωcm and lower than $1\times10^{4}$ Ωcm, and further preferably higher than or equal to $1\times10^{-3}$ Ωcm and lower than $1\times10^{-1}$ Ωcm.

The conductivity of the conductive film containing an oxide conductor is typically higher than or equal to $1\times10^{-2}$ S/m and lower than or equal to $1\times10^{5}$ S/m, or higher than or equal to $1\times10^{3}$ S/m and lower than or equal to $1\times10^{5}$ S/m.

An oxide conductor contains defects as well as impurities. A typical example of the conductive film containing an oxide conductor is a film in which defects are generated by the addition of a rare gas or by the exposure to plasma.

A Cu—X alloy film (X is Mn, Ni, Cr, Fe, Co, Mo, Ta, or Ti) may be used for the conductive films 104, 112a, 112b, 204, 212a, and 212b. The use of the Cu—X alloy film enables the manufacturing cost to be reduced because a wet etching process can be used in the processing. Since the resistance of the Cu—X alloy film is low, the use of the Cu—X alloy film for the conductive films 104, 112a, 112b, 204, 212a, and 212b can reduce wiring delay. Thus, in manufacturing a large display device, the Cu—X alloy film is suitably used for a wiring.

Among the above-mentioned metal elements, any one or more elements selected from copper, titanium, tungsten, tantalum, and molybdenum are favorably included in the conductive films 112a, 112b, 212a, and 212b. In particular, a tantalum nitride film is suitably used for the conductive films 112a, 112b, 212a, and 212b. A tantalum nitride film has conductivity and a high barrier property against copper or hydrogen. Because a tantalum nitride film releases little hydrogen from itself, it can be favorably used for the conductive film in contact with the metal oxide films 108 and 208 or the conductive film in the vicinity of the metal oxide films 108 and 208. It is favorable to use a copper film for the conductive films 112a, 112b, 212a, and 212b because the resistance of the conductive films 112a, 112b, 212a, and 212b can be reduced.

The conductive films 112a, 112b, 212a, and 212b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Insulating Film Functioning as Gate Insulating Film]

As the insulating film 106 functioning as the gate insulating films of the transistors 100A and 200A, an insulating layer containing at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film Note that the insulating film 106 may have a stacked-layer structure of two, or three or more layers.

The insulating film 106 that is in contact with the metal oxide films 108 and 208 functioning as the channel regions of the transistors 100A and 200A is preferably an oxide insulating film and preferably includes a region containing oxygen in excess of the stoichiometric composition (oxygen-excess region). In other words, the insulating film 106 is an insulating film capable of releasing oxygen. In order to provide the oxygen-excess region in the insulating film 106, the insulating film 106 is formed in an oxygen atmosphere, or the deposited insulating film 106 is subjected to heat treatment in an oxygen atmosphere, for example.

In the case where hafnium oxide is used for the insulating film 106, the following effect is attained. Hafnium oxide has a higher dielectric constant than silicon oxide and silicon oxynitride. Therefore, by using hafnium oxide, the thickness of the insulating film 106 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

Note that one embodiment of the present invention is not limited to the above structure, and a nitride insulating film may be used for the insulating film in contact with the metal oxide films 108 and 208. For example, a silicon nitride film is formed and a surface of the silicon nitride film is oxidized by oxygen plasma treatment or the like performed on the surface of the silicon nitride film. In the case where oxygen plasma treatment or the like is performed on the surface of the silicon nitride film, the surface of the silicon nitride film may be oxidized at the atomic level. For this reason, in the case of performing cross-sectional observation of the transistor, an oxide film is not observed or the silicon nitride film and the metal oxide film are observed to be in contact with each other, in some cases.

Note that the silicon nitride film has a higher dielectric constant than a silicon oxide film and needs a larger thickness to obtain capacitance equivalent to that of the silicon oxide film. Thus, when the silicon nitride film is used for the gate insulating film of the transistor, the thickness of the insulating film can be increased. This makes it possible to inhibit a decrease in withstand voltage of the transistor and furthermore to increase the withstand voltage, thereby reducing electrostatic discharge damage to the transistor.

In this embodiment, a layered film of a silicon nitride film and a silicon oxide film is formed as the insulating film 106.

[Metal Oxide Film]

The metal oxide films 108 and 208 can be formed using the materials described above.

In the case where the metal oxide films 108 and 208 include an In-M-Zn oxide, it is preferable that the atomic ratio of metal elements of a sputtering target used for forming the In-M-Zn oxide satisfy In >M. The atomic ratio of metal elements in such a sputtering target is, for example, In:M:Zn=2:1:3, 3:1:2, 4:2:4.1, 5:1:6, 5:1:7, 5:1:8, 6:1:6, or 5:2:5.

In the case where the metal oxide films 108 and 208 are formed using an In-M-Zn oxide, it is preferable to use a target including a polycrystalline In-M-Zn oxide as the sputtering target. The use of the target including a polycrystalline In-M-Zn oxide facilitates formation of the metal oxide films 108 and 208 having crystallinity. Note that the atomic ratio of metal elements in the formed metal oxide films 108 and 208 varies from the above atomic ratios of metal elements of the sputtering targets in a range of ±40%. For example, when a sputtering target with an atomic ratio of In to Ga to Zn of 4:2:4.1 is used, the atomic ratio of In to Ga to Zn in the formed metal oxide films 108 and 208 may be 4:2:3 or in the neighborhood of 4:2:3.

The energy gap of each of the metal oxide films 108 and 208 is 2 eV or more, preferably 2.5 eV or more. With the use of an oxide semiconductor having such a wide energy gap, the off-state current of each of the transistors 100A and 200A can be reduced.

Furthermore, the metal oxide films 108 and 208 each preferably have a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect states, whereas the CAAC-OS has the lowest density of defect states.

Even when the metal oxide films 108_1, 108_2, 208_1, and 208_2 each independently have a region in which the atomic proportion of In is higher than the atomic proportion of M, the field-effect mobility might be low if the metal oxide films 108_1, 108_2, 208_1, and 208_2 each have high crystallinity.

Thus, the metal oxide film 108_1 may have a region having lower crystallinity than the metal oxide film 108_2, and the metal oxide film 208_1 may have a region having lower crystallinity than the metal oxide film 208_2. Note that the crystallinity of the metal oxide films 108_1, 108_2, 208_1, and 208_2 can be determined by analysis by X-ray diffraction (XRD) or with a transmission electron microscope (TEM), for example.

In the case where the metal oxide films 108_1 and 208_1 each have a region with low crystallinity, the following effects can be achieved.

First, oxygen vacancies that might be formed in the metal oxide film 108 will be described.

Oxygen vacancies formed in the metal oxide film 108 adversely affect the transistor characteristics and therefore cause a problem. For example, oxygen vacancies formed in the metal oxide film 108 are bonded to hydrogen to serve as a carrier supply source. The carrier supply source generated in the metal oxide film 108 causes a change in the electrical characteristics, typically, shift in the threshold voltage, of the transistor 100A including the metal oxide film 108. Therefore, it is preferable that the amount of oxygen vacancies in the metal oxide film 108 be as small as possible.

In view of this, one embodiment of the present invention is a structure in which insulating films in the vicinity of the metal oxide film 108, specifically the insulating films 114 and 116 formed over the metal oxide film 108, include excess oxygen. Oxygen or excess oxygen is transferred from the insulating films 114 and 116 to the metal oxide film 108, whereby the oxygen vacancies in the metal oxide film can be reduced.

Figure 45A:
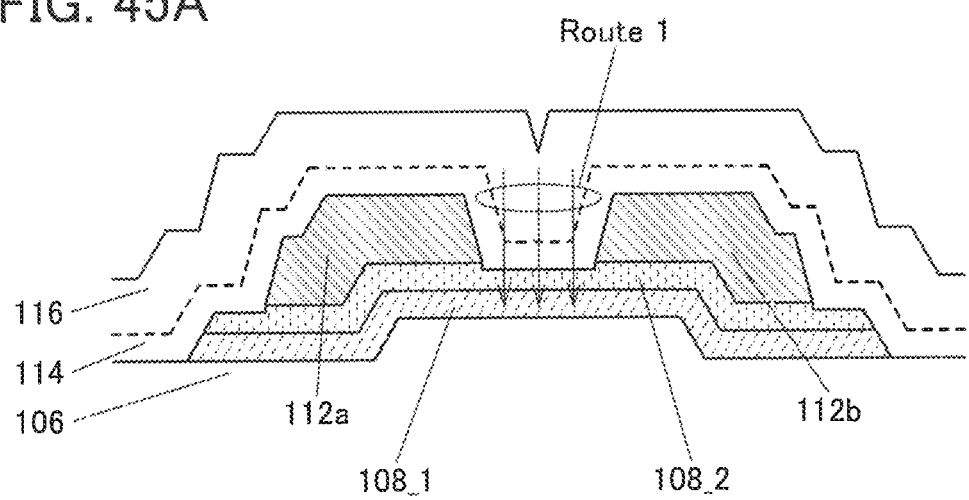
FIGS. 45A and 45B are conceptual diagrams illustrating diffusion paths of oxygen or excess oxygen diffused into a metal oxide film.
Figure 45B:
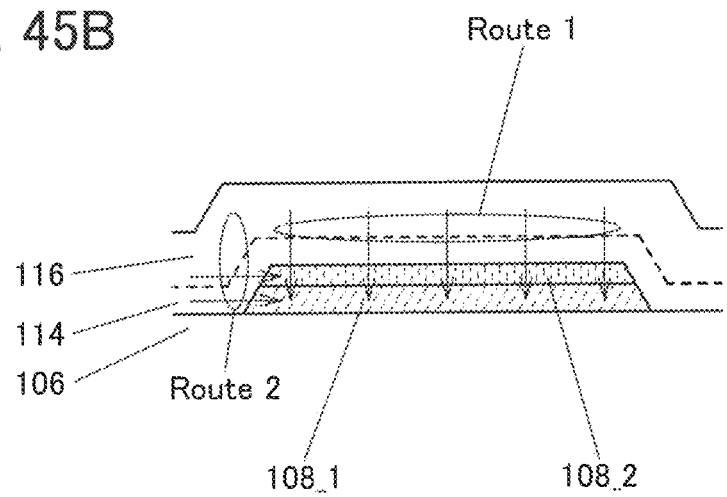

Here, paths of oxygen or excess oxygen diffused into the metal oxide film 108 will be described with reference to FIGS. 45A and 45B. FIGS. 45A and 45B are conceptual diagrams illustrating the paths of oxygen or excess oxygen diffused into the metal oxide film 108. FIG. 45A is the conceptual diagram in the channel length direction and FIG. 45B is the conceptual diagram in the channel width direction. Although the metal oxide film 108 is used for the description here, oxygen is diffused also into the metal oxide film 208 in a similar manner to the case of the metal oxide film 108.

Oxygen or excess oxygen in the insulating films 114 and 116 is diffused to the metal oxide film 108_1 from above, i.e., through the metal oxide film 108_2 (Route 1 in FIGS. 45A and 45B).

Oxygen or excess oxygen in the insulating films 114 and 116 is also diffused into the metal oxide film 108 through side surfaces of the metal oxide films 108_1 and 108_2 (Route 2 in FIG. 45B).

The diffusion of oxygen or excess oxygen through Route 1 illustrated in FIGS. 45A and 45B is sometimes prevented when the metal oxide film 108_2 has high crystallinity, for example In the case of Route 2 illustrated in FIG. 45B, in contrast, oxygen or excess oxygen can be diffused to the metal oxide films 108_1 and 108_2 through the side surfaces of the metal oxide films 108_1 and 108_2.

Furthermore, in the case where the metal oxide film 108_1 has a region whose crystallinity is lower than that of the metal oxide film 108_2, the region serves as a diffusion path of excess oxygen; thus, excess oxygen can be diffused to the metal oxide film 108_2 having crystallinity higher than the metal oxide film 108_1 through Route 2 illustrated in FIG. 45B. Although not illustrated in FIGS. 45A and 45B, when the insulating film 106 contains oxygen or excess oxygen, the oxygen or excess oxygen might be diffused from the insulating film 106 into the metal oxide film 108.

When a stacked-layer structure including the metal oxide films having different crystallinity is employed and the region with low crystallinity is used as a diffusion path of excess oxygen as described above, the transistor can be highly reliable.

Note that in the case where the metal oxide film 108 consists only of a metal oxide film with low crystallinity, the reliability might be lowered because of attachment or entry of impurities (e.g., hydrogen or moisture) to the back channel side of the metal oxide film, i.e., a region corresponding to the metal oxide film 108_2.

Impurities such as hydrogen or moisture entering the metal oxide film 108 adversely affect the transistor characteristics and therefore cause a problem. Therefore, it is preferable that the amount of impurities such as hydrogen or moisture in the metal oxide film 108 be as small as possible.

Accordingly, the crystallinity of the upper layer of the metal oxide film 108 is increased so that impurities can be prevented from entering the metal oxide film 108. In particular, damage at the time of processing into the conductive films 112a and 112b can be prevented when the metal oxide film 108_2 has increased crystallinity. A surface of the metal oxide film 108, i.e., a surface of the metal oxide film 108_2 is exposed to an etchant or an etching gas at the time of processing into the conductive films 112a and 112b. However, when the metal oxide film 108_2 has a region with high crystallinity, the metal oxide film 108_2 has higher etching resistance than the metal oxide film 108_1. Thus, the metal oxide film 108_2 functions as an etching stopper.

Note that it is preferable to use, as the metal oxide film 108, a metal oxide film in which the impurity concentration is low and the density of defect states is low, in which case the transistor can have more excellent electrical characteristics. Here, the state in which the impurity concentration is low and the density of defect states is low (the amount of oxygen vacancies is small) is referred to as "highly purified intrinsic" or "substantially highly purified intrinsic." Typical examples of impurities contained in the metal oxide film include water and hydrogen. In this specification and the like, reducing or removing water and hydrogen from a metal oxide film is referred to as dehydration or dehydrogenation in some cases. Moreover, adding oxygen to a metal oxide film or an oxide insulating film is referred to as oxygen addition in some cases, and a state in which oxygen in excess of the stoichiometric composition is contained due to the oxygen addition is referred to as an oxygen-excess state in some cases.

A highly purified intrinsic or substantially highly purified intrinsic metal oxide film has few carrier generation sources, and thus can have a low carrier density. Thus, a transistor in which a channel region is formed in the metal oxide film rarely has a negative threshold voltage (is rarely normally on). A highly purified intrinsic or substantially highly purified intrinsic metal oxide film has a low density of defect states and accordingly has a low density of trap states in some cases. Furthermore, the highly purified intrinsic or substantially highly purified intrinsic metal oxide film has an extremely low off-state current; even when an element has a channel width W of $1\times10^6$ µm and a channel length L of 10 µm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

When the metal oxide film 108_1 includes a region having lower crystallinity than the metal oxide film 1082, in some cases, the metal oxide film 108_1 has a high carrier density.

When the metal oxide film 108_1 has a high carrier density, the Fermi level is sometimes high relative to the conduction band of the metal oxide film 108_1. This lowers the conduction band minimum of the metal oxide film 108_1, so that the energy difference between the conduction band minimum of the metal oxide film 108_1 and the trap state, which might be formed in a gate insulating film (here, the insulating film 106), is increased in some cases. The increase of the energy difference can reduce trap of charges in the gate insulating film and reduce variation in the threshold voltage of the transistor, in some cases. In addition, when the metal oxide film 108_1 has a high carrier density, the metal oxide film 108 can have high field-effect mobility.

[Insulating Film 1 Functioning as Protective Insulating Film]

The insulating films 114 and 116 function as protective insulating films of the transistors 100A and 200A. In addition, the insulating films 114 and 116 each have a function of supplying oxygen to the metal oxide films 108 and 208. That is, the insulating films 114 and 116 contain oxygen. The insulating film 114 is an insulating film that is permeable to oxygen. The insulating film 114 also functions as a film that relieves damage to the metal oxide films 108 and 208 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used for the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by ESR measurement. If the density of defects in the insulating film 114 is high, oxygen is bonded to the defects and the oxygen permeability of the insulating film 114 is decreased.

Note that not all oxygen entering the insulating film 114 from the outside move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that allows oxygen to pass through is formed as the insulating film 114, oxygen released from the insulating film 116 provided over the insulating film 114 can be moved to the metal oxide films 108 and 208 through the insulating film 114.

Note that the insulating film 114 can be formed using an oxide insulating film having a low density of states due to nitrogen oxide. Note that the density of states due to nitrogen oxide can be formed between the valence band maximum (Ev_os) and the conduction band minimum (Ec_os) of the metal oxide films. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film of which the amount of released ammonia is larger than the amount of released nitrogen oxide in thermal desorption spectroscopy (TDS); the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of each of the metal oxide films 108 and 208. Therefore, when nitrogen oxide is diffused to the interfaces between the insulating film 114 and each of the metal oxide films 108 and 208, an electron is in some cases trapped by the level on the insulating film 114 side. As a result, the trapped electron remains in the vicinity of the interfaces between the insulating film 114 and each of the metal oxide films 108 and 208; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interfaces between the insulating film 114 and each of the metal oxide films 108 and 208.

By using such an oxide insulating film, the insulating film 114 can reduce the shift in the threshold voltage of the transistor, which leads to a smaller change in the electrical characteristics of the transistor.

The nitrogen concentration of the above oxide insulating film measured by SIMS is lower than or equal to $6\times10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is an oxide insulating film which contains oxygen at a higher proportion than the stoichiometric composition. Part of oxygen is released from the above oxide insulating film by heating. The amount of oxygen released from the oxide insulating film in TDS is more than or equal to $1.0 \times 10^{19}$ atoms/cm$^3$, preferably more than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used for the insulating film 116.

It is preferable that the number of defects in the insulating film 116 be small, and typically the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from metal oxide films 108 and 208 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, one embodiment of the present invention is not limited thereto. For example, a single-layer structure of the insulating film 114 or a stacked-layer structure of three or more layers may be used.

[Insulating Film 2 Functioning as Protective Insulating Film]

The insulating film 118 functions as protective insulating films of the transistors 100A and 200A.

The insulating film 118 contains either hydrogen or nitrogen, or both. Alternatively, the insulating film 118 contains nitrogen and silicon. The insulating film 118 has a function of blocking oxygen, hydrogen, water, alkali metal, alkaline earth metal, and the like. It is possible to prevent outward diffusion of oxygen from the metal oxide films 108 and 208, outward diffusion of oxygen included in the insulating films 114 and 116, and entry of hydrogen, water, or the like into the metal oxide films 108 and 208 from the outside by providing the insulating film 118.

As the insulating film 118, a nitride insulating film can be used, for example Examples of the nitride insulating film include a silicon nitride film, a silicon nitride oxide film, an aluminum nitride film, and an aluminum nitride oxide film.

Although the above-described variety of films such as the conductive films, the insulating films, the metal oxide film, and the metal film can be formed by a sputtering method or a PECVD method, they may be formed by another method, e.g., a thermal chemical vapor deposition (CVD) method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film In a thermal CVD method, a source gas is introduced into a chamber, the chamber is set at an atmospheric pressure or a reduced pressure, and a film is deposited on a substrate.

Furthermore, in an ALD method, a source gas is introduced into a chamber, the chamber is set at an atmospheric pressure or a reduced pressure, and a film is deposited on a substrate.

<Structure Example 2 of Display Device>

Figure 3A:
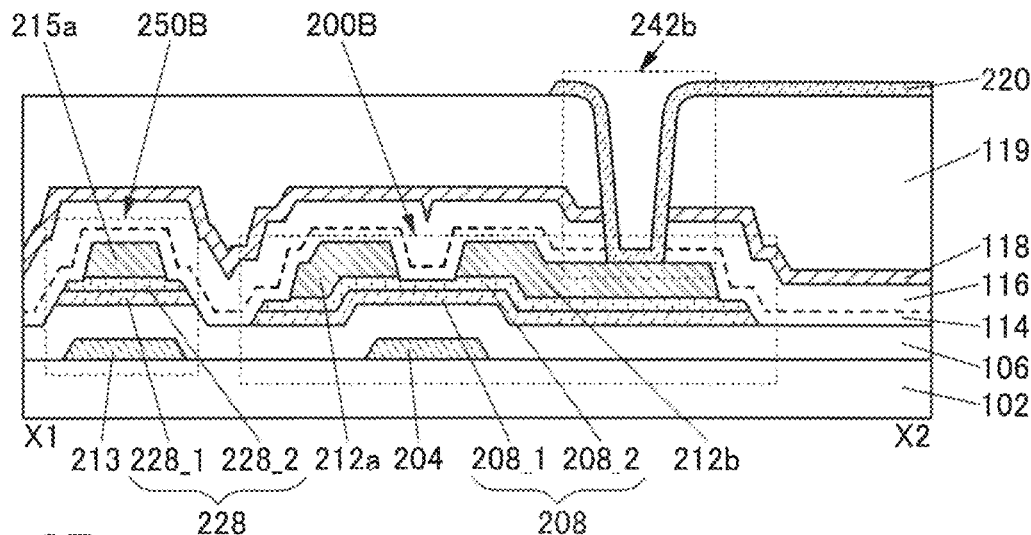
FIGS. 3A to 3C are cross-sectional views illustrating a display device.
Figure 3B:
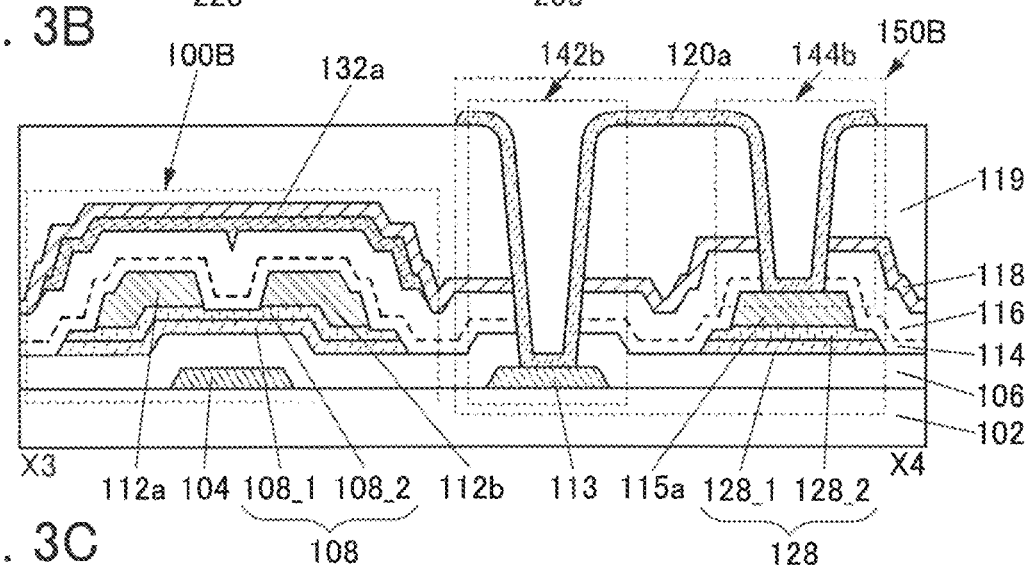
Figure 3C:
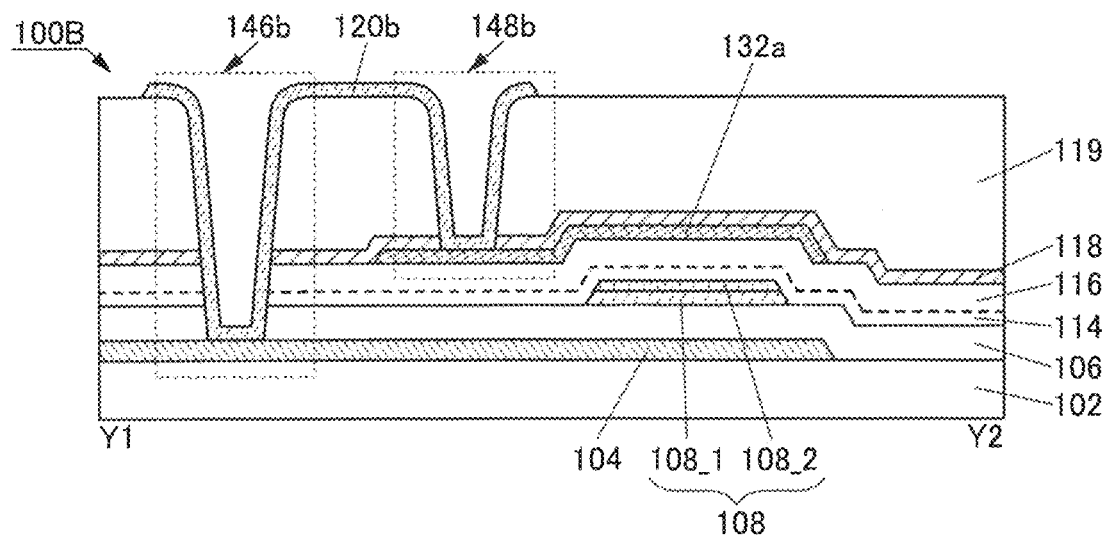

FIGS. 3A to 3C are cross-sectional views of transistors in a pixel portion and a driver circuit included in another display device of one embodiment of the present invention. The display device illustrated in FIGS. 3A to 3C is different from the display device illustrated in FIGS. 1A to 1C in the transistor structure. Since the top views are similar to those illustrated in FIGS. 2A and 2B, FIGS. 2A and 2B are used for the description.

The display device of one embodiment of the present invention includes a transistor 100B, a transistor 200B, a capacitor 250B, and a connection portion 150B.

FIG. 3A is a cross-sectional view of the transistor 200B and the capacitor 250B included in the pixel portion, which corresponds to a cross-sectional view taken along dashed-dotted line X1-X2 in FIG. 2A. FIG. 3B is a cross-sectional view of the transistor 100B and the connection portion 150B included in the driver circuit, which corresponds to a cross-sectional view taken along dashed-dotted line X3-X4 in FIG. 2B. FIG. 3C is a cross-sectional view of the transistor 100B included in the driver circuit, which corresponds to a cross-sectional view taken along dashed-dotted line Y1-Y2 in FIG. 2B.

As illustrated in FIG. 3A, the pixel portion includes the transistor 200B, the conductive film 220 functioning as a pixel electrode, and the capacitor 250B. Note that the conductive film 220 functioning as the pixel electrode is electrically connected to the transistor 200B. The description of the transistor 200A and the capacitor 250A illustrated in FIG. 1A can be referred to for that of the transistor 200B and the capacitor 250B; thus, the transistor 200B and the capacitor 250B are not described in detail.

As illustrated in FIGS. 3B and 3C, the driver circuit includes the transistor 100B and the connection portion 150B.

The transistor 100B includes the conductive film 104 over the substrate 102, the insulating film 106 over the substrate 102 and the conductive film 104, the metal oxide film 108 over the insulating film 106, the conductive film 112a over the metal oxide film 108, the conductive film 112b over the metal oxide film 108, the insulating film 114 over the metal oxide film 108 and the conductive films 112a and 112b, the insulating film 116 over the insulating film 114, and a conductive film 132a over the insulating film 116.

In the transistor 100B, the insulating film 106 functions as a first gate insulating film, the insulating films 114 and 116 collectively function as a second gate insulating film, the conductive film 104 functions as a first gate electrode, the conductive film 132a functions as a second gate electrode, the conductive film 112a functions as a source electrode, and the conductive film 112b functions as a drain electrode.

In the transistor 100B, end portions of the conductive films 112a and 112b are located inward from end portions of the metal oxide film 108.

The insulating film 118 and the insulating film 119 over the insulating film 118 are formed over the transistor 100B, specifically over the insulating film 116 and the conductive film 132a. In the transistor 100B, the insulating films 118 functions as a protective insulating film of the transistor 100B, and the insulating film 119 functions as a planarization film.

In the transistor 100B, the insulating films 106, 114, 116, 118, and 119 have an opening 146b in a region overlapping with the conductive film 104. Furthermore, the insulating film 119 has an opening 148b in a region overlapping with the conductive film 132a. The conductive film 120b functioning as a first wiring is electrically connected to the conductive film 132a and the conductive film 104 through the opening 146b and the opening 148b. Owing to the conductive film 120b, the conductive film 104 functioning as the first gate electrode of the transistor 100B and the conductive film 132a functioning as the second gate electrode of the transistor 100B are electrically connected to each other.

Note that the transistor 100B is what is called a channel-etched transistor, and has a dual-gate structure.

The above-described oxide conductor (OC) is preferably used for the conductive film 132a. When the oxide conductor is used for the conductive film 132a, oxygen can be added to the insulating films 114 and 116. Oxygen added to the insulating films 114 and 116 can move to the metal oxide films 108 and 208 to fill oxygen vacancies in the metal oxide films 108 and 208. As a result, the reliability of the transistors 100B and 200B can be increased.

Furthermore, as illustrated in FIG. 3B, the metal oxide film 108 of the transistor 100B is positioned between the two conductive films functioning as the gate electrodes so as to face the conductive films 104 and 132a. The length of the conductive film 132a in the channel length direction and that in the channel width direction are longer than the length of the metal oxide film 108 in the channel length direction and that in the channel width direction, respectively. The metal oxide film 108 is entirely covered with the conductive film 132a with the insulating films 114 and 116 positioned therebetween.

In other words, the conductive films 104 and 132a are connected to each other through the opening provided in the insulating films 106, 114, 116, 118, and 119, and each include a region positioned outside an edge portion of the metal oxide film 108.

With this structure, the metal oxide film 108 included in the transistor 100B can be electrically surrounded by electric fields of the conductive films 104 and 132a; thus, an S-channel structure is obtained. The above description can be referred to for the S-channel structure.

The connection portion 150B includes the conductive film 113 functioning as a second wiring over the substrate 102; an opening 142b provided in the insulating films 106, 114, 116, 118, and 119 over the conductive film 113 functioning as the second wiring; the conductive film 115a functioning as a third wiring over the metal oxide film 128; an opening 144b provided in the insulating films 114, 116, 118, and 119 over the conductive film 115a functioning as the third wiring; and the conductive film 120a functioning as a fourth wiring that covers the openings 142b and 144b and connects the conductive film 113 functioning as the second wiring and the conductive film 115a functioning as the third wiring. Note that although FIG. 3B illustrates the openings 142b and 144b each having one step, the openings 142b and 144b may each have two or more steps.

In the connection portion 150B, an end portion of the conductive film 115a is located inward from an end portion of the metal oxide film 128.

The conductive film 113 functioning as the second wiring and the conductive film 104 functioning as the first gate electrode of the transistor 100B are formed on the same plane in the same process. The conductive film 115a functioning as the third wiring and the conductive films 112a and 112b functioning as the source and drain electrodes of the transistor 100B are formed on the same plane in the same process. The conductive film 120a functioning as the fourth wiring and the conductive film 220 functioning as the pixel electrode are formed on the same plane in the same process.

In other words, the conductive film 113 functioning as the second wiring is formed using the same layer as the conductive film 104 functioning as the first gate electrode of the transistor 100B. The conductive film 115a functioning as the third wiring is formed using the same layer as the conductive films 112a and 112b functioning as the source and drain electrodes of the transistor 100B. The conductive film 120a functioning as the fourth wiring is formed using the same layer as the conductive film 220 functioning as the pixel electrode.

The conductive film 220 functioning as the pixel electrode, the conductive film 120b functioning as the first wiring, and the conductive film 120a functioning as the fourth wiring are formed in the same process. In other words, the conductive film 220 functioning as the pixel electrode, the conductive film 120b functioning as the first wiring, and the conductive film 120a functioning as the fourth wiring are formed using the same layer. The conductive film 220 functioning as the pixel electrode, the conductive film 120b functioning as the first wiring, and the conductive film 120a functioning as the fourth wiring are in contact with the top surface of the insulating film 119 functioning as the planarization film.

<Structure Example 3 of Display Device>

Figure 4A:
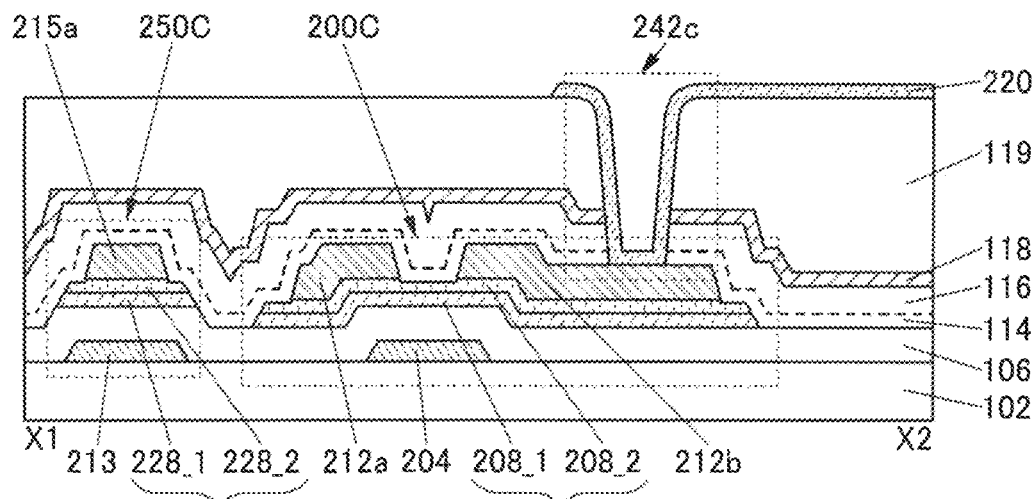
FIGS. 4A to 4C are cross-sectional views illustrating a display device.
Figure 4B:
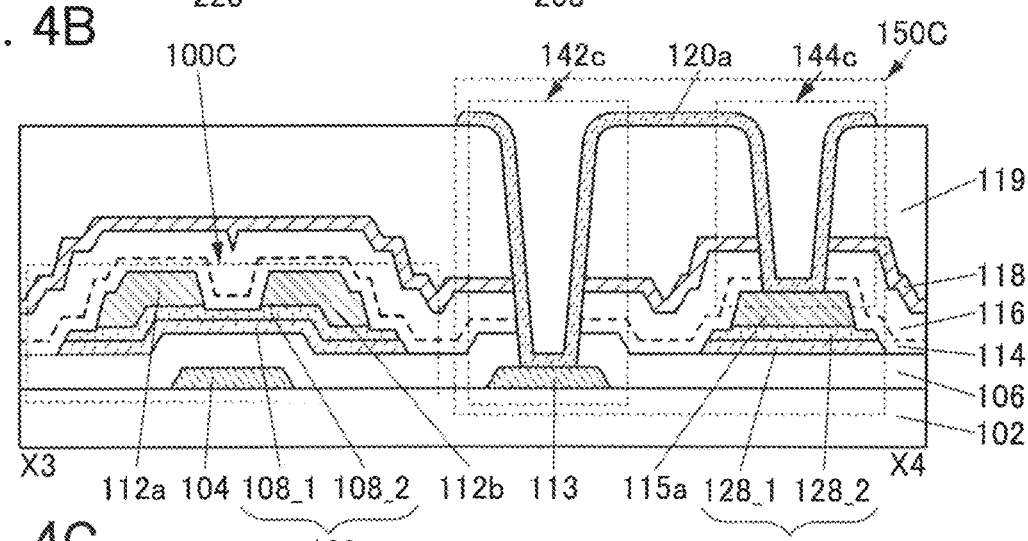
Figure 4C:
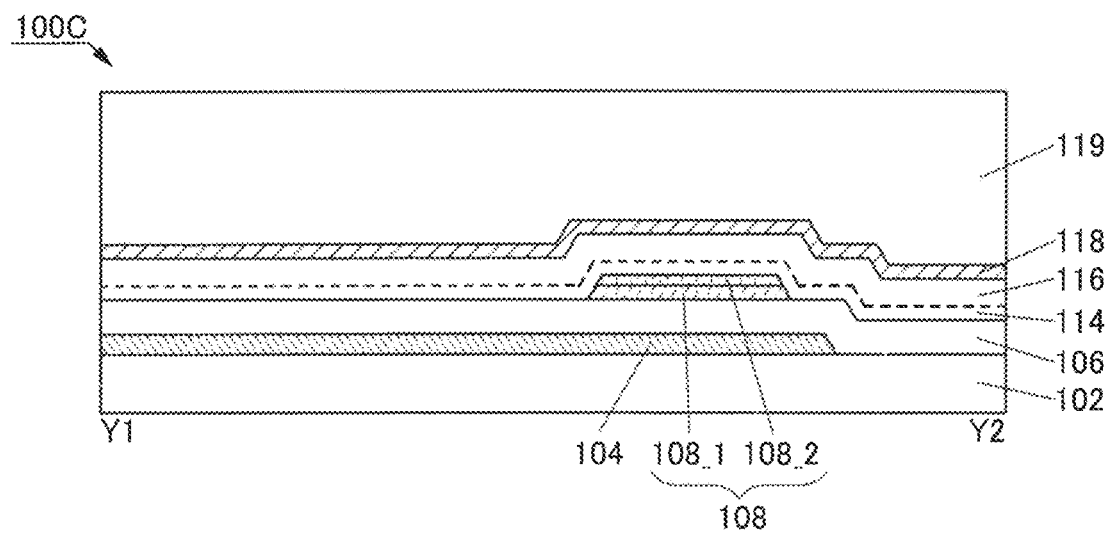
Figure 5A:
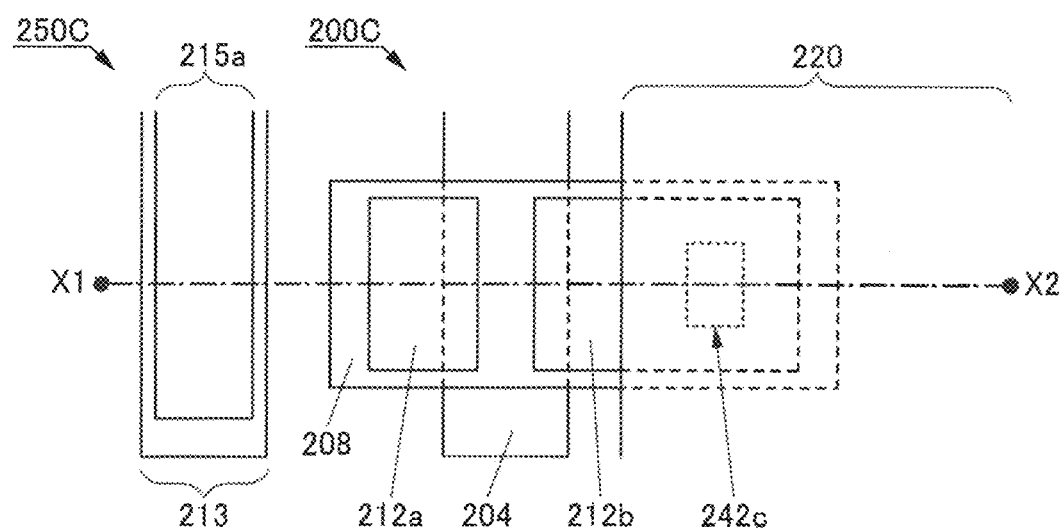
FIGS. 5A and 5B are top views illustrating a display device.
Figure 5B:
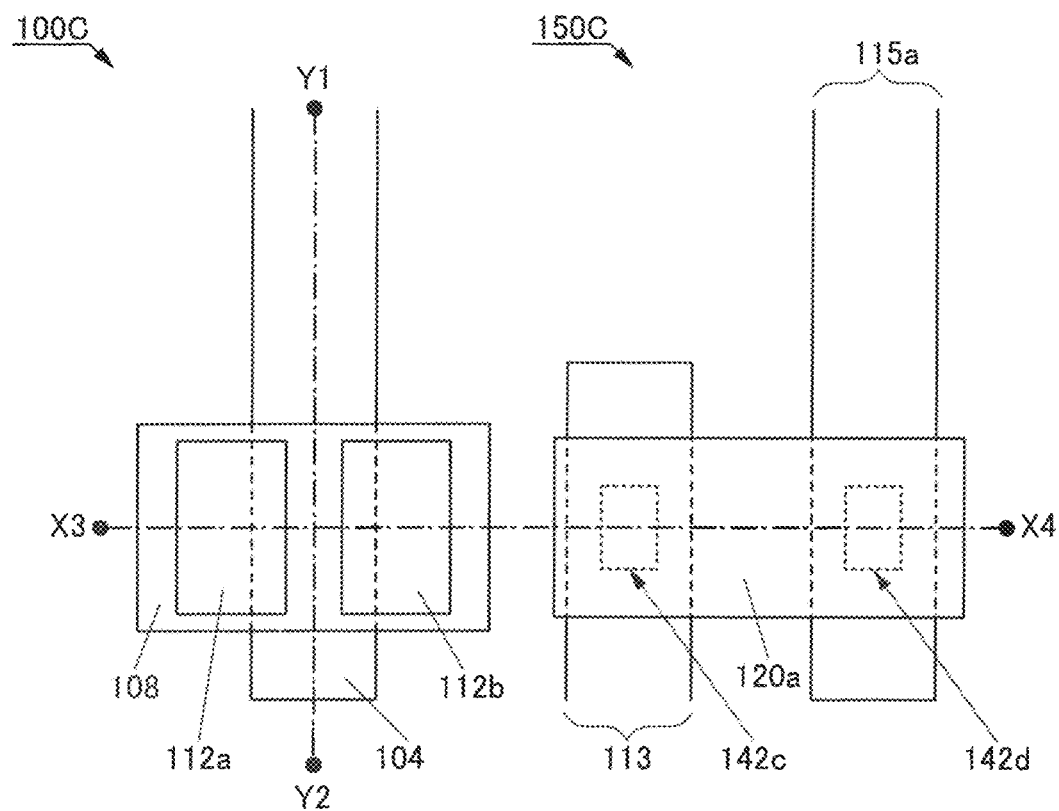

FIGS. 4A to 4C are cross-sectional views of transistors in a pixel portion and a driver circuit included in another display device of one embodiment of the present invention. FIGS. 5A and 5B are top views of the transistors. The display device illustrated in FIGS. 4A to 4C and FIGS. 5A and 5B is different from the display device illustrated in FIGS. 1A to 1C in the transistor structure.

The display device of one embodiment of the present invention includes a transistor 100C, a transistor 200C, a capacitor 250C, and a connection portion 150C.

FIG. 4A is a cross-sectional view of the transistor 200C and the capacitor 250C included in the pixel portion, which corresponds to a cross-sectional view taken along dashed-dotted line X1-X2 in FIG. 5A. FIG. 4B is a cross-sectional view of the transistor 100C and the connection portion 150C included in the driver circuit, which corresponds to a cross-sectional view taken along dashed-dotted line X3-X4 in FIG. 5B. FIG. 4C is a cross-sectional view of the transistor 100C included in the driver circuit, which corresponds to a cross-sectional view taken along dashed-dotted line Y1-Y2 in FIG. 5B.

As illustrated in FIG. 4A, the pixel portion includes the transistor 200C, the conductive film 220 functioning as a pixel electrode, and the capacitor 250C. Note that the conductive film 220 functioning as the pixel electrode is electrically connected to the transistor 200C. The description of the transistor 200A and the capacitor 250A illustrated in FIG. 1A can be referred to for that of the transistor 200C and the capacitor 250C; thus, the transistor 200C and the capacitor 250C are not described in detail.

As illustrated in FIGS. 4B and 4C, the driver circuit includes the transistor 100C and the connection portion 150C.

The transistor 100C includes the conductive film 104 over the substrate 102, the insulating film 106 over the substrate 102 and the conductive film 104, the metal oxide film 108 over the insulating film 106, the conductive film 112a over the metal oxide film 108, and the conductive film 112b over the metal oxide film 108.

In the transistor 100C, the insulating film 106 functions as a gate insulating film, the conductive film 104 functions as a gate electrode, the conductive film 112a functions as a source electrode, and the conductive film 112b functions as a drain electrode.

In the transistor 100C, end portions of the conductive films 112a and 112b are located inward from end portions of the metal oxide film 108.

The insulating film 114, the insulating film 116 over the insulating film 114, the insulating film 118 over the insulating film 116, and the insulating film 119 over the insulating film 118 are formed over the transistor 100C, specifically over the metal oxide film 108 and the conductive films 112a and 112b. In the transistor 100C, the insulating films 114, 116, and 118 collectively function as a protective insulating film of the transistor 100C, and the insulating film 119 functions as a planarization film.

The insulating films 114, 116, 118, and 119 have an opening 242c in a region overlapping with the conductive film 212b. The conductive film 220 functioning as the pixel electrode is electrically connected to the conductive film 212b through the opening 242c.

Note that the transistor 100C is what is called a channel-etched transistor, and has a single-gate structure.

The connection portion 150C includes the conductive film 113 functioning as a second wiring over the substrate 102; an opening 142c provided in the insulating films 106, 114, 116, 118, and 119 over the conductive film 113 functioning as the second wiring; the conductive film 115a functioning as a third wiring over the metal oxide film 128; an opening 144c provided in the insulating films 114, 116, 118, and 119 over the conductive film 115a functioning as the third wiring; and the conductive film 120a functioning as a fourth wiring that covers the openings 142c and 144c and connects the conductive film 113 functioning as the second wiring and the conductive film 115a functioning as the third wiring. Note that although FIG. 4B illustrates the openings 142c and 144c each having one step, the openings 142c and 144c may each have two or more steps.

In the connection portion 150C, an end portion of the conductive film 115a is located inward from an end portion of the metal oxide film 128.

The conductive film 113 functioning as the second wiring and the conductive film 104 functioning as the first gate electrode of the transistor 100C are formed on the same plane in the same process. The conductive film 115a functioning as the third wiring and the conductive films 112a and 112b functioning as the source and drain electrodes of the transistor 100C are formed on the same plane in the same process. The conductive film 120a functioning as the fourth wiring and the conductive film 220 functioning as the pixel electrode are formed on the same plane in the same process.

In other words, the conductive film 113 functioning as the second wiring is formed using the same layer as the conductive film 104 functioning as the first gate electrode of the transistor 100C. The conductive film 115a functioning as the third wiring is formed using the same layer as the conductive films 112a and 112b functioning as the source and drain electrodes of the transistor 100C. The conductive film 120a functioning as the fourth wiring is formed using the same layer as the conductive film 220 functioning as the pixel electrode.

The conductive film 220 functioning as the pixel electrode, the conductive film 120b functioning as the first wiring, and the conductive film 120a functioning as the fourth wiring are formed in the same process. In other words, the conductive film 220 functioning as the pixel electrode, the conductive film 120b functioning as the first wiring, and the conductive film 120a functioning as the fourth wiring are formed using the same layer. The conductive film 220 functioning as the pixel electrode, the conductive film 120b functioning as the first wiring, and the conductive film 120a functioning as the fourth wiring are in contact with the top surface of the insulating film 119 functioning as the planarization film.

<Structure Example 4 of Display Device>

Figure 6A:
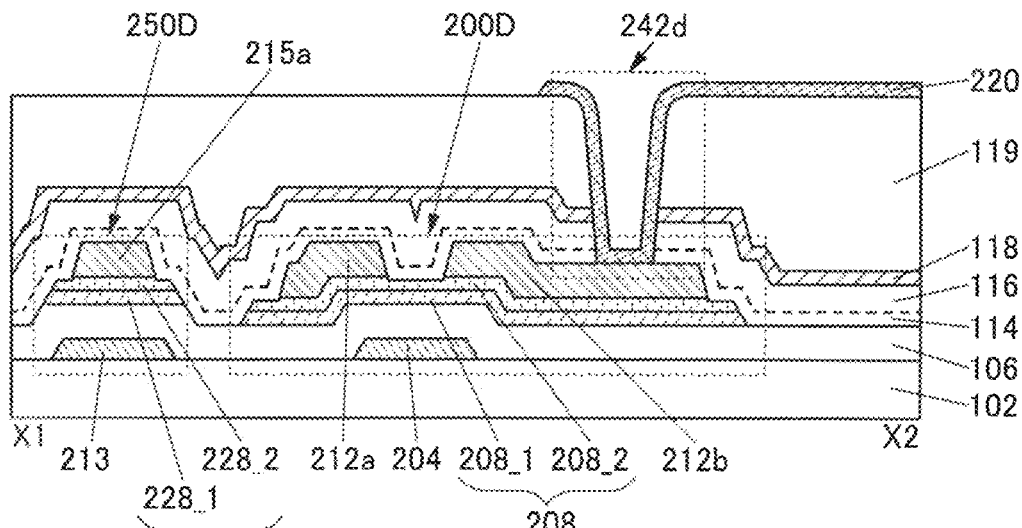
FIGS. 6A to 6C are cross-sectional views illustrating a display device.
Figure 6B:
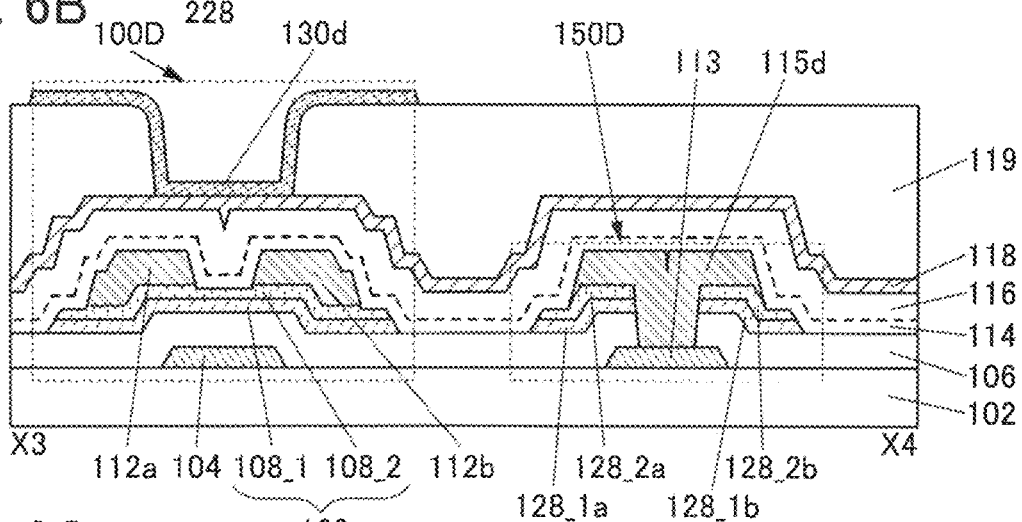
Figure 6C:
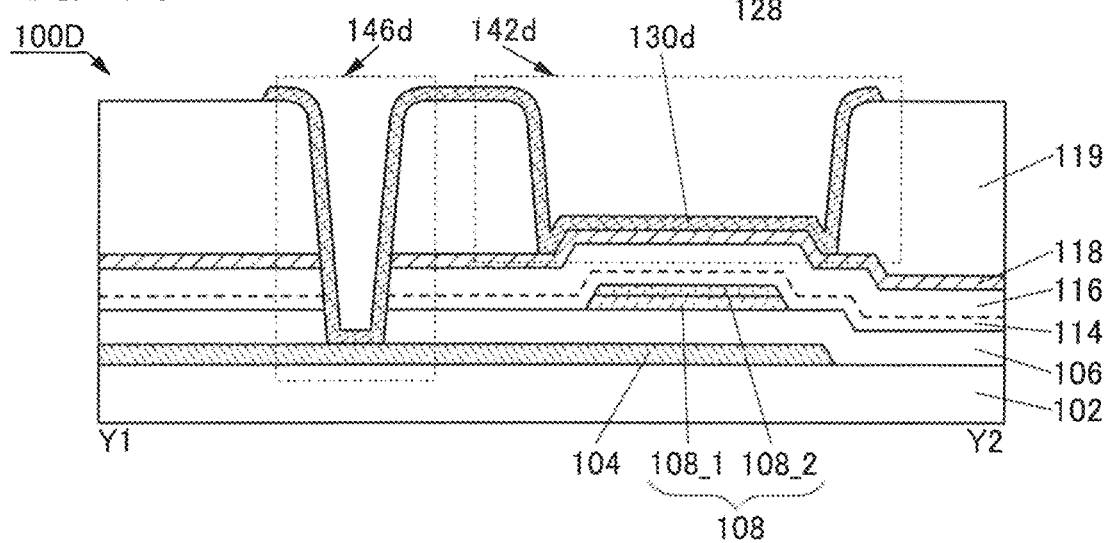
Figure 7A:
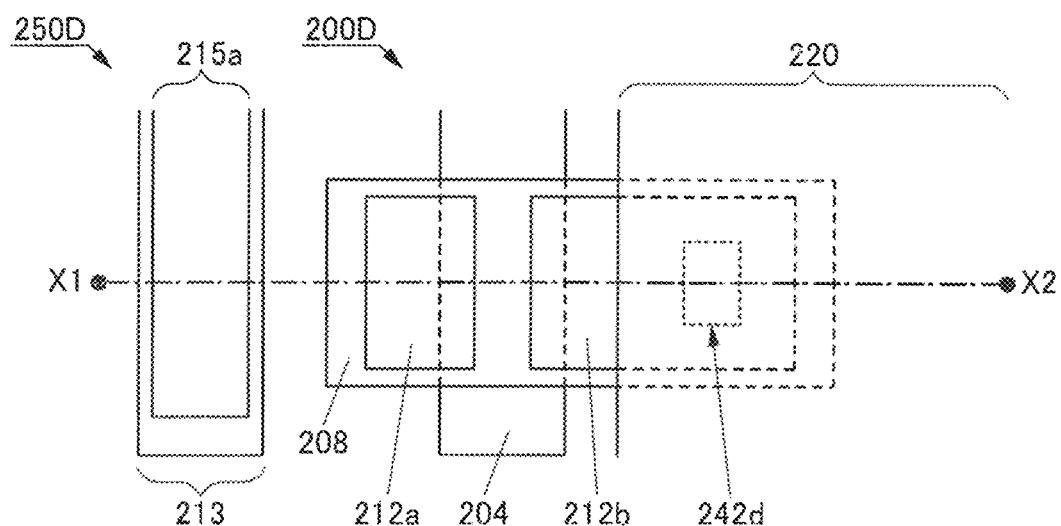
FIGS. 7A and 7B are top views illustrating a display device.
Figure 7B:
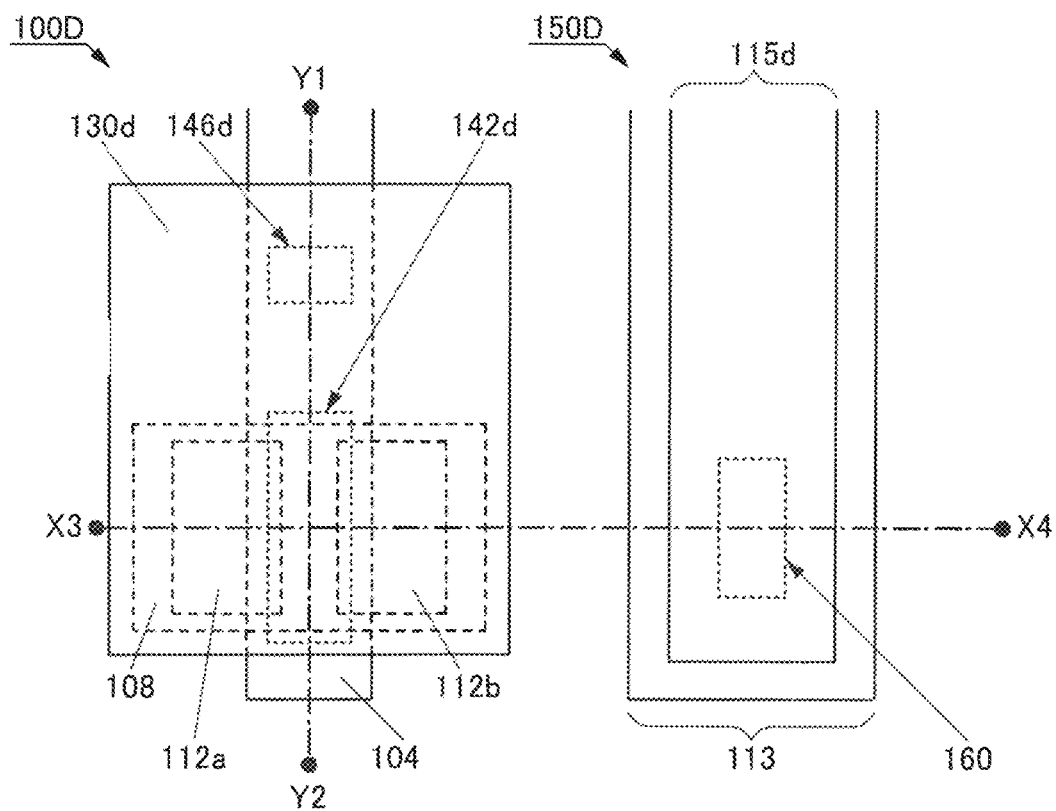

FIGS. 6A to 6C are cross-sectional views of transistors in a pixel portion and a driver circuit included in another display device of one embodiment of the present invention. FIGS. 7A and 7B are top views of the transistors.

The display device of one embodiment of the present invention includes a transistor 100D, a transistor 200D, a capacitor 250D, and a connection portion 150D.

FIG. 6A is a cross-sectional view of the transistor 200D and the capacitor 250D included in the pixel portion, which corresponds to a cross-sectional view taken along dashed-dotted line X1-X2 in FIG. 7A. FIG. 6B is a cross-sectional view of the transistor 100D and the connection portion 150D included in the driver circuit, which corresponds to a cross-sectional view taken along dashed-dotted line X3-X4 in FIG. 7B. FIG. 6C is a cross-sectional view of the transistor 100D included in the driver circuit, which corresponds to a cross-sectional view taken along dashed-dotted line Y1-Y2 in FIG. 7B. Note that in FIGS. 7A and 7B, some components of the transistors 100D and 200D and the capacitor 250D (e.g., an insulating film functioning as a gate insulating film) are not illustrated to avoid complexity. In the transistors, the direction of the dashed-dotted line X1-X2 is called a channel length direction, and the direction of the dashed-dotted line Y1-Y2 is called a channel width direction, in some cases. As in FIGS. 7A and 7B, some components of transistors described below are not illustrated in top views in some cases.

As illustrated in FIG. 6A, the pixel portion includes the transistor 200D, a conductive film 220 functioning as a pixel electrode, and the capacitor 250D. Note that the conductive film 220 functioning as the pixel electrode is electrically connected to the transistor 200D.

The transistor 200D includes the conductive film 204 over the substrate 102, the insulating film 106 over the substrate 102 and the conductive film 204, the metal oxide film 208 over the insulating film 106, the conductive film 212a over the metal oxide film 208, and the conductive film 212b over the metal oxide film 208.

In the transistor 200D, the insulating film 106 functions as a gate insulating film, the conductive film 204 functions as a gate electrode, the conductive film 212a functions as a source electrode, and the conductive film 212b functions as a drain electrode.

In the transistor 200D, end portions of the conductive films 212a and 212b are located inward from end portions of the metal oxide film 208.

The insulating film 114, the insulating film 116 over the insulating film 114, the insulating film 118 over the insulating film 116, and the insulating film 119 over the insulating film 118 are formed over the transistor 200D, specifically over the metal oxide film 208 and the conductive films 212a and 212b. In the transistor 200D, the insulating films 114, 116, and 118 collectively function as a protective insulating film of the transistor 200D. The insulating film 119 functions as a planarization film.

The insulating films 114, 116, 118, and 119 have an opening 242d in a region overlapping with the conductive film 212b. The conductive film 220 functioning as the pixel electrode is electrically connected to the conductive film 212b through the opening 242d.

Note that the transistor 200D is what is called a channel-etched transistor, and has a single-gate structure.

The capacitor 250D includes the conductive film 213, the insulating film 106, the metal oxide film 228, and the conductive film 215a. The conductive film 213 functioning as a capacitor wiring and the conductive films 204, 104, and 113 are formed on the same plane in the same process. The conductive film 215a and the conductive films 212a, 212b, 112a, 112b, and 115d are formed on the same plane in the same process.

In the capacitor 250D, an end portion of the conductive film 215a is located inward from an end portion of the metal oxide film 228.

The conductive film 220 functioning as the pixel electrode is formed over the insulating film 119. The conductive film 220 provided over the insulating film 119 functioning as the planarization film also has high planarity; thus, in the case where the display device is a liquid crystal display device, alignment defects in a liquid crystal layer can be reduced. Moreover, the insulating film 119 can widen the distance between the conductive film 204 functioning as a gate wiring and the conductive film 220 and the distance between the conductive film 212a functioning as a signal line and the conductive film 220, which enables a reduction in wiring delay.

As illustrated in FIGS. 6B and 6C, the driver circuit includes the transistor 100D and the connection portion 150D.

The transistor 100D includes the conductive film 104 over the substrate 102, the insulating film 106 over the substrate 102 and the conductive film 104, the metal oxide film 108 over the insulating film 106, the conductive film 112a over the metal oxide film 108, the conductive film 112b over the metal oxide film 108, the insulating film 114 over the metal oxide film 108 and the conductive films 112a and 112b, the insulating film 116 over the insulating film 114, the insulating film 118 over the insulating film 116, and the insulating film 119 and a conductive film 130d over the insulating film 118.

In the transistor 100D, the insulating film 119 has an opening 142d in a region overlapping with the conductive film 104 and the metal oxide film 108. Furthermore, the insulating films 106, 114, 116, 118, and 119 have an opening 146d in a region not overlapping with the metal oxide film 108, the conductive film 112a, and the conductive film 112b but with the conductive film 104.

The conductive film 130d functioning as a second gate electrode is provided so as to cover the opening 146d and the opening 142d. In the opening 142d, the conductive film 130d functioning as the second gate electrode is provided over the conductive film 104 functioning as a first gate electrode. This means that the conductive film 130d functioning as the second gate electrode and the conductive film 104 functioning as the first gate electrode are electrically connected to each other. In the opening 142d, the conductive film 130d functioning as the second gate electrode is provided over the insulating film 118 functioning as a second gate insulating film. This means that the conductive film 130d functioning as the second gate electrode is provided in the region overlapping with the conductive film 104 functioning as the first gate electrode and the metal oxide film 108.

In the transistor 100D, the insulating film 106 functions as a first gate insulating film, the insulating films 114, 116, and 118 collectively function as a second gate insulating film, the conductive film 104 functions as the first gate electrode, the conductive film 130d functions as the second gate electrode, the conductive film 112a functions as a source electrode, and the conductive film 112b functions as a drain electrode.

In the transistor 100D, the insulating film 119 functions as the planarization film.

In the transistor 100D, end portions of the conductive films 112a and 112b are located inward from end portions of the metal oxide film 108.

Note that the transistor 100D is what is called a channel-etched transistor, and has a dual-gate structure.

Furthermore, as illustrated in FIG. 6B, the metal oxide film 108 of the transistor 100D is positioned between the two conductive films functioning as the gate electrodes so as to face the conductive films 104 and 130d. The length of the conductive film 130d in the channel length direction and that in the channel width direction are longer than the length of the metal oxide film 108 in the channel length direction and that in the channel width direction, respectively. The metal oxide film 108 is entirely covered with the conductive film 130d with the insulating films 114, 116, 118, and 119 positioned therebetween.

In other words, the conductive films 104 and 130d are connected to each other through the opening provided in the insulating films 106, 114, 116, 118, and 119, and each include a region positioned outside an edge portion of the metal oxide film 108.

With this structure, the metal oxide film 108 included in the transistor 100D can be electrically surrounded by electric fields of the conductive films 104 and 130d; thus, an S-channel structure is obtained. The above description can be referred to for the S-channel structure.

Since the transistor 100D has an S-channel structure, an electric field for inducing a channel can be effectively applied to the metal oxide film 108 by the conductive film 104 functioning as the first gate electrode; thus, the current drive capability of the transistor 100D can be improved and high on-state current characteristics can be obtained. Since the on-state current can be increased, it is possible to miniaturize the transistor 100D. In addition, since the transistor 100D has a structure where the metal oxide film 108 is surrounded by the conductive film 104 functioning as the first gate electrode and the conductive film 130d functioning as the second gate electrode, the mechanical strength of the transistor 100D can be increased.

The connection portion 150D includes the conductive film 113 functioning as a first wiring over the substrate 102, an opening 160 provided in the insulating film 106 over the conductive film 113 functioning as the first wiring, and a conductive film 115d functioning as a second wiring that covers the opening 160. In the opening 160, the conductive film 115d functioning as the second wiring is provided over the conductive film 113 functioning as the first wiring, and the conductive film 113 functioning as the first wiring and the conductive film 115d functioning as the second wiring are electrically connected to each other.

In the opening 160, the conductive film 113 functioning as the first wiring and the conductive film 115d functioning as the second wiring are directly connected to each other. Thus, the opening 160 can also be referred to as a contact hole. Since the conductive film 113 functioning as the first wiring and the conductive film 115*d* functioning as the second wiring are directly connected to each other, a favorable contact can be obtained and contact resistance can be reduced.

The conductive film 113 functioning as the first wiring and the conductive film 104 functioning as the first gate electrode of the transistor 100D are formed on the same plane in the same process. The conductive film 115*d* functioning as the second wiring and the conductive films 112*a* and 112*b* functioning as the source and drain electrodes of the transistor 100D are formed on the same plane in the same process.

In other words, the conductive film 113 functioning as the first wiring is formed using the same layer as the conductive film 104 functioning as the first gate electrode of the transistor 100D. The conductive film 115*d* functioning as the second wiring is formed using the same layer as the conductive films 112*a* and 112*b* functioning as the source and drain electrodes of the transistor 100D.

The conductive film 220 functioning as the pixel electrode and the conductive film 130*d* functioning as the second gate electrode are formed in the same process. In other words, the conductive film 220 functioning as the pixel electrode and the conductive film 130*d* functioning as the second gate electrode are formed using the same layer. The conductive film 220 functioning as the pixel electrode and the conductive film 130*d* functioning as the second gate electrode are in contact with the top surface of the insulating film 119 functioning as the planarization film <Structure Example 5 of Display Device>

Figure 8A:
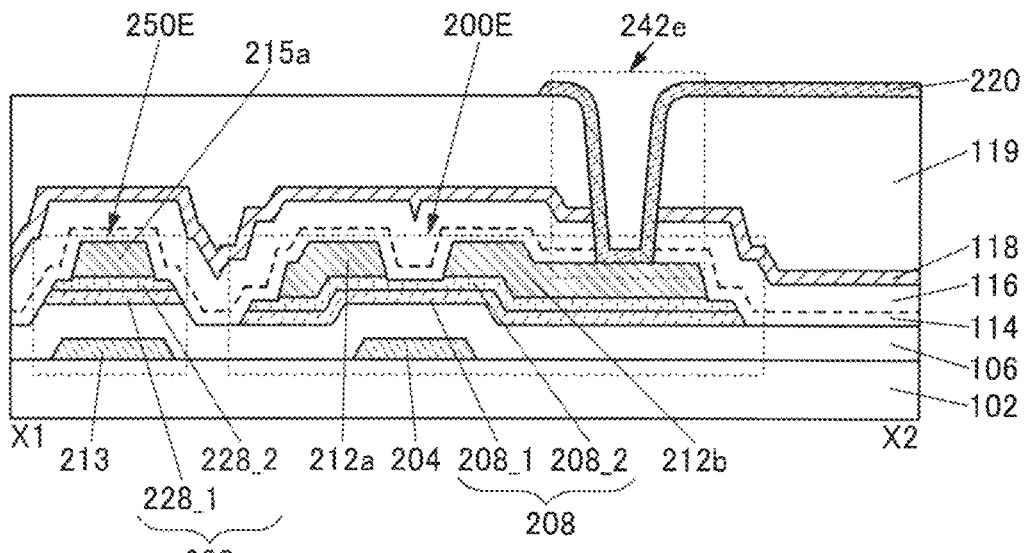
FIGS. 8A to 8C are cross-sectional views illustrating a display device.
Figure 8B:
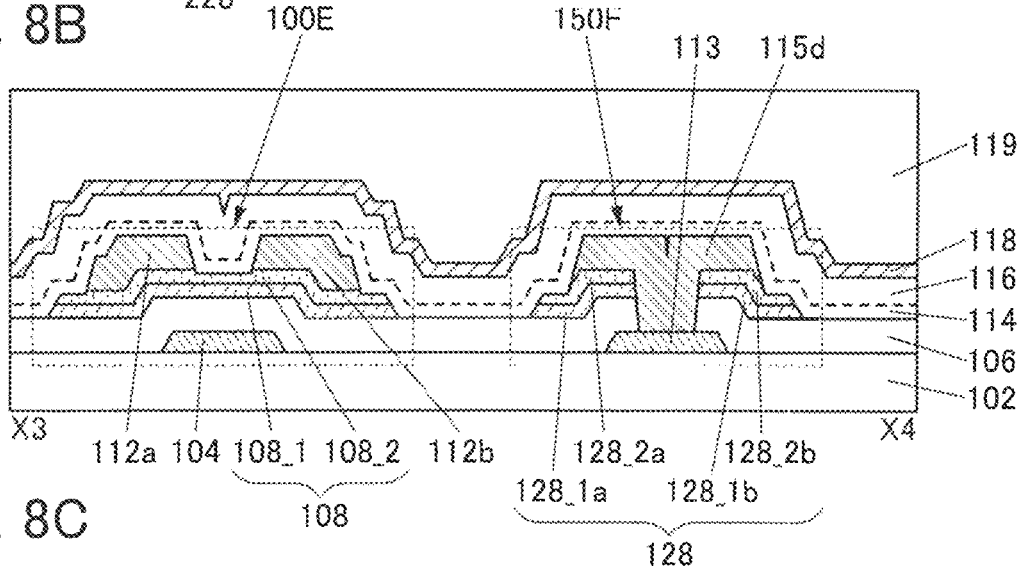
Figure 8C:
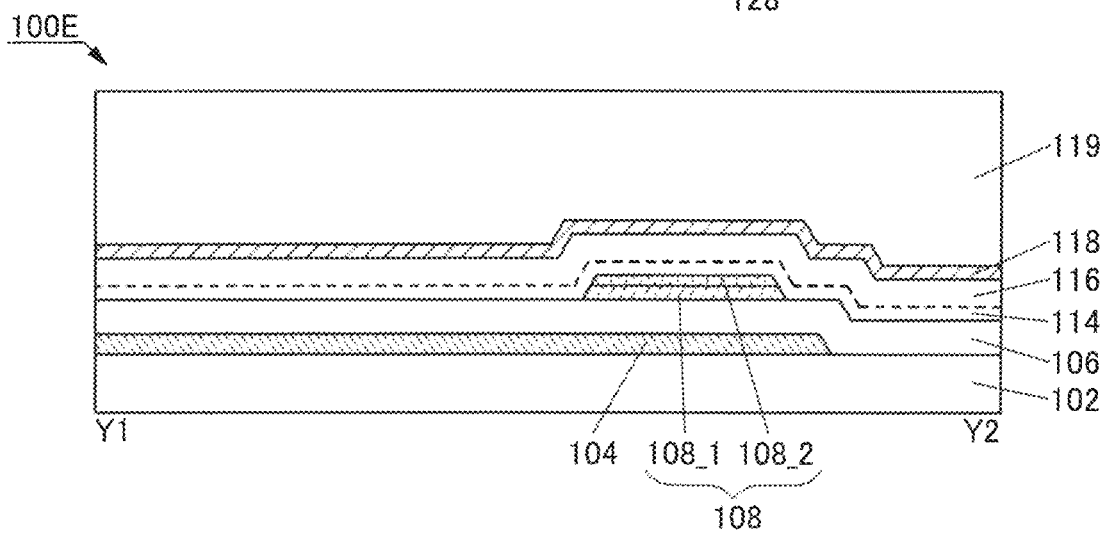
Figure 9A:
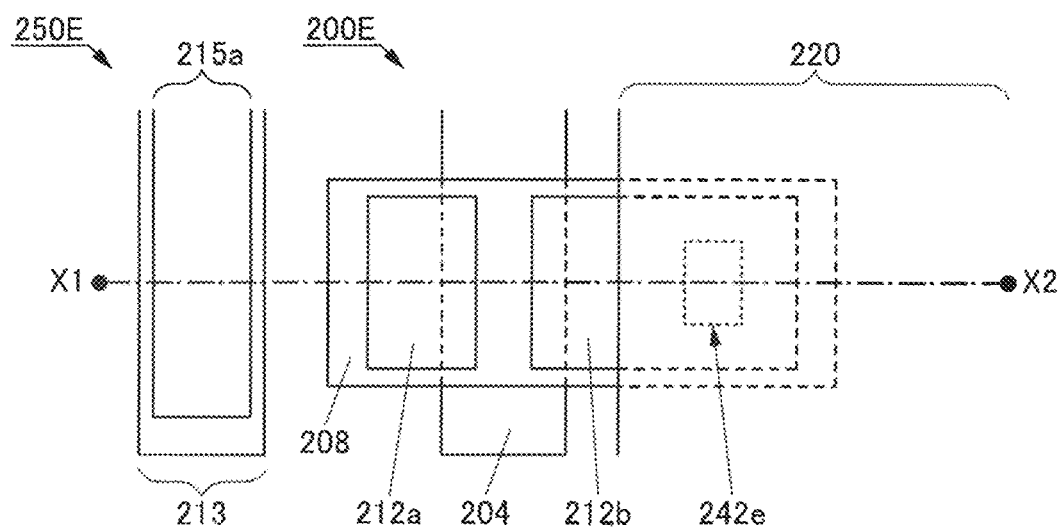
FIGS. 9A and 9B are top views illustrating a display device.
Figure 9B:
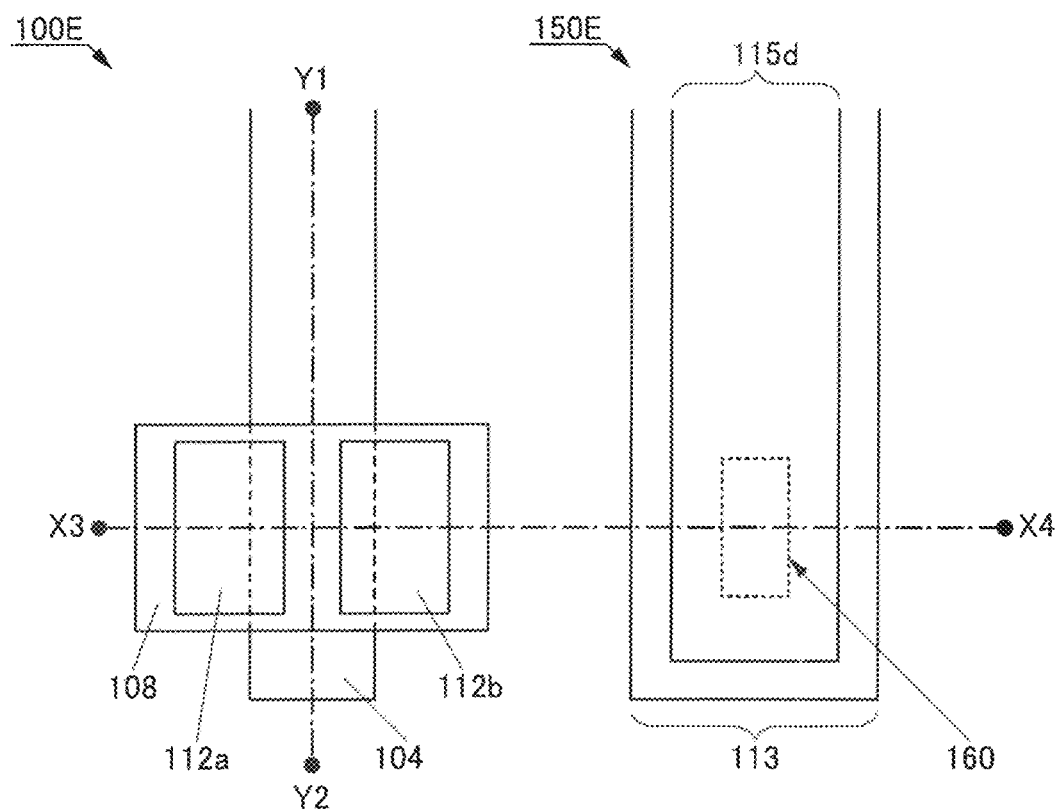
Figure 10A:
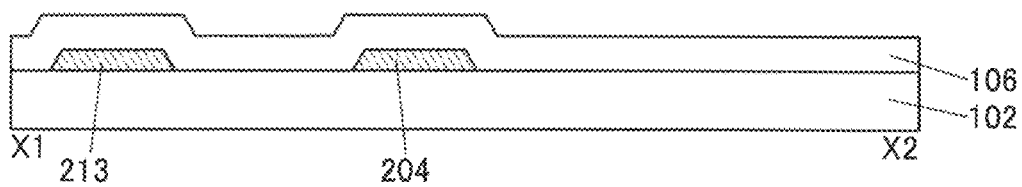
FIGS. 10A to 10C are cross-sectional views illustrating a method for manufacturing a display device.
Figure 10B:
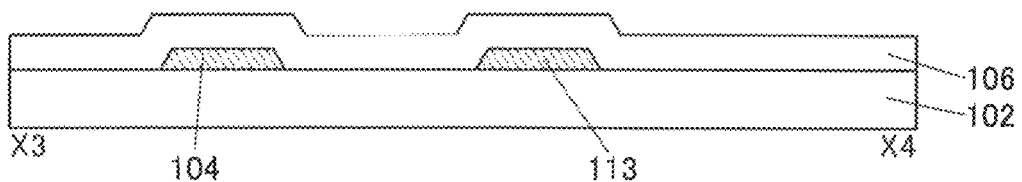
Figure 10C:
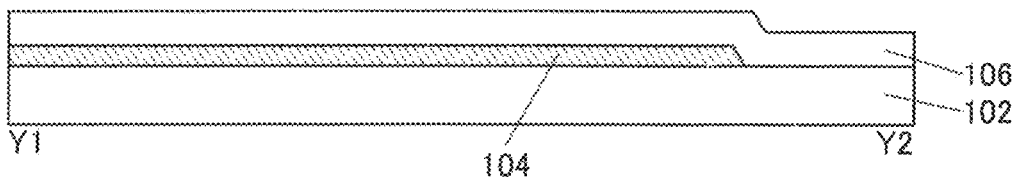

FIGS. 8A to 8C are cross-sectional views of transistors in a pixel portion and a driver circuit included in another display device of one embodiment of the present invention. FIGS. 9A and 9B are top views of the transistors. The display device illustrated in FIGS. 8A to 8C and FIGS. 9A and 9B is different from the display device illustrated in FIGS. 1A to 1C in the transistor structure.

The display device of one embodiment of the present invention includes a transistor 100E, a transistor 200E, a capacitor 250E, and a connection portion 150E.

FIG. 8A is a cross-sectional view of the transistor 200E and the capacitor 250E included in the pixel portion, which corresponds to a cross-sectional view taken along dashed-dotted line X1-X2 in FIG. 9A. FIG. 8B is a cross-sectional view of the transistor 100E and the connection portion 150E included in the driver circuit, which corresponds to a cross-sectional view taken along dashed-dotted line X3-X4 in FIG. 9B. FIG. 8C is a cross-sectional view of the transistor 100E included in the driver circuit, which corresponds to a cross-sectional view taken along dashed-dotted line Y1-Y2 in FIG. 9B.

As illustrated in FIG. 8A, the pixel portion includes the transistor 200E, the conductive film 220 functioning as a pixel electrode, and the capacitor 250E. Note that the conductive film 220 functioning as the pixel electrode is electrically connected to the transistor 200E. The description of the transistor 200D and the capacitor 250D illustrated in FIG. 6A can be referred to for that of the transistor 200E and the capacitor 250E; thus, the transistor 200E and the capacitor 250E are not described in detail.

As illustrated in FIGS. 8B and 8C, the driver circuit includes the transistor 100E and the connection portion 150E.

The transistor 100E includes the conductive film 104 over the substrate 102, the insulating film 106 over the substrate 102 and the conductive film 104, the metal oxide film 108 over the insulating film 106, the conductive film 112*a* over the metal oxide film 108, and the conductive film 112*b* over the metal oxide film 108.

In the transistor 100E, the insulating film 106 functions as a gate insulating film, the conductive film 104 functions as a gate electrode, the conductive film 112*a* functions as a source electrode, and the conductive film 112*b* functions as a drain electrode.

In the transistor 100E, end portions of the conductive films 112*a* and 112*b* are located inward from end portions of the metal oxide film 108.

The insulating film 114, the insulating film 116 over the insulating film 114, the insulating film 118 over the insulating film 116, and the insulating film 119 over the insulating film 118 are formed over the transistor 100E, specifically over the metal oxide film 108 and the conductive films 112*a* and 112*b*. In the transistor 100E, the insulating films 114, 116, and 118 collectively function as a protective insulating film of the transistor 100E, and the insulating film 119 functions as a planarization film.

Note that the transistor 100E is what is called a channel-etched transistor, and has a single-gate structure.

The description of the connection portion 150D illustrated in FIG. 6B can be referred to for that of the connection portion 150E; thus, the connection portion 150E is not described in detail.

<Method 1 for Manufacturing Display Device>

A method for manufacturing the transistor 100A, the transistor 200A, the capacitor 250A, and the connection portion 150A included in the display device of one embodiment of the present invention illustrated in FIGS. 1A to 1C will be described with reference to FIGS. 10A to 10C to FIGS. 22A to 22C.

FIGS. 10A to 10C to FIGS. 22A to 22C are cross-sectional views illustrating the method for manufacturing the display device. In FIGS. 10A to 10C to FIGS. 22A to 22C, a cross-sectional view taken along dashed-dotted line X1-X2 is a cross-sectional view of the transistor 200A in the channel length direction, a cross-sectional view taken along dashed-dotted line X3-X4 is a cross-sectional view of the transistor 100A in the channel length direction, and a cross-sectional view taken along dashed-dotted line Y1-Y2 is a cross-sectional view of the transistor 100A in the channel width direction.

First, a conductive film is formed over the substrate 102 and processed through a lithography process and an etching process to form the conductive film 104 functioning as the first gate electrode of the transistor 100A, the conductive film 113 functioning as a wiring, the conductive film 204 functioning as the gate electrode of the transistor 200A, and the conductive film 213 functioning as the capacitor wiring. Then, the insulating film 106 functioning as the first gate insulating films is formed over the conductive films 104, 113, 213, and 204 and the substrate 102 (see FIGS. 10A to 10C). This process of forming the conductive films 104, 113, 213, and 204 is a first lithography process.

A lithography process in this specification and the like is a process of forming a pattern using a light-exposure mask.

In this embodiment, a glass substrate is used as the substrate 102. Furthermore, a 50-nm-thick titanium film and a 200-nm-thick copper film are formed for the conductive films 104, 113, 204, and 213 by a sputtering method.

In this embodiment, a 400-nm-thick silicon nitride film and a 50-nm-thick silicon oxynitride film are formed for the insulating film 106 by a PECVD method.

Note that the above-described silicon nitride film has a three-layer structure of a first silicon nitride film, a second silicon nitride film, and a third silicon nitride film. The three-layer structure can be formed as follows, for example.

The first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as source gases to a reaction chamber of a PECVD apparatus, the pressure in the reaction chamber is adjusted to 100 Pa, and a power of 2000 W is supplied using a 27.12 MHz high-frequency power source, for example.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as source gases to the reaction chamber of the PECVD apparatus, the pressure in the reaction chamber is adjusted to 100 Pa, and a power of 2000 W is supplied using the 27.12 MHz high-frequency power source.

The third silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as source gases to the reaction chamber of the PECVD apparatus, the pressure in the reaction chamber is adjusted to 100 Pa, and a power of 2000 W is supplied using the 27.12 MHz high-frequency power source, for example.

Note that the first silicon nitride film, the second silicon nitride film, and the third silicon nitride film can each be formed at a substrate temperature of lower than or equal to 350° C.

When the silicon nitride film has the above-described three-layer structure, in the case where a conductive film containing copper is used for one or more of the conductive films 104, 113, 204, and 213, for example, the following effects can be obtained.

The first silicon nitride film can inhibit diffusion of copper from the conductive films 104, 113, 204, and 213. The second silicon nitride film has a function of releasing hydrogen and can improve withstand voltage of the insulating film functioning as the gate insulating film. The third silicon nitride film releases a small amount of hydrogen and can inhibit diffusion of hydrogen released from the second silicon nitride film.

Figure 12A:
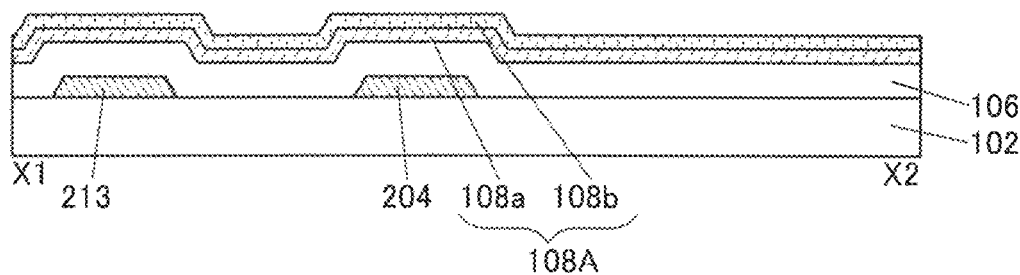
FIGS. 12A to 12C are cross-sectional views illustrating a method for manufacturing a display device.
Figure 12B:
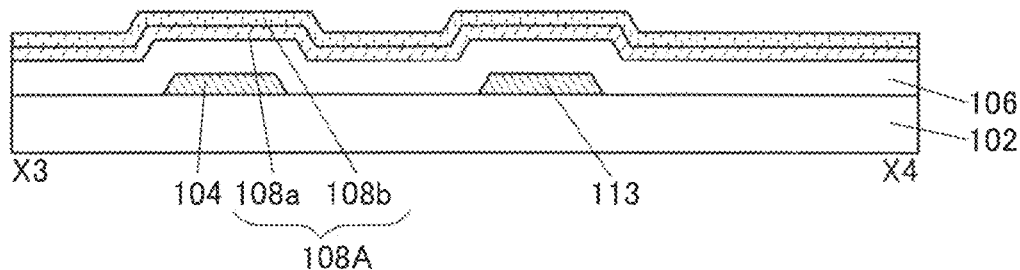
Figure 12C:
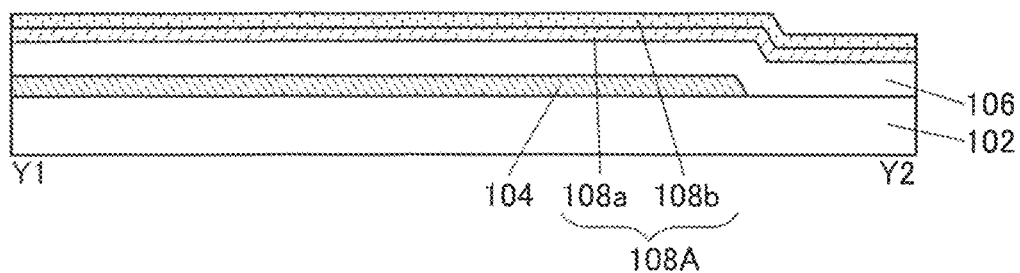

Next, a metal oxide film 108a and a metal oxide film 108b are formed over the insulating film 106 (see FIGS. 12A to 12C).

Figure 11A:
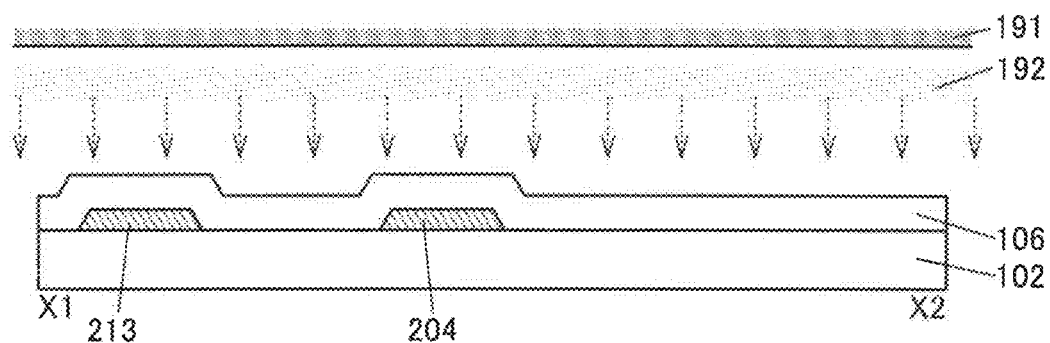
FIGS. 11A to 11C are cross-sectional views illustrating a method for manufacturing a display device.
Figure 11B:
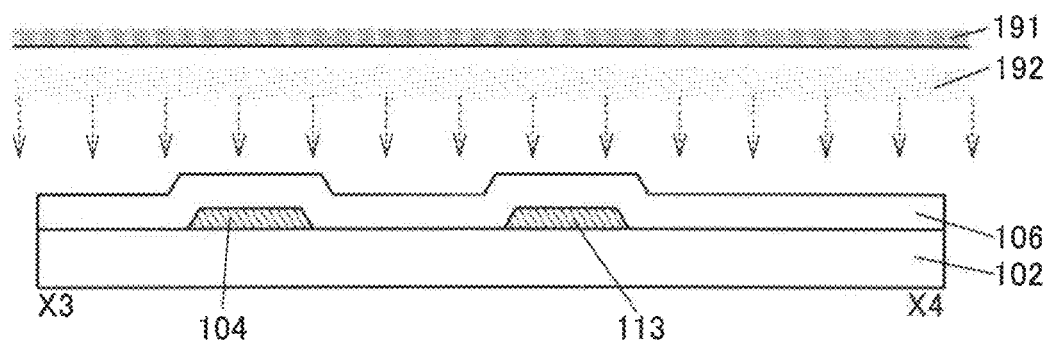
Figure 11C:
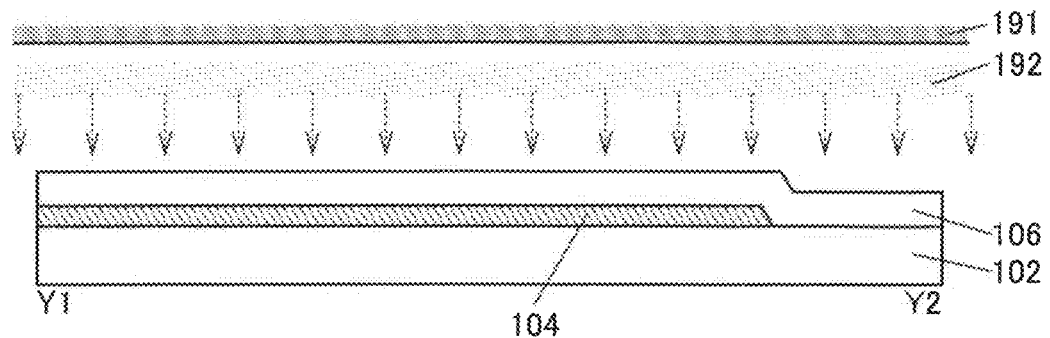

FIGS. 11A to 11C are schematic cross-sectional views illustrating the inside of a deposition apparatus when the metal oxide films 108a and 108b are formed over the insulating film 106. In FIGS. 11A to 11C, a sputtering apparatus is used as the deposition apparatus, and a target 191 placed inside the sputtering apparatus and plasma 192 generated under the target 191 are schematically illustrated.

In FIGS. 11A to 11C, oxygen or excess oxygen added to the insulating film 106 is schematically shown by arrows of broken lines. Oxygen can be favorably added to the insulating film 106 when an oxygen gas is used in forming the metal oxide film 108a, for example.

The metal oxide film 108a is formed over the insulating film 106 to a thickness greater than or equal to 1 nm and less than or equal to 25 nm, preferably greater than or equal to 5 nm and less than or equal to 20 nm. The metal oxide film 108a is formed using one or both of an inert gas (typified by an Ar gas) and an oxygen gas. Note that the proportion of the oxygen gas in the whole deposition gas (hereinafter also referred to as an oxygen flow rate percentage) in forming the metal oxide film 108a is higher than or equal to 0% and lower than 30%, preferably higher than or equal to 5% and lower than or equal to 15%.

When the oxygen flow rate percentage for forming the metal oxide film 108a is set in the above range, the crystallinity of the metal oxide film 108a can be low.

Next, the metal oxide film 108b is formed over the metal oxide film 108a. When the metal oxide film 108b is formed, plasma discharge is performed in an atmosphere containing an oxygen gas. At this time, oxygen is added to the metal oxide film 108a over which the metal oxide film 108b is to be formed. The oxygen flow rate percentage in forming the metal oxide film 108b is higher than or equal to 30% and lower than or equal to 100%, preferably higher than or equal to 50% and lower than or equal to 100%, and further preferably higher than or equal to 70% and lower than or equal to 100%.

The thickness of the metal oxide film 108b is greater than or equal to 20 nm and less than or equal to 100 nm, preferably greater than or equal to 20 nm and less than or equal to 50 nm.

As described above, the oxygen flow rate percentage for forming the metal oxide film 108b is preferably higher than the oxygen flow rate percentage for forming the metal oxide film 108a. In other words, the metal oxide film 108a is preferably formed under a lower oxygen partial pressure than the metal oxide film 108b.

The substrate temperature at the time of the formation of the metal oxide films 108a and 108b is set at higher than or equal to room temperature (25° C.) and lower than or equal to 200° C., preferably higher than or equal to room temperature and lower than or equal to 130° C. Setting the substrate temperature in the above range is favorable for large glass substrates (e.g., the above-described 8th- or 10th-generation glass substrate). Specifically, when the substrate temperature for forming the metal oxide films 108a and 108b is set at room temperature, bending or distortion of the substrate can be inhibited. To increase the crystallinity of the metal oxide film 108b, the substrate temperature in forming the metal oxide film 108b is preferably increased.

Note that it is more favorable to successively form the metal oxide films 108a and 108b in a vacuum because impurities can be prevented from being caught at the interfaces.

In addition, the purity of a sputtering gas needs to be increased. For example, when an oxygen gas or an argon gas which is highly purified to have a dew point of −40° C. or lower, preferably −80° C. or lower, further preferably −100° C. or lower, still further preferably −120° C. or lower is used as a sputtering gas, entry of moisture or the like into the metal oxide films can be minimized.

In the case where the metal oxide films are deposited by a sputtering method, a chamber of a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the metal oxide films, as much as possible. In particular, the partial pressure of gas molecules corresponding to $H_2O$ (gas molecules with m/z=18) in the chamber in the standby mode of the sputtering apparatus is preferably lower than or equal to $1\times10^{-4}$ Pa, and further preferably lower than or equal to $5\times10^{-5}$ Pa.

In this embodiment, the metal oxide film 108a is formed by a sputtering method using an In—Ga—Zn metal oxide target (In:Ga:Zn=4:2:4.1 in an atomic ratio). The substrate temperature during the formation of the metal oxide film 108a is room temperature, and an argon gas at a flow rate of 180 sccm and an oxygen gas at a flow rate of 20 sccm are used as deposition gases (oxygen flow rate percentage: 10%).

In addition, the metal oxide film 108b is formed by a sputtering method using an In—Ga—Zn metal oxide target (In:Ga:Zn=4:2:4.1 in an atomic ratio). The substrate temperature during the formation of the metal oxide film 108b is room temperature, and an oxygen gas at a flow rate of 200 sccm is used as a deposition gas (oxygen flow rate percentage: 100%).

When the oxygen flow rate percentage in forming the metal oxide film 108a is different from that in forming the metal oxide film 108b, a layered film having a plurality of kinds of crystallinity can be formed.

Note that the formation method is not limited to the above-described sputtering method, and a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of the thermal CVD method, a metal organic chemical vapor deposition (MOCVD) method can be given.

After the metal oxide films 108a and 108b are formed, the metal oxide films 108a and 108b may be exposed to plasma containing oxygen. As a result, oxygen can be added to surfaces of the metal oxide films 108a and 108b, which leads to a reduction in oxygen vacancies in the metal oxide films 108a and 108b. It is particularly preferable to reduce oxygen vacancies at side surfaces of the metal oxide films 108a and 108b because leakage current in the transistors can be prevented.

It is suitable that heat treatment (hereinafter referred to as first heat treatment) is performed after the metal oxide films 108a and 108b are formed. By the first heat treatment, hydrogen, water, or the like contained in the metal oxide films 108a and 108b can be reduced. The heat treatment for the purpose of reducing hydrogen, water, or the like may be performed after the metal oxide films 108a and 108b are processed into island shapes. Note that the first heat treatment is one kind of treatment for increasing the purity of the metal oxide films.

The first heat treatment can be performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

Moreover, an electric furnace, an RTA apparatus, or the like can be used for the first heat treatment. With the use of an RTA apparatus, the heat treatment can be performed at a temperature higher than or equal to the strain point of the substrate only for a short time. Therefore, the heat treatment time can be shortened. The first heat treatment may be performed in an atmosphere of nitrogen, oxygen, ultra-dry air (air with a water content of 20 ppm or less, preferably 1 ppm or less, further preferably 10 ppb or less), or a rare gas (e.g., argon or helium). It is preferable that hydrogen, water, and the like not be contained in the nitrogen, oxygen, ultra-dry air, or rare gas. Furthermore, after heat treatment is performed in a nitrogen atmosphere or a rare gas atmosphere, heat treatment may be additionally performed in an oxygen atmosphere or an ultra-dry air atmosphere. As a result, hydrogen, water, or the like contained in the metal oxide films can be released and oxygen can be supplied to the metal oxide films at the same time. Consequently, the number of oxygen vacancies in the metal oxide films can be reduced.

Then, a conductive film 112 is formed over the metal oxide films 108a and 108b. Subsequently, through a second lithography process, a resist mask 251, a resist mask 253, a resist mask 151, and a resist mask 153 are formed over the conductive film 112 (see FIGS. 13A to 13C). This process of forming the resist masks 251, 253, 151, and 153 is the second lithography process.

In this embodiment, for the conductive film 112, a 30-nm-thick titanium film, a 200-nm-thick copper film, and a 10-nm-thick titanium film are formed in this order by a sputtering method.

The resist mask 253 has a region 255 with a small resist thickness in a region overlapping with the conductive film 204. The region 255 can also be referred to as a depressed portion. The resist mask 151 has a region 155 with a small resist thickness in a region overlapping with the conductive film 104. The region 155 can also be referred to as a depressed portion. In this embodiment, light exposure using a multi-tone (high-tone) mask is performed for forming the resist masks. When the multi-tone (high-tone) mask is used, a resist mask having varied resist thicknesses can be formed.

The light exposure using the multi-tone (high-tone) mask will be described.

First, to form a resist mask, a resist is formed. As the resist, a positive resist or a negative resist can be used. Here, a positive resist is used. The resist may be formed by a spin coating method or may be selectively formed by an inkjet method. When the resist is selectively formed by an inkjet method, a resist can be prevented from being formed in an unintended portion, which results in reducing waste of the material.

Next, the resist is irradiated with light with the use of a multi-tone mask as a light-exposure mask, so that light exposure is performed on the resist.

A multi-tone mask is a mask capable of light exposure of three levels to provide an exposed region, a half-exposed region, and an unexposed region. A multi-tone mask is a light-exposure mask through which light is transmitted to have a plurality of intensities. One-time light exposure and development process allows a resist mask with a plurality of thicknesses to be formed. Accordingly, the use of the multi-tone mask can reduce the number of lithography processes, leading to a simple process flow.

Figure 46A:
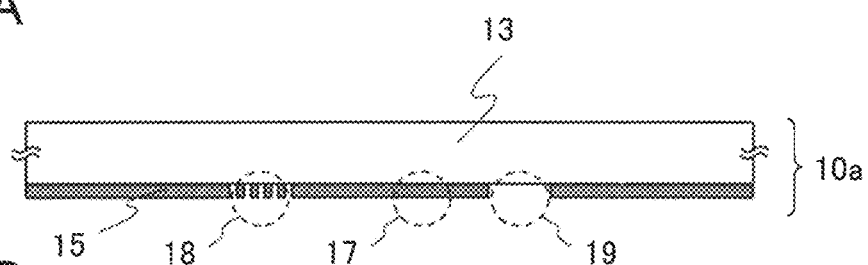
FIGS. 46A and 46C are cross-sectional views each illustrating a multi-tone mask and FIGS. 46B and 46D each show light transmittance.
Figure 46B:
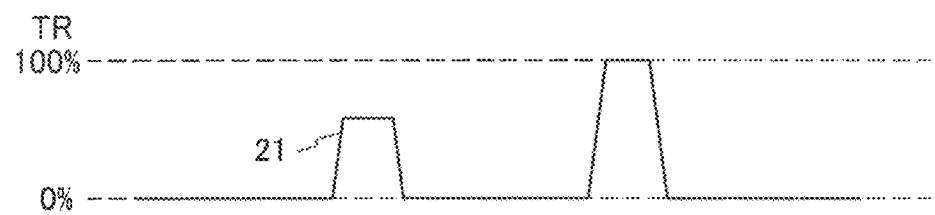
Figure 46C:
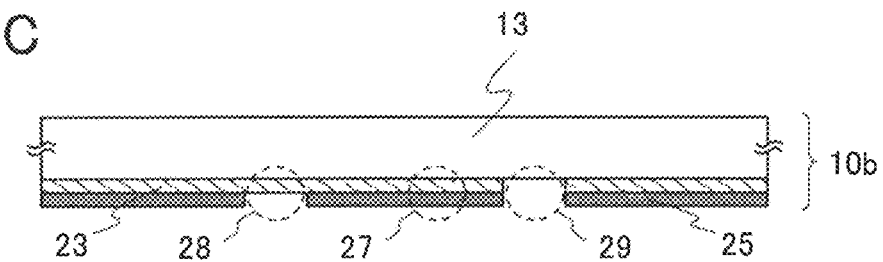

Typical examples of the multi-tone mask include a gray-tone mask 10a illustrated in FIG. 46A and a half-tone mask 10b illustrated in FIG. 46C.

As illustrated in FIG. 46A, the gray-tone mask 10a includes a light-transmitting substrate 13 and a light-blocking film 15 formed over the light-transmitting substrate 13. The gray-tone mask 10a has a light-blocking portion 17 where the light-blocking film is provided, a diffraction grating portion 18 formed using a pattern of the light-blocking film, and a light-transmitting portion 19 where the light-blocking film is not provided.

As the light-transmitting substrate 13, a light-transmitting substrate such as a quartz substrate can be used. The light-blocking film 15 can be formed using a light-blocking material which absorbs light, such as chromium or chromium oxide.

FIG. 46B shows light transmittance TR when the gray-tone mask 10a is irradiated with light for exposure. As shown in FIG. 46B, light transmittance 21 of the light-blocking portion 17 is 0%. The light transmittance 21 of the light-transmitting portion 19 is approximately 100%. The light transmittance 21 of the diffraction grating portion 18 can be adjusted in the range from 10% to 70%. In the diffraction grating portion 18, a gap in a light-transmitting portion in a slit form, a dot form, a mesh form, or the like is adjusted to be less than or equal to the resolution limit of light for exposure. The diffraction grating portion 18 can adjust the light transmittance by having the gap or pitch of the slits, dots, or mesh adjusted. The slits, dots, or mesh of the diffraction grating portion 18 can be either periodic or nonperiodic.

As illustrated in FIG. 46C, the half-tone mask 10b includes the light-transmitting substrate 13 and a light-blocking film 25 and a semi-transmissive film 23 formed over the light-transmitting substrate 13. The half-tone mask 10b has a light-blocking portion 27 where the light-blocking film 25 and the semi-transmissive film 23 are provided, a semi-transmissive portion 28 where the light-blocking film 25 is not provided and the semi-transmissive film 23 is provided, and a light-transmitting portion 29 where the light-blocking film 25 and the semi-transmissive film 23 are not provided.

Figure 46D:
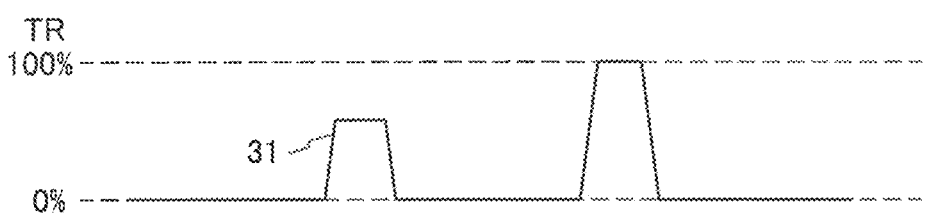

FIG. 46D shows light transmittance when the half-tone mask 10b is irradiated with light for exposure. As shown in FIG. 46D, light transmittance 31 of the light-blocking portion 27 is 0% and the light transmittance 31 of the light-transmitting portion 29 is approximately 100%. The light transmittance 31 of the semi-transmissive portion 28 can be adjusted in the range from 10% to 70%. In the semi-transmissive portion 28, the light transmittance can depend on the material of the semi-transmissive film 23.

The semi-transmissive film 23 can be formed using MoSiN, MoSi, MoSiO, MoSiON, CrSi, or the like. For the light-blocking film 25, a light-blocking material which absorbs light, such as chromium or chromium oxide, can be used.

Figure 13A:
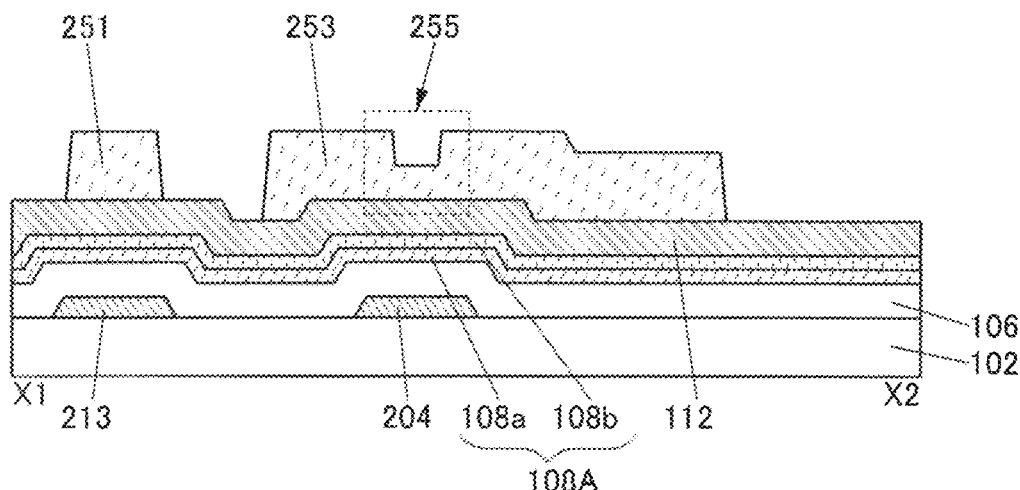
FIGS. 13A to 13C are cross-sectional views illustrating a method for manufacturing a display device.
Figure 13B:
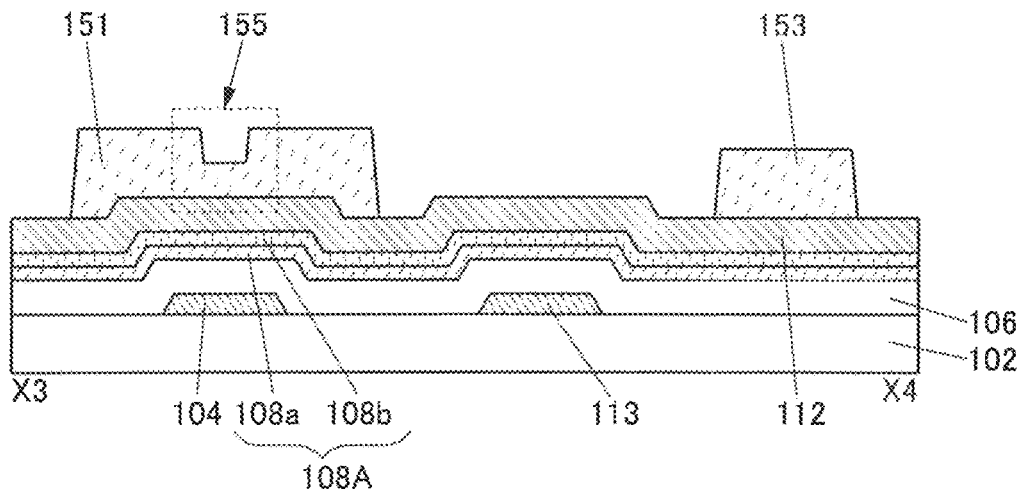
Figure 13C:
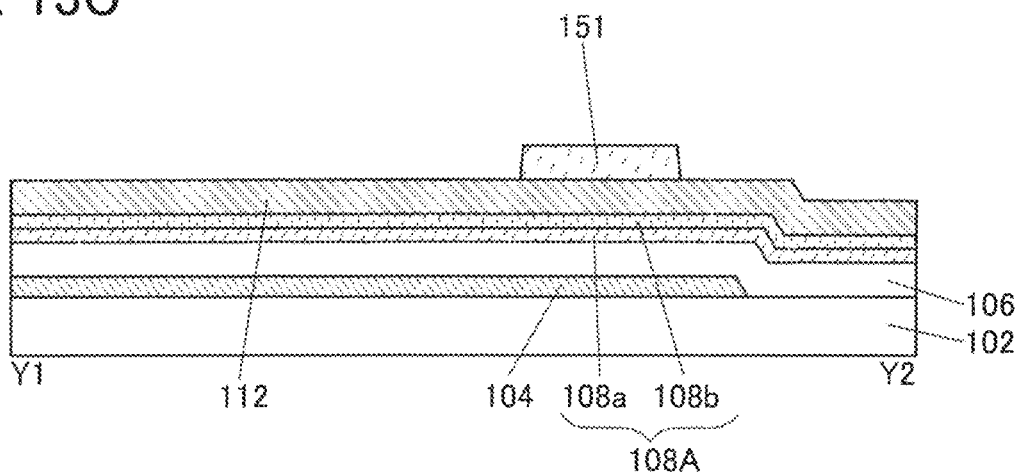

After the light exposure using the multi-tone mask, development is performed; accordingly, a resist mask having regions with different thicknesses can be formed as illustrated in FIGS. 13A to 13C.

Although the multi-tone mask with two different resist thicknesses is described as an example, one embodiment of the present invention is not limited thereto. When the diffraction grating portion 18 or the semi-transmissive film 23 having a plurality of light transmittances is used, a resist with three or more different thicknesses can be formed.

Figure 14A:
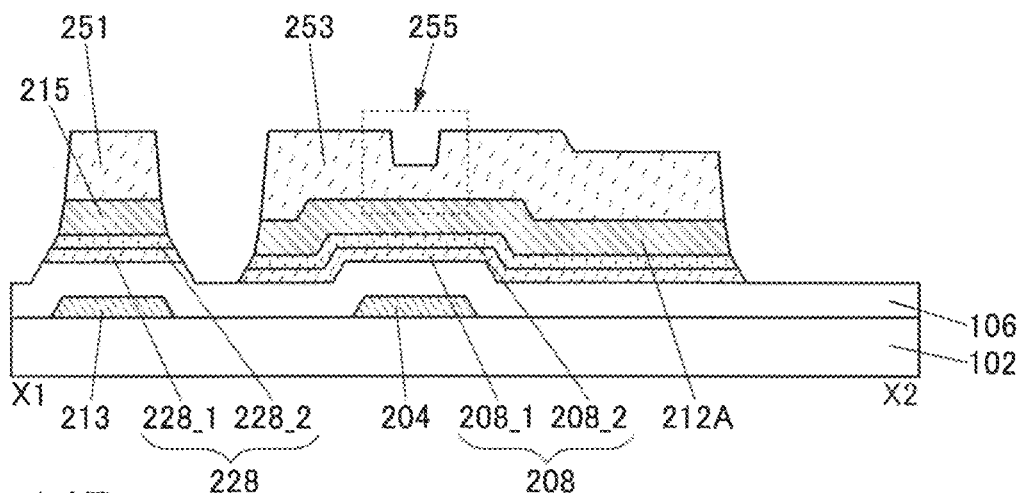
FIGS. 14A to 14C are cross-sectional views illustrating a method for manufacturing a display device.
Figure 14B:
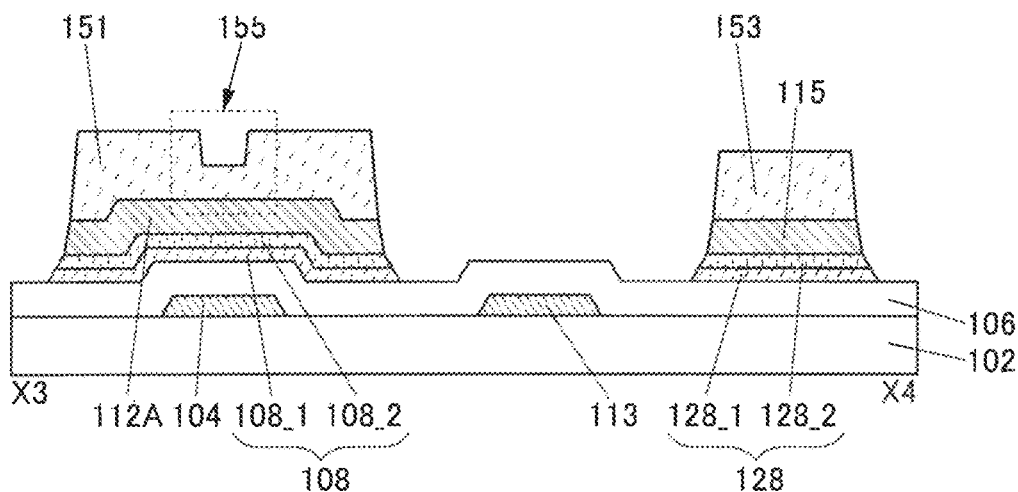
Figure 14C:
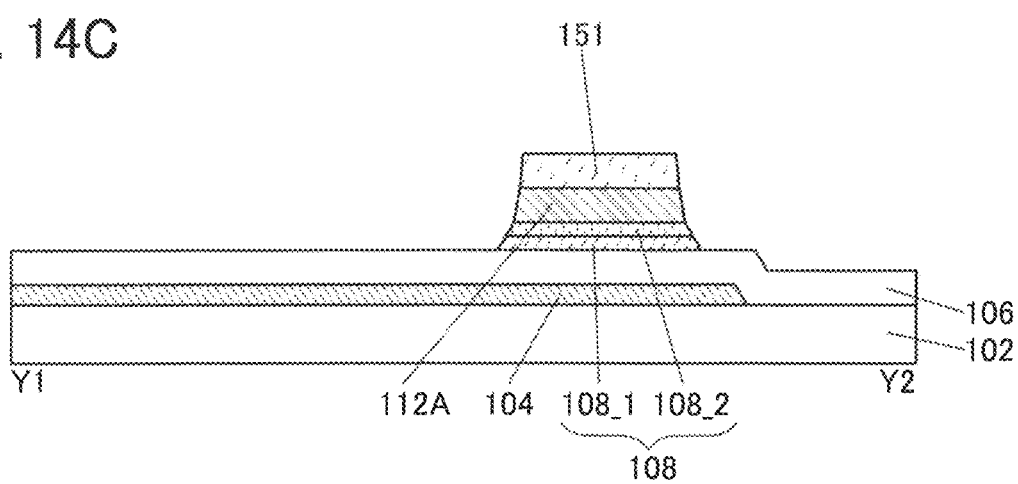

Next, the conductive film 112 and the metal oxide films 108a and 108b are partly removed with the use of the resist masks 251, 253, 151, and 153 to form a conductive film 215, a conductive film 212A, a conductive film 112A, a conductive film 115, the metal oxide film 228, the metal oxide film 208, the metal oxide film 108, and the metal oxide film 128 (see FIGS. 14A to 14C).

Wet etching can be used for the processing of the conductive film 112. The processing method is not limited to wet etching, and dry etching may be used, for example. Wet etching can also be used for the processing of the metal oxide film 108b. The processing method is not limited to wet etching, and dry etching may be used, for example.

The conductive film 112, the metal oxide film 108a, and the metal oxide film 108b may be processed by different etching. For example, the conductive film 112 may be processed by dry etching and the metal oxide films 108a and 108b may be processed by wet etching.

Then, the resist masks 251, 253, 151, and 153 are partly removed to reduce the areas of the resist masks. As a result of the reduction in the areas of the resist masks, a resist mask 251a, a resist mask 253a, a resist mask 253b, a resist mask 151a, a resist mask 151b, and a resist mask 153a are formed (see FIGS. 15A to 15C).

An ashing apparatus can be used for partly removing the resist masks. In some cases, the thicknesses of the resist masks are reduced by ashing at the same time as the areas of the resist masks.

The ashing can be, for example, photoexcitation ashing in which a gas such as oxygen or ozone is irradiated with light such as ultraviolet light to cause a chemical reaction between the gas and an organic material, so that the organic material is removed. Alternatively, plasma ashing in which a gas such as oxygen or ozone is made into plasma with the use of a high-frequency wave or the like and an organic material is removed using the plasma may be used.

Figure 15A:
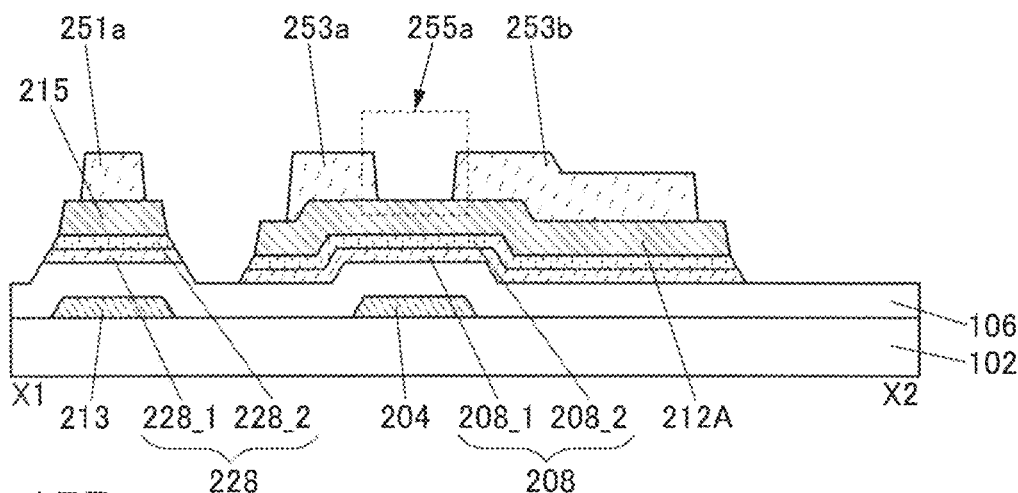
FIGS. 15A to 15C are cross-sectional views illustrating a method for manufacturing a display device.
Figure 15B:
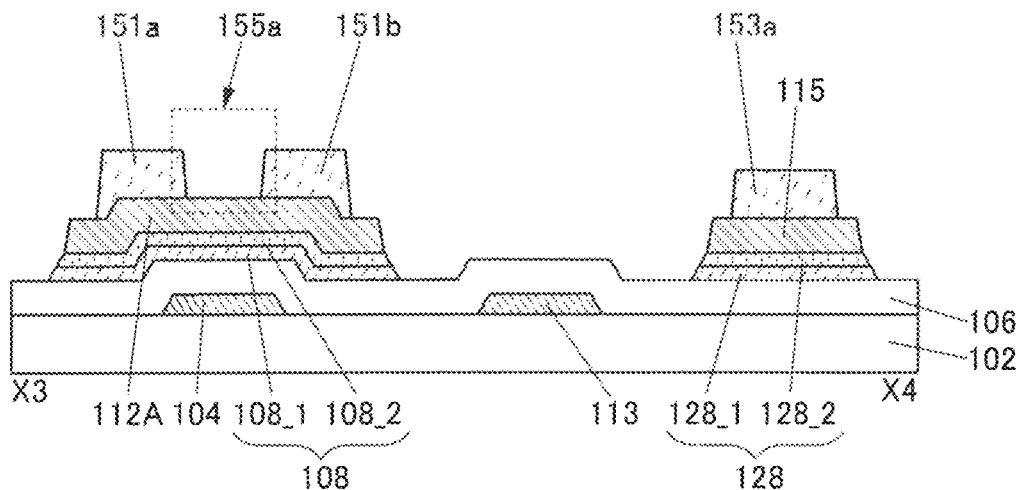
Figure 15C:
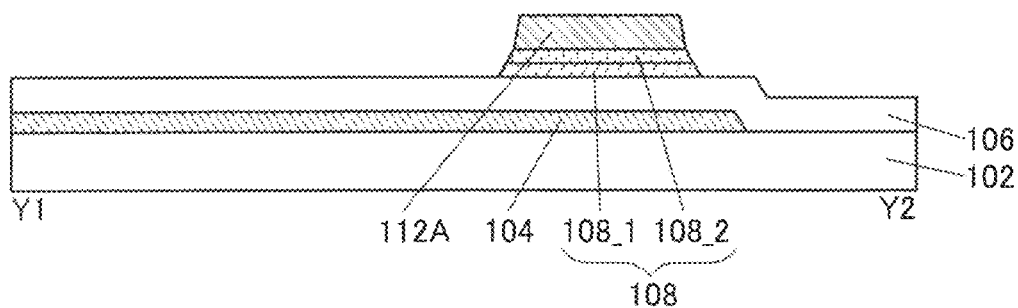

In the region 255 of the resist mask 253 where the resist has a small thickness and the region 155 of the resist mask 151 where the resist has a small thickness, resists are removed by the ashing, so that the resist masks are separated as illustrated in FIGS. 15A to 15C. When the resist masks are partly removed, the resist in a region 255a overlapping with the conductive film 204 is removed and the conductive film 212A in the region 255a is exposed. Furthermore, the resist in a region 155a overlapping with the conductive film 104 is removed and the conductive film 112A in the region 155a is exposed.

An end portion of the resist mask 251a is located inward from an end portion of the conductive film 215. End portions of the resist masks 253a and 253b are located inward from end portions of the conductive film 212A. End portions of the resist masks 151a and 151b are located inward from end portions of the conductive film 112A. An end portion of the resist mask 153a is located inward from an end portion of the conductive film 115.

Figure 16A:
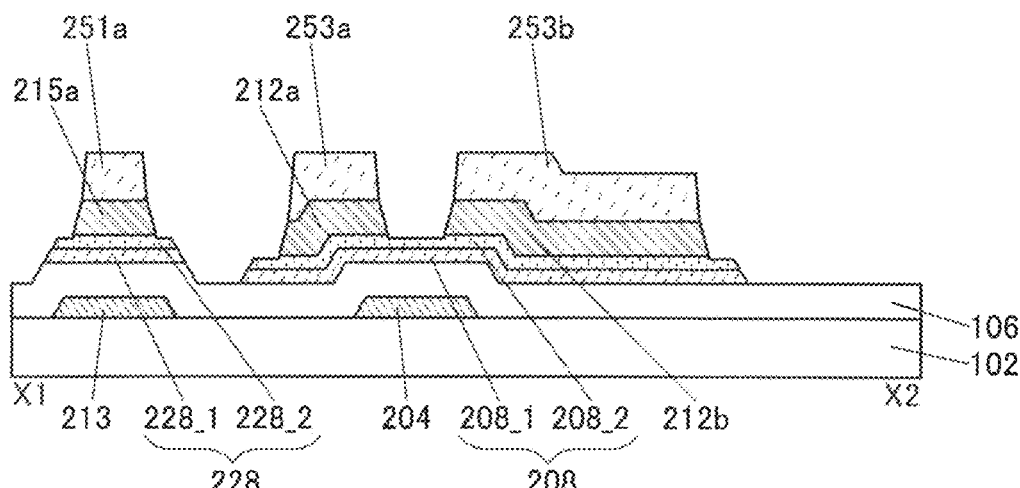
FIGS. 16A to 16C are cross-sectional views illustrating a method for manufacturing a display device.
Figure 16B:
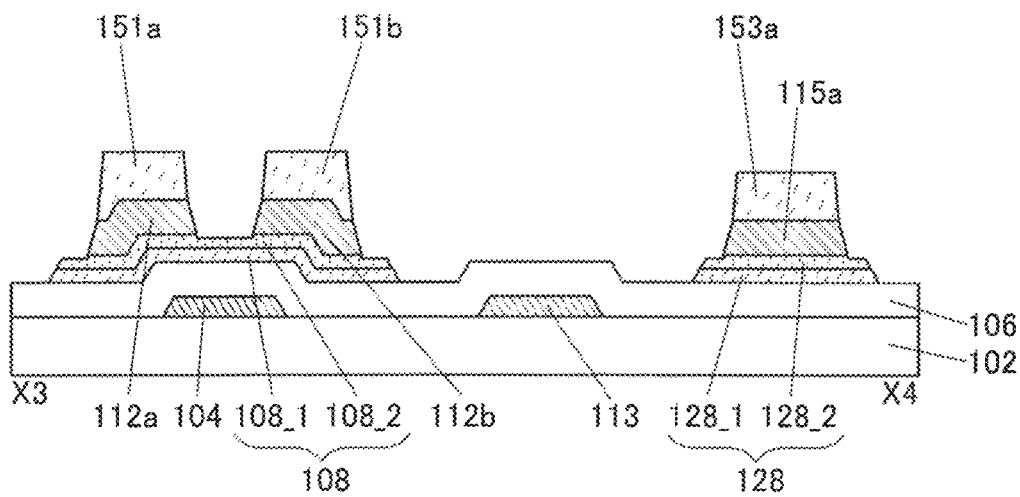
Figure 16C:
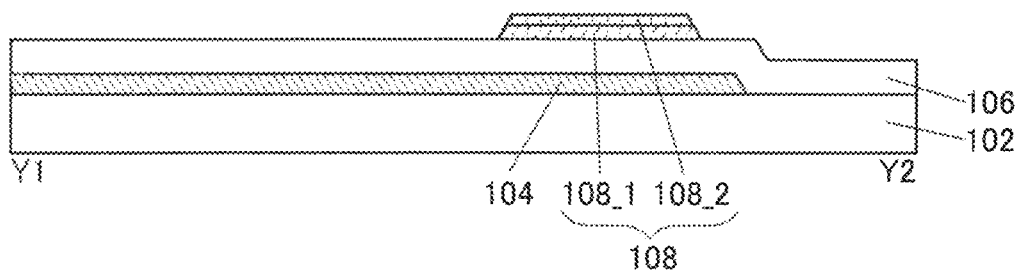

Next, the conductive films 215, 212A, 112A, and 115 are partly removed with the use of the resist masks 251a, 253a, 253b, 151a, 151b, and 153a to form the conductive films 215a, 212a, 212b, 112a, 112b, and 115a (see FIGS. 16A to 16C).

The end portion of the conductive film 215a is located inward from the end portion of the metal oxide film 228. The end portions of the conductive films 212a and 212b are located inward from the end portions of the metal oxide film 208. The end portions of the conductive films 112a and 112b are located inward from the end portions of the metal oxide film 108. The end portion of the conductive film 115a is located inward from the end portion of the metal oxide film 128.

Then, the resist masks 251a, 253a, 253b, 151a, 151b, and 153a are removed.

After the resist masks are removed, surfaces (on the back channel side) of the metal oxide films 108, 128, 208, and 228 (specifically, the metal oxide films 108_2, 128_2, 208_2, and 228_2) may be cleaned. The cleaning may be performed using, for example, a chemical solution such as a phosphoric acid. The cleaning using a chemical solution such as a phosphoric acid can remove impurities (e.g., an element contained in the conductive films 112a, 112b, 212a, and 212b) attached to the surfaces of the metal oxide films 108_2, 128_2, 208_2, and 228_2. Note that the cleaning is not necessarily performed; in some cases, the cleaning is not performed.

In the step of forming the conductive films 112a, 112b, 212a, and 212b and/or the cleaning step, the metal oxide films 108 and 208 are sometimes thinned in regions not covered with the conductive films 112a, 112b, 212a, and 212b.

Note that the exposed regions of the metal oxide films 108 and 208, that is, the metal oxide films 108_2 and 208_2, preferably have high crystallinity. Impurities (in particular, constituent elements of the conductive films 112a, 112b, 212a, and 212b) are less likely to be diffused into the metal oxide films with high crystallinity. Thus, highly reliable transistors can be fabricated.

Although FIGS. 16A to 16C illustrate an example in which depressed portions are formed on the surfaces of the metal oxide films 108, 128, 208, and 228 not covered with the conductive films 112a, 112b, 115a, 212a, 212b, and 215a, i.e., the surfaces of the metal oxide films 108_2, 128_2, 208_2, and 228_2, one embodiment of the present invention is not limited to this example and depressed portions are not necessarily formed on the surfaces of the metal oxide films 108, 128, 208, and 228 not covered with the conductive films 112a, 112b, 115a, 212a, 212b, and 215a.

Figure 17A:
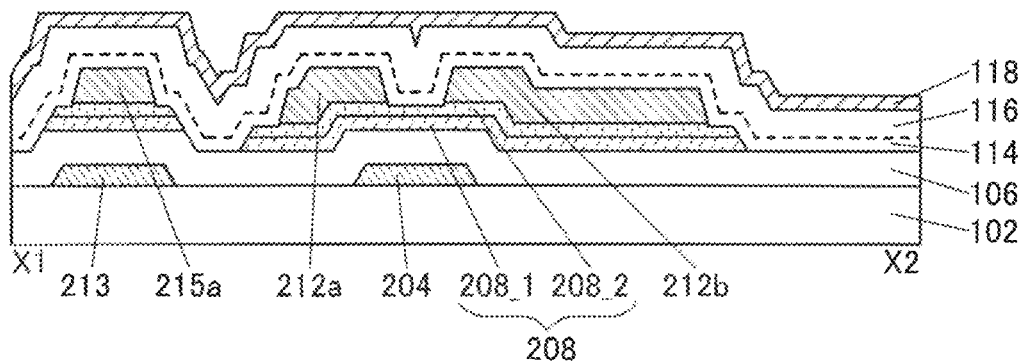
FIGS. 17A to 17C are cross-sectional views illustrating a method for manufacturing a display device.
Figure 17B:
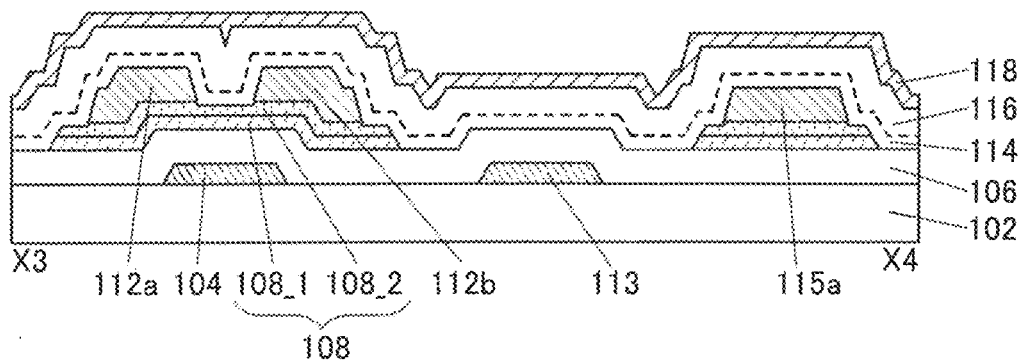
Figure 17C:
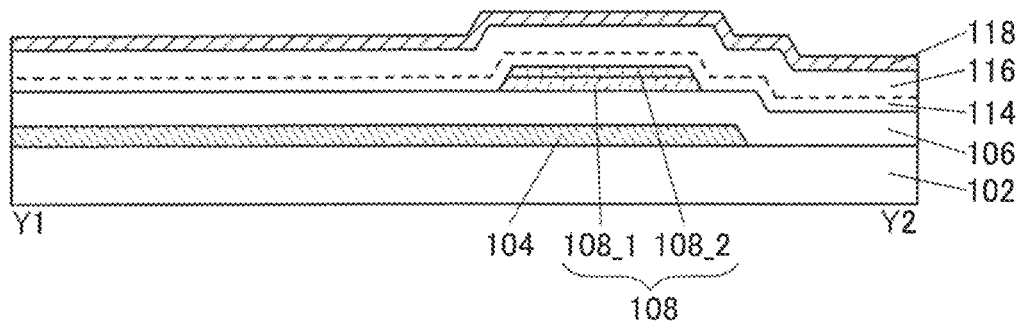

Next, the insulating films 114, 116, and 118 are formed over the insulating film 106, the metal oxide films 108, 128, 208, and 228, and the conductive films 215a, 212a, 212b, 112a, 112b, and 115a (see FIGS. 17A to 17C).

Note that after the insulating film 114 is formed, the insulating film 116 is preferably formed successively without exposure to the air. When the insulating film 116 is formed successively after the formation of the insulating film 114 without exposure to the air while at least one of the flow rate of a source gas, the pressure, high-frequency power, and the substrate temperature is adjusted, the concentration of impurities attributed to the atmospheric component at the interface between the insulating films 114 and 116 can be reduced.

For example, as the insulating film 114, a silicon oxynitride film can be formed by a PECVD method. In that case, a deposition gas containing silicon and an oxidizing gas are preferably used as source gases. Typical examples of the deposition gas containing silicon include silane, disilane, trisilane, and silane fluoride. Examples of the oxidizing gas include dinitrogen monoxide and nitrogen dioxide. The flow rate of the oxidizing gas is more than or equal to 20 times and less than or equal to 500 times, preferably more than or equal to 40 times and less than or equal to 100 times, that of the deposition gas.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as source gases, the pressure in the treatment chamber is 20 Pa, and a high-frequency power of 100 W at 13.56 MHz ($1.6 \times 10^{-2}$ W/cm$^2$ as the power density) is supplied to a parallel-plate electrode.

As the insulating film 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 114 functions as a protective film for the metal oxide film 108 in the step of forming the insulating film 116. Therefore, the insulating film 116 can be formed using the high-frequency power having a high power density while damage to the metal oxide film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e., the spin density of a signal which appears at g=2.001 due to a dangling bond of silicon, is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistors 100A and 200A can be improved.

It is suitable that heat treatment (hereinafter referred to as second heat treatment) is performed after the insulating films 114 and 116 are formed. The second heat treatment can reduce nitrogen oxide included in the insulating films 114 and 116. By the second heat treatment, part of oxygen contained in the insulating films 114 and 116 can be transferred to the metal oxide film 108, so that the amount of oxygen vacancies included in the metal oxide film 108 can be reduced.

The temperature of the second heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon or helium). It is preferable that hydrogen, water, and the like not be contained in the nitrogen, oxygen, ultra-dry air, or rare gas. An electric furnace, RTA, or the like can be used for the heat treatment.

The insulating film 118 includes either or both of hydrogen and nitrogen. As the insulating film 118, a silicon nitride film is suitably used, for example. The insulating film 118 can be formed by a sputtering method or a PECVD method, for example. In the case where the insulating film 118 is formed by a PECVD method, for example, the substrate temperature is lower than 400° C., preferably lower than 375° C., and further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the metal oxide film 108.

In the case where a silicon nitride film is formed by a PECVD method as the insulating film 118, a deposition gas containing silicon, nitrogen, and ammonia are preferably used as source gases. A small amount of ammonia compared with the amount of nitrogen is used, whereby ammonia is dissociated in the plasma and activated species are generated. The activated species cut a bond between silicon and hydrogen which are included in a deposition gas including silicon and a triple bond between nitrogen molecules. As a result, formation of the bond between silicon and nitrogen is promoted, leading to the formation of a dense silicon nitride film having few bonds between silicon and hydrogen and few defects. If the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, further preferably 10 times or more and 50 times or less the flow rate of ammonia.

In this embodiment, with the use of a PECVD apparatus, a 50-nm-thick silicon nitride film is formed as the insulating film 118 using silane, nitrogen, and ammonia as source gases. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to a parallel-plate electrode with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Note that after the insulating film 116 is formed, the insulating film 118 may be formed successively without exposure to the air. When the insulating film 118 is formed successively after the formation of the insulating film 116 without exposure to the air while at least one of the flow rate of a source gas, the pressure, high-frequency power, and the substrate temperature is adjusted, the concentration of impurities attributed to the atmospheric component at the interface between the insulating films 116 and 118 can be reduced.

After the insulating film 118 is formed, heat treatment similar to the first heat treatment or the second heat treatment (hereinafter referred to as third heat treatment) may be performed.

By the third heat treatment, oxygen included in the insulating film 116 moves into the metal oxide films 108 and 208 to fill the oxygen vacancies in the metal oxide films 108 and 208.

Figure 18A:
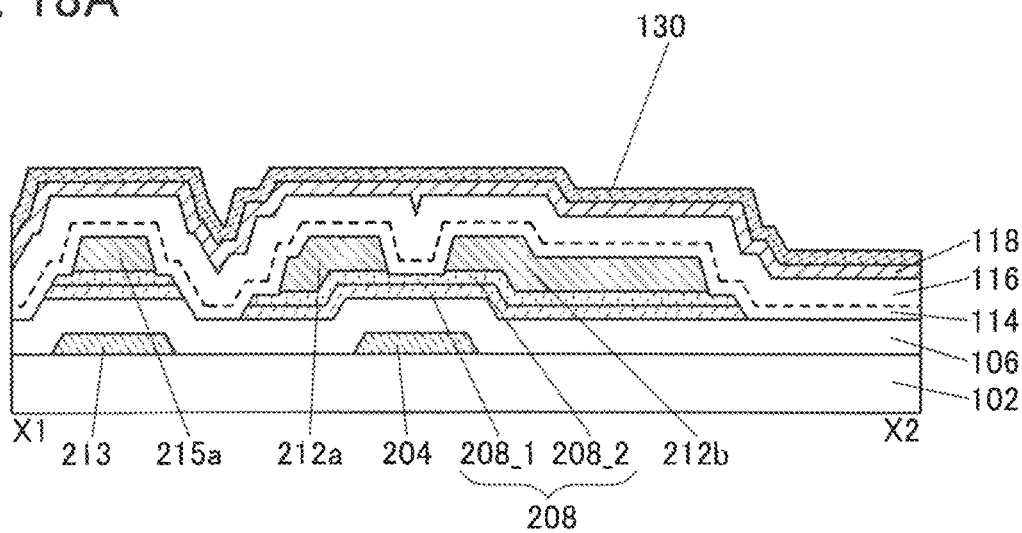
FIGS. 18A to 18C are cross-sectional views illustrating a method for manufacturing a display device.
Figure 18B:
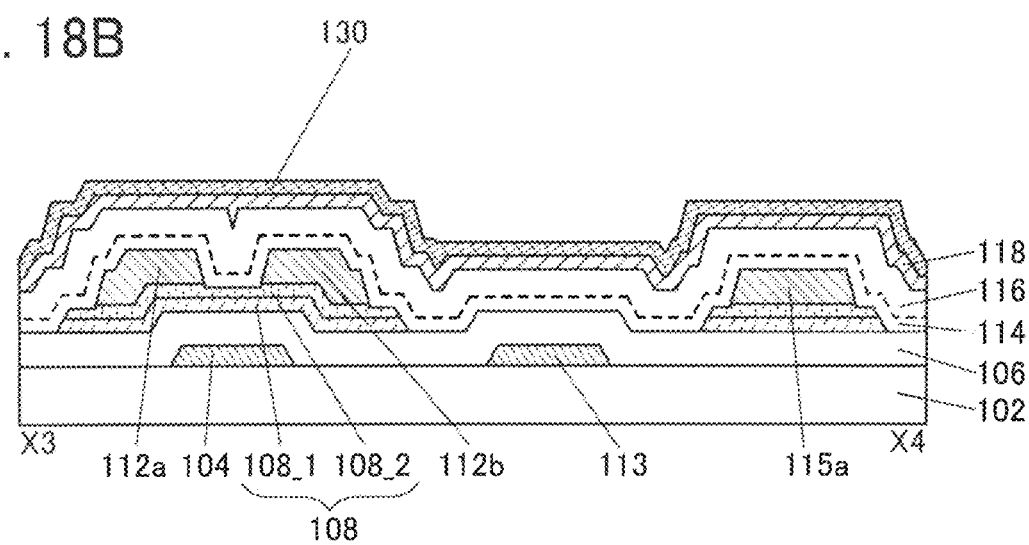
Figure 18C:
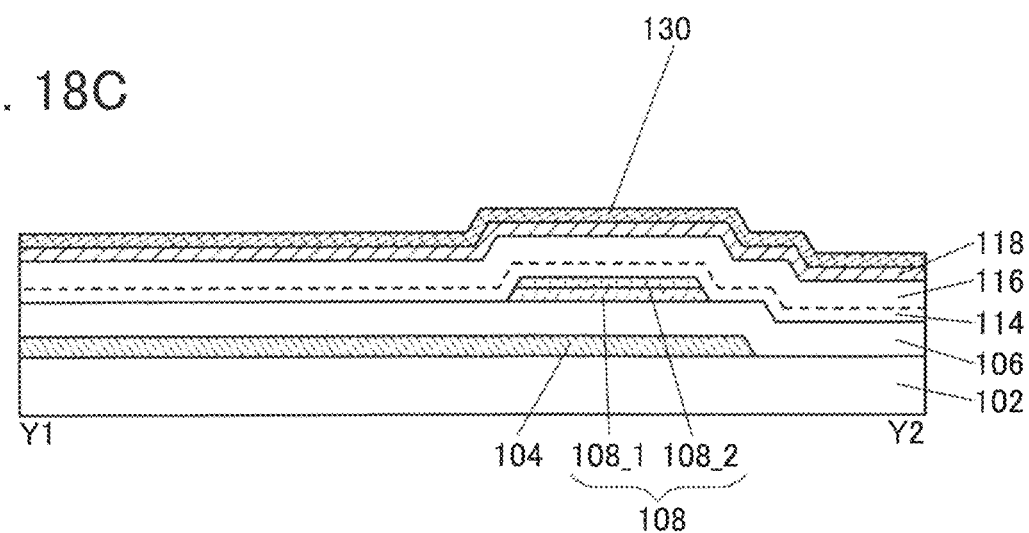

Next, a conductive film 130 is formed over the insulating film 118 (see FIGS. 18A to 18C).

A light-transmitting conductive film can be used for the conductive film 130. The light-transmitting conductive film can be formed using a conductive material such as indium tin oxide, an indium zinc oxide, an indium oxide containing tungsten oxide, an indium zinc oxide containing tungsten oxide, an indium oxide containing titanium oxide, an indium tin oxide containing titanium oxide, or an indium tin oxide containing silicon oxide.

In the case where the conductive film 130 is formed using an In—Ga—Zn metal oxide target (In:Ga:Zn=4:2:4.1 [atomic ratio]), either or both of hydrogen and nitrogen contained in the insulating film 118 might enter the conductive film 130. In that case, either or both of hydrogen and nitrogen are bonded to oxygen vacancies in the conductive film 130 to cause a reduction in the resistance of the conductive film 130. Accordingly, the conductive film 130 with low resistance can be formed. Note that the conductive film with low resistance is an oxide conductor film.

The conductive film 130 can be formed with a sputtering apparatus. When the conductive film 130 is formed, plasma discharge is performed in an atmosphere containing an oxygen gas. At this time, oxygen is added to the insulating film 118 over which the conductive film 130 is to be formed. When the conductive film 130 is formed, an inert gas (e.g., a helium gas, an argon gas, or a xenon gas) and the oxygen gas may be mixed.

The oxygen gas is mixed at least when the conductive film 130 is formed. The proportion of the oxygen gas in a deposition gas for forming the conductive film 130 is higher than 0% and lower than or equal to 100%, preferably higher than or equal to 10% and lower than or equal to 100%, further preferably higher than or equal to 30% and lower than or equal to 100%.

In this embodiment, the conductive film 130 is formed by a sputtering method using an In—Ga—Zn metal oxide target (In:Ga:Zn=4:2:4.1 [atomic ratio]). Alternatively, the conductive film 130 may be formed by a sputtering method using an ITO target and an oxygen gas (100%) as a deposition gas.

Note that although oxygen is added to the insulating film 116 when the conductive film 130 is formed in this embodiment, the method for adding oxygen is not limited to this example. For example, oxygen may be further added to the insulating film 116 after the conductive film 130 is formed.

As the method for adding oxygen to the insulating film 116, an ITSO film with a thickness of 5 nm may be formed using a target of an oxide including indium, tin, and silicon (an In—Sn—Si oxide, also referred to as ITSO) (In$_2$O$_3$: SnO$_2$:SiO$_2$=85:10:5 in wt %), for example. In that case, the thickness of the ITSO film is preferably greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating film 116 through the ITSO film. Oxygen can be added by, for example, ion doping, ion implantation, or plasma treatment. By application of a bias voltage to the substrate side when oxygen is added, oxygen can be effectively added to the insulating film 116. An ashing apparatus is used, for example, and the power density of the bias voltage applied to the substrate side of the ashing apparatus can be greater than or equal to 1 W/cm$^2$ and less than or equal to 5 W/cm$^2$. The substrate temperature during addition of oxygen is higher than or equal to room temperature and lower than or equal to 300° C., preferably higher than or equal to 100° C. and lower than or equal to 250° C., whereby oxygen can be added efficiently to the insulating film 116.

Figure 19A:
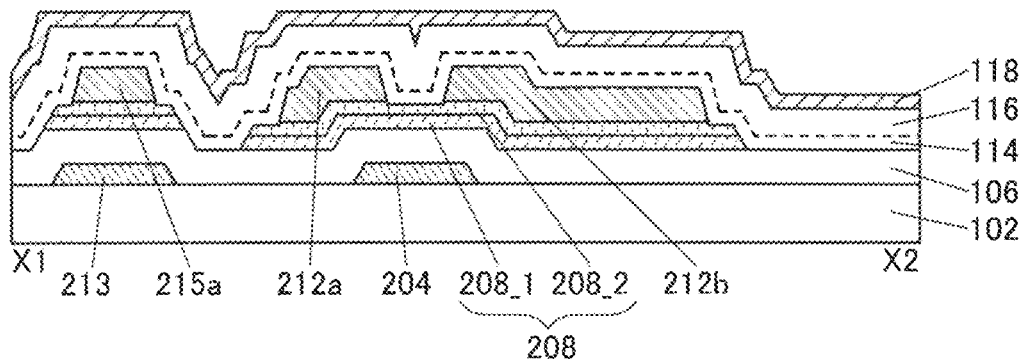
FIGS. 19A to 19C are cross-sectional views illustrating a method for manufacturing a display device.
Figure 19B:
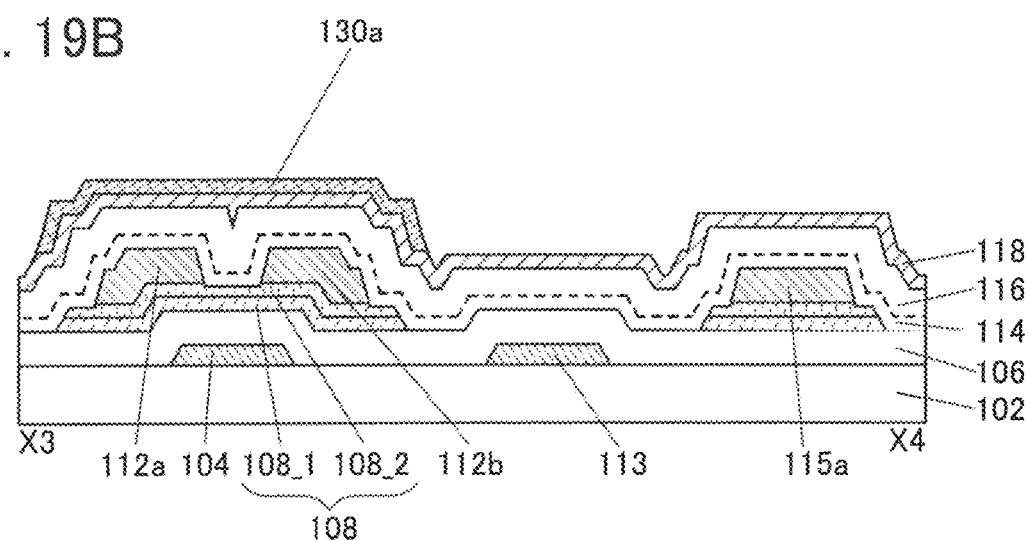
Figure 19C:
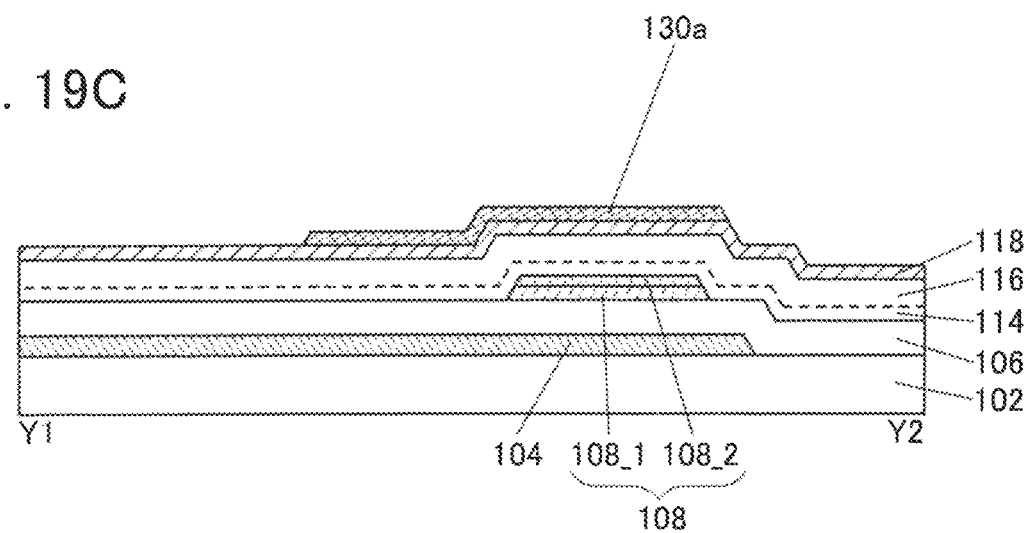

Next, the conductive film 130 is processed into a desired shape to form the conductive film 130a (see FIGS. 19A to 19C). This process of forming the conductive film 130a is a third lithography process.

In this embodiment, the conductive film 130a is formed by wet etching. Dry etching may be used to form the conductive film 130a.

Figure 20A:
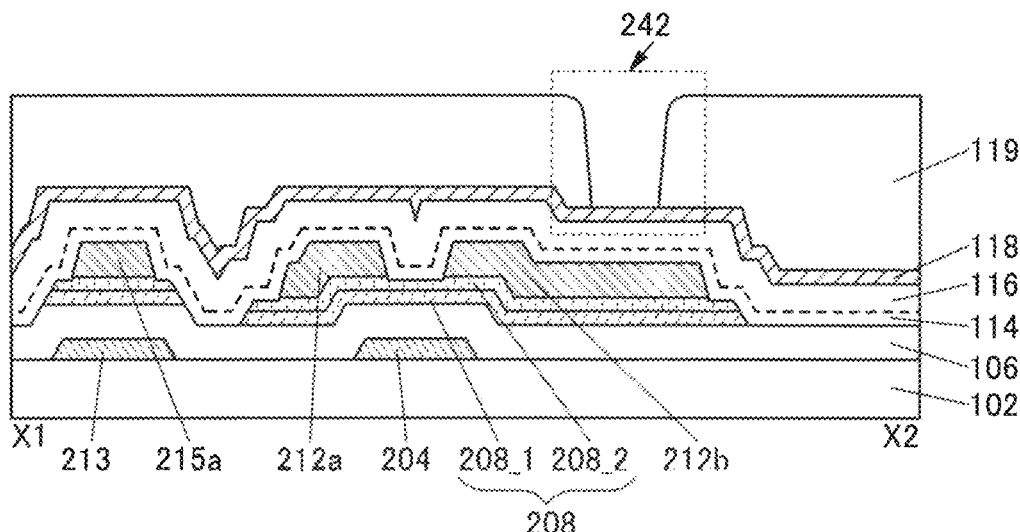
FIGS. 20A to 20C are cross-sectional views illustrating a method for manufacturing a display device.
Figure 20B:
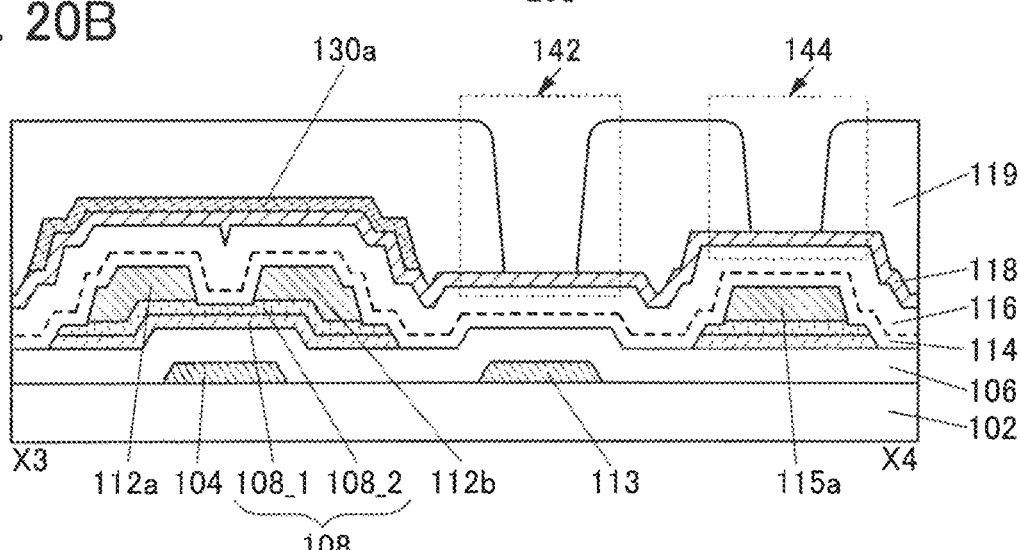
Figure 20C:
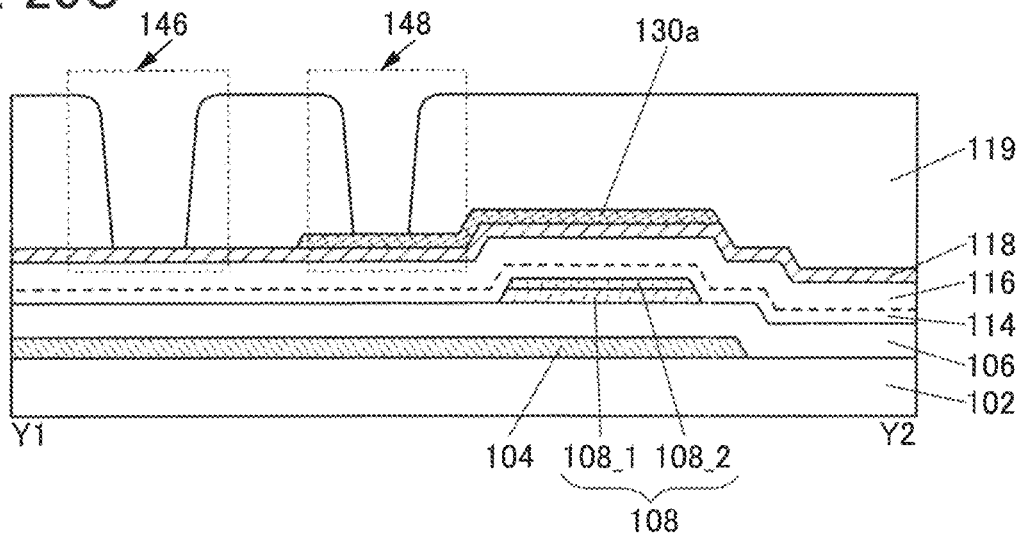

Then, the insulating film 119 is formed over the insulating film 118 and the conductive film 130a (see FIGS. 20A to 20C). The insulating film 119 has an opening 242 in a region overlapping with the conductive film 212b, an opening 142 in a region overlapping with the conductive film 113, an opening 144 in a region overlapping with the conductive film 115a, an opening 146 in a region overlapping not with the conductive film 130a but with the conductive film 104, and an opening 148 in a region overlapping with the conductive film 130a.

The insulating film 119 can be formed in the following manner: a photosensitive resin is applied to the insulating film 118 and the conductive film 130a and then light exposure and development are performed. Alternatively, the insulating film 119 can be formed in the following manner: a non-photosensitive resin is applied to the insulating film 118 and the conductive film 130a and baked; a resist mask is formed; and the baked non-photosensitive resin is etched with the use of the resist mask. This process of forming the insulating film 119 is a fourth lithography process.

Figure 21A:
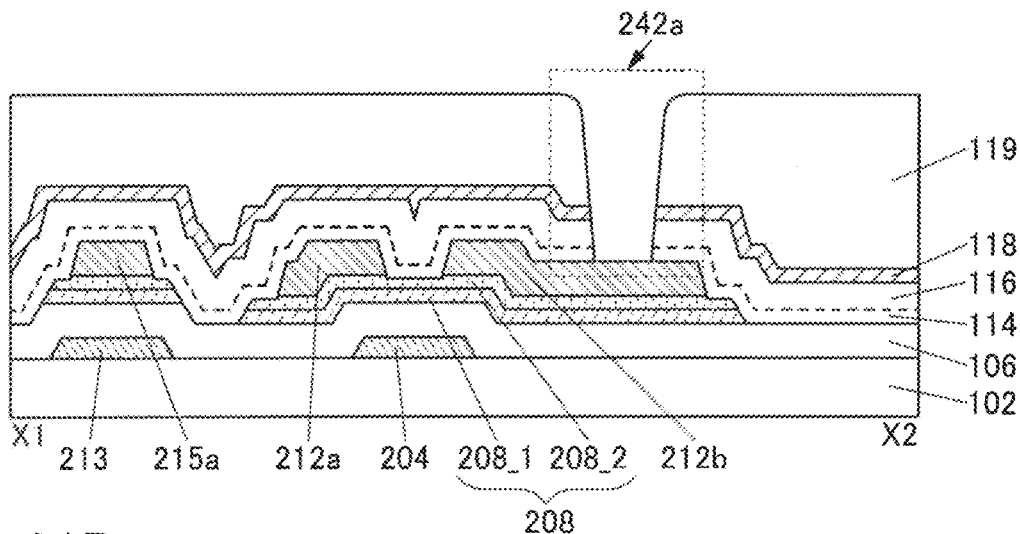
FIGS. 21A to 21C are cross-sectional views illustrating a method for manufacturing a display device.
Figure 21B:
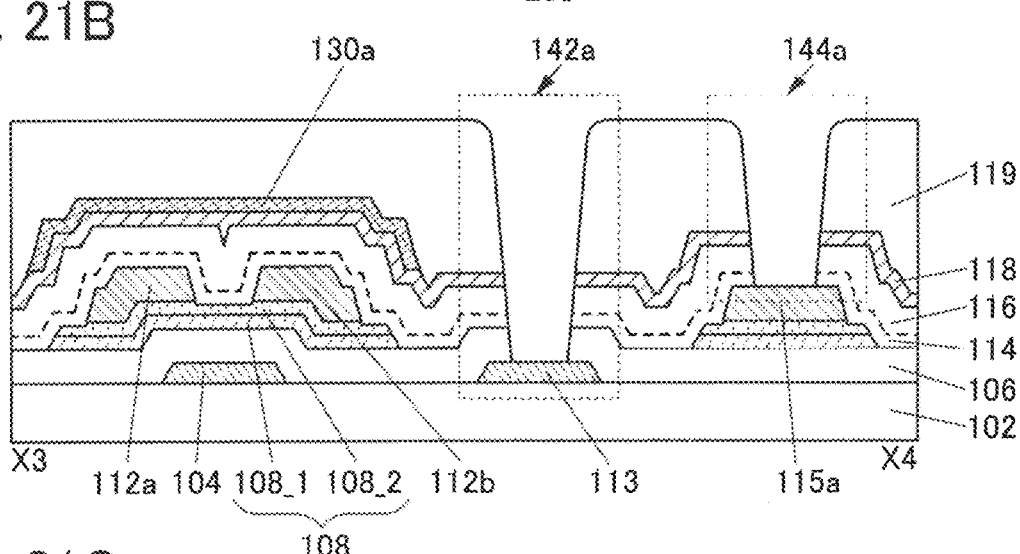
Figure 21C:
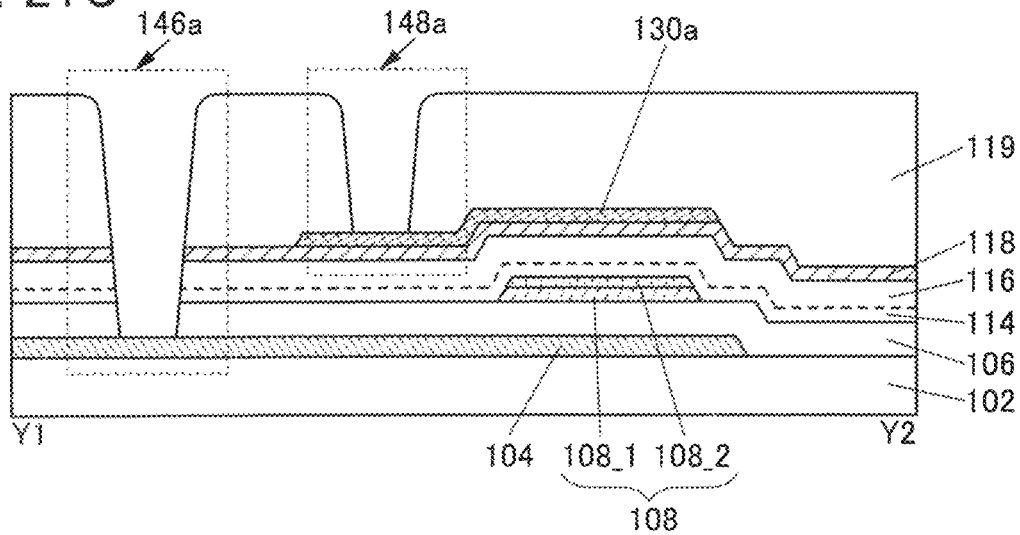

Then, the insulating films 106, 114, 116, and 118 are partly removed using the insulating film 119 as a mask (see FIGS. 21A to 21C). The insulating films 114, 116, and 118 in a region overlapping with the opening 242 are removed so that the conductive film 212b is exposed to form the opening 242a. The insulating films 106, 114, 116, and 118 in a region overlapping with the opening 142 are removed so that the conductive film 113 is exposed to form the opening 142a. The insulating films 114, 116, and 118 in a region overlapping with the opening 144 are removed so that the conductive film 115a is exposed to form the opening 144a. The insulating films 106, 114, 116, and 118 in a region overlapping with the opening 146 are removed so that the conductive film 104 is exposed to form the opening 146a. The conductive film 130a in a region overlapping with the opening 148 is not removed to obtain the opening 148a.

The openings 242a, 142a, 144a, 146a, and 148a can be formed by dry etching or wet etching. Dry etching and wet etching may be used in combination.

In forming the openings 242a, 142a, 144a, 146a, and 148a, the etching rates of the insulating films 106, 114, 116, and 118 are preferably high and the etching rates of the conductive films 212b, 113, 115a, and 130a are preferably low. Furthermore, the etching rate of the insulating film 119 is preferably low.

During the formation of the openings 242a, 142a, 144a, 146a, and 148a, the thickness of the insulating film 119 is reduced in some cases. The insulating film 119 can be formed to have a thickness larger by the reduced thickness.

Next, a conductive film which is to be the conductive film 220, the conductive film 120a functioning as the fourth wiring, and the conductive film 120b functioning as the first wiring is formed over the insulating film 119 and the openings 242a, 142a, 144a, 146a, and 148a.

Figure 22A:
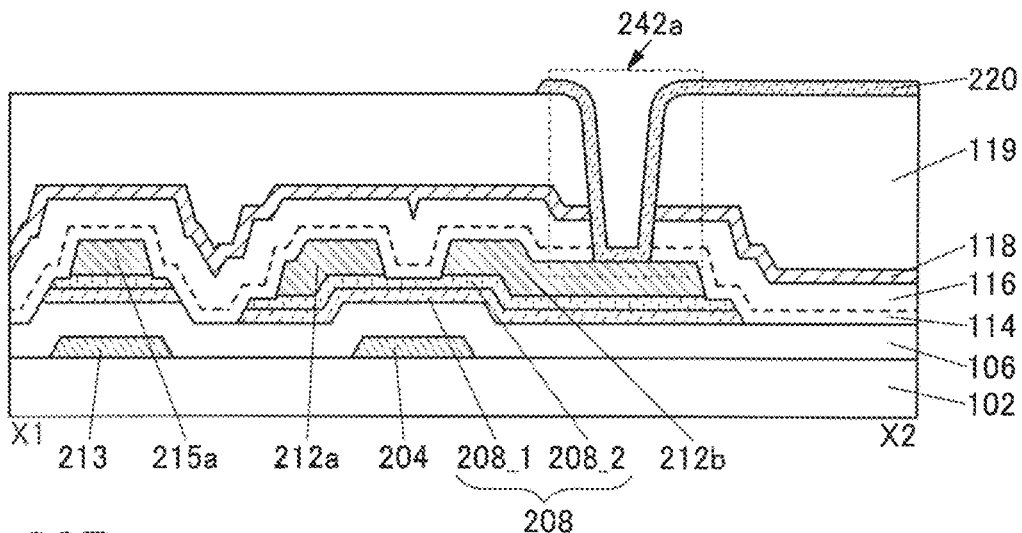
FIGS. 22A to 22C are cross-sectional views illustrating a method for manufacturing a display device.
Figure 22B:
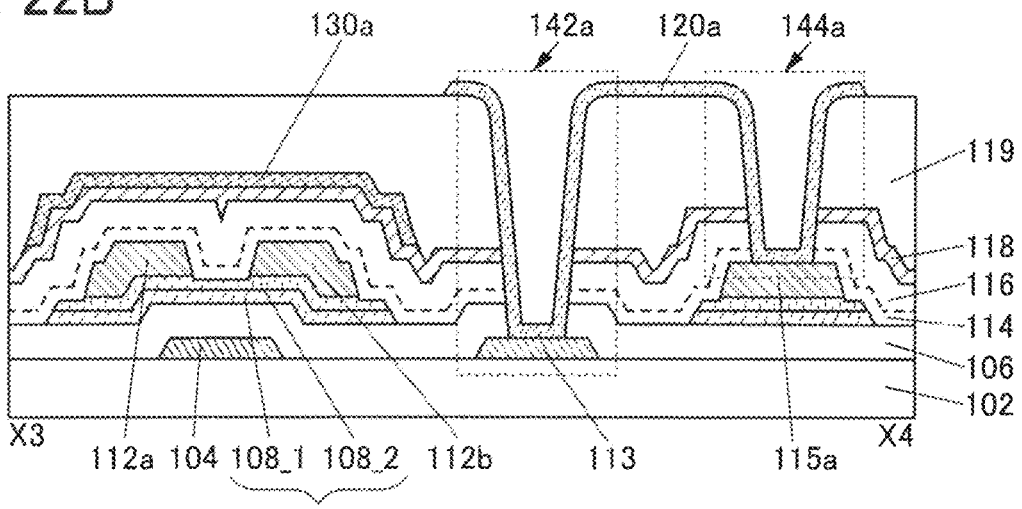
Figure 22C:
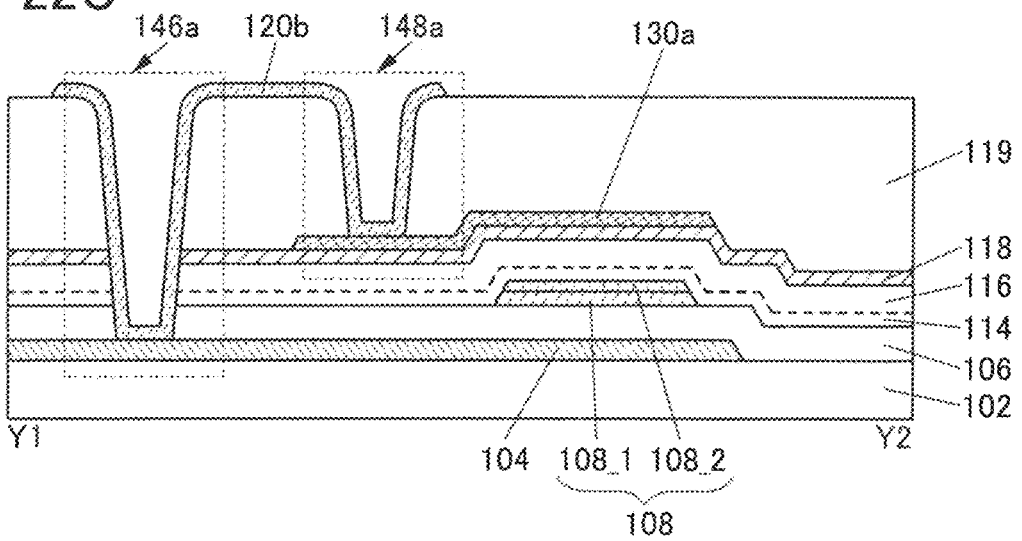

The conductive film is processed through a lithography process and an etching process to form the conductive film 220, the conductive film 120a functioning as the fourth wiring, and the conductive film 120b functioning as the first wiring (see FIGS. 22A to 22C). The conductive film 120a electrically connects the conductive film 113 and the conductive film 115a to each other. The conductive film 120b electrically connects the conductive film 130a and the conductive film 104 to each other.

This process of forming the conductive film 220, the conductive film 120a functioning as the fourth wiring, and the conductive film 120b functioning as the first wiring is a fifth lithography process.

As described above, the display device illustrated in FIGS. 1A to 1C can be manufactured through five lithography processes.

In one embodiment of the present invention, a display device can be manufactured through only five lithography processes. A reduction in the number of lithography processes can reduce a pattern arrangement margin and enables miniaturization of a transistor and an increase in the definition of the display device. Furthermore, a reduction in the number of lithography processes leads to a simple process flow and an improved yield. A reduction in the number of lithography processes can also reduce the cost for masks.

<Method 2 for Manufacturing Display Device>

A method for manufacturing the transistor 100B, the transistor 200B, the capacitor 250B, and the connection portion 150B included in the display device of one embodiment of the present invention illustrated in FIGS. 3A to 3C will be described with reference to FIGS. 23A to 23C to FIGS. 29A to 29C.

FIGS. 23A to 23C to FIGS. 29A to 29C are cross-sectional views illustrating the method for manufacturing the display device. In FIGS. 23A to 23C to FIGS. 29A to 29C, a cross-sectional view taken along dashed-dotted line X1-X2 is a cross-sectional view of the transistor 200B in the channel length direction, a cross-sectional view taken along dashed-dotted line X3-X4 is a cross-sectional view of the transistor 100B in the channel length direction, and a cross-sectional view taken along dashed-dotted line Y1-Y2 is a cross-sectional view of the transistor 100B in the channel width direction.

In the method for manufacturing the display device illustrated in FIGS. 3A to 3C, the conductive films 215, 212a, 212b, 112a, 112b, and 115a and components blow the conductive films 215, 212a, 212b, 112a, 112b, and 115a are formed in a similar manner to the display device illustrated in FIGS. 1A to 1C.

Figure 23A:
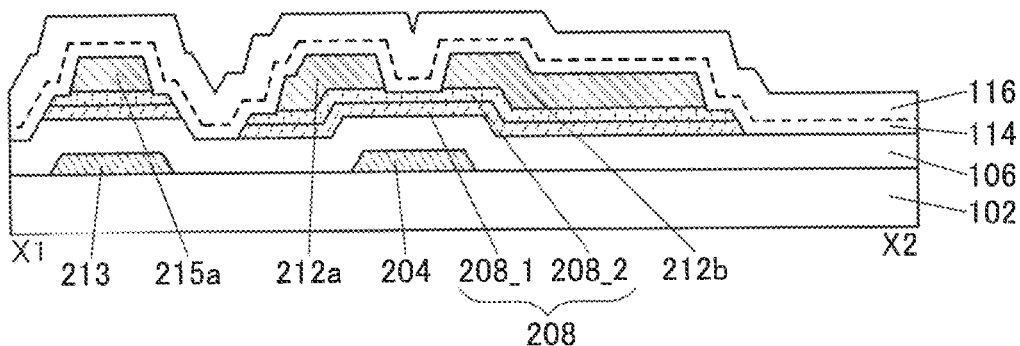
FIGS. 23A to 23C are cross-sectional views illustrating a method for manufacturing a display device.
Figure 23B:
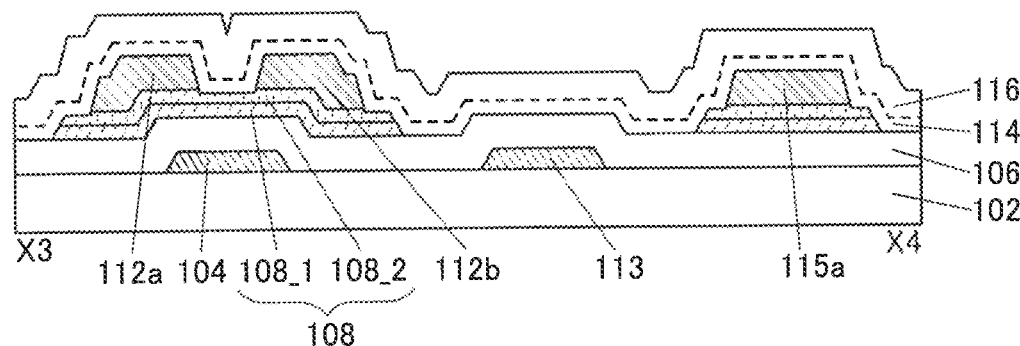
Figure 23C:
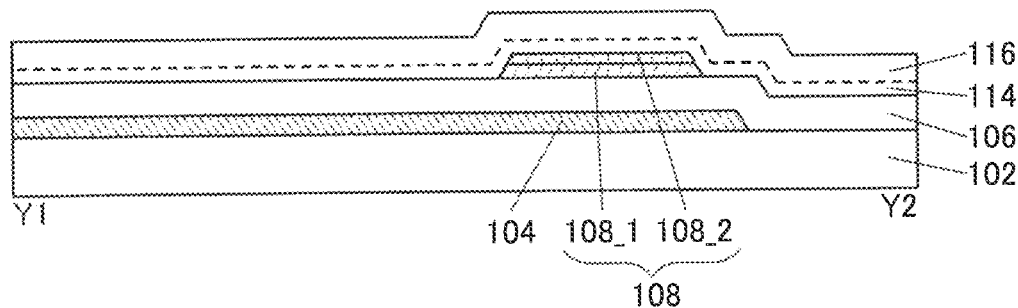

Then, the insulating films 114 and 116 are formed over the conductive films 215a, 212a, 212b, 112a, 112b, and 115a (see FIGS. 23A to 23C).

Figure 25A:
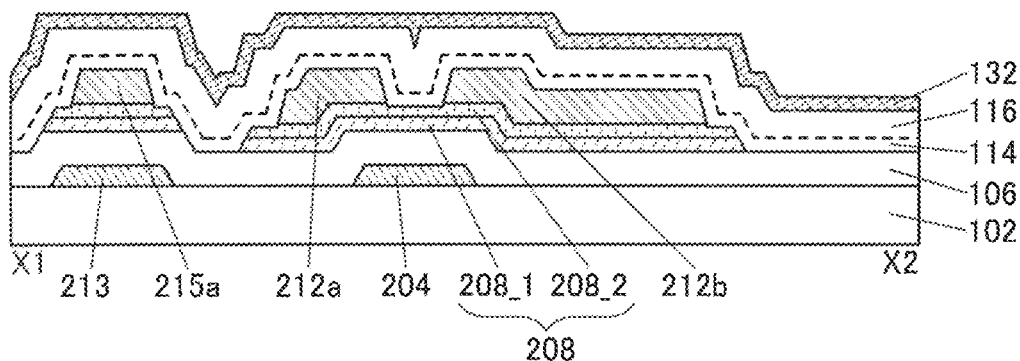
FIGS. 25A to 25C are cross-sectional views illustrating a method for manufacturing a display device.
Figure 25B:
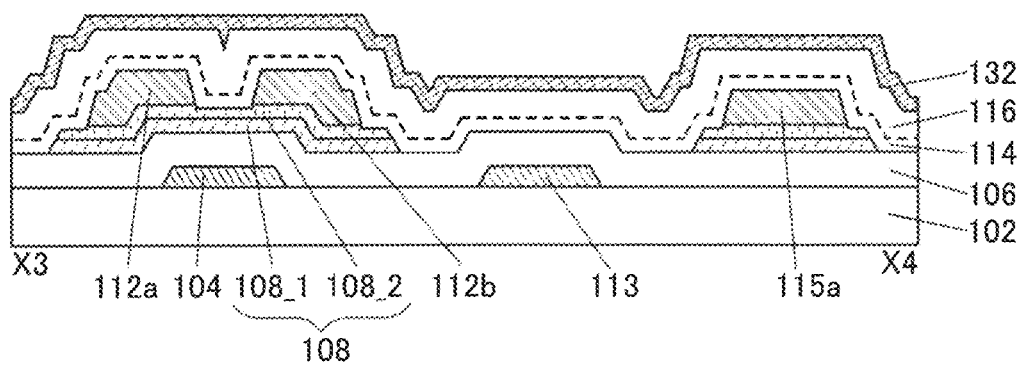
Figure 25C:
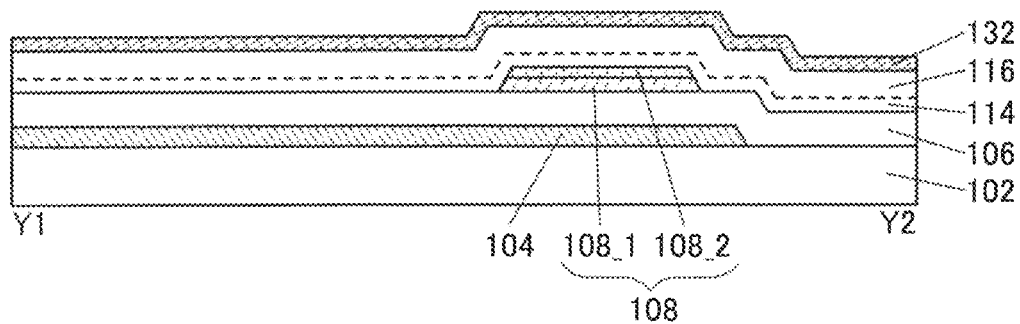

After that, a conductive film 132 is formed over the insulating film 116 (see FIGS. 25A to 25C).

A conductive film formed using an In—Ga—Zn metal oxide target (In:Ga:Zn=4:2:4.1 [atomic ratio]) can be used for the conductive film 132. When the insulating film 118 is formed over the conductive film 132, either or both of hydrogen and nitrogen contained in the insulating film 118 enter the conductive film 132 in some cases. In that case, either or both of hydrogen and nitrogen are bonded to oxygen vacancies in the conductive film 132 to cause a reduction in the resistance of the conductive film 132. Accordingly, the conductive film 132 with low resistance can be formed. Note that the conductive film with low resistance is an oxide conductor film.

Figure 24A:
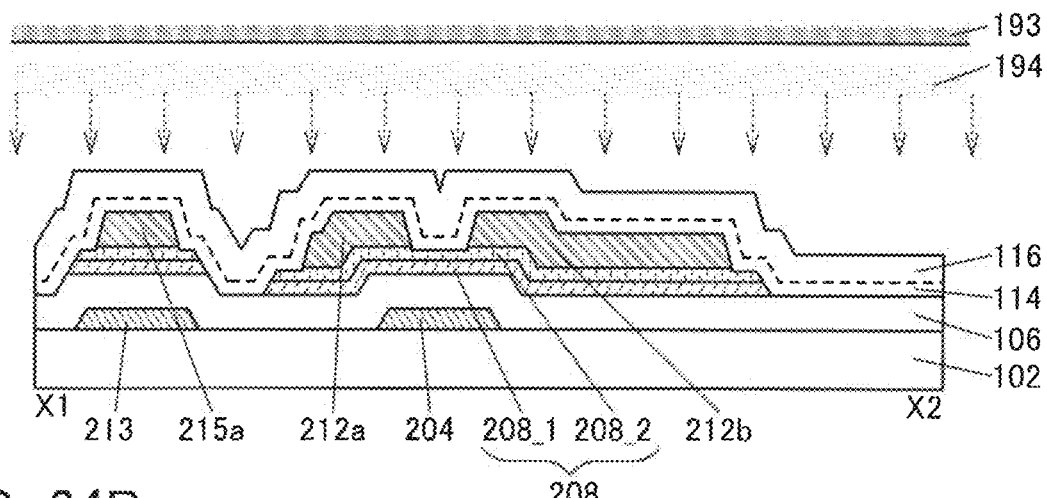
FIGS. 24A to 24C are cross-sectional views illustrating a method for manufacturing a display device.
Figure 24B:
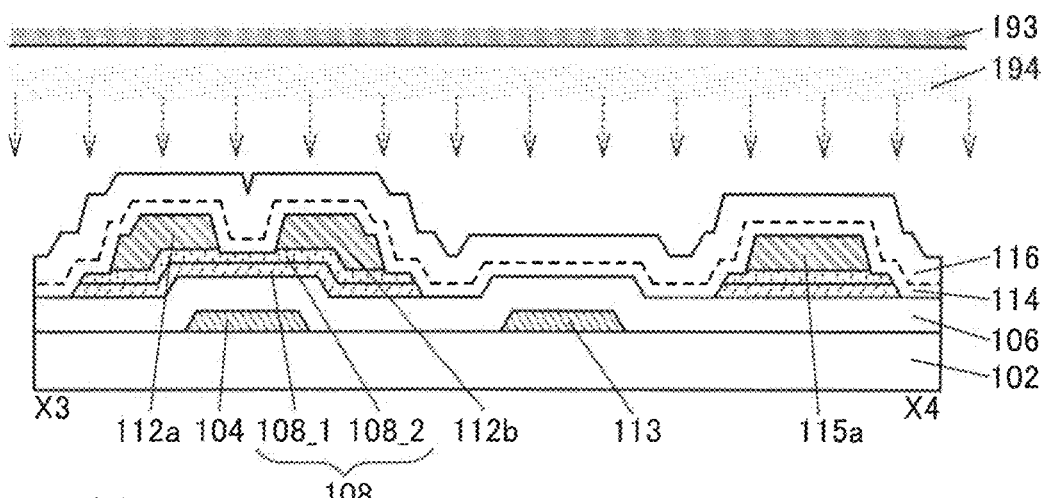
Figure 24C:
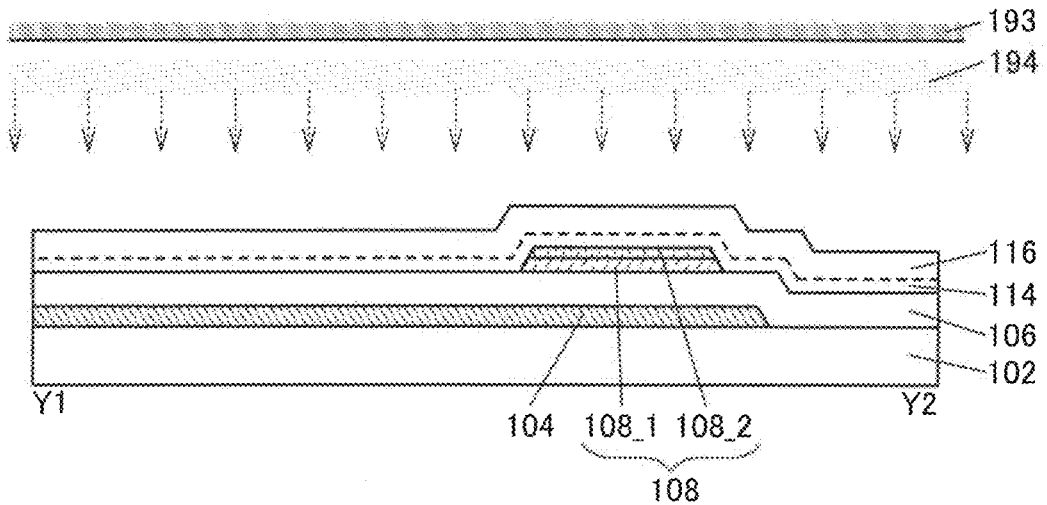

FIGS. 24A to 24C are schematic cross-sectional views illustrating the inside of a deposition apparatus when the conductive film 132 is formed over the insulating film 116. In FIGS. 24A to 24C, a sputtering apparatus is used as the deposition apparatus, and a target 193 placed inside the sputtering apparatus and plasma 194 generated under the target 193 are schematically illustrated.

When the conductive film 132 is formed, plasma discharge is performed in an atmosphere containing an oxygen gas. At this time, oxygen is added to the insulating film 116 over which the conductive film 132 is to be formed. When the conductive film 132 is formed, an inert gas (e.g., a helium gas, an argon gas, or a xenon gas) and the oxygen gas may be mixed.

The oxygen gas is mixed at least when the conductive film 132 is formed. The proportion of the oxygen gas in a deposition gas for forming the conductive film 132 is higher than 0% and lower than or equal to 100%, preferably higher than or equal to 10% and lower than or equal to 100%, further preferably higher than or equal to 30% and lower than or equal to 100%.

In FIGS. 24A to 24C, oxygen or excess oxygen added to the insulating film 116 is schematically shown by arrows of broken lines.

In this embodiment, the conductive film 132 is formed by a sputtering method using an In—Ga—Zn metal oxide target (In:Ga:Zn=4:2:4.1 [atomic ratio]). Alternatively, the conductive film 132 may be formed by a sputtering method using an ITO target and an oxygen gas (100%) as a deposition gas.

Note that although oxygen is added to the insulating film 116 when the conductive film 132 is formed in this embodiment, the method for adding oxygen is not limited to this example. For example, oxygen may be further added to the insulating film 116 after the conductive film 132 is formed.

As the method for adding oxygen to the insulating film 116, an ITSO film with a thickness of 5 nm may be formed using a target of an oxide including indium, tin, and silicon (an In—Sn—Si oxide, also referred to as ITSO) ($In_2O_3$:$SnO_2$:$SiO_2$=85:10:5 in wt %), for example. In that case, the thickness of the ITSO film is preferably greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating film 116 through the ITSO film. Oxygen can be added by, for example, ion doping, ion implantation, or plasma treatment. By application of a bias voltage to the substrate side when oxygen is added, oxygen can be effectively added to the insulating film 116. An ashing apparatus is used, for example, and the power density of the bias voltage applied to the substrate side of the ashing apparatus can be greater than or equal to 1 W/cm$^2$ and less than or equal to 5 W/cm$^2$. The substrate temperature during addition of oxygen is higher than or equal to room temperature and lower than or equal to 300° C., preferably higher than or equal to 100° C. and lower than or equal to 250° C., whereby oxygen can be added efficiently to the insulating film 116.

Figure 26A:
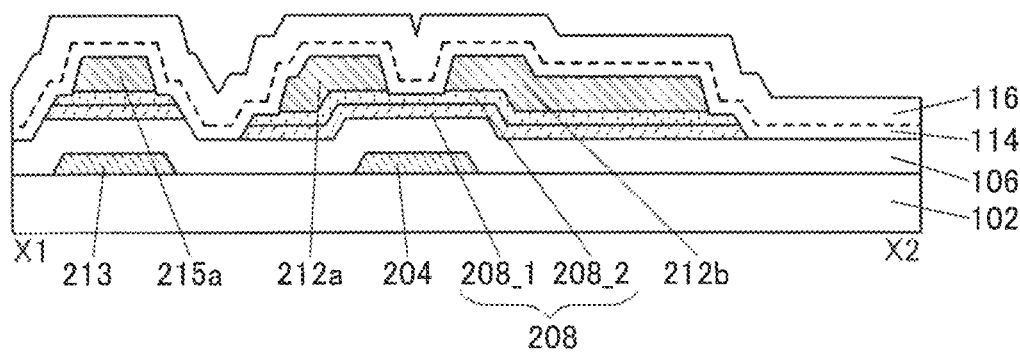
FIGS. 26A to 26C are cross-sectional views illustrating a method for manufacturing a display device.
Figure 26B:
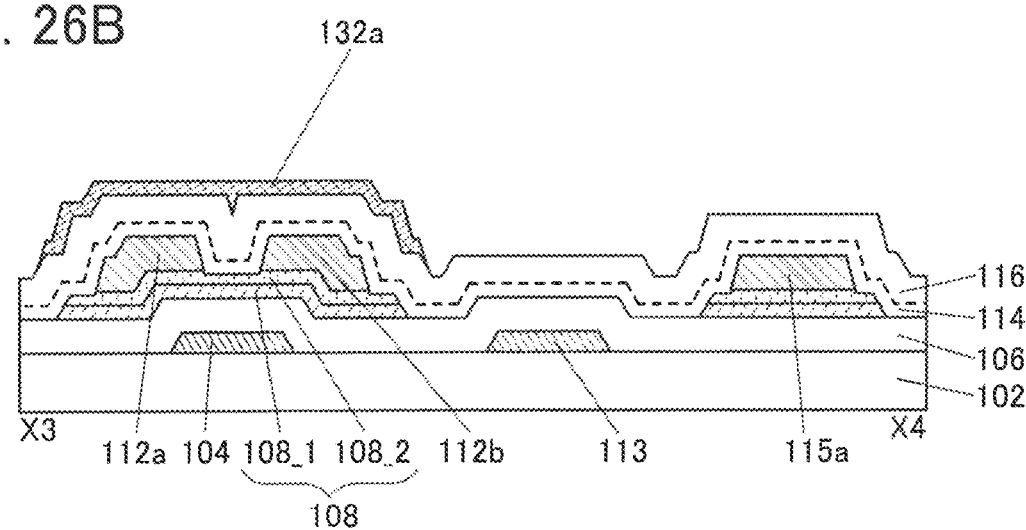
Figure 26C:
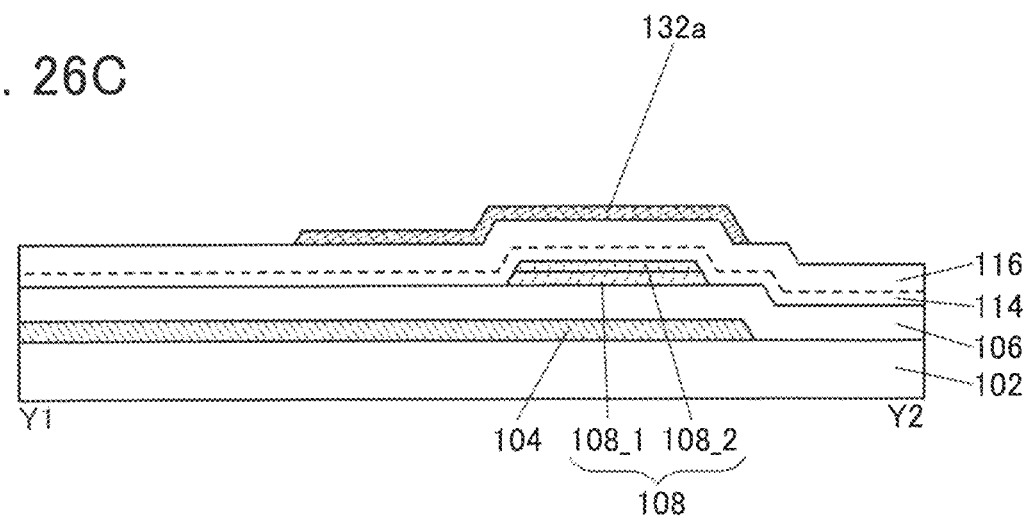

Next, the conductive film 132 is processed into a desired shape to form the conductive film 132a (see FIGS. 26A to 26C). This process of forming the conductive film 132a is a third lithography process.

In this embodiment, the conductive film 132a is formed by wet etching. Dry etching may be used to form the conductive film 132a.

Next, the insulating film 118 is formed over the insulating film 116 and the conductive film 132a.

Figure 27A:
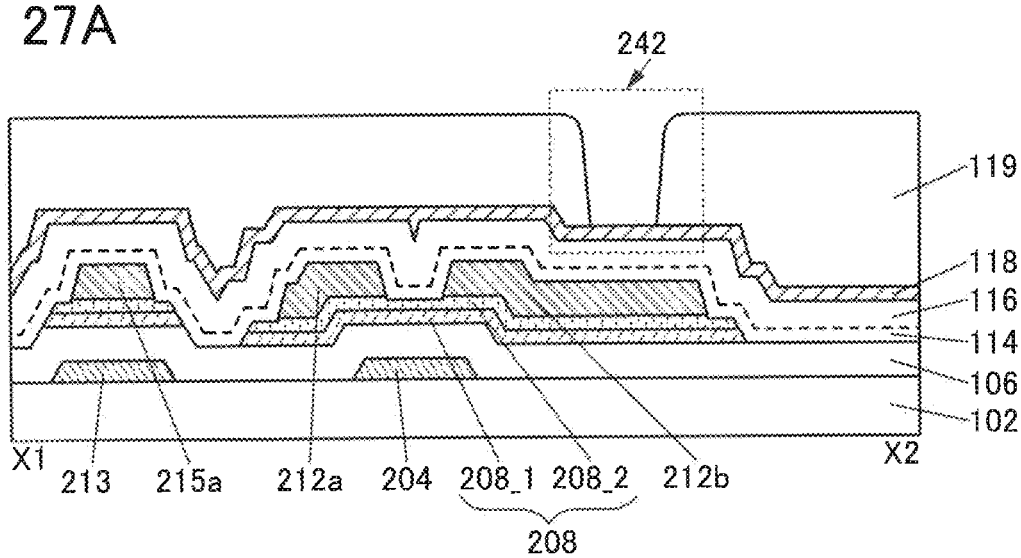
FIGS. 27A to 27C are cross-sectional views illustrating a method for manufacturing a display device.
Figure 27B:
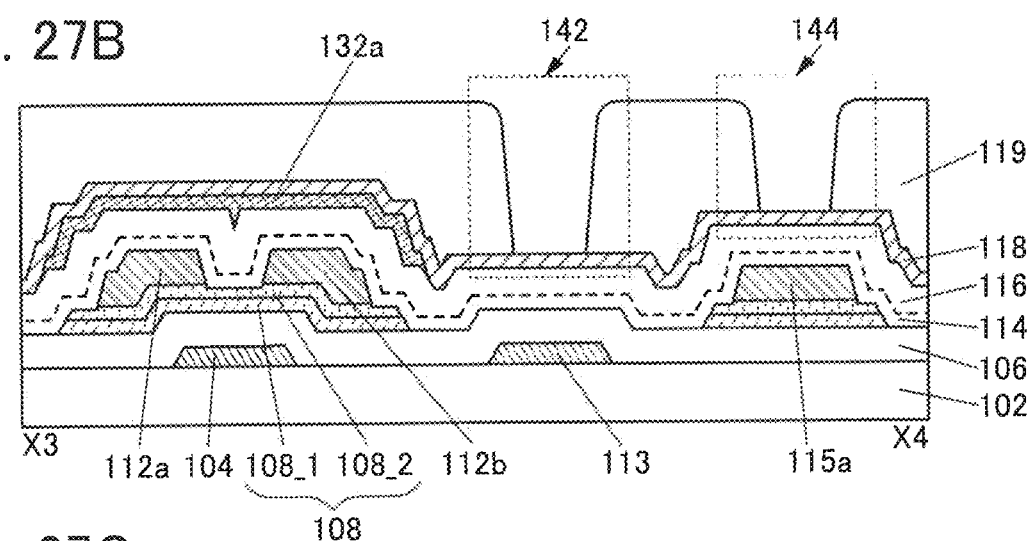
Figure 27C:
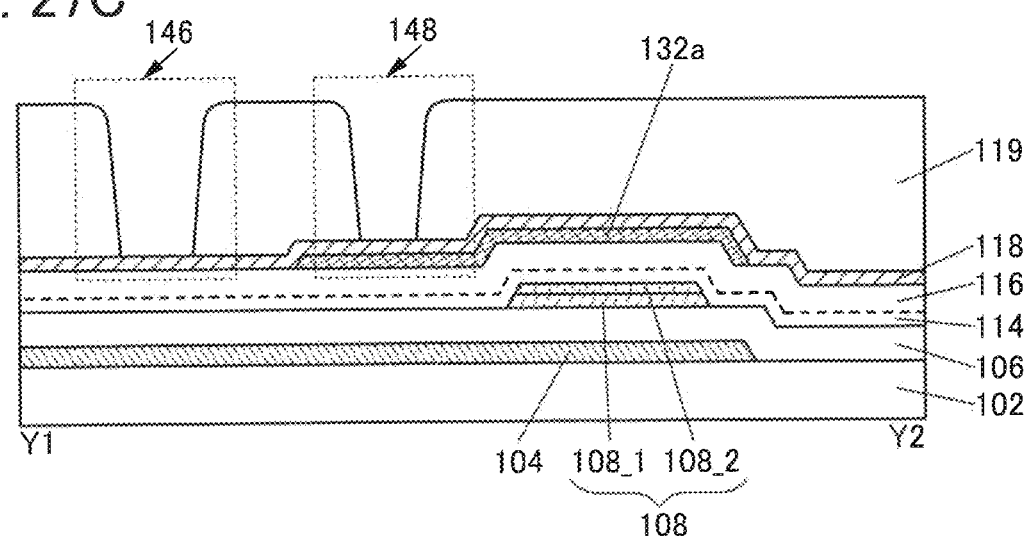

Then, the insulating film 119 is formed over the insulating film 118 (see FIGS. 27A to 27C). The insulating film 119 has the opening 242 in a region overlapping with the conductive film 212b, the opening 142 in a region overlapping with the conductive film 113, the opening 144 in a region overlapping with the conductive film 115a, the opening 146 in a region overlapping not with the conductive film 132a but with the conductive film 104, and the opening 148 in a region overlapping with the conductive film 132a.

The insulating film 119 can be formed in the following manner: a photosensitive resin is applied to the insulating film 118 and the conductive film 132a and then light exposure and development are performed. Alternatively, the insulating film 119 can be formed in the following manner: a non-photosensitive resin is applied to the insulating film 118 and the conductive film 132a and baked; a resist mask is formed; and the baked non-photosensitive resin is etched with the use of the resist mask. This process of forming the insulating film 119 is a fourth lithography process.

Figure 28A:
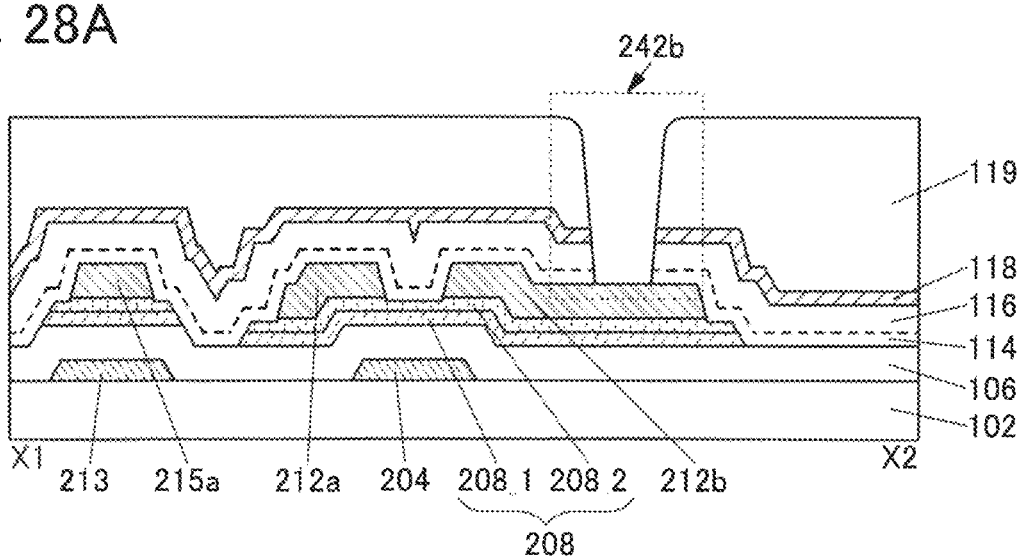
FIGS. 28A to 28C are cross-sectional views illustrating a method for manufacturing a display device.
Figure 28B:
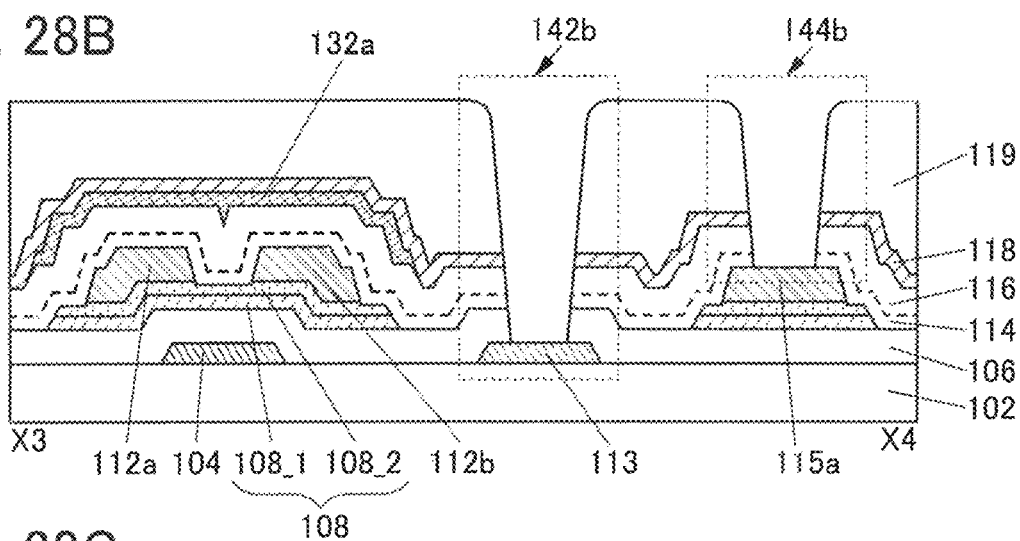
Figure 28C:
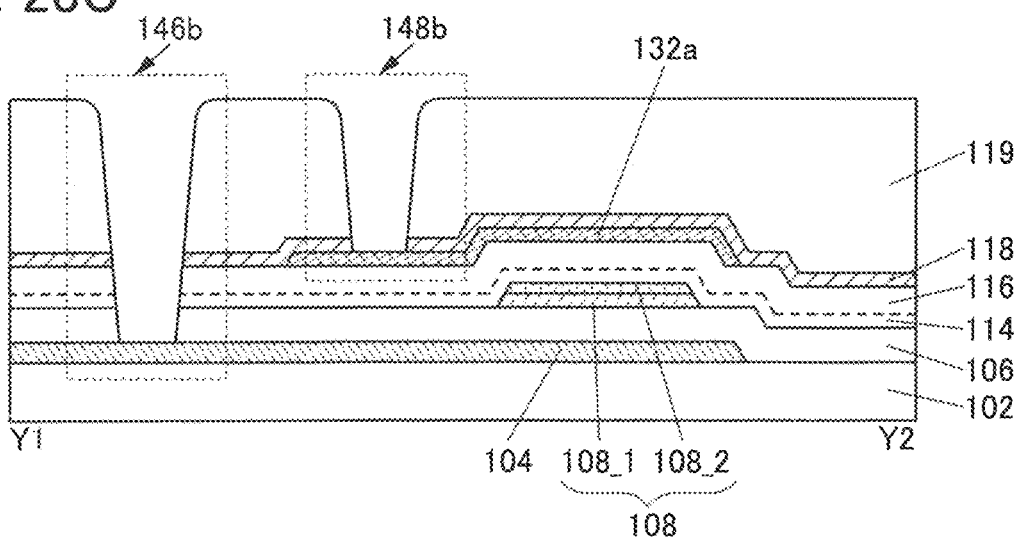

Then, the insulating films 106, 114, 116, and 118 are partly removed using the insulating film 119 as a mask (see FIGS. 28A to 28C). The insulating films 114, 116, and 118 in a region overlapping with the opening 242 are removed so that the conductive film 212b is exposed to form the opening 242b. The insulating films 106, 114, 116, and 118 in a region overlapping with the opening 142 are removed so that the conductive film 113 is exposed to form the opening 142b. The insulating films 114, 116, and 118 in a region overlapping with the opening 144 are removed so that the conductive film 115a is exposed to form the opening 144b. The insulating films 106, 114, 116, and 118 in a region overlapping with the opening 146 are removed so that the conductive film 104 is exposed to form the opening 146b. The insulating film 118 in a region overlapping with the opening 148 is removed so that the conductive film 132a is exposed to form the opening 148b.

The openings 242b, 142b, 144b, 146b, and 148b can be formed by dry etching or wet etching. Dry etching and wet etching may be used in combination.

In forming the openings 242b, 142b, 144b, 146b, and 148b, the etching rates of the insulating films 106, 114, 116, and 118 are preferably high and the etching rates of the conductive films 212b, 113, 115a, and 132a are preferably low. Furthermore, the etching rate of the insulating film 119 is preferably low.

During the formation of the openings 242b, 142b, 144b, 146b, and 148b, the thickness of the insulating film 119 is reduced in some cases. The insulating film 119 can be formed to have a thickness larger by the reduced thickness.

Next, a conductive film which is to be the conductive film 220, the conductive film 120a functioning as the fourth wiring, and the conductive film 120b functioning as the first wiring is formed over the insulating film 119 and the openings 242b, 142b, 144b, 146b, and 148b.

Figure 29A:
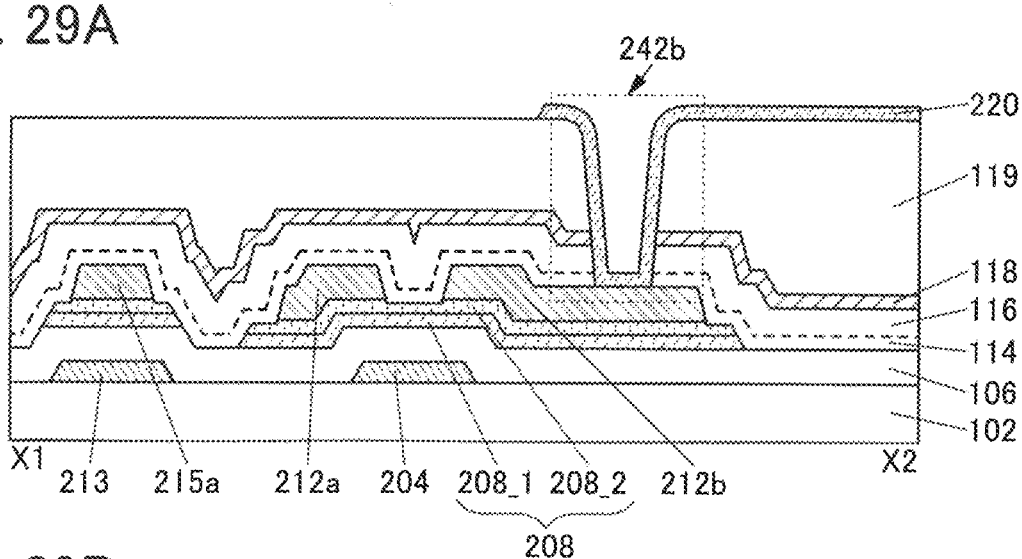
FIGS. 29A to 29C are cross-sectional views illustrating a method for manufacturing a display device.
Figure 29B:
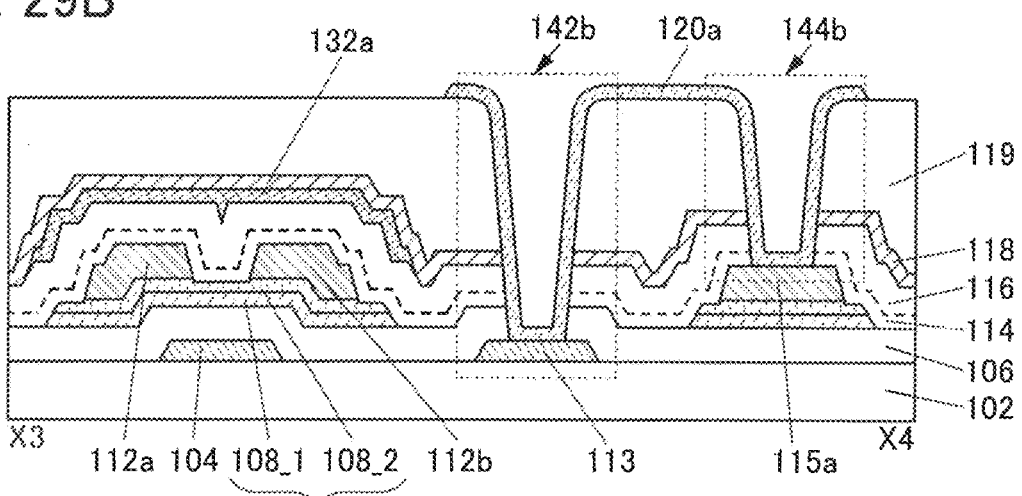
Figure 29C:
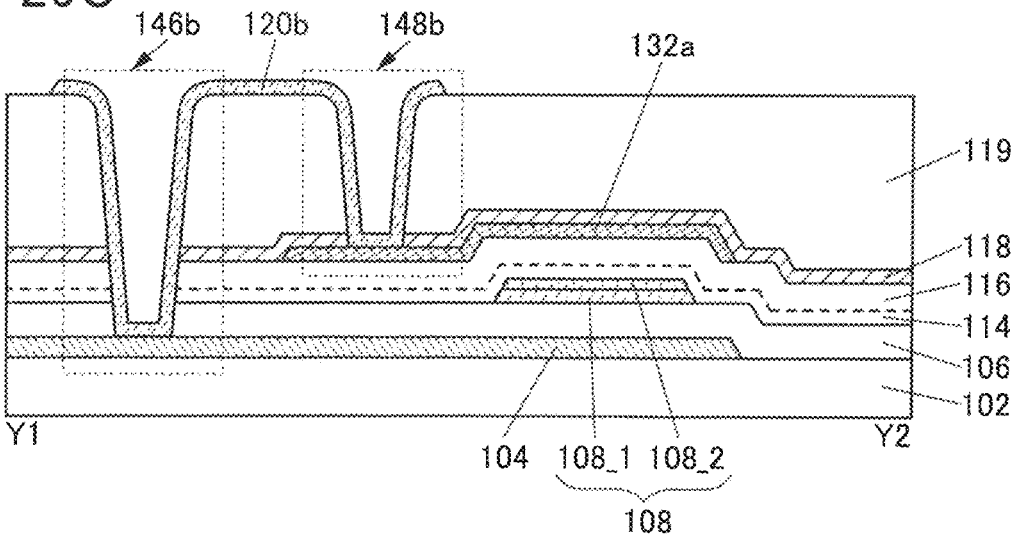

The conductive film is processed through a lithography process and an etching process to form the conductive film 220, the conductive film 120a functioning as the fourth wiring, and the conductive film 120b functioning as the first wiring (see FIGS. 29A to 29C). The conductive film 120a electrically connects the conductive film 113 and the conductive film 115a to each other. The conductive film 120b electrically connects the conductive film 132a and the conductive film 104 to each other.

This process of forming the conductive film 220, the conductive film 120a functioning as the fourth wiring, and the conductive film 120b functioning as the first wiring is a fifth lithography process.

As described above, the display device illustrated in FIGS. 3A to 3C can be manufactured through five lithography processes.

In one embodiment of the present invention, a display device can be manufactured through only five lithography processes. A reduction in the number of lithography processes can reduce a pattern arrangement margin and enables miniaturization of a transistor and an increase in the definition of the display device. Furthermore, a reduction in the number of lithography processes leads to a simple process flow and an improved yield. A reduction in the number of lithography processes can also reduce the cost for masks.

<Method 3 for Manufacturing Display Device>

A method for manufacturing the transistor 100C, the transistor 200C, the capacitor 250C, and the connection portion 150C included in the display device of one embodiment of the present invention illustrated in FIGS. 4A to 4C will be described with reference to FIGS. 30A to 30C to FIGS. 32A to 32C. In the method for manufacturing the display device illustrated in FIGS. 4A to 4C, the insulating film 118 and components below the insulating film 118 are formed in a similar manner to the display device illustrated in FIGS. 1A to 1C.

Figure 30A:
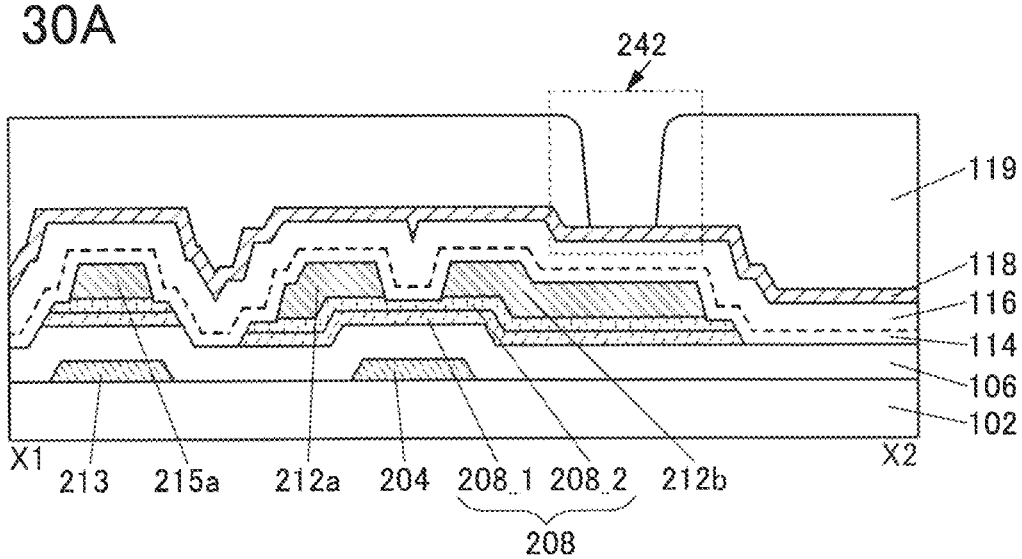
FIGS. 30A to 30C are cross-sectional views illustrating a method for manufacturing a display device.
Figure 30B:
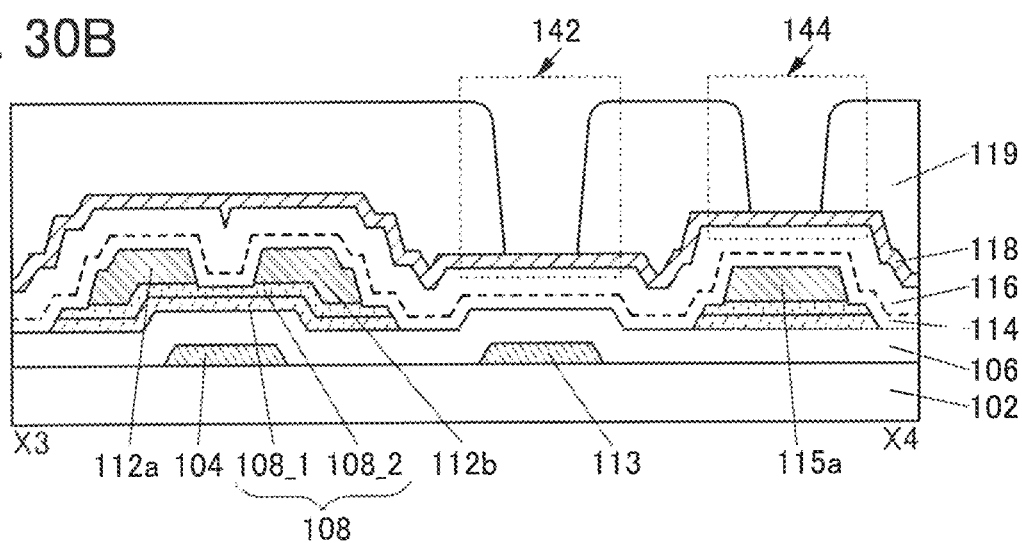
Figure 30C:
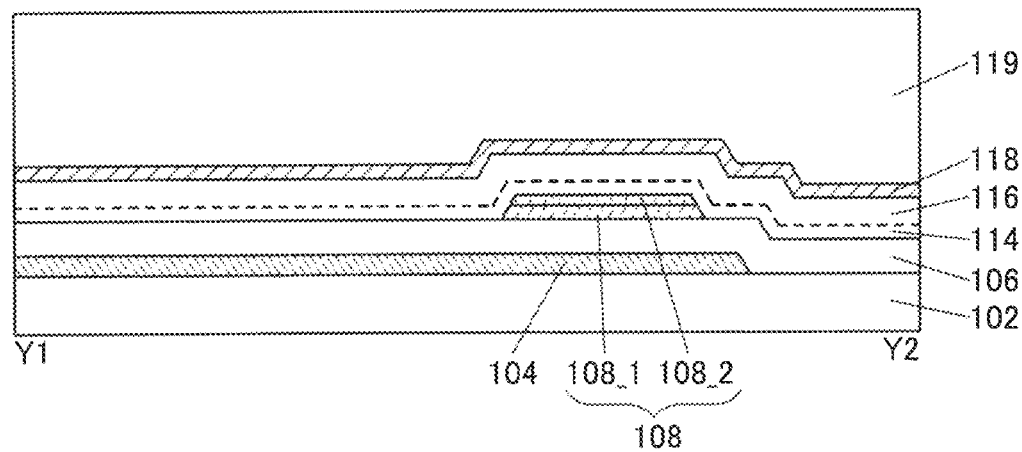

Then, the insulating film 119 is formed over the insulating film 118 (see FIGS. 30A to 30C). The insulating film 119 has the opening 242 in a region overlapping with the conductive film 212b, the opening 142 in a region overlapping with the conductive film 113, and the opening 144 in a region overlapping with the conductive film 115a.

The insulating film 119 can be formed in the following manner: a photosensitive resin is applied to the insulating film 118 and then light exposure and development are performed. Alternatively, the insulating film 119 can be formed in the following manner a non-photosensitive resin is applied to the insulating film 118 and baked; a resist mask is formed; and the baked non-photosensitive resin is etched with the use of the resist mask. This process of forming the insulating film 119 is a third lithography process.

Figure 31A:
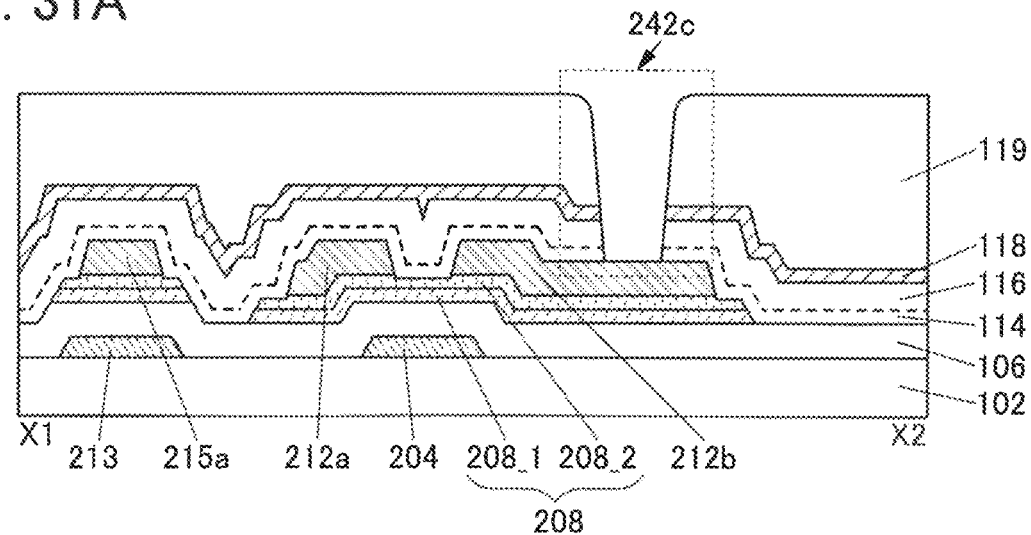
FIGS. 31A to 31C are cross-sectional views illustrating a method for manufacturing a display device.
Figure 31B:
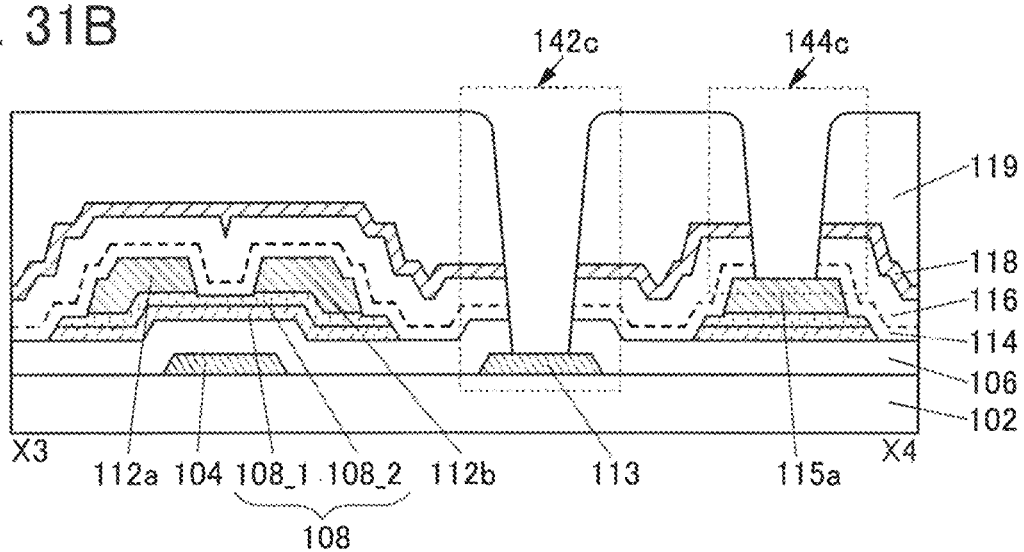
Figure 31C:
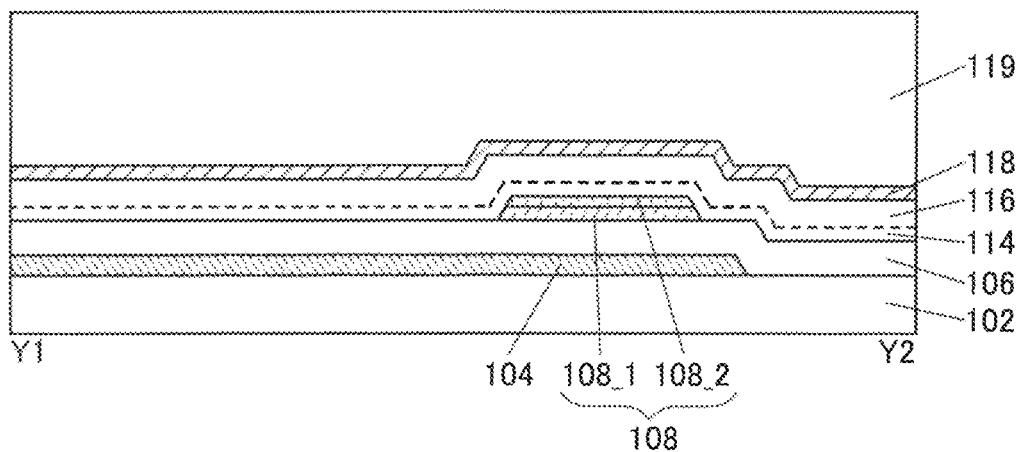

Then, the insulating films 106, 114, 116, and 118 are partly removed using the insulating film 119 as a mask (see FIGS. 31A to 31C). The insulating films 114, 116, and 118 in a region overlapping with the opening 242 are removed so that the conductive film 212b is exposed to form the opening 242c. The insulating films 106, 114, 116, and 118 in a region overlapping with the opening 142 are removed so that the conductive film 113 is exposed to form the opening 142c. The insulating films 114, 116, and 118 in a region overlapping with the opening 144 are removed so that the conductive film 115a is exposed to form the opening 144c.

The openings 242c, 142c, and 144c can be formed by dry etching or wet etching. Dry etching and wet etching may be used in combination.

In forming the openings 242c, 142c, and 144c, the etching rates of the insulating films 106, 114, 116, and 118 are preferably high and the etching rates of the conductive films 212b, 113, 115a, and 132a are preferably low. Furthermore, the etching rate of the insulating film 119 is preferably low.

During the formation of the openings 242c, 142c, and 144c, the thickness of the insulating film 119 is reduced in some cases. The insulating film 119 can be formed to have a thickness larger by the reduced thickness.

Next, a conductive film which is to be the conductive film 220, the conductive film 120a functioning as the fourth wiring, and the conductive film 120b functioning as the first wiring is formed over the insulating film 119 and the openings 242c, 142c, and 144c.

Figure 32A:
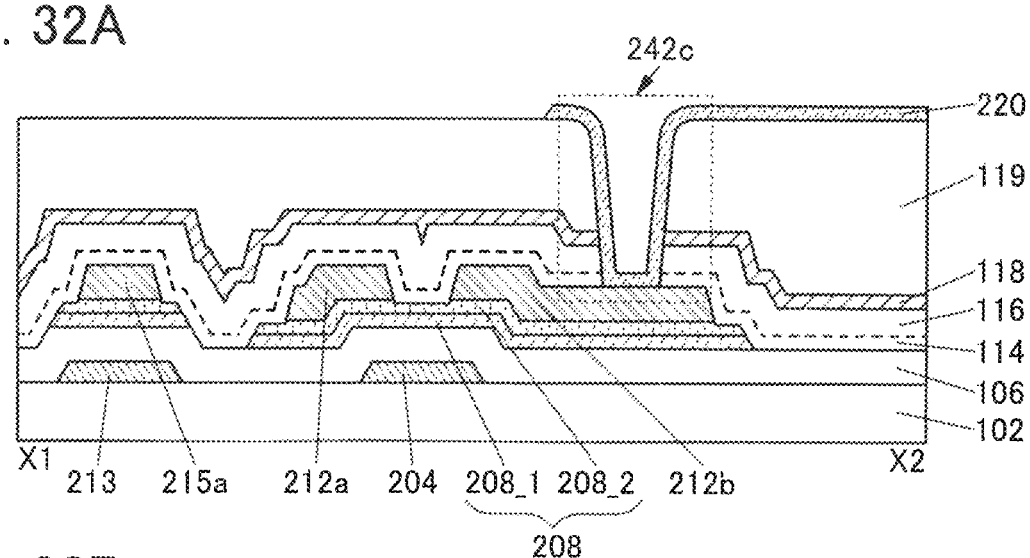
FIGS. 32A to 32C are cross-sectional views illustrating a method for manufacturing a display device.
Figure 32B:
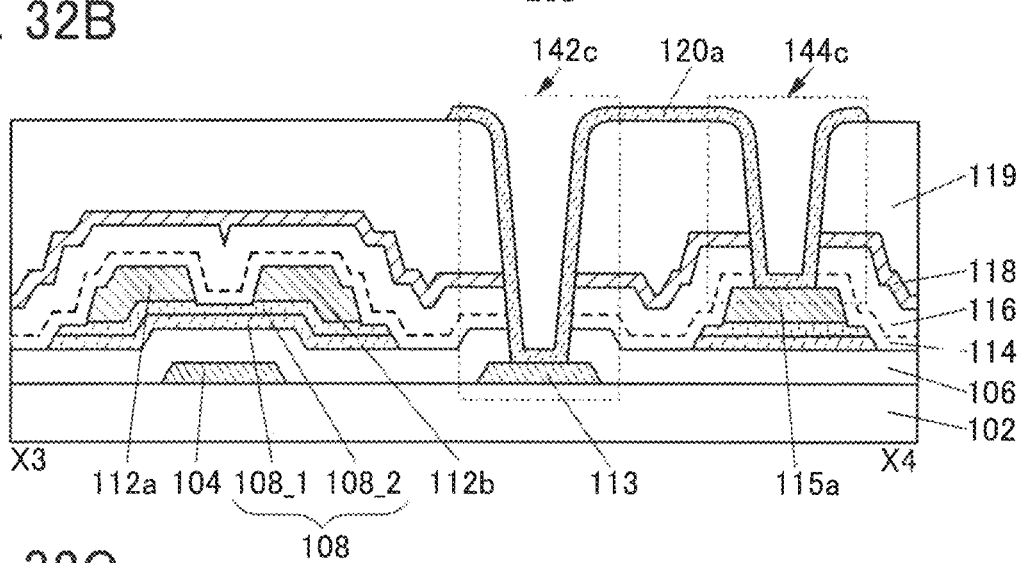
Figure 32C:
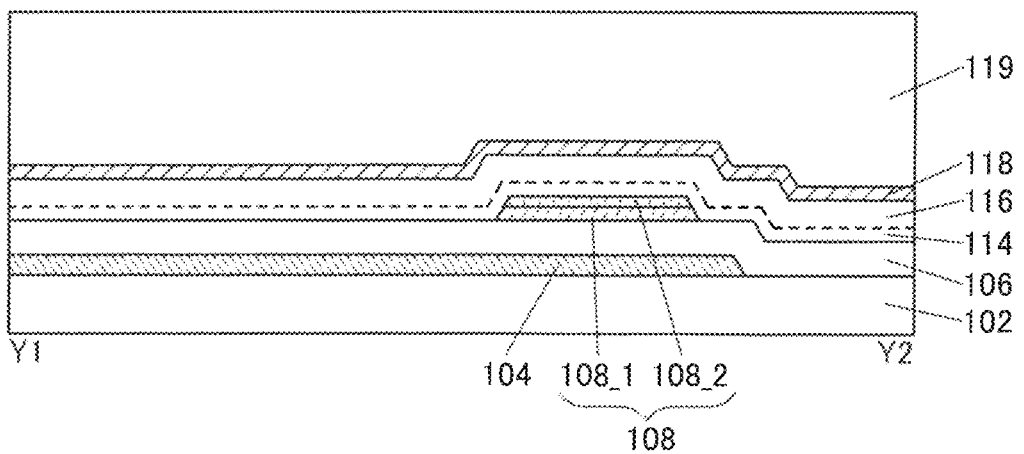

The conductive film is processed through a lithography process and an etching process to form the conductive film 220, the conductive film 120a functioning as the fourth wiring, and the conductive film 120b functioning as the first wiring (see FIGS. 32A to 32C). The conductive film 120a electrically connects the conductive film 113 and the conductive film 115a to each other.

This process of forming the conductive film 220, the conductive film 120a functioning as the fourth wiring, and the conductive film 120b functioning as the first wiring is a fourth lithography process.

As described above, the display device illustrated in FIGS. 4A to 4C can be manufactured through four lithography processes.

In this embodiment, the metal oxide films 228, 208, 108, and 128 and the conductive films 215a, 212a, 212b, 112a, 112b, and 115a are formed through one lithography process. The formation of the metal oxide films 228, 208, 108, and 128 and the formation of the conductive films 215a, 212a, 212b, 112a, 112b, and 115a may be performed through different lithography processes, in which case the display device illustrated in FIGS. 4A to 4C can be manufactured through five lithography processes.

In one embodiment of the present invention, a display device can be manufactured through only four or five lithography processes. A reduction in the number of lithography processes can reduce a pattern arrangement margin and enables miniaturization of a transistor and an increase in the definition of the display device. Furthermore, a reduction in the number of lithography processes leads to a simple process flow and an improved yield. A reduction in the number of lithography processes can also reduce the cost for masks.

<Method 4 for Manufacturing Display Device>

A method for manufacturing the transistor 100D, the transistor 200D, the capacitor 250D, and the connection portion 150D included in the display device of one embodiment of the present invention illustrated in FIGS. 6A to 6C will be described with reference to FIGS. 33A to 33C to FIGS. 41A to 41C.

FIGS. 33A to 33C to FIGS. 41A to 41C are cross-sectional views illustrating the method for manufacturing the display device. In FIGS. 33A to 33C to FIGS. 41A to 41C, a cross-sectional view taken along dashed-dotted line X1-X2 is a cross-sectional view of the transistor 200D in the channel length direction, a cross-sectional view taken along dashed-dotted line X3-X4 is a cross-sectional view of the transistor 100D in the channel length direction, and a cross-sectional view taken along dashed-dotted line Y1-Y2 is a cross-sectional view of the transistor 100D in the channel width direction.

In the method for manufacturing the display device illustrated in FIGS. 6A to 6C, the metal oxide films 108a and 108b and components below the metal oxide films 108a and 108b are formed in a similar manner to the display device illustrated in FIGS. 1A to 1C.

Figure 33A:
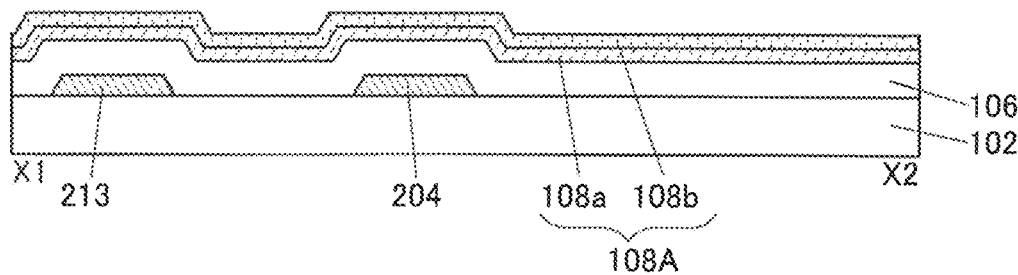
FIGS. 33A to 33C are cross-sectional views illustrating a method for manufacturing a display device.
Figure 33B:
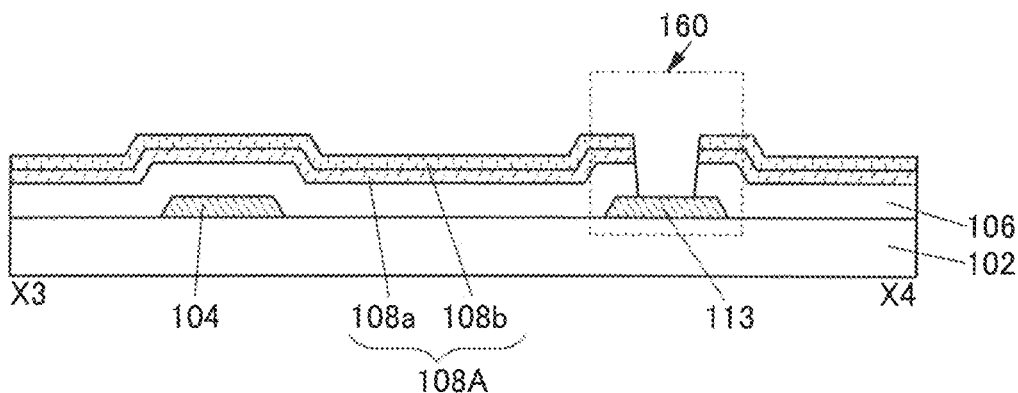
Figure 33C:
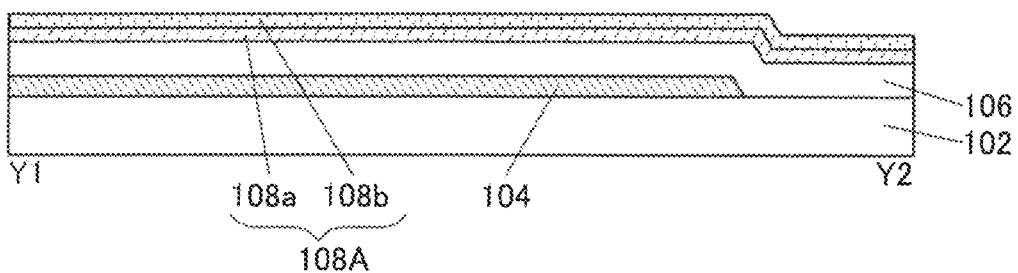

Next, the metal oxide film 108 and the insulating film 106 are processed through a lithography process and an etching process to form the opening 160 in a region overlapping with the conductive film 113 (see FIGS. 33A to 33C). The conductive film 113 is exposed in the opening 160. This process of forming the opening 160 is a second lithography process.

Then, the conductive film 112 is formed over the metal oxide film 108. Subsequently, through a third lithography process, the resist masks 251, 253, 151, and 153 are formed over the conductive film 112 (see FIGS. 34A to 34C). This process of forming the resist masks 251, 253, 151, and 153 is the third lithography process.

In this embodiment, for the conductive film 112, a 30-nm-thick titanium film, a 200-nm-thick copper film, and a 10-nm-thick titanium film are formed in this order by a sputtering method.

The resist mask 253 has the region 255 with a small resist thickness in a region overlapping with the conductive film 204. The region 255 can also be referred to as a depressed portion. The resist mask 151 has the region 155 with a small resist thickness in a region overlapping with the conductive film 104. The region 155 can also be referred to as a depressed portion. In this embodiment, light exposure using a multi-tone (high-tone) mask is performed for forming the resist masks. When the multi-tone (high-tone) mask is used, a resist mask having varied resist thicknesses can be formed.

Figure 34A:
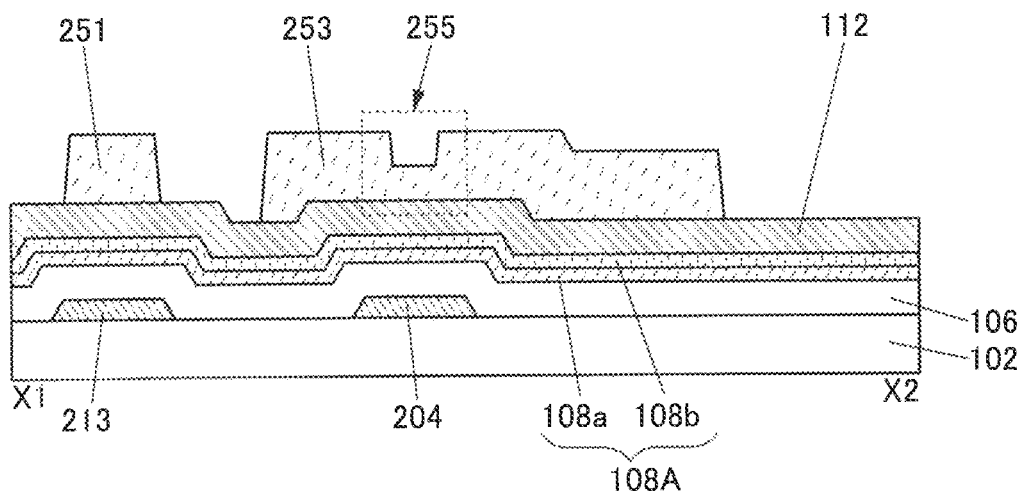
FIGS. 34A to 34C are cross-sectional views illustrating a method for manufacturing a display device.
Figure 34B:
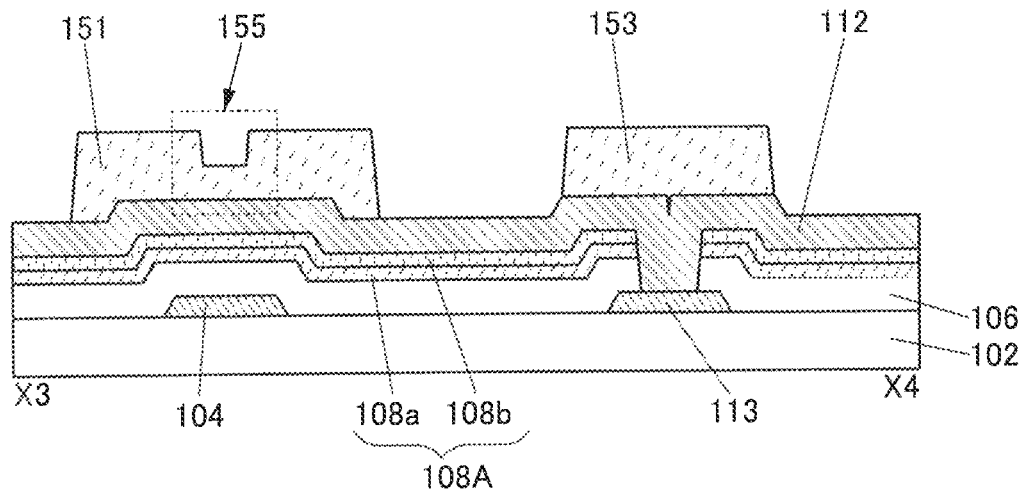
Figure 34C:
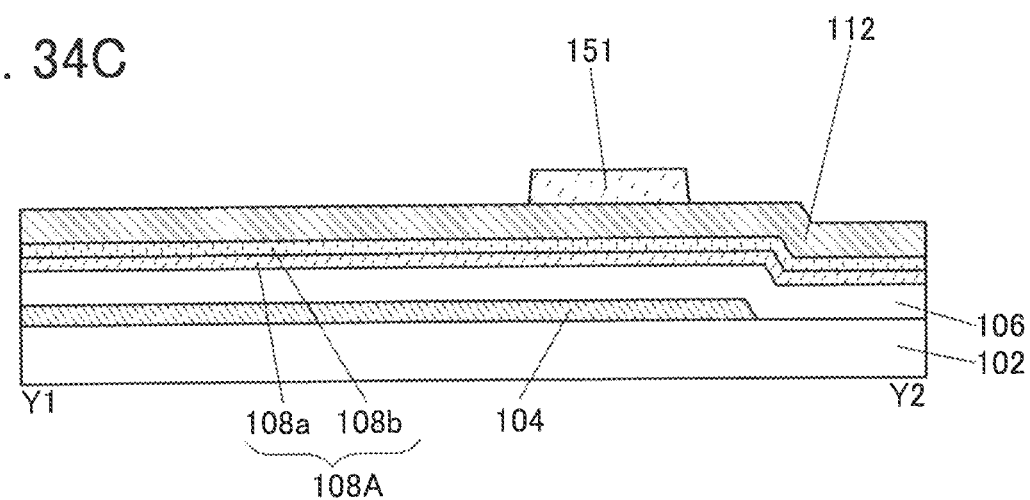

After the light exposure using the multi-tone mask, development is performed; accordingly, a resist mask having regions with different thicknesses can be formed as illustrated in FIGS. 34A to 34C.

Although the multi-tone mask with two different resist thicknesses is described as an example, one embodiment of the present invention is not limited thereto. When the diffraction grating portion 18 or the semi-transmissive film 23 having a plurality of light transmittances is used, a resist with three or more different thicknesses can be formed.

Figure 35A:
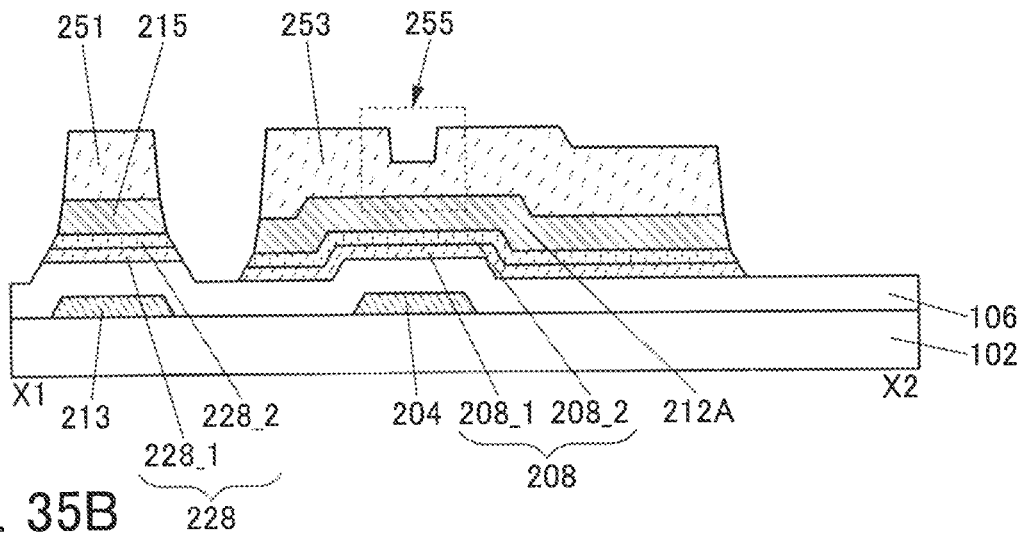
FIGS. 35A to 35C are cross-sectional views illustrating a method for manufacturing a display device.
Figure 35B:
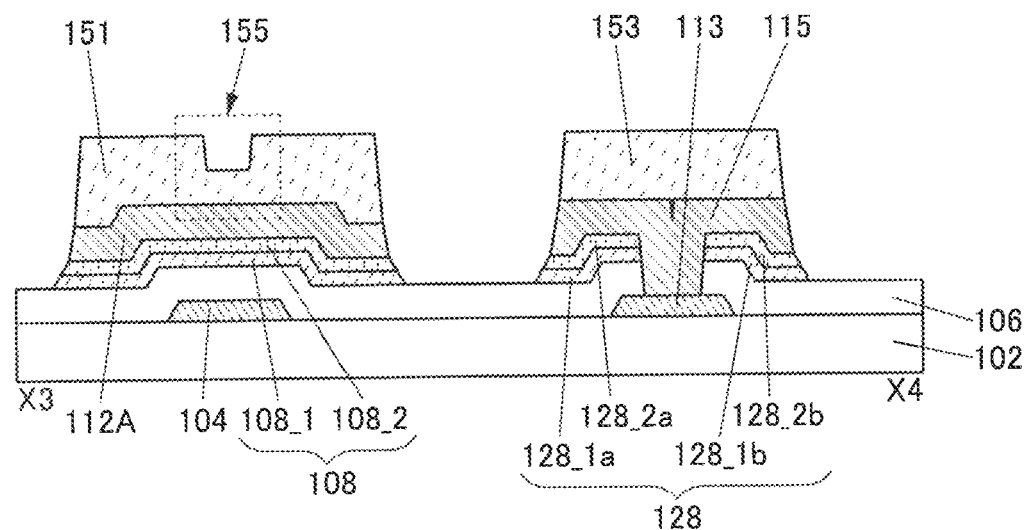
Figure 35C:
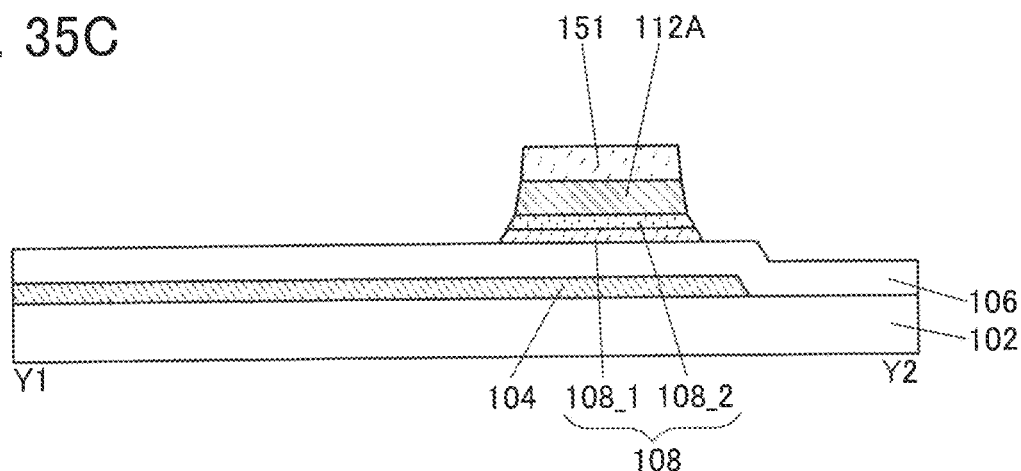

Next, the conductive film 112 and the metal oxide film 108 are partly removed with the use of the resist masks 251, 253, 151, and 153 to form the conductive films 215, 212A, 112A, and 115, and the metal oxide films 228, 208, 108, and 128 (see FIGS. 35A to 35C).

Wet etching can be used for the processing of the conductive film 112. The processing method is not limited to wet etching, and dry etching may be used, for example. Wet etching can also be used for the processing of the metal oxide film 108b. The processing method is not limited to wet etching, and dry etching may be used, for example.

The conductive film 112, the metal oxide film 108a, and the metal oxide film 108b may be processed by different etching. For example, the conductive film 112 may be processed by dry etching and the metal oxide films 108a and 108b may be processed by wet etching.

Then, the resist masks 251, 253, 151, and 153 are partly removed to reduce the areas of the resist masks. As a result of the reduction in the areas of the resist masks, the resist masks 251a, 253a, 253b, 151a, 151b, and 153a are formed (see FIGS. 36A to 36C).

An ashing apparatus can be used for partly removing the resist masks. In some cases, the thicknesses of the resist masks are reduced by ashing at the same time as the areas of the resist masks.

The ashing can be, for example, photoexcitation ashing in which a gas such as oxygen or ozone is irradiated with light such as ultraviolet light to cause a chemical reaction between the gas and an organic material, so that the organic material is removed. Alternatively, plasma ashing in which a gas such as oxygen or ozone is made into plasma with the use of a high-frequency wave or the like and an organic material is removed using the plasma may be used.

Figure 36A:
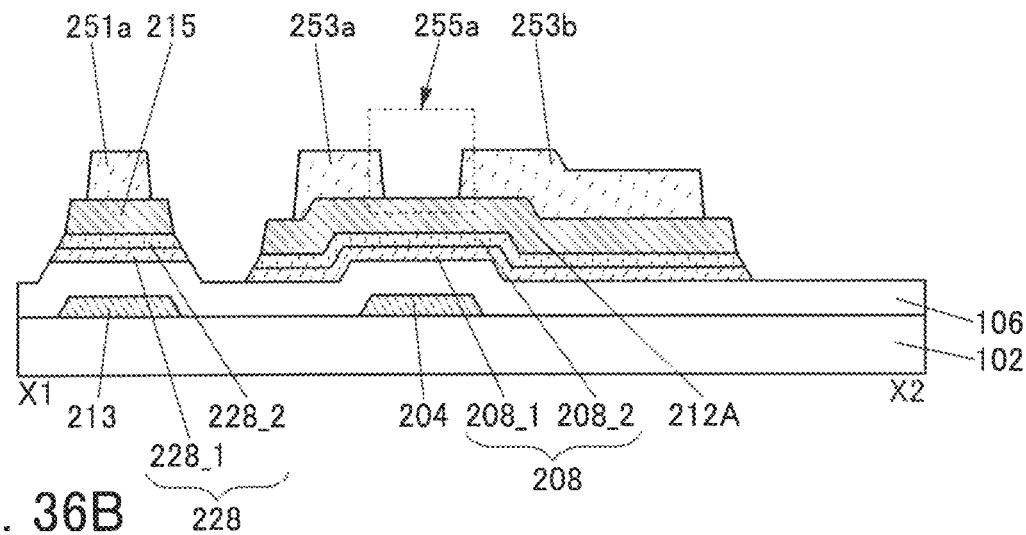
FIGS. 36A to 36C are cross-sectional views illustrating a method for manufacturing a display device.
Figure 36B:
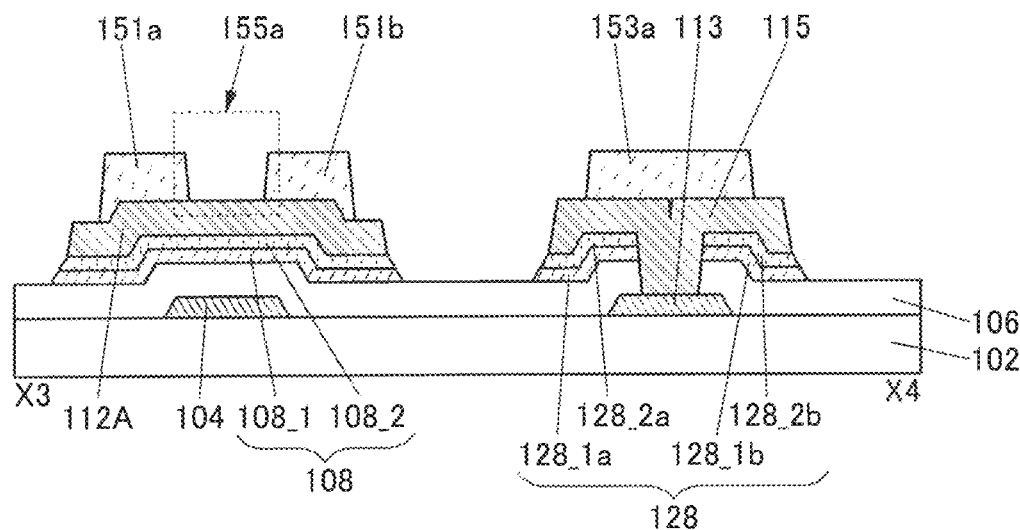
Figure 36C:
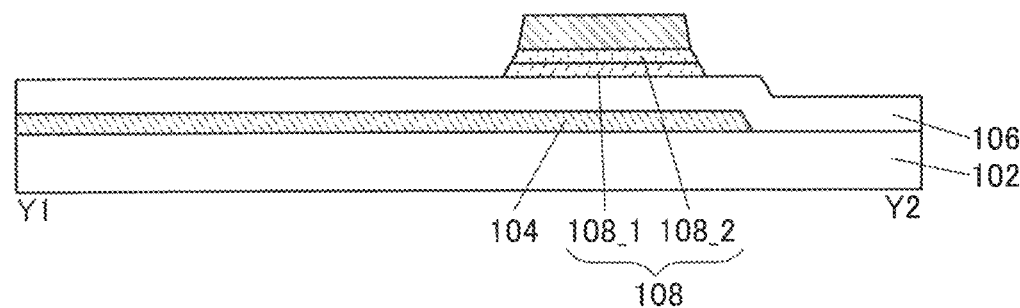

In the region 255 of the resist mask 253 where the resist has a small thickness and the region 155 of the resist mask 151 where the resist has a small thickness, resists are removed by the ashing, so that the resist masks are separated as illustrated in FIGS. 36A to 36C. When the resist masks are partly removed, the resist in a region 255a overlapping with the conductive film 204 is removed and the conductive film 212A in the region 255a is exposed. Furthermore, the resist in a region 155a overlapping with the conductive film 104 is removed and the conductive film 112A in the region 155a is exposed.

An end portion of the resist mask 251a is located inward from an end portion of the conductive film 215. End portions of the resist masks 253a and 253b are located inward from end portions of the conductive film 212A. End portions of the resist masks 151a and 151b are located inward from end portions of the conductive film 112A. An end portion of the resist mask 153a is located inward from an end portion of the conductive film 115.

Figure 37A:
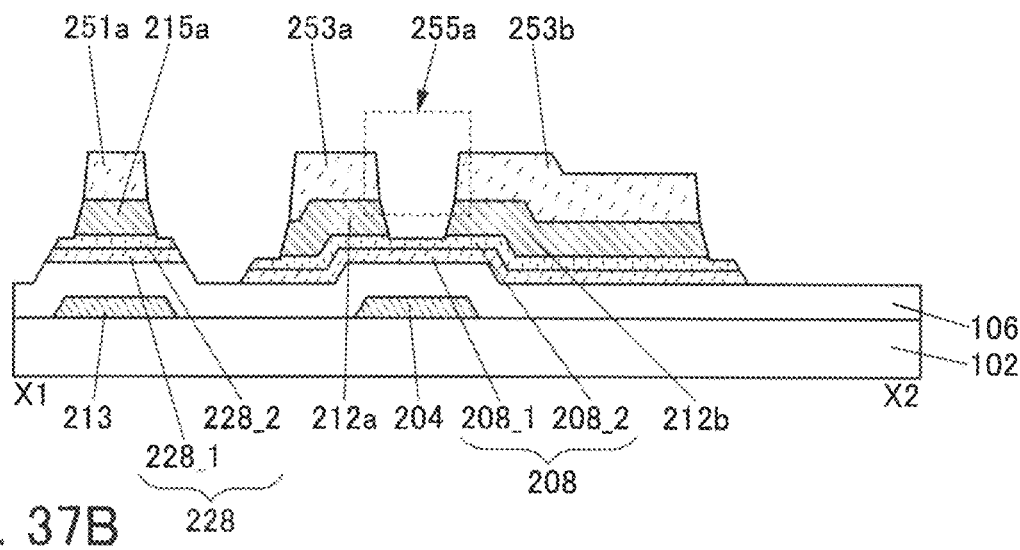
FIGS. 37A to 37C are cross-sectional views illustrating a method for manufacturing a display device.
Figure 37B:
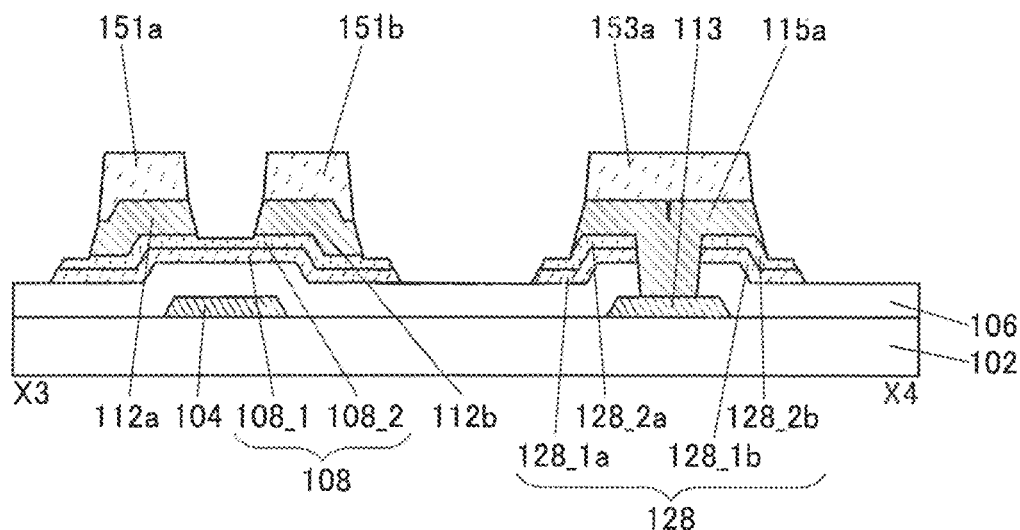
Figure 37C:
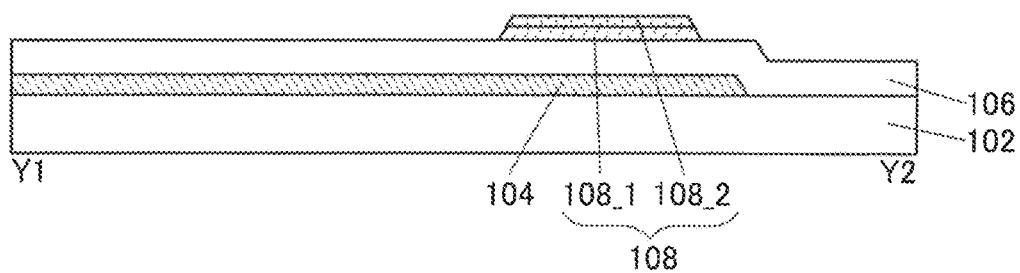

Next, the conductive films 215, 212A, 112A, and 115 are partly removed with the use of the resist masks 251a, 253a, 253b, 151a, 151b, and 153a to form the conductive films 215a, 212a, 212b, 112a, 112b, and 115a (see FIGS. 37A to 37C).

The end portion of the conductive film 215a is located inward from the end portion of the metal oxide film 228. The end portions of the conductive films 212a and 212b are located inward from the end portions of the metal oxide film 208. The end portions of the conductive films 112a and 112b are located inward from the end portions of the metal oxide film 108. The end portion of the conductive film 115a is located inward from the end portion of the metal oxide film 128.

Then, the resist masks 251a, 253a, 253b, 151a, 151b, and 153a are removed.

After the resist masks are removed, surfaces (on the back channel side) of the metal oxide films 108, 128, 208, and 228 (specifically, the metal oxide films 108_2, 128_2, 208_2, and 228_2) may be cleaned. The cleaning may be performed using, for example, a chemical solution such as a phosphoric acid. The cleaning using a chemical solution such as a phosphoric acid can remove impurities (e.g., an element contained in the conductive films 112a, 112b, 212a, and 212b) attached to the surfaces of the metal oxide films 108_2, 128_2, 208_2, and 228_2. Note that the cleaning is not necessarily performed; in some cases, the cleaning is not performed.

In the step of forming the conductive films 112a, 112b, 212a, and 212b and/or the cleaning step, the metal oxide films 108 and 208 are sometimes thinned in regions not covered with the conductive films 112a, 112b, 212a, and 212b.

Note that the exposed regions of the metal oxide films 108 and 208, that is, the metal oxide films 108_2 and 208_2, preferably have high crystallinity. Impurities (in particular, constituent elements of the conductive films 112a, 112b, 212a, and 212b) are less likely to be diffused into the metal oxide films with high crystallinity. Thus, highly reliable transistors can be fabricated.

Although FIGS. 37A to 37C illustrate an example in which depressed portions are formed on the surfaces of the metal oxide films 108, 128, 208, and 228 not covered with the conductive films 112a, 112b, 115a, 212a, 212b, and 215a, i.e., the surfaces of the metal oxide films 108_2, 128_2, 208_2, and 228_2, one embodiment of the present invention is not limited to this example and depressed portions are not necessarily formed on the surfaces of the metal oxide films 108, 128, 208, and 228 not covered with the conductive films 112a, 112b, 115a, 212a, 212b, and 215a.

Figure 38A:
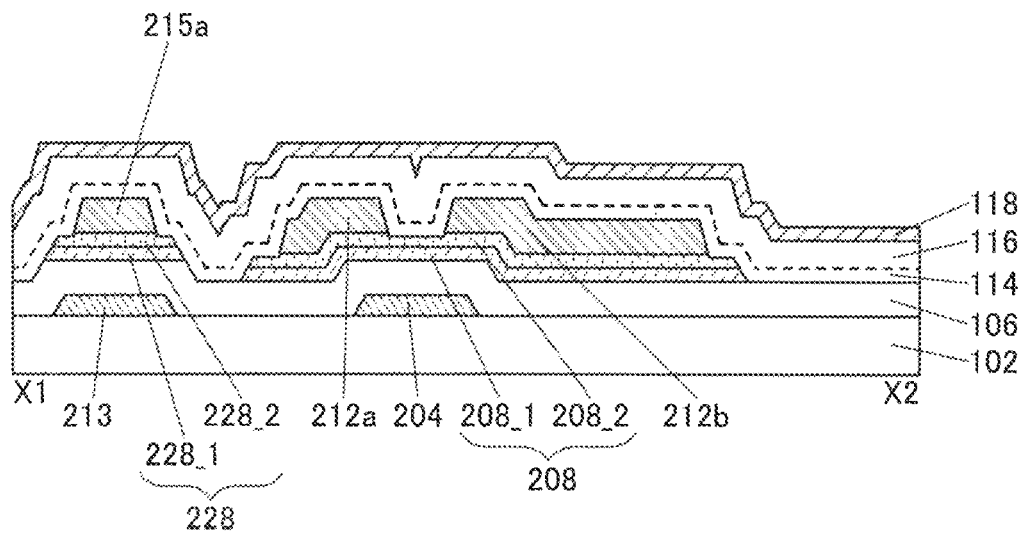
FIGS. 38A to 38C are cross-sectional views illustrating a method for manufacturing a display device.
Figure 38B:
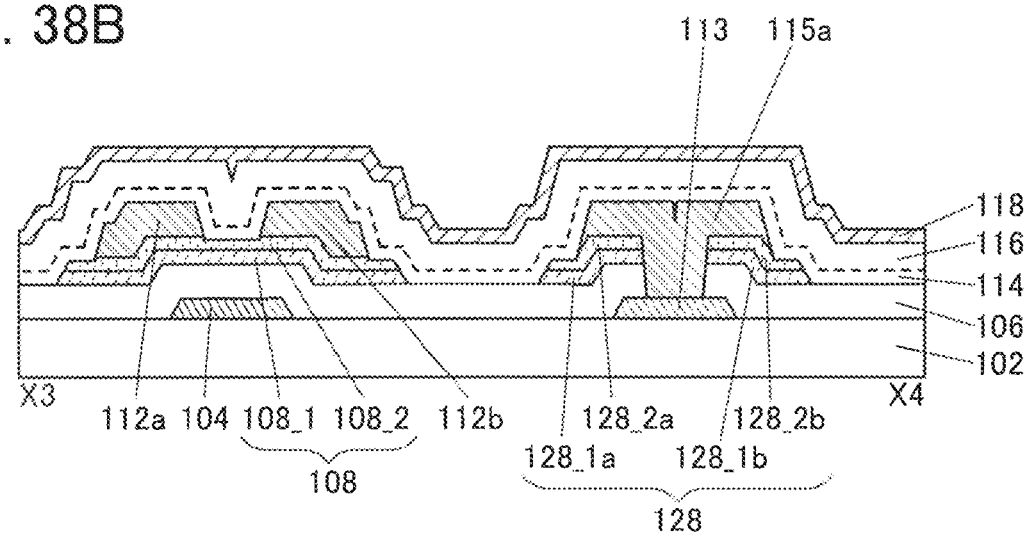
Figure 38C:
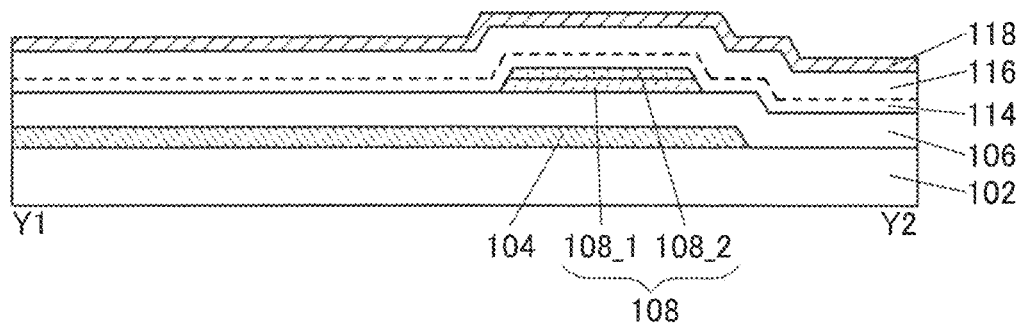

Next, the insulating films 114, 116, and 118 are formed over the insulating film 106, the metal oxide films 108, 128, 208, and 228, and the conductive films 215a, 212a, 212b, 112a, 112b, and 115a (see FIGS. 38A to 38C).

The above description can be referred to for the description of a method for forming the insulating films 114, 116, and 118; thus, the method is not described in detail.

Note that after the insulating film 114 is formed, the insulating film 116 is preferably formed successively without exposure to the air. When the insulating film 116 is formed successively after the formation of the insulating film 114 without exposure to the air while at least one of the flow rate of a source gas, the pressure, high-frequency power, and the substrate temperature is adjusted, the concentration of impurities attributed to the atmospheric component at the interface between the insulating films 114 and 116 can be reduced.

Note that after the insulating film 116 is formed, the insulating film 118 may be formed successively without exposure to the air. When the insulating film 118 is formed successively after the formation of the insulating film 116 without exposure to the air while at least one of the flow rate of a source gas, the pressure, high-frequency power, and the substrate temperature is adjusted, the concentration of impurities attributed to the atmospheric component at the interface between the insulating films 116 and 118 can be reduced.

After the insulating film 118 is formed, heat treatment similar to the first heat treatment or the second heat treatment (hereinafter referred to as third heat treatment) may be performed.

By the third heat treatment, oxygen included in the insulating film 116 moves into the metal oxide films 108 and 208 to fill the oxygen vacancies in the metal oxide films 108 and 208.

Figure 39A:
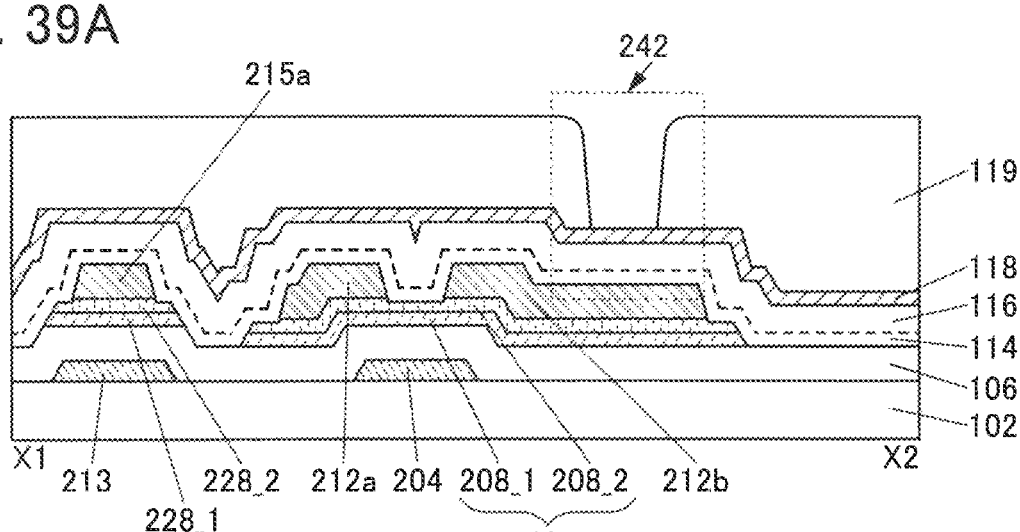
FIGS. 39A to 39C are cross-sectional views illustrating a method for manufacturing a display device.
Figure 39B:
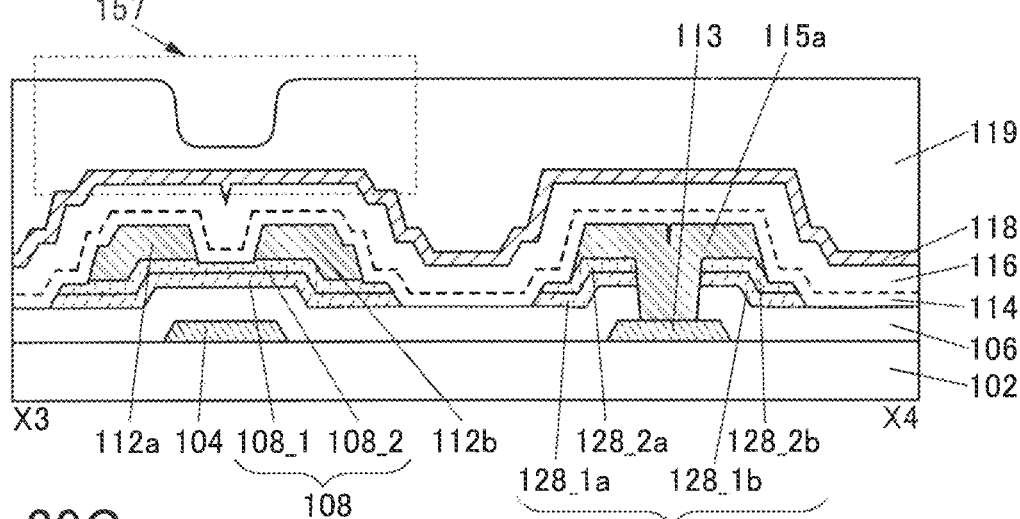
Figure 39C:
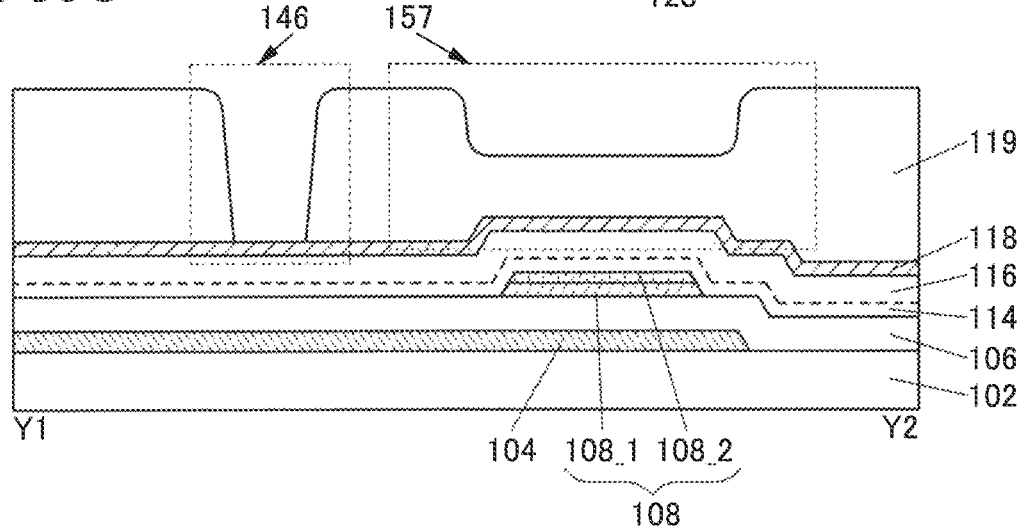

Next, through a fourth lithography process, the insulating film 119 is formed over the insulating film 118 (see FIGS. 39A to 39C). The insulating film 119 has the opening 242 in a region overlapping with the conductive film 212b. The insulating film 119 has a region 157 with a small thickness in a region overlapping with the conductive film 104 and the metal oxide film 108. The region 157 can also be referred to as a depressed portion. The insulating film 119 has the opening 146 in a region not overlapping with the metal oxide film 108 but with the conductive film 104. In this embodiment, light exposure using a multi-tone (high-tone) mask is performed for forming the insulating film 119. When the multi-tone (high-tone) mask is used, the insulating film 119 having regions with different thicknesses can be formed.

The insulating film 119 can be formed in the following manner: a photosensitive resin is applied to the insulating film 118 and then light exposure and development are performed. Alternatively, the insulating film 119 can be formed in the following manner a non-photosensitive resin is applied to the insulating film 118 and baked; a resist mask is formed; and the baked non-photosensitive resin is etched with the use of the resist mask.

Figure 40A:
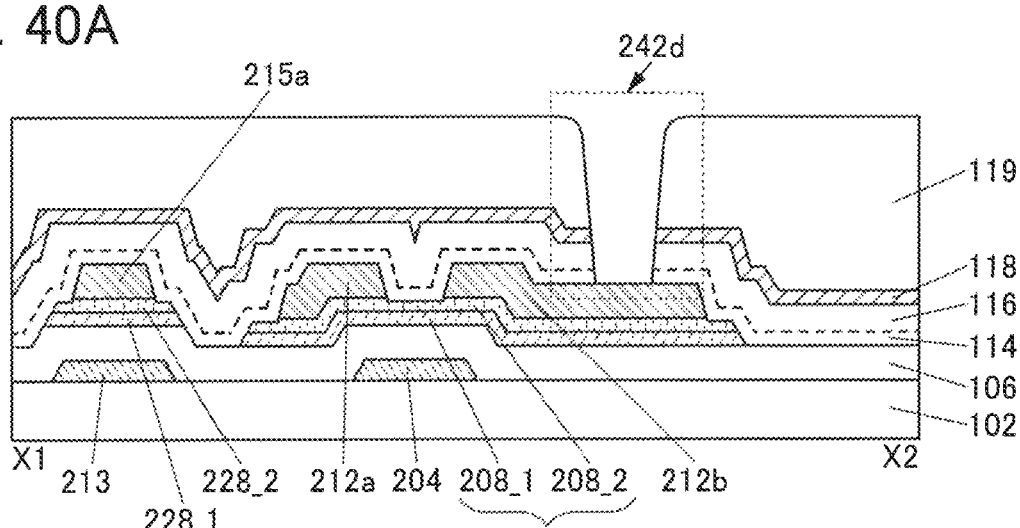
FIGS. 40A to 40C are cross-sectional views illustrating a method for manufacturing a display device.
Figure 40B:
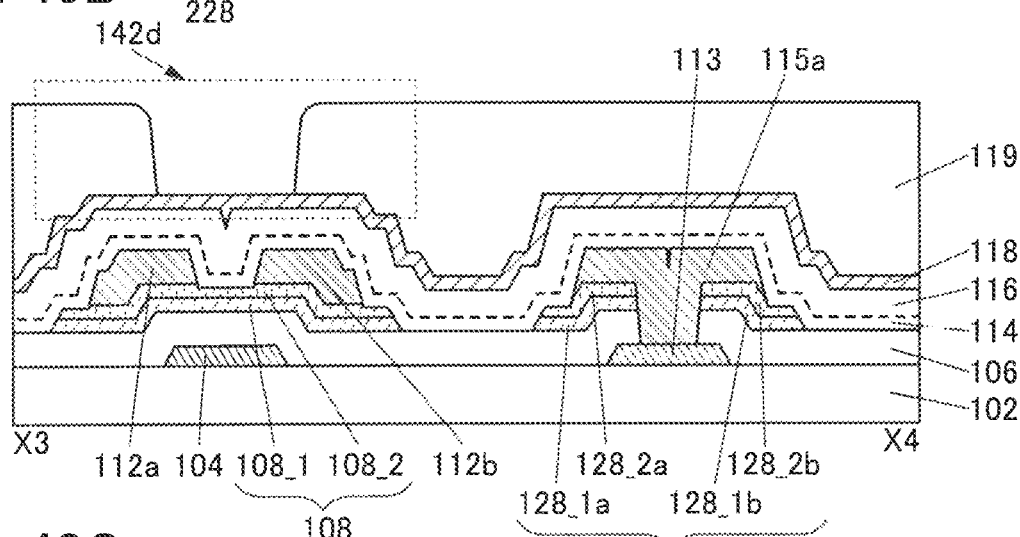
Figure 40C:
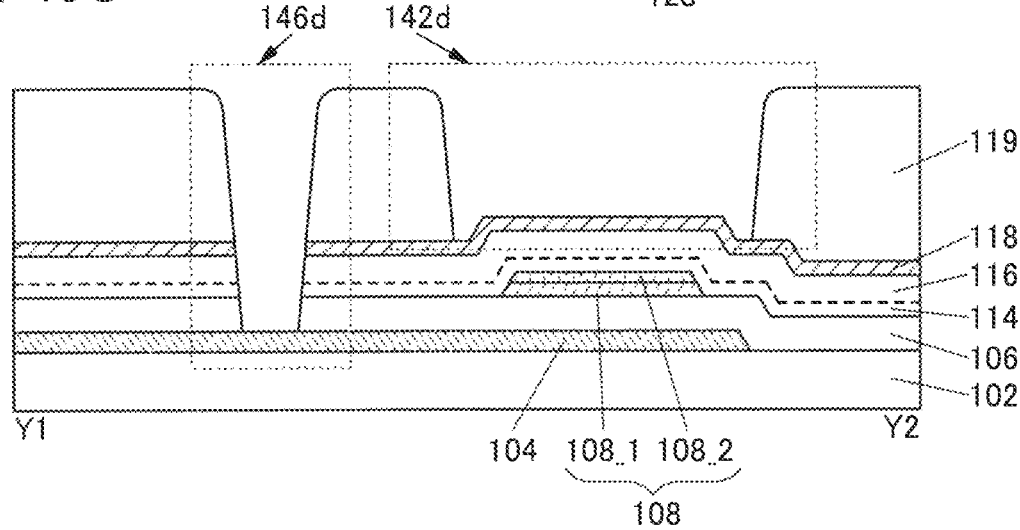
Figure 41A:
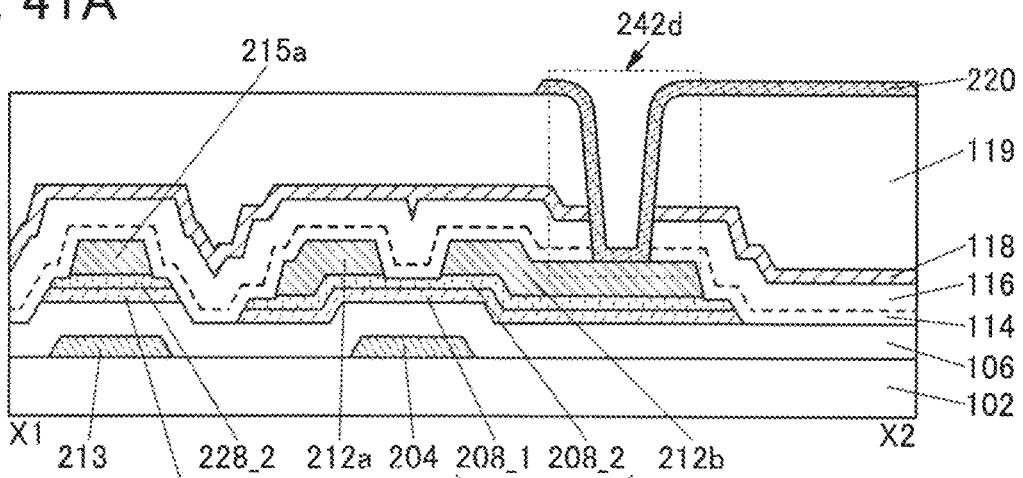
FIGS. 41A to 41C are cross-sectional views illustrating a method for manufacturing a display device.
Figure 41B:
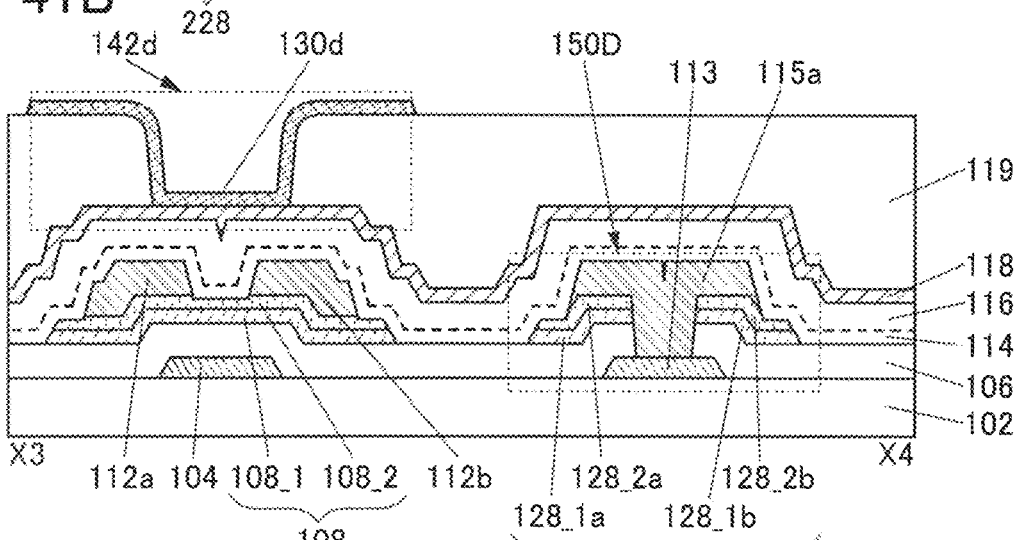
Figure 41C:
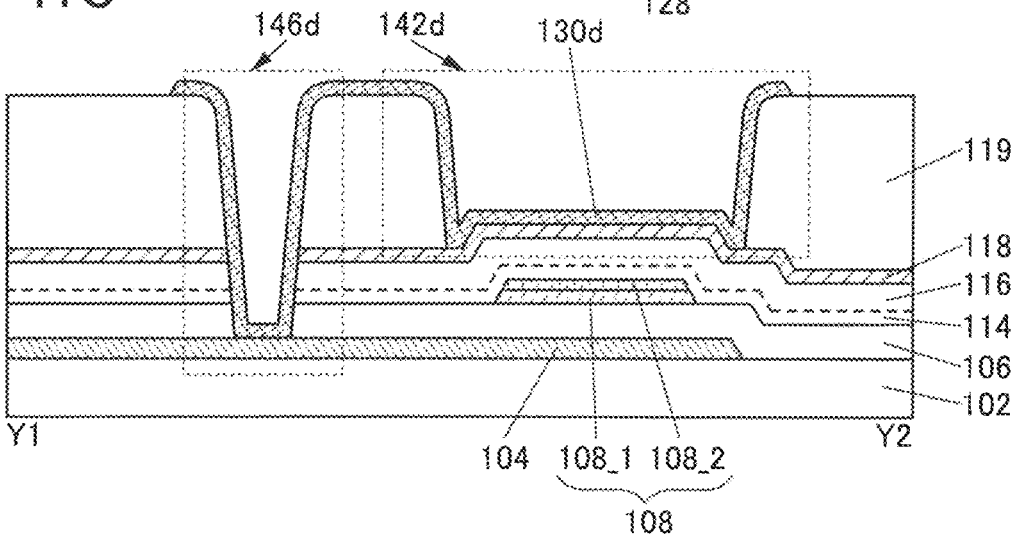

After that, the insulating films 106, 114, 116, and 118 are partly removed using the insulating film 119 as a mask (see FIGS. 40A to 40C). The insulating films 114, 116, and 118 in a region overlapping with the opening 242 are removed so that the conductive film 212b is exposed to form the opening 242d. The insulating films 106, 114, 116, and 118 in a region overlapping with the opening 146 are removed so that the conductive film 104 is exposed to form the opening 146d. The insulating film 119 is partly removed at the same time as the insulating films 106, 114, 116, and 118. The insulating film 119 in the region 157 is removed so that the insulating film 118 is exposed to form the opening 142d.

The openings 242d, 142d, and 146d can be formed by dry etching or wet etching. Dry etching and wet etching may be used in combination.

In forming the openings 242d, 142d, and 146d, the etching rates of the insulating films 106, 114, 116, and 118 are preferably high and the etching rates of the conductive films 212b, 113, and 115a are preferably low.

During the formation of the openings 242d, 142d, and 146d, the thickness of the insulating film 119 is reduced in some cases. The insulating film 119 can be formed to have a thickness larger by the reduced thickness.

The insulating film 119 in the region 157 may be removed by ashing. In some cases, the thickness of the insulating film 119 is reduced by ashing at the same time as the area of the insulating film 119. The insulating film 119 can be formed to have a thickness larger by the reduced thickness.

Next, a conductive film is formed over the insulating film 119 and the openings 242a, 142d, and 146d. The conductive film is processed into desired shapes to form the conductive films 220 and 130d (see FIGS. 41A to 41C). This process of forming the conductive films 220 and 130d is a fifth lithography process.

A light-transmitting conductive film can be used for the conductive films 220 and 130d. The light-transmitting conductive film can be formed using a conductive material such as indium tin oxide, an indium zinc oxide, an indium oxide containing tungsten oxide, an indium zinc oxide containing tungsten oxide, an indium oxide containing titanium oxide, an indium tin oxide containing titanium oxide, or an indium tin oxide containing silicon oxide.

In the case where the conductive films 220 and 130d are formed using an In—Ga—Zn metal oxide target (In:Ga:Zn=4:2:4.1 [atomic ratio]), either or both of hydrogen and nitrogen contained in the insulating film 118 might enter the conductive films 220 and 130d. In that case, either or both of hydrogen and nitrogen are bonded to oxygen vacancies in the conductive films 220 and 130d to cause a reduction in the resistance of the conductive films 220 and 130d. Accordingly, the conductive films 220 and 130d with low resistance can be formed. Note that the conductive film with low resistance is an oxide conductor film.

The conductive films 220 and 130d can be formed with a sputtering apparatus. When the conductive films 220 and 130d are formed, plasma discharge is performed in an atmosphere containing an oxygen gas. At this time, oxygen is added to the insulating film 118 over which the conductive films 220 and 130d are to be formed. When the conductive films 220 and 130d are formed, an inert gas (e.g., a helium gas, an argon gas, or a xenon gas) and the oxygen gas may be mixed.

The oxygen gas is mixed at least when the conductive films 220 and 130d are formed. The proportion of the oxygen gas in a deposition gas for forming the conductive films 220 and 130d is higher than 0% and lower than or equal to 100%, preferably higher than or equal to 10% and lower than or equal to 100%, further preferably higher than or equal to 30% and lower than or equal to 100%.

In this embodiment, the conductive films 220 and 130d are formed by a sputtering method using an In—Ga—Zn metal oxide target (In:Ga:Zn=4:2:4.1 [atomic ratio]). Alternatively, the conductive films 220 and 130d may be formed by a sputtering method using an ITO target and an oxygen gas (100%) as a deposition gas.

Note that although oxygen is added to the insulating film 116 when the conductive films 220 and 130d are formed in this embodiment, the method for adding oxygen is not limited to this example. For example, oxygen may be further added to the insulating film 116 after the conductive films 220 and 130d are formed.

As the method for adding oxygen to the insulating film 116, an ITSO film with a thickness of 5 nm may be formed using a target of an oxide including indium, tin, and silicon (an In—Sn—Si oxide, also referred to as ITSO) ($In_2O_3$:$SnO_2$:$SiO_2$=85:10:5 in wt %), for example. In that case, the thickness of the ITSO film is preferably greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating film 116 through the ITSO film. Oxygen can be added by, for example, ion doping, ion implantation, or plasma treatment. By application of a bias voltage to the substrate side when oxygen is added, oxygen can be effectively added to the insulating film 116. An ashing apparatus is used, for example, and the power density of the bias voltage applied to the substrate side of the ashing apparatus can be greater than or equal to 1 W/cm$^2$ and less than or equal to 5 W/cm$^2$. The substrate temperature during addition of oxygen is higher than or equal to room temperature and lower than or equal to 300° C., preferably higher than or equal to 100° C. and lower than or equal to 250° C., whereby oxygen can be added efficiently to the insulating film 116.

In this embodiment, the conductive films 220 and 130d are formed by wet etching. Dry etching may be used to form the conductive films 220 and 130d.

As described above, the display device illustrated in FIGS. 6A to 6C can be manufactured through five lithography processes.

In one embodiment of the present invention, a display device can be manufactured through only five lithography processes. A reduction in the number of lithography processes can reduce a pattern arrangement margin and enables miniaturization of a transistor and an increase in the definition of the display device. Furthermore, a reduction in the number of lithography processes leads to a simple process flow and an improved yield. A reduction in the number of lithography processes can also reduce the cost for masks. Since the conductive film 113 functioning as the first wiring and the conductive film 115d functioning as the second wiring are directly connected to each other in the connection portion, a favorable contact can be obtained and contact resistance can be reduced.

<Method 5 for Manufacturing Display Device>

A method for manufacturing the transistor 100E, the transistor 200E, the capacitor 250E, and the connection portion 150E included in the display device of one embodiment of the present invention illustrated in FIGS. 8A to 8C will be described with reference to FIGS. 42A to 42C to FIGS. 44A to 44C. In the method for manufacturing the display device illustrated in FIGS. 8A to 8C, the insulating film 118 and components below the insulating film 118 are formed in a similar manner to the display device illustrated in FIGS. 6A to 6C.

Figure 42A:
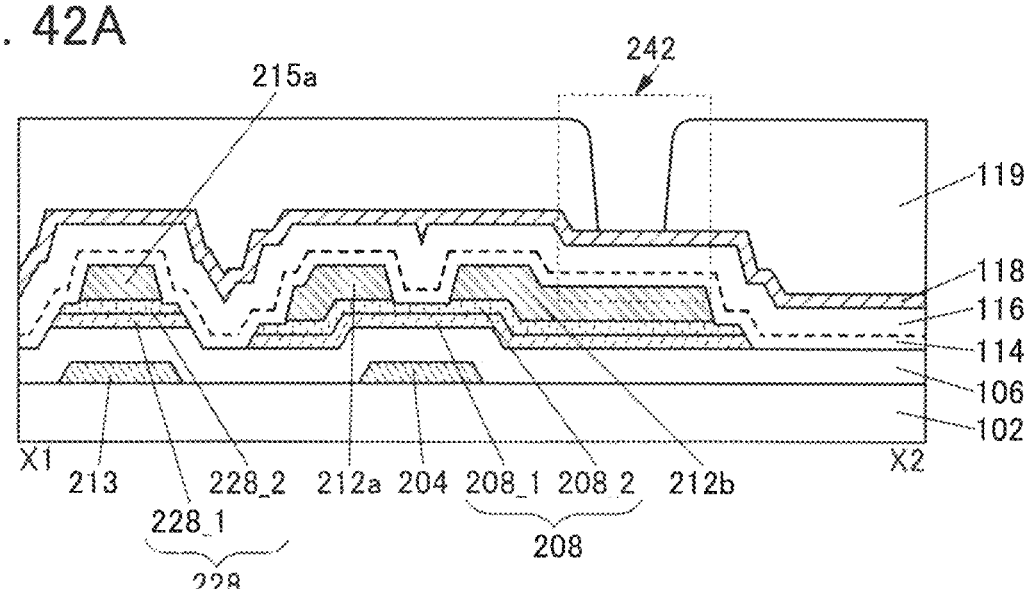
FIGS. 42A to 42C are cross-sectional views illustrating a method for manufacturing a display device.
Figure 42B:
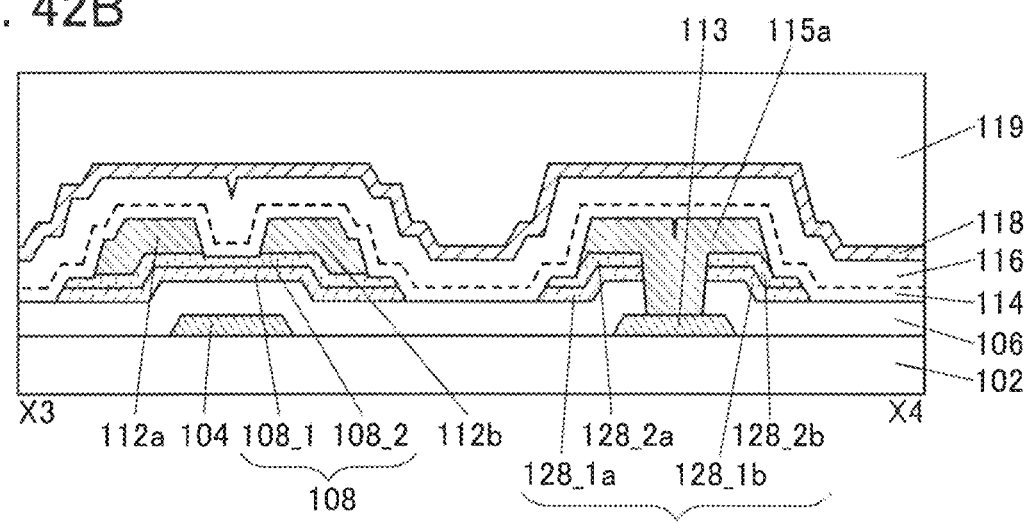
Figure 42C:
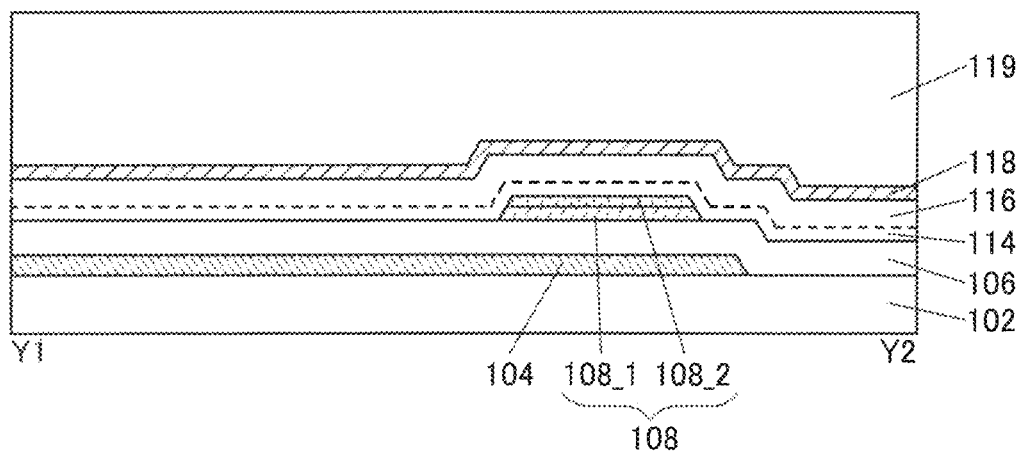

Then, through a fourth lithography process, the insulating film 119 is formed over the insulating film 118 (see FIGS. 42A to 42C). The insulating film 119 has the opening 242 in a region overlapping with the conductive film 212b.

The insulating film 119 can be formed in the following manner: a photosensitive resin is applied to the insulating film 118 and then light exposure and development are performed. Alternatively, the insulating film 119 can be formed in the following manner a non-photosensitive resin is applied to the insulating film 118 and baked; a resist mask is formed; and the baked non-photosensitive resin is etched with the use of the resist mask.

Figure 43A:
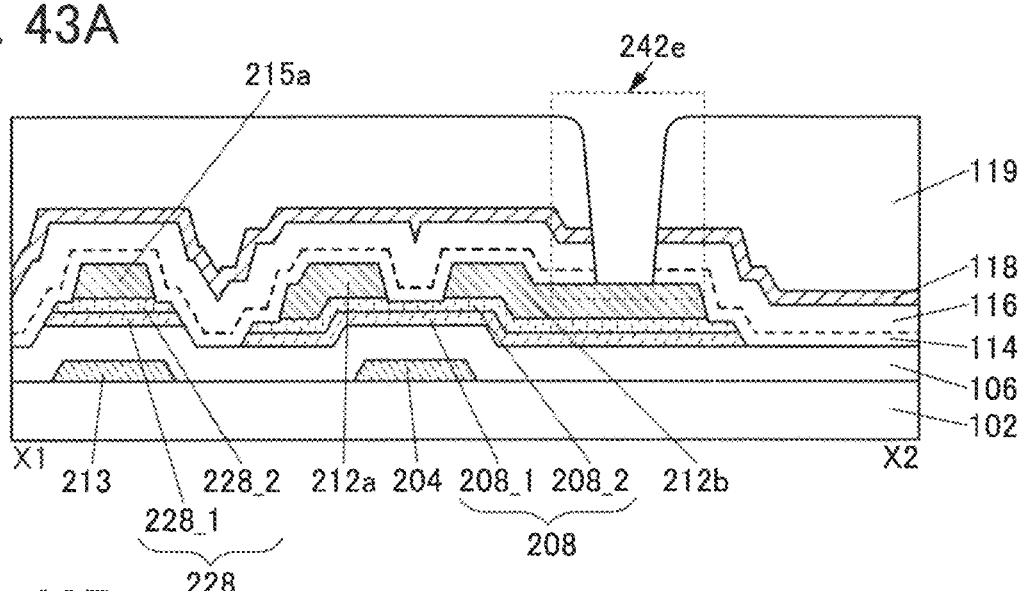
FIGS. 43A to 43C are cross-sectional views illustrating a method for manufacturing a display device.
Figure 43B:
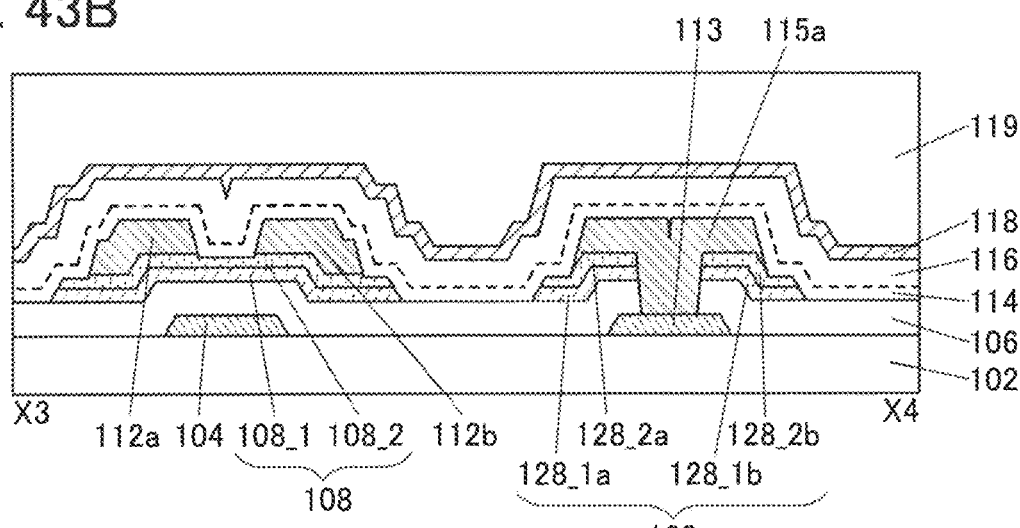
Figure 43C:
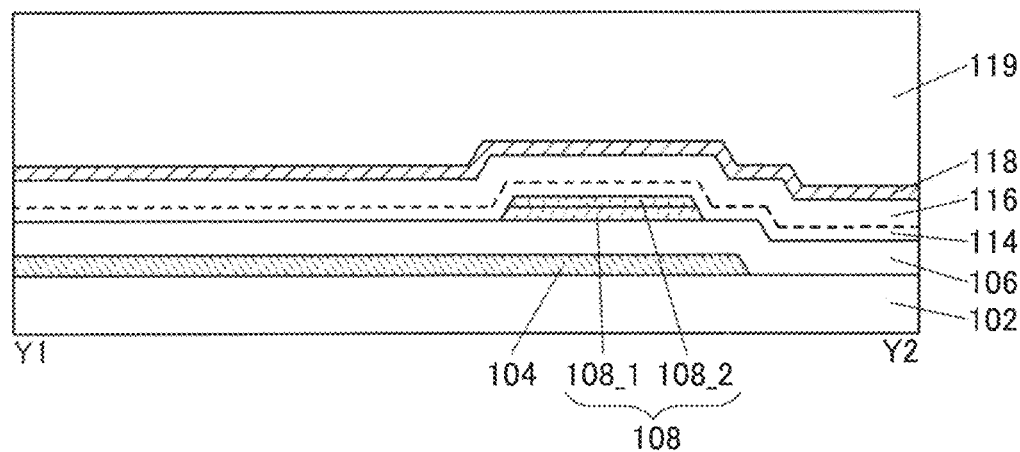
Figure 44A:
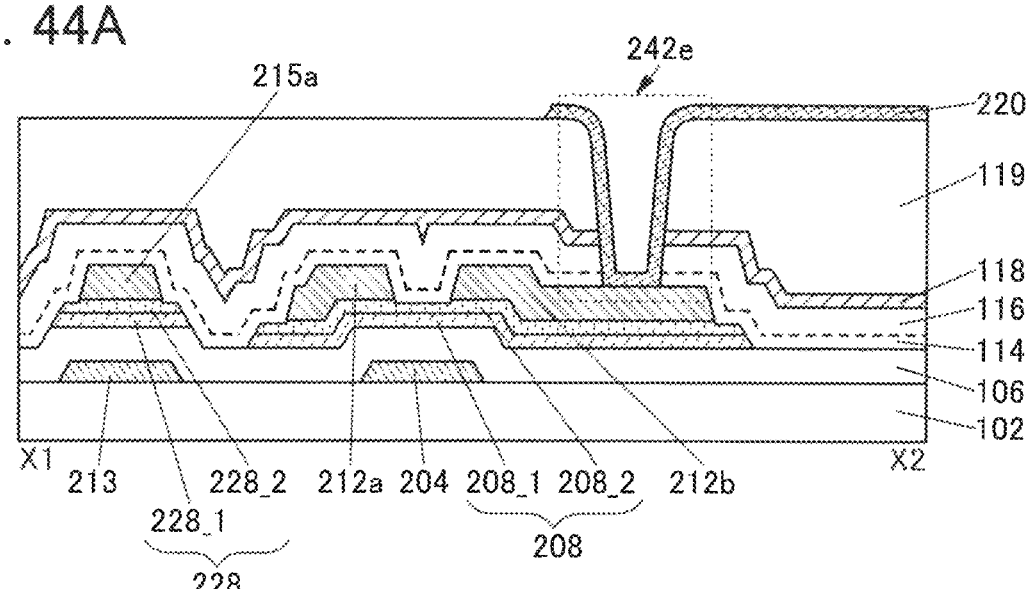
FIGS. 44A to 44C are cross-sectional views illustrating a method for manufacturing a display device.
Figure 44B:
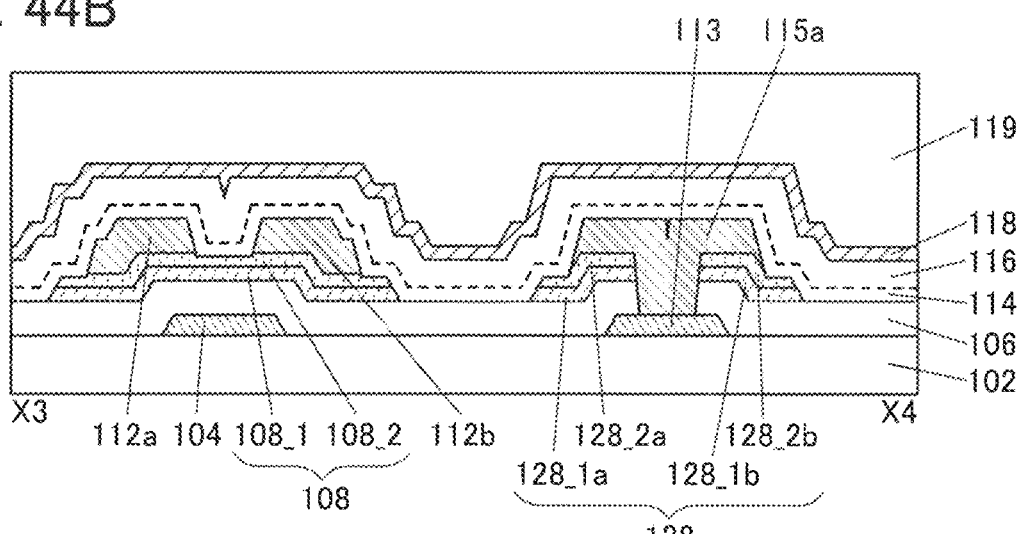
Figure 44C:
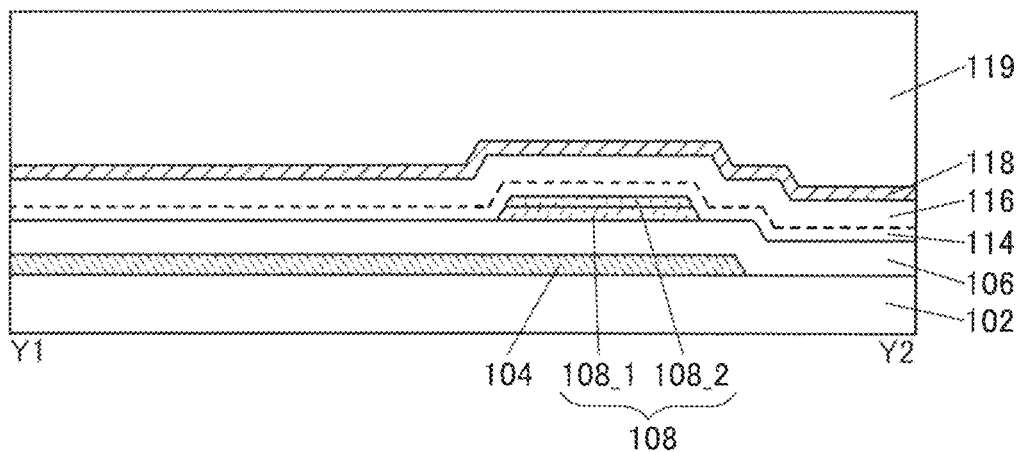

Then, the insulating films 114, 116, and 118 are partly removed using the insulating film 119 as a mask (see FIGS. 43A to 43C). The insulating films 114, 116, and 118 in a region overlapping with the opening 242 are removed so that the conductive film 212b is exposed to form the opening 242e.

The opening 242e can be formed by dry etching or wet etching. Dry etching and wet etching may be used in combination.

In forming the opening 242e, the etching rates of the insulating films 114, 116, and 118 are preferably high and the etching rate of the conductive film 212b is preferably low. Furthermore, the etching rate of the insulating film 119 is preferably low.

During the formation of the opening 242e, the thickness of the insulating film 119 is reduced in some cases. The insulating film 119 can be formed to have a thickness larger by the reduced thickness.

Next, a conductive film is formed over the insulating film 119 and the opening 242e. The conductive film is processed into a desired shape to form the conductive film 220 (see FIGS. 44A to 44C). This process of forming the conductive film 220 is a fifth lithography process.

A light-transmitting conductive film can be used for the conductive film 220. The light-transmitting conductive film can be formed using a conductive material such as indium tin oxide, an indium zinc oxide, an indium oxide containing tungsten oxide, an indium zinc oxide containing tungsten oxide, an indium oxide containing titanium oxide, an indium tin oxide containing titanium oxide, or an indium tin oxide containing silicon oxide.

In this embodiment, the conductive film 220 is formed by wet etching. Dry etching may be used to form the conductive film 220.

As described above, the display device illustrated in FIGS. 8A to 8C can be manufactured through five lithography processes.

In one embodiment of the present invention, a display device can be manufactured through only five lithography processes. A reduction in the number of lithography processes can reduce a pattern arrangement margin and enables miniaturization of a transistor and an increase in the definition of the display device. Furthermore, a reduction in the number of lithography processes leads to a simple process flow and an improved yield. A reduction in the number of lithography processes can also reduce the cost for masks. Since the conductive film 113 functioning as the first wiring and the conductive film 115a functioning as the second wiring are directly connected to each other in the connection portion, a favorable contact can be obtained and contact resistance can be reduced.

At least part of this embodiment can be implemented in combination with any of the other embodiments described in this specification as appropriate.

Embodiment 2

In this embodiment, the metal oxide film of one embodiment of the present invention will be described with reference to FIG. 47, FIG. 48, FIGS. 49A to 49L, and FIGS. 50A to 50C.

<Composition of CAC-OS>

Described below is the detail of a metal oxide having a CAC composition that can be used in the transistor disclosed in one embodiment of the present invention. As a typical example of the metal oxide having a CAC composition, a CAC-OS will be described here.

In the CAC-OS, as illustrated in FIG. 47 for example, elements contained in the metal oxide are unevenly distributed to form the regions 001 and 002 each containing any of the elements as a main component. The regions are mixed to form or to be distributed in a mosaic pattern. In other words, the CAC-OS has a composition in which elements included in a metal oxide are unevenly distributed. Materials including unevenly distributed elements each have a size greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into an indium oxide ($InO_{X1}$, where X1 is a real number greater than 0) or an indium zinc oxide ($In_{X2}Zn_{Y2}O_{Z2}$, where X2, Y2, and Z2 are real numbers greater than 0), and a gallium oxide ($GaO_{X3}$, where X3 is a real number greater than 0) or a gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different oxygen gas flow rate percentages in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate percentage) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 48:
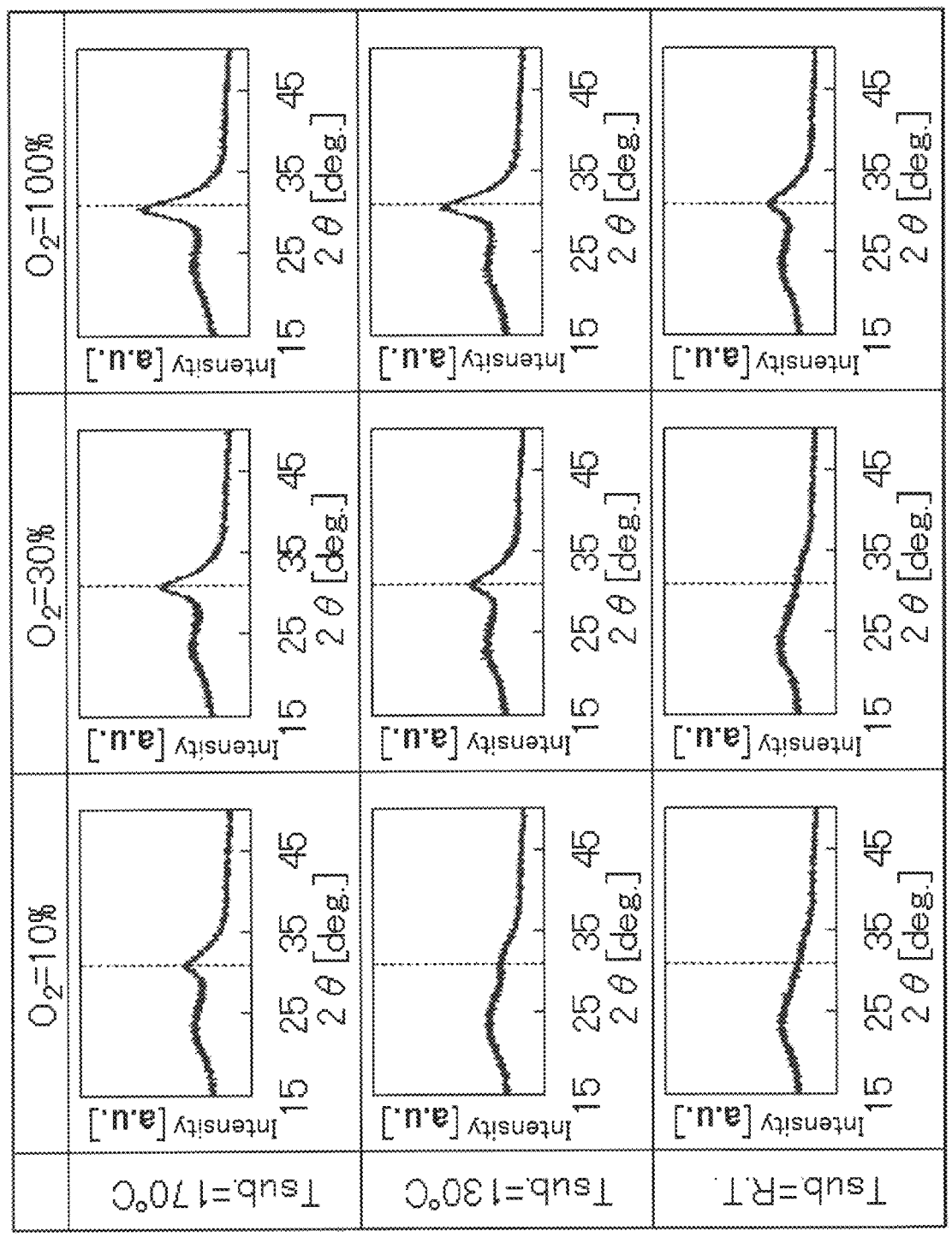
FIG. 48 shows measured XRD spectra of samples.

FIG. 48 shows XRD spectra measured by an out-of-plane method. In FIG. 48, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate percentage of 10%; the middle column shows the measurement results of the samples formed with an oxygen gas flow rate percentage of 30%; the right column shows the measurement results of the samples formed with an oxygen gas flow rate percentage of 100%.

In the XRD spectra shown in FIG. 48, the higher the substrate temperature at the time of formation is or the higher the oxygen gas flow rate percentage at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or the top surface of the crystalline IGZO compound (such a compound is also referred to as c-axis aligned crystalline (CAAC) IGZO).

As shown in the XRD spectra in FIG. 48, as the substrate temperature at the time of formation is lower or the oxygen gas flow rate percentage at the time of formation is lower, a peak becomes less clear. Accordingly, it is found that there are no alignment in the a-b plane direction and c-axis direction in the measured areas of the samples that are formed at a lower substrate temperature or with a lower oxygen gas flow rate percentage.

<<Analysis with Electron Microscope>>

This section describes the observation and analysis results of the samples formed at a substrate temperature of R.T. and with an oxygen gas flow rate percentage of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 49A is a plan-view TEM image of the sample formed at a substrate temperature of R.T. and with an oxygen gas flow rate percentage of 10%. FIG. 49B is a cross-sectional TEM image of the sample formed at a substrate temperature of R.T. and with an oxygen gas flow rate percentage of 10%.

<<Analysis of Electron Diffraction Patterns>>

This section describes electron diffraction patterns obtained by irradiation of the sample formed at a substrate temperature of R.T. and an oxygen gas flow rate percentage of 10% with an electron beam with a probe diameter of 1 nm (also referred to as a nanobeam).

Electron diffraction patterns of points indicated by black dots a1, a2, a3, a4, and a5 in the plan-view TEM image in FIG. 49A of the sample formed at a substrate temperature of R.T. and an oxygen gas flow rate percentage of 10% are observed. Note that the electron diffraction patterns are observed while electron beam irradiation is performed at a constant rate for 35 seconds. FIGS. 49C, 49D, 49E, 49F, and 49G show the results of the points indicated by the black dots a1, a2, a3, a4, and a5, respectively.

In FIGS. 49C, 49D, 49E, 49F, and 49G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 49B of the sample formed at a substrate temperature of R.T. and an oxygen gas flow rate percentage of 10% are observed. FIGS. 49H, 49I, 49J, 49K, and 49L show the results of the points indicated by the black dots b1, b2, b3, b4, and b5, respectively.

In FIGS. 49H, 49I, 49J, 49K, and 49L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot assigned to the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate percentage of 10% has regions with high luminance in a ring pattern and a plurality of bright spots appear in the ring-like pattern. Accordingly, the sample formed at a substrate temperature of R.T. and with an oxygen gas flow rate percentage of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate percentage is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate percentage of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 50A:
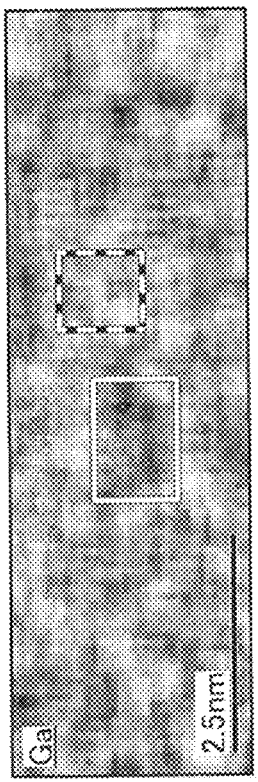
FIGS. 50A to 50C show EDX mapping images of a sample.
Figure 50B:
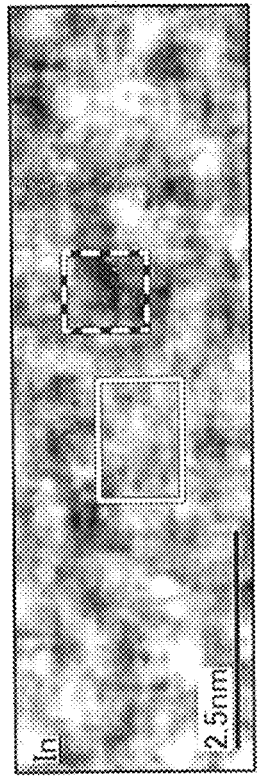
Figure 50C:
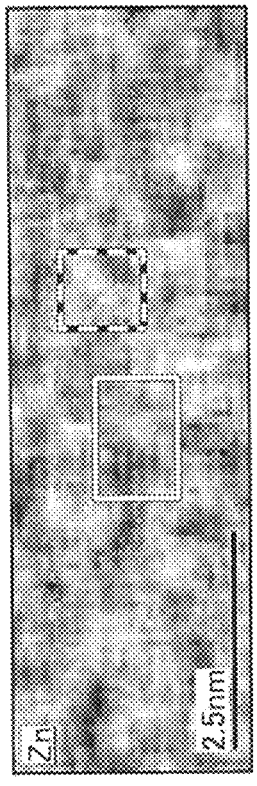

FIGS. 50A to 50C show EDX mapping images in a cross section of the sample formed at a substrate temperature of R.T. and with an oxygen gas flow rate percentage of 10%. FIG. 50A shows an EDX mapping image of Ga atoms. The proportion of the Ga atoms in all the atoms is 1.18 atomic % to 18.64 atomic %. FIG. 50B shows an EDX mapping image of In atoms. The proportion of the In atoms in all the atoms is 9.28 atomic % to 33.74 atomic %. FIG. 50C shows an EDX mapping image of Zn atoms. The proportion of the Zn atoms in all the atoms is 6.69 atomic % to 24.99 atomic %. FIGS. 50A to 50C show the same region in the cross section of the sample formed at a substrate temperature of R.T. and with an oxygen gas flow rate percentage of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 50A to 50C is 7200000 times.

The EDX mapping images in FIGS. 50A to 50C show relative distribution of brightness indicating that each element has a distribution in the sample formed at a substrate temperature of R.T. and with an oxygen gas flow rate percentage of 10%. Areas surrounded by solid lines and areas surrounded by dashed lines in FIGS. 50A to 50C are examined.

In FIG. 50A, a relatively dark region occupies a large area in the area surrounded by the solid line, while a relatively bright region occupies a large area in the area surrounded by the dashed line. In FIG. 50B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 50C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 50C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 50A to 50C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 50A to 50C, each of the regions including $GaO_{X3}$ or the like as a main component and the regions including $In_{X2}Zn_{Y2}O_{Z2}$ or $InO_{X1}$ as a main component has a size greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be inhibited and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has a high reliability. Thus, the CAC-OS is suitably used in a variety of semiconductor devices typified by a display.

At least part of this embodiment can be implemented in combination with any of the other embodiments described in this specification as appropriate.

<Transistor Including Metal Oxide Film>

Next, a transistor including a metal oxide film will be described.

With the use of the metal oxide film in a transistor, the transistor can have high carrier mobility and high switching characteristics. Moreover, the transistor can have high reliability.

A metal oxide film with a low carrier density is preferably used in a transistor. For example, the carrier density of the metal oxide film is lower than $8 \times 10^{11}/cm^3$, preferably lower than $1 \times 10^{11}/cm^3$, and further preferably lower than $1 \times 10^{10}/cm^3$, and higher than or equal to $1 \times 10^{-9}/cm^3$.

In order to reduce the carrier density of the metal oxide film, the impurity concentration of the metal oxide film is reduced so that the density of defect states can be reduced. In this specification and the like, a state with a low impurity concentration and a low density of defect states is referred to as a highly purified intrinsic or substantially highly purified intrinsic state. A highly purified intrinsic or substantially highly purified intrinsic metal oxide film has few carrier generation sources, and thus can have a low carrier density. A highly purified intrinsic or substantially highly purified intrinsic metal oxide film has a low density of defect states and accordingly has a low density of trap states in some cases.

Charge trapped by the trap states in the metal oxide film takes a long time to be released and may behave like fixed charge. Thus, a transistor in which a channel region is formed in an oxide semiconductor having a high density of trap states might have unstable electrical characteristics.

To obtain stable electrical characteristics of the transistor, it is effective to reduce the impurity concentration of the metal oxide film. In order to reduce the impurity concentration of the metal oxide film, the impurity concentration of a film which is adjacent to the metal oxide film is preferably reduced. As examples of the impurities, hydrogen, nitrogen, alkali metal, alkaline earth metal, iron, nickel, silicon, and the like are given.

Here, the influence of impurities in the metal oxide film is described.

When silicon or carbon that is one of Group 14 elements is contained in the metal oxide film, defect states are formed in an oxide semiconductor. Thus, the concentration of silicon or carbon in the oxide semiconductor and around an interface with the oxide semiconductor (measured by secondary ion mass spectrometry, SIMS) is set lower than or equal to $2 \times 10^{18}$ atoms/cm$^3$, and preferably lower than or equal to $2 \times 10^{17}$ atoms/cm$^3$.

When the metal oxide film contains alkali metal or alkaline earth metal, defect states are formed and carriers are generated, in some cases. Thus, a transistor including a metal oxide film that contains alkali metal or alkaline earth metal is likely to be normally on. Therefore, it is preferable to reduce the concentration of alkali metal or alkaline earth metal in the metal oxide film Specifically, the concentration of alkali metal or alkaline earth metal in the metal oxide film measured by SIMS is set lower than or equal to $1 \times 10^{18}$ atoms/cm$^3$, and preferably lower than or equal to $2 \times 10^{16}$ atoms/cm$^3$.

When the metal oxide film contains nitrogen, the metal oxide film easily becomes n-type by generation of electrons serving as carriers and an increase of carrier density. Thus, a transistor whose semiconductor includes an oxide semiconductor that contains nitrogen is likely to be normally on. For this reason, nitrogen in the oxide semiconductor is preferably reduced as much as possible; the nitrogen concentration measured by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in the metal oxide film reacts with oxygen bonded to a metal atom to be water, and thus causes an oxygen vacancy ($V_O$), in some cases. Due to entry of hydrogen into the oxygen vacancy ($V_O$), an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on. Accordingly, it is preferable that hydrogen in the oxide semiconductor be reduced as much as possible. Specifically, the hydrogen concentration of the oxide semiconductor measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

The oxygen vacancies ($V_O$) in the metal oxide film can be reduced by introduction of oxygen into the metal oxide film. That is, the oxygen vacancies ($V_O$) in the metal oxide film disappear when the oxygen vacancies ($V_O$) are filled with oxygen. Accordingly, diffusion of oxygen in the metal oxide film can reduce the oxygen vacancies ($V_O$) in a transistor and improve the reliability of the transistor.

As a method for introducing oxygen into the metal oxide film, for example, an oxide in which oxygen content is higher than that in the stoichiometric composition is provided in contact with the oxide semiconductor. That is, in the oxide, a region containing oxygen in excess of that in the stoichiometric composition (hereinafter also referred to as an excess oxygen region) is preferably formed. In particular, in the case of using the metal oxide film in a transistor, an oxide including an excess oxygen region is provided in a base film, an interlayer film, or the like in the vicinity of the transistor, whereby oxygen vacancies in the transistor are reduced, and the reliability can be improved.

When a metal oxide film with sufficiently reduced impurity concentration is used for a channel formation region in a transistor, the transistor can have stable electrical characteristics.

At least part of this embodiment can be implemented in combination with any of the other embodiments described in this specification as appropriate.

Embodiment 3

In this embodiment, examples of a display device that includes the transistor described in the above embodiments are described below with reference to FIG. 51 to FIG. 63.

Figure 51:
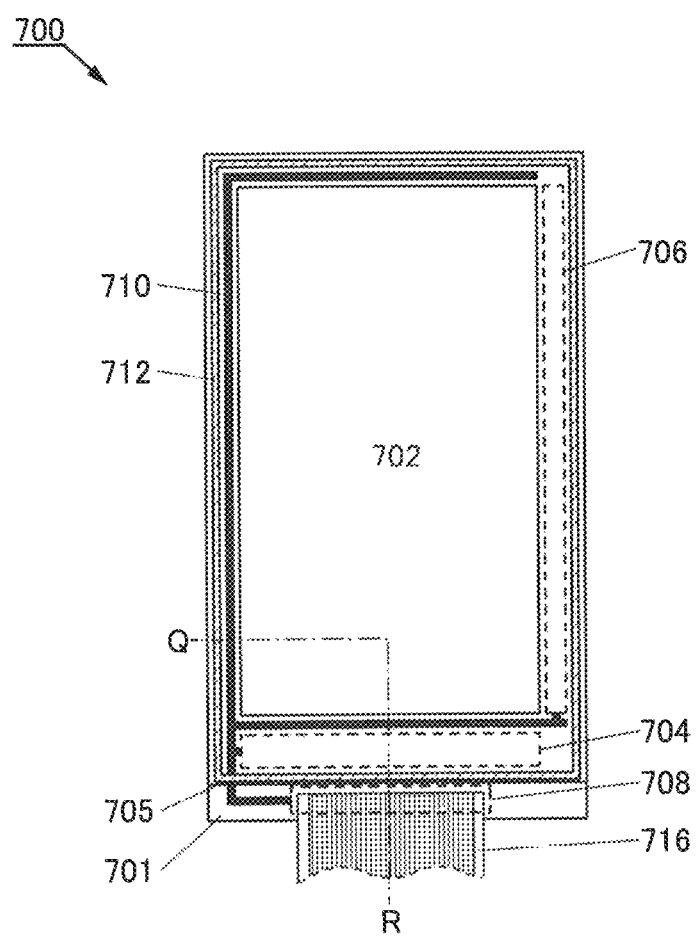
FIG. 51 is a top view illustrating one embodiment of a display device.

FIG. 51 is a top view illustrating an example of a display device. A display device 700 in FIG. 51 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 51, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. As the transistors, any of the transistors that are the semiconductor devices of embodiments of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), or a digital micro shutter (DMS) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of displaying color images are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be inhibited, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 56:
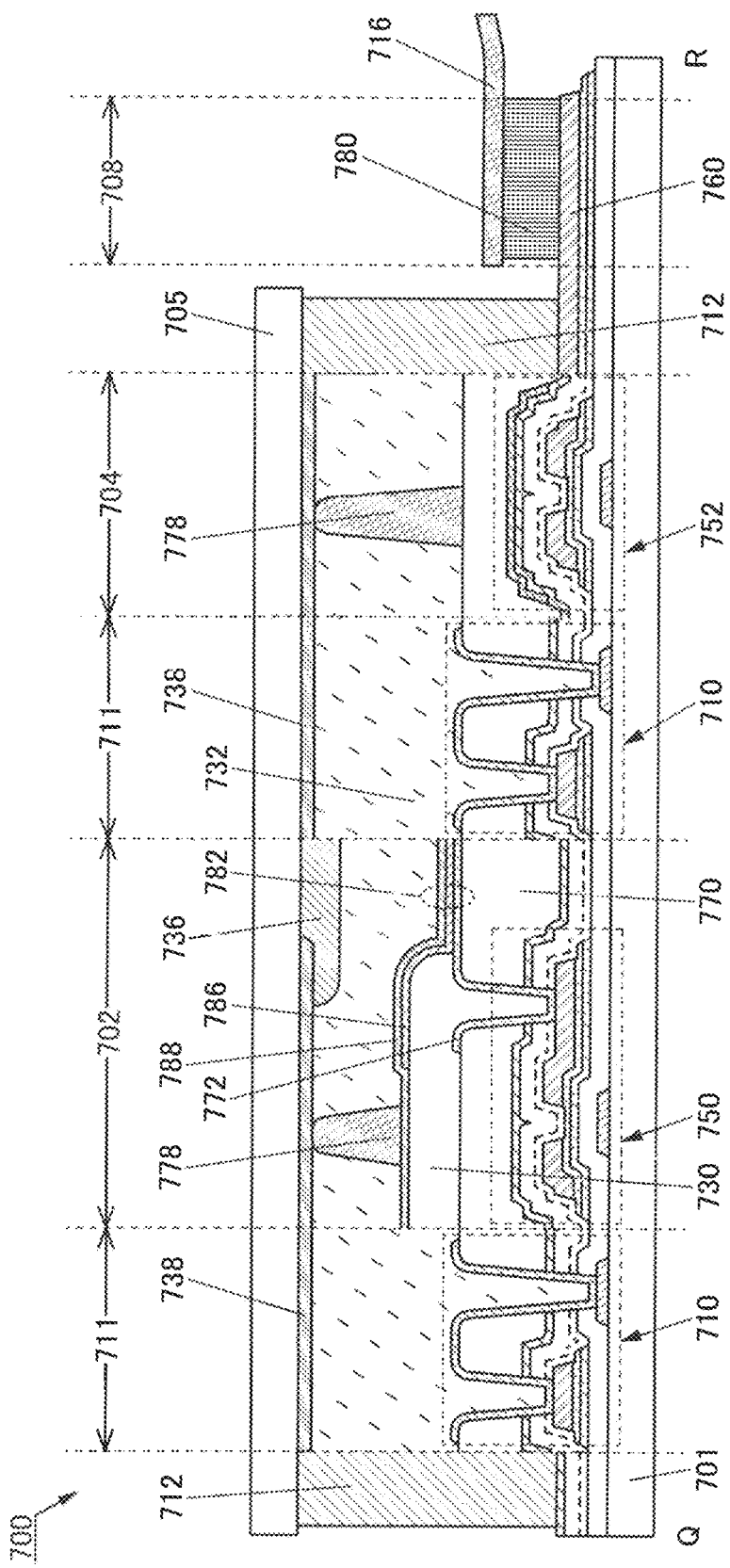
FIG. 56 is a cross-sectional view illustrating one embodiment of a display device.
Figure 57:
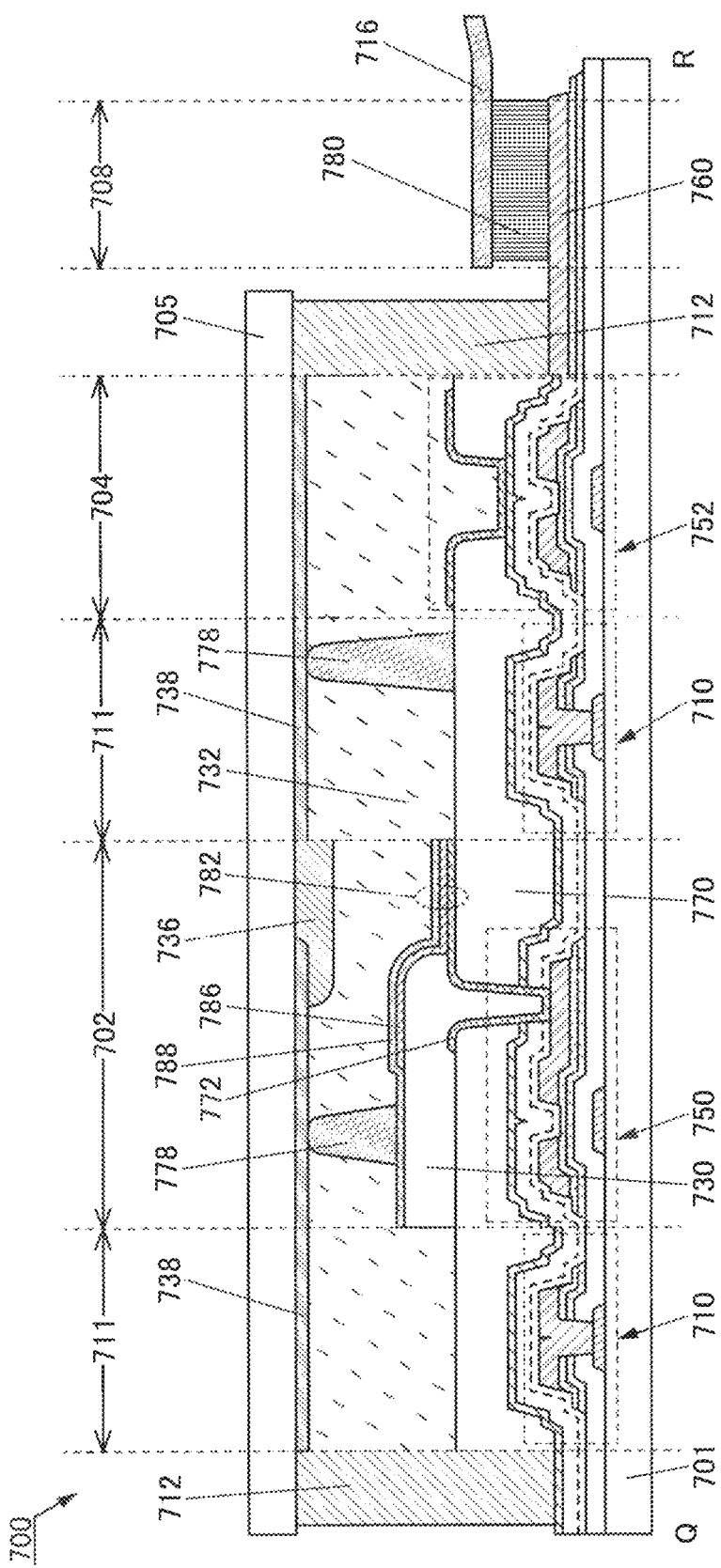
FIG. 57 is a cross-sectional view illustrating one embodiment of a display device.
Figure 58:
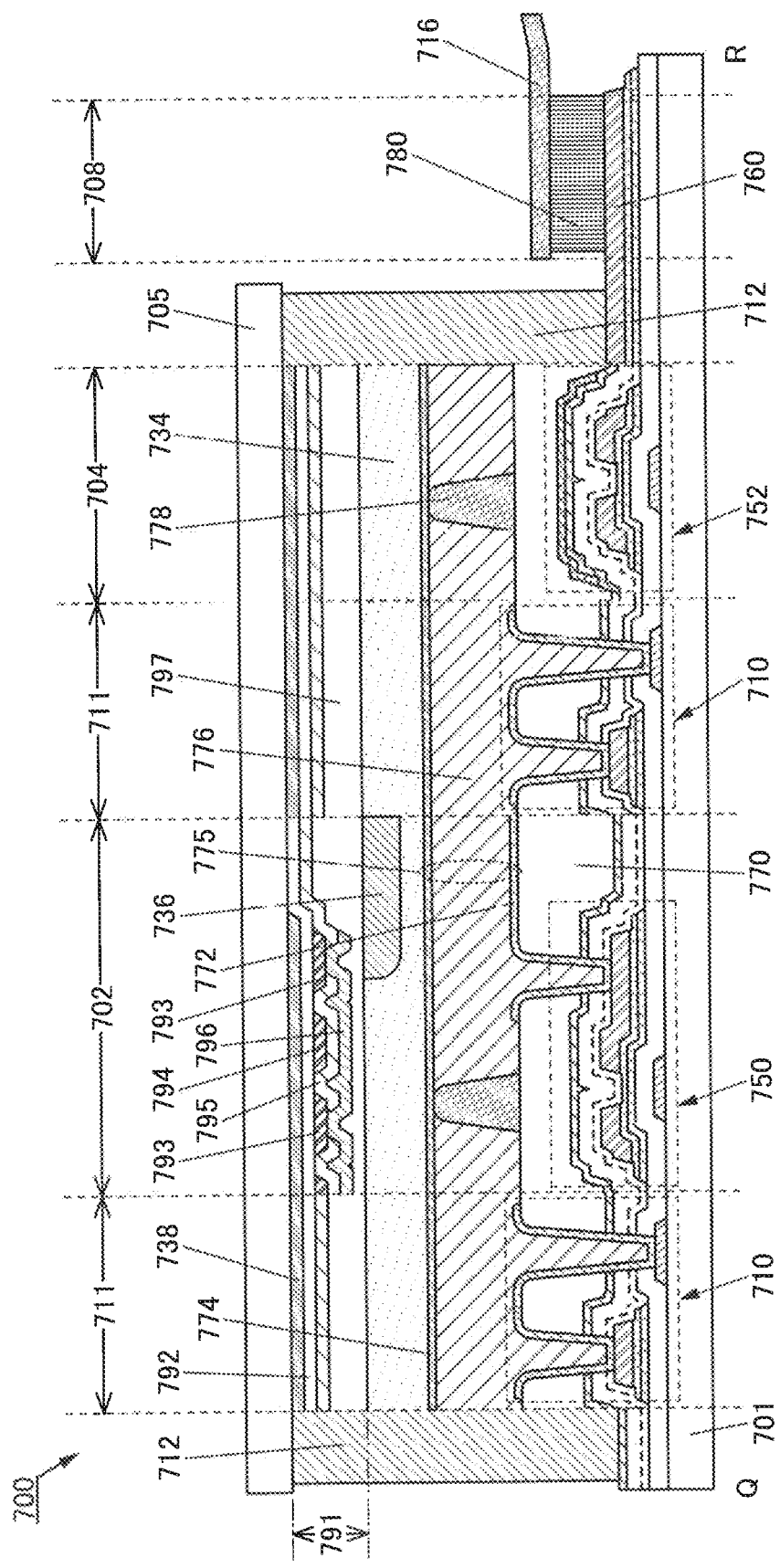
FIG. 58 is a cross-sectional view illustrating one embodiment of a display device.
Figure 59:
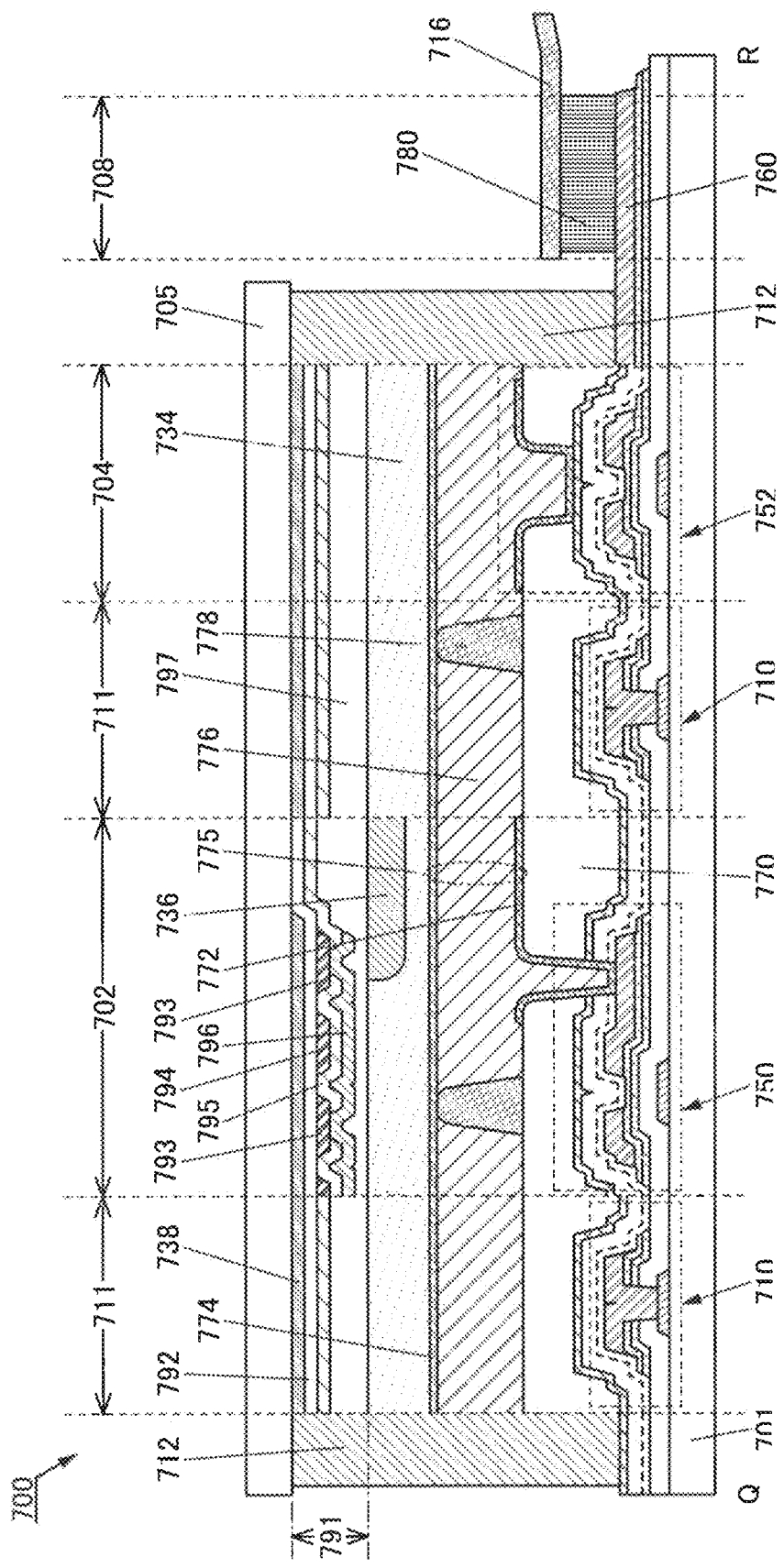
FIG. 59 is a cross-sectional view illustrating one embodiment of a display device.
Figure 60:
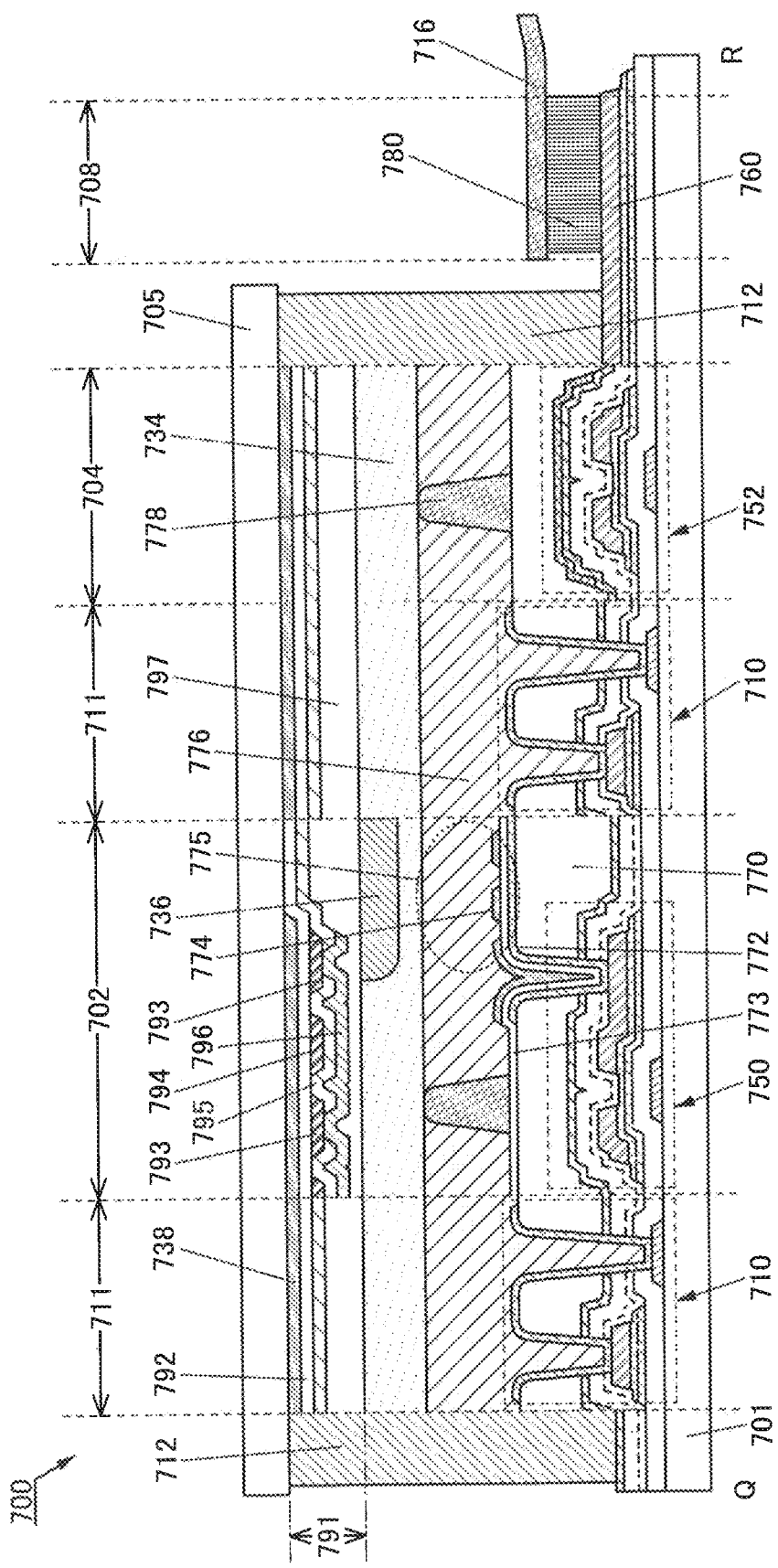
FIG. 60 is a cross-sectional view illustrating one embodiment of a display device.
Figure 61:
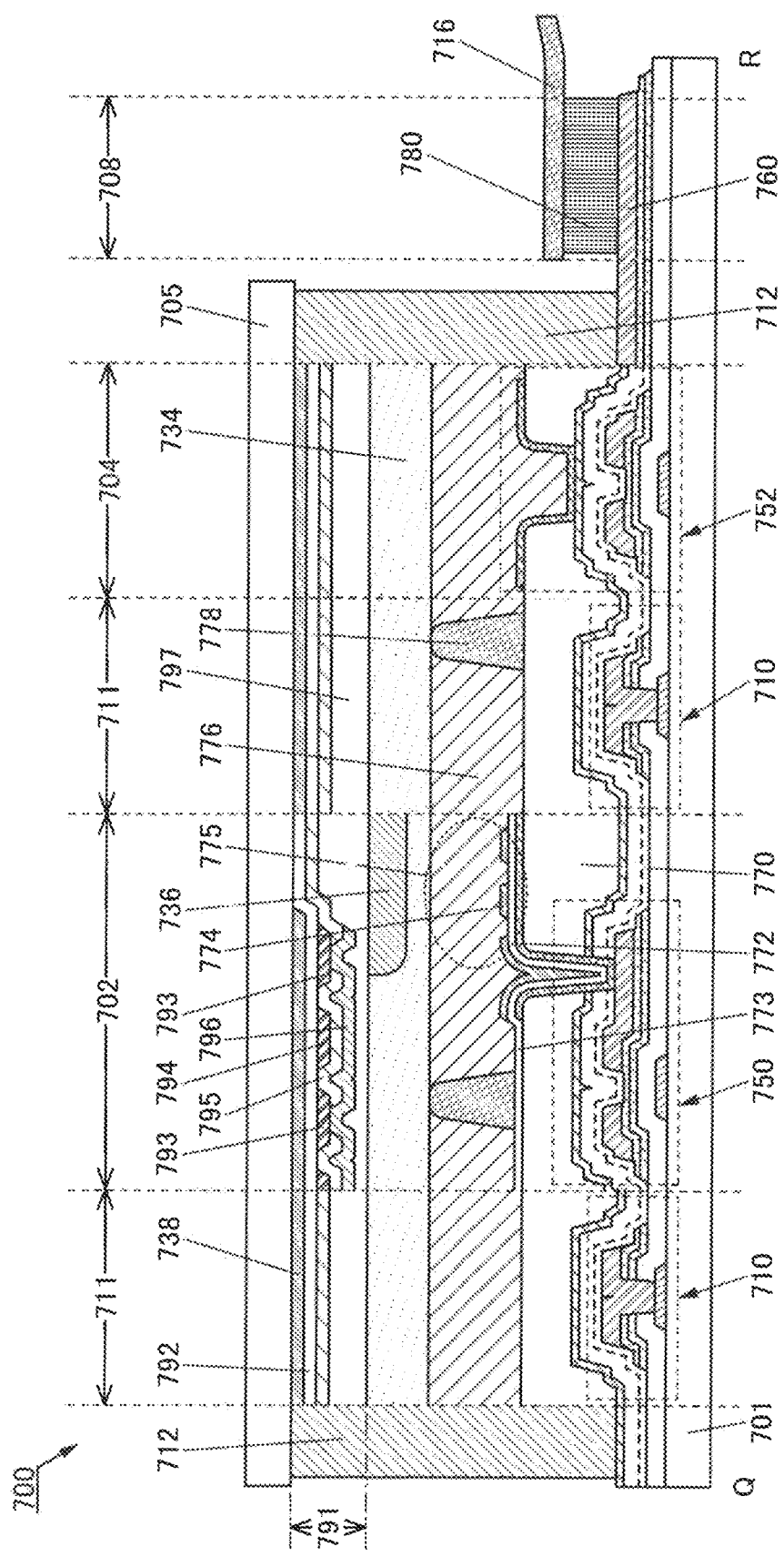
FIG. 61 is a cross-sectional view illustrating one embodiment of a display device.

In this embodiment, a structure including a liquid crystal element as a display element and a structure including an EL element as a display element are described with reference to FIG. 52 to FIG. 57. FIG. 52 to FIG. 55 are each a cross-sectional view taken along dashed-dotted line Q-R in FIG. 51 and each illustrate the structure including a liquid crystal element as a display element. FIG. 56 and FIG. 57 are each a cross-sectional view taken along dashed-dotted line Q-R in FIG. 51 and each illustrate the structure including an EL element as a display element.

Portions common to FIG. 52 to FIG. 57 are described first, and then, different portions are described.

<Portions Common to Display Devices>

The display device 700 in FIG. 52 to FIG. 57 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor (not illustrated). The source driver circuit portion 704 includes a transistor 752.

The transistor 750 has a structure similar to that of the transistor 200A described above. The transistor 752 has a structure similar to that of the transistor 100A described above. The transistor 750 and the transistor 752 may each have the structure of any of the other transistors described in the above embodiments.

The transistor used in this embodiment includes a metal oxide film that is highly purified and in which formation of oxygen vacancies is inhibited. The off-state current of the transistor can be low. Accordingly, an electrical signal such as an image signal can be held for a long time, and a long writing interval can be set in an on state. Accordingly, the frequency of refresh operation can be reduced, which reduces power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

Although FIG. 52 to FIG. 57 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and the inverted staggered transistor described in Embodiment 1 is used in the source driver circuit portion 704, or a structure in which the inverted staggered transistor described in Embodiment 1 is used in the pixel portion 702 and a staggered transistor is used in the source driver circuit portion 704 may be employed. Note that the term "source driver circuit portion 704" can be replaced by the term "gate driver circuit portion."

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables images to be displayed on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Including Liquid Crystal Element>

Figure 52:
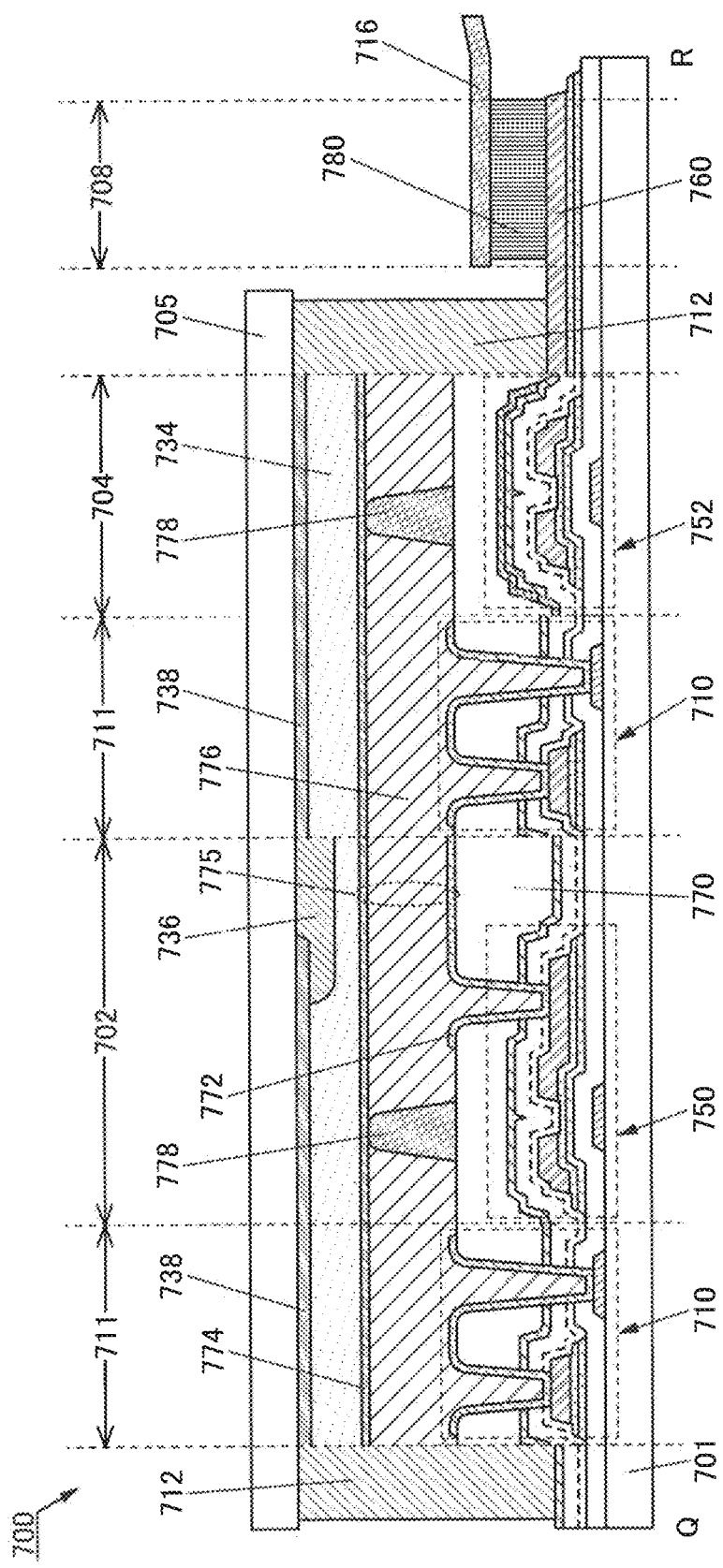
FIG. 52 is a cross-sectional view illustrating one embodiment of a display device.
Figure 53:
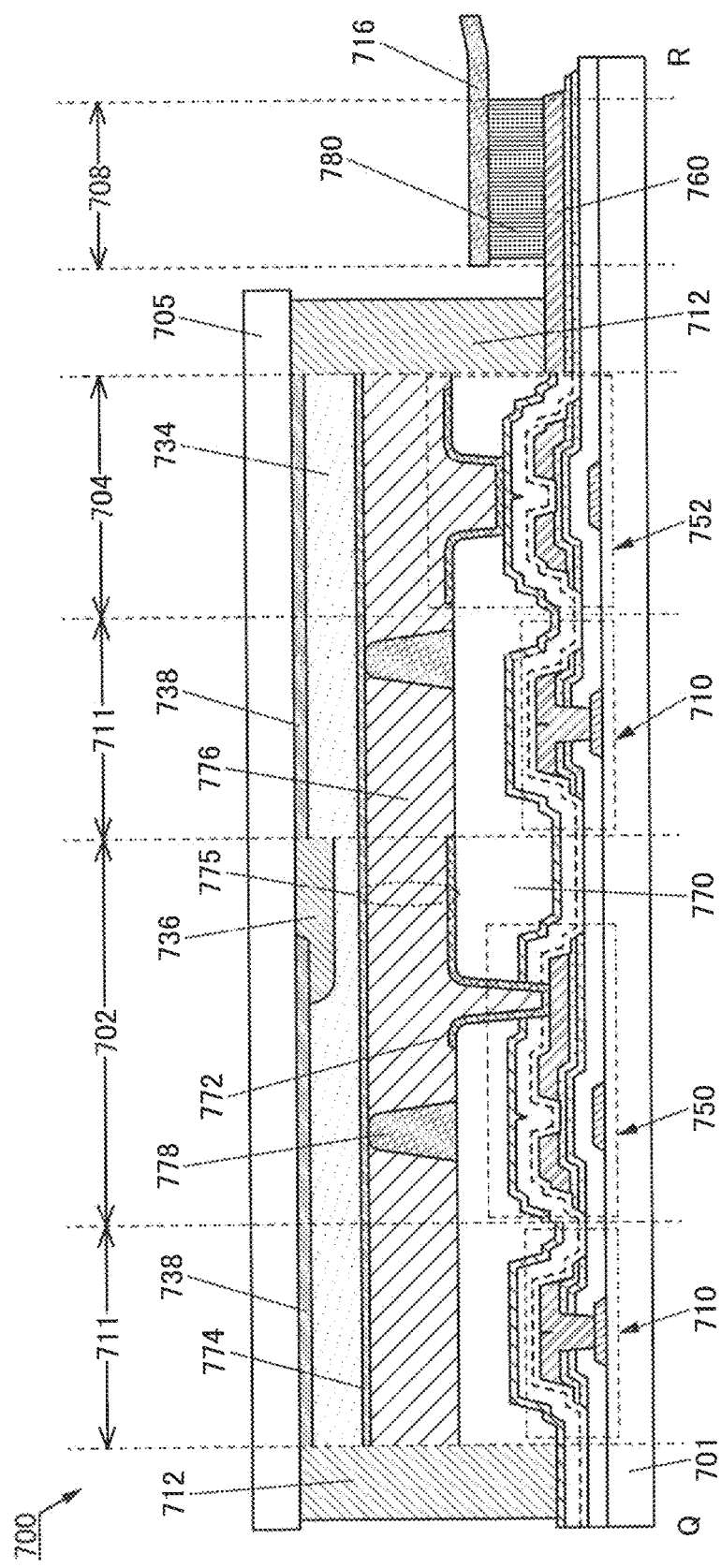
FIG. 53 is a cross-sectional view illustrating one embodiment of a display device.

The display devices 700 in FIG. 52 and FIG. 53 each include a liquid crystal element 775. The liquid crystal element 775 includes a conductive film 772, a conductive film 774, and a liquid crystal layer 776. The conductive film 774 is provided on the second substrate 705 side and functions as a counter electrode. Each of the display devices 700 in FIG. 52 and FIG. 53 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode or the drain electrode of the transistor 750. The conductive film 772 is formed over a gate insulating film of the transistor 750 and functions as a pixel electrode, that is, one electrode of the display element. The conductive film 772 has a function of a reflective electrode. Each of the display devices 700 in FIG. 52 and FIG. 53 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, a conductive film that reflects visible light is used for the conductive film 772.

As illustrated in FIG. 52 and FIG. 53, an insulating film 770 functions as a planarization film. The conductive film 772 is formed over the insulating film 770.

Although the display devices 700 illustrated in FIG. 52 and FIG. 53 are each a reflective color liquid crystal display device, the display type is not limited thereto. For example, a transmissive color liquid crystal display device in which a conductive film that transmits visible light is used for the conductive film 772 may be used. Alternatively, the display device 700 may be what is called a transflective color liquid crystal display device in which a reflective color liquid crystal display device and a transmissive color liquid crystal display device are combined.

Figure 54:
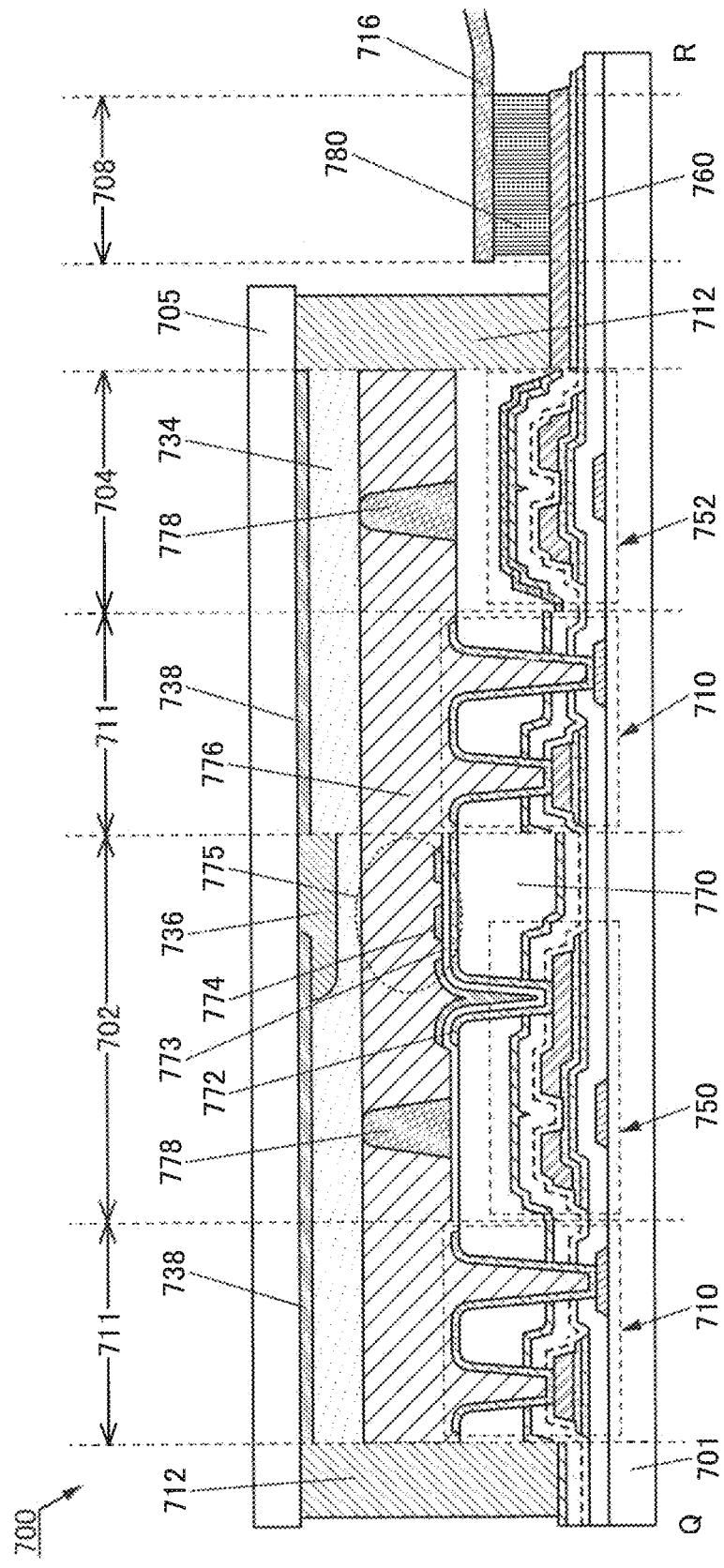
FIG. 54 is a cross-sectional view illustrating one embodiment of a display device.
Figure 55:
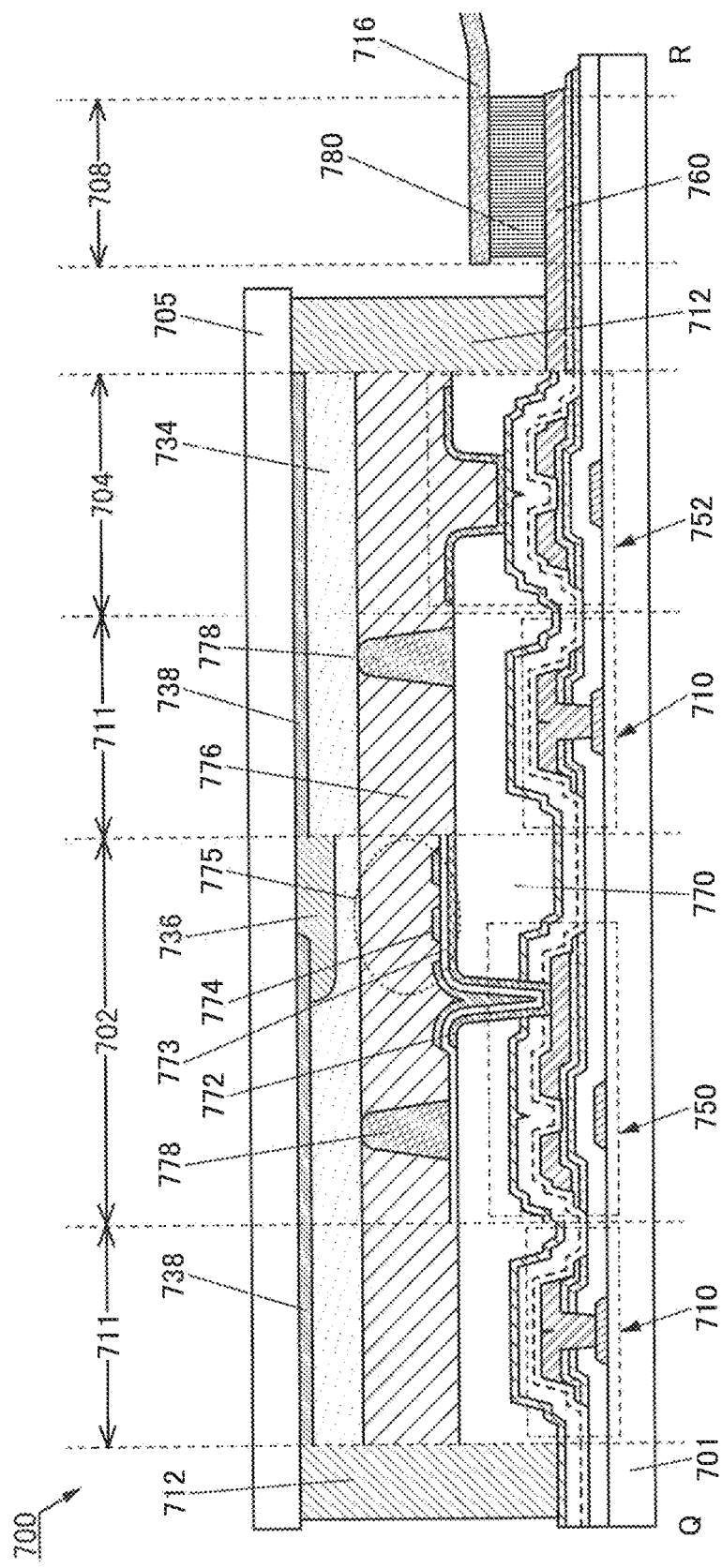
FIG. 55 is a cross-sectional view illustrating one embodiment of a display device.

FIG. 54 and FIG. 55 each illustrate an example of a transmissive color liquid crystal display device. FIG. 54 and FIG. 55 are each a cross-sectional view taken along dashed-dotted line Q-R in FIG. 51 and illustrate the structure including a liquid crystal element as a display element. The display devices 700 illustrated in FIG. 54 and FIG. 55 are each an example of employing a horizontal electric field mode (e.g., FFS mode) as a driving mode of the liquid crystal element. In each of the structures illustrated in FIG. 54 and FIG. 55, an insulating film 773 is provided over the conductive film 772 functioning as the pixel electrode, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 52 to FIG. 55, the conductive film 772 and/or the conductive film 774 may be provided with an alignment film on a side in contact with the liquid crystal layer 776. Although not illustrated in FIG. 52 to FIG. 55, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<Display Device Including Light-Emitting Element>

The display devices 700 illustrated in FIG. 56 and FIG. 57 each include a light-emitting element 782. The light-emitting element 782 includes a conductive film 772, an EL layer 786, and a conductive film 788. Each of the display devices 700 illustrated in FIG. 56 and FIG. 57 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In each of the display devices 700 illustrated in FIG. 56 and FIG. 57, an insulating film 730 is provided over the transistor 750. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 may be covered with an insulating film. A space between the light-emitting element 782 and the coloring film 736 is filled with a sealing film 732. The structure of the display device 700 is not limited to the example in FIG. 56, in which the coloring film 736 is provided. For example, a structure without the coloring film 736 may also be employed in the case where the EL layer 786 is formed by separate coloring.

The insulating film 730 can be formed using a heat-resistant organic material, such as a polyimide resin, an acrylic resin, a polyimide amide resin, a benzocyclobutene resin, a polyamide resin, or an epoxy resin. Note that the insulating film 730 may be formed by stacking a plurality of insulating films formed from these materials.

<Structure Example of Display Device Provided with Input/Output Device>

An input/output device may be provided in the display devices 700 illustrated in FIG. 52 to FIG. 57. As an example of the input/output device, a touch panel or the like can be given.

FIG. 58 to FIG. 63 illustrate structures in which the display devices 700 illustrated in FIG. 52 to FIG. 57 are provided with a touch panel 791.

FIG. 58 to FIG. 63 are cross-sectional views of the structures in which the display devices 700 illustrated in FIG. 52 to FIG. 57 are provided with the touch panel 791.

First, the touch panel 791 illustrated in FIG. 58 to FIG. 63 will be described below.

The touch panel 791 illustrated in FIG. 58 to FIG. 63 is what is called an in-cell touch panel provided between the second substrate 705 and the coloring film 736. The touch panel 791 is formed on the second substrate 705 side before the coloring film 736 is formed.

Note that the touch panel 791 includes the light-blocking film 738, an insulating film 792, an electrode 793, an electrode 794, an insulating film 795, an electrode 796, and an insulating film 797. A change in the mutual capacitance between the electrodes 793 and 794 can be detected when an object such as a finger or a stylus approaches, for example.

A portion in which the electrode 793 intersects with the electrode 794 is illustrated in the upper portion of the transistor 750 illustrated in FIG. 58 to FIG. 63. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 58 to FIG. 63 as an example; however, one embodiment of the present invention is not limited thereto. For example, the region where the electrode 796 is provided may be provided in the source driver circuit portion 704.

Figure 62:
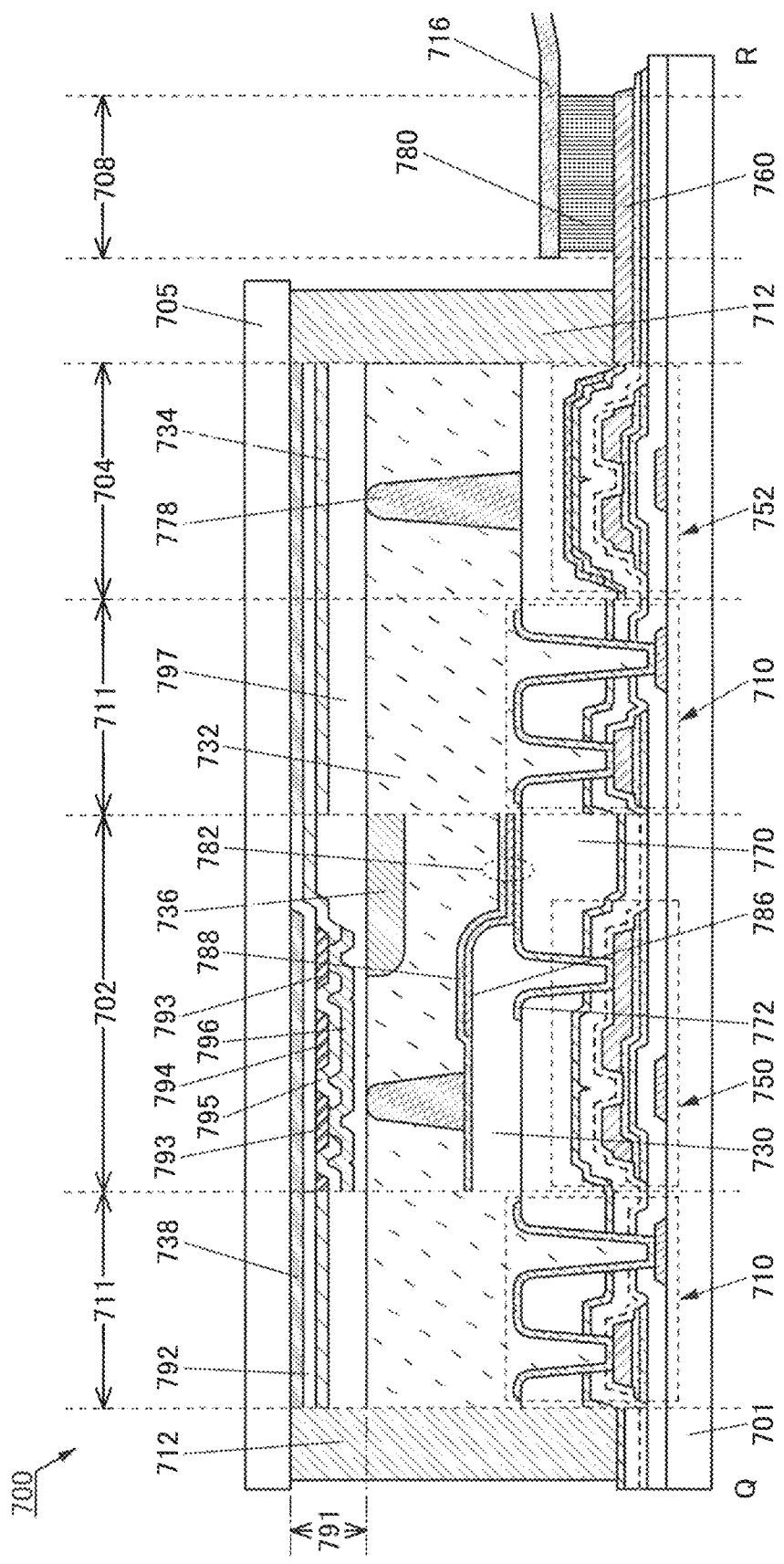
FIG. 62 is a cross-sectional view illustrating one embodiment of a display device.
Figure 63:
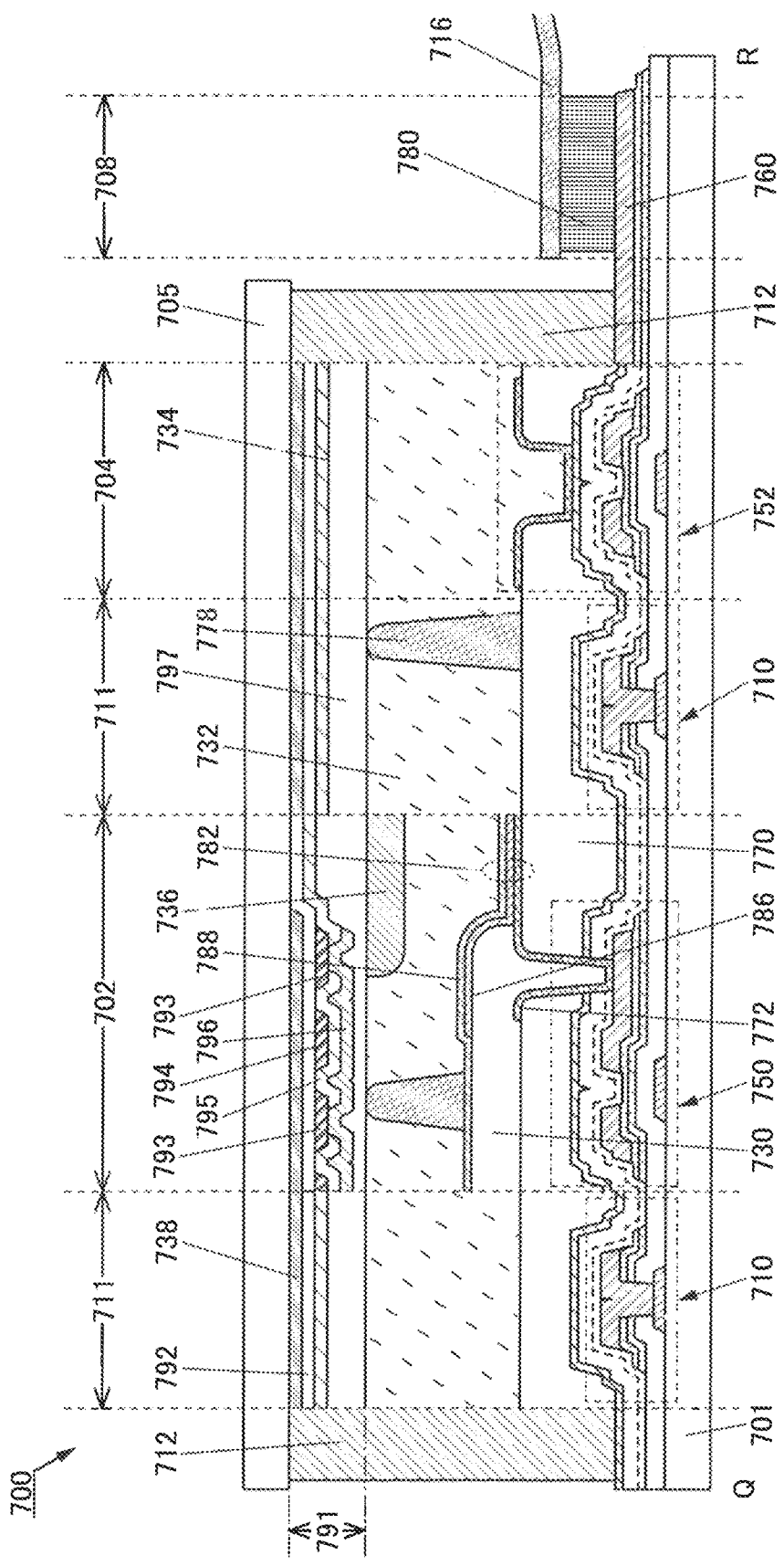
FIG. 63 is a cross-sectional view illustrating one embodiment of a display device.

The electrode 793 and the electrode 794 are provided in a region overlapping with the light-blocking film 738. As illustrated in FIG. 62 and FIG. 63, it is preferable that the electrode 793 not overlap with the light-emitting element 782. As illustrated in FIG. 58 to FIG. 61, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter greater than or equal to 1 nm and less than or equal to 100 nm, preferably greater than or equal to 5 nm and less than or equal to 50 nm, and further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 793, 794, and 796, the transmittance of visible light can be greater than or equal to 89% and the sheet resistance can be greater than or equal to 40 Ω/sq. and less than or equal to 100 Ω/sq.

Although the structure of the in-cell touch panel is illustrated in each of FIG. 58 to FIG. 63, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with a variety of types of touch panels.

At least part of this embodiment can be implemented in combination with any of the other embodiments described in this specification as appropriate.

Embodiment 4

In this embodiment, a display device including a semiconductor device of one embodiment of the present invention will be described with reference to FIGS. 64A to 64C.

<Circuit Configuration of Display Device>

A display device illustrated in FIG. 64A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the image signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n depending on the potential of the scan line GL_m.

Figure 64A:
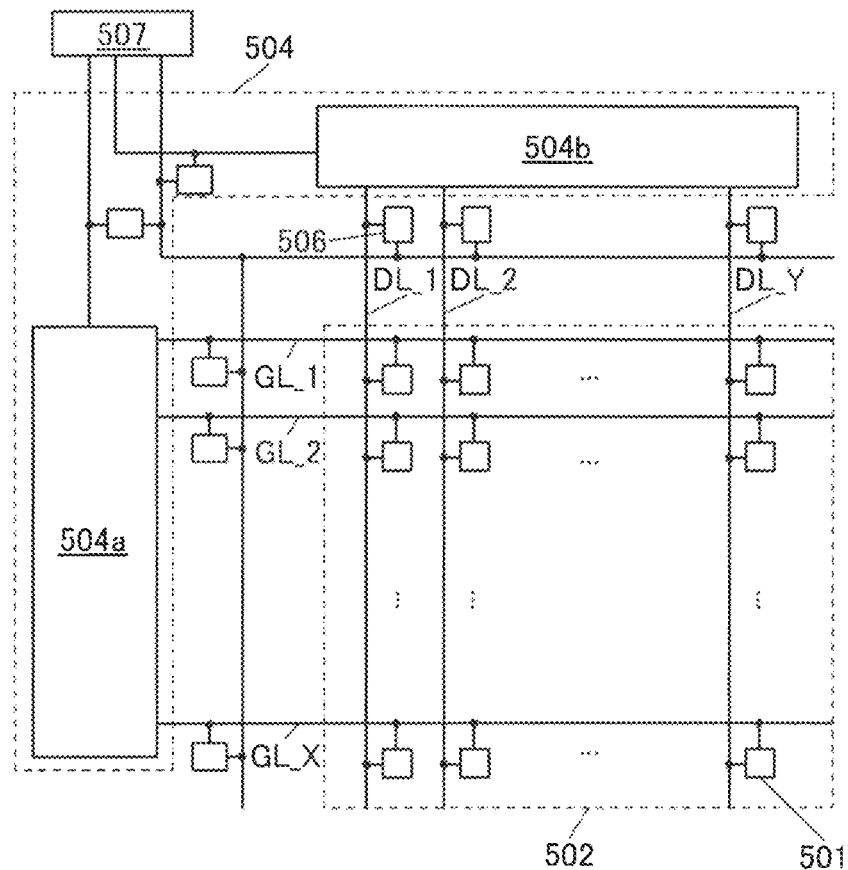
FIGS. 64A to 64C are a block diagram and circuit diagrams each illustrating a display device.

The protection circuit 506 shown in FIG. 64A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As shown in FIG. 64A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 64A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 64B:
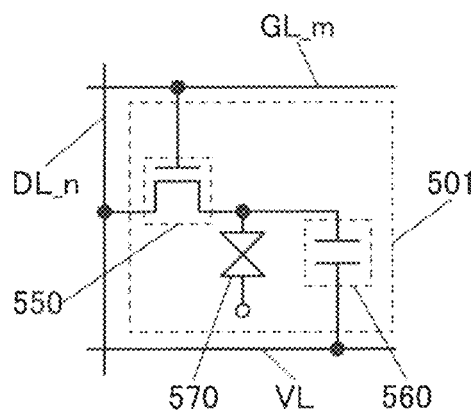

Each of the plurality of pixel circuits 501 in FIG. 64A can have the structure illustrated in FIG. 64B, for example.

The pixel circuit 501 in FIG. 64B includes a liquid crystal element 570, a transistor 550, and a capacitor 560. As the transistor 550, the transistor described in the above embodiment can be used.

The potential of one of a pair of electrodes of the liquid crystal element 570 is set as appropriate depending on the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, a variety of liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether to write a data signal.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate depending on the specifications of the pixel circuit 501. The capacitor 560 functions as a storage capacitor for storing written data.

For example, in the display device including the pixel circuits 501 in FIG. 64B, the gate driver 504a in FIG. 64A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 64C:
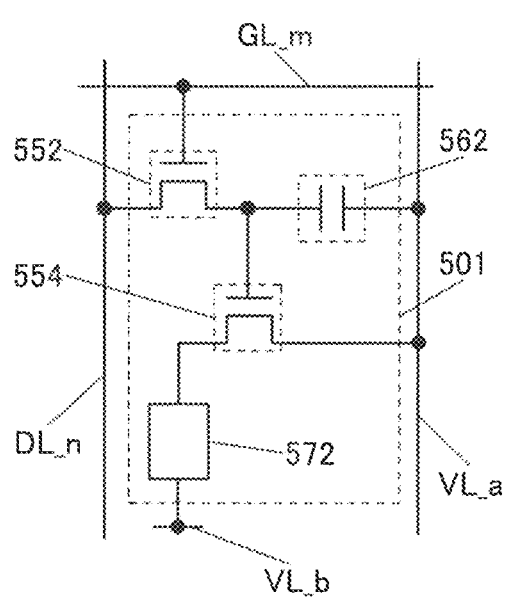

Each of the plurality of pixel circuits 501 in FIG. 64A can have a configuration illustrated in FIG. 64C, for example.

The pixel circuit 501 illustrated in FIG. 64C includes transistors 552 and 554, a capacitor 562, and a light-emitting element 572. Any of the transistors described in the above embodiment can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 is configured to be turned on or off to control whether to write a data signal.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

For example, in the display device including the pixel circuit 501 in FIG. 64C, the pixel circuits 501 are sequentially selected row by row by the gate driver 504a illustrated in FIG. 64A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled by the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments described in this specification as appropriate.

Embodiment 5

Figure 65:
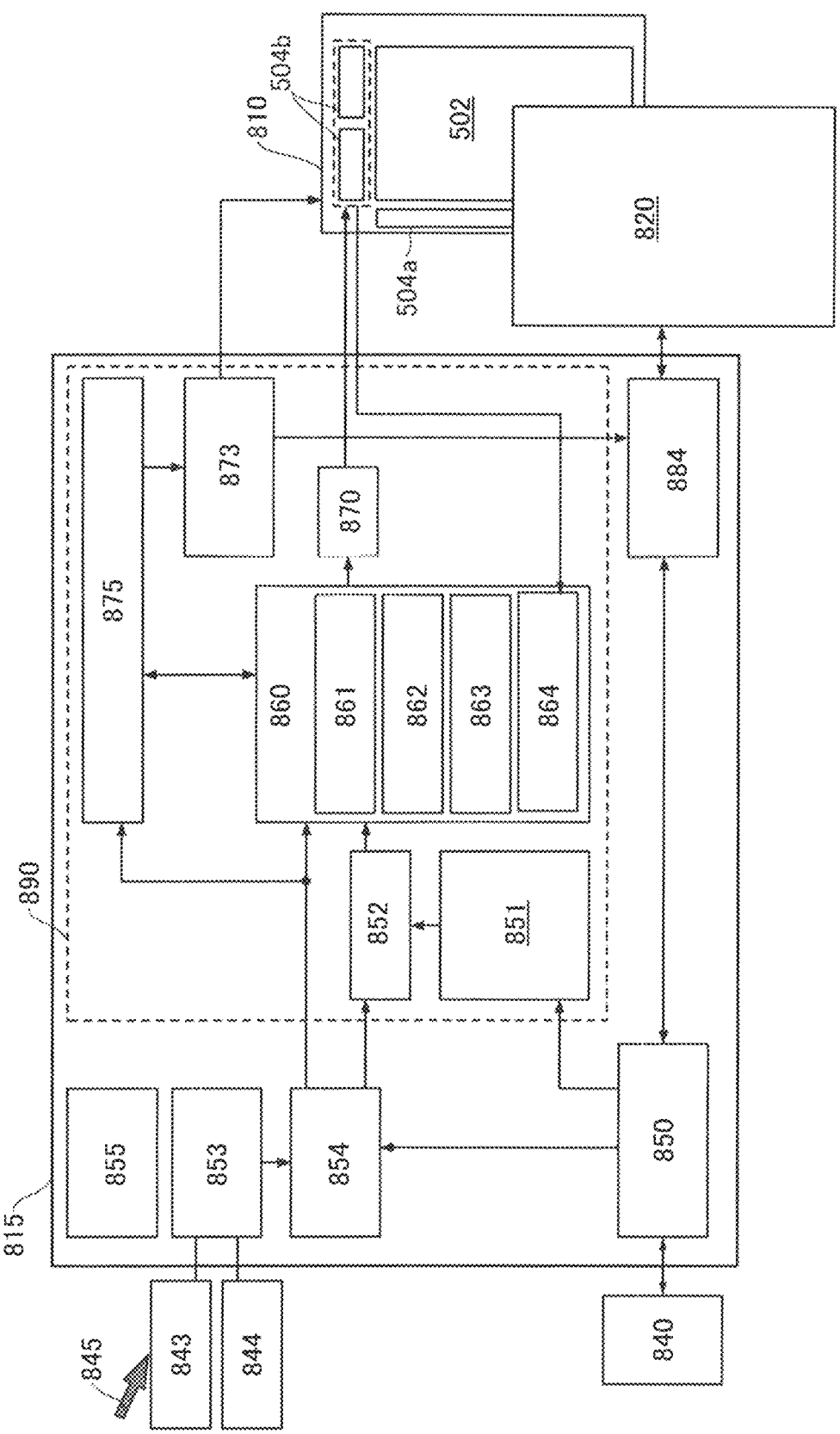
FIG. 65 is a block diagram illustrating a configuration example of a controller IC.

FIG. 65 is a block diagram illustrating a configuration example of a display device 800. The display device 800 includes a display unit 810, a touch sensor unit 820, a controller IC 815, and a host 840. The display device 800 may include an optical sensor 843 and an open/close sensor 844, as necessary. The display unit 810 includes the pixel portion 502, the gate driver 504a, and the source driver 504b.

<<Controller IC>>

In FIG. 65, the controller IC 815 includes an interface 850, a frame memory 851, a decoder 852, a sensor controller 853, a controller 854, a clock generation circuit 855, an image processing portion 860, a memory 870, a timing controller 873, a register 875, and a touch sensor controller 884.

Communication between the controller IC 815 and the host 840 is performed through the interface 850. Image data, a variety of control signals, and the like are transmitted from the host 840 to the controller IC 815. Information on a touch position or the like obtained by the touch sensor controller 884 is transmitted from the controller IC 815 to the host 840. Note that the decision whether the circuits included in the controller IC 815 are chosen or not is made as appropriate depending on the standard of the host 840, the specifications of the display device 800, and the like.

The frame memory 851 is a memory for storing the image data input to the controller IC 815. In the case where compressed image data is transmitted from the host 840, the frame memory 851 can store the compressed image data. The decoder 852 is a circuit for decompressing the compressed image data. When decompression of the image data is not needed, processing is not performed in the decoder 852. Alternatively, the decoder 852 can be provided between the frame memory 851 and the interface 850.

The image processing portion 860 has a function of performing various kinds of image processing on image data. The image processing portion 860 includes, for example, a gamma correction circuit 861, a dimming circuit 862, and a toning circuit 863.

In the case where a display element that emits light when current flows, such as an organic EL or an LED, is used as a display element of the display device 800, the image processing portion 860 may include a correction circuit 864. In that case, the source driver 504b preferably includes a circuit for detecting current flowing in the display element. The correction circuit 864 has a function of adjusting the luminance of the display element on the basis of a signal transmitted from the source driver 504b.

The image data processed in the image processing portion 860 is output to the source driver 504b through the memory 870. The memory 870 is a memory for temporarily storing image data. The source driver 504b has a function of processing the input image data and writing the image data to a source line of the pixel portion 502. Note that there is no limitation on the number of the source drivers 504b, and a necessary number of the source drivers 504b for pixels in the pixel portion 502 are provided.

The timing controller 873 has a function of generating timing signals to be used in the source driver 504b, the touch sensor controller 884, and the gate driver 504a.

The touch sensor controller 884 has a function of controlling a driver circuit of the touch sensor unit 820. A signal including touch information read from the touch sensor unit 820 is processed in the touch sensor controller 884 and transmitted to the host 840 through the interface 850. The host 840 generates image data reflecting the touch information and transmits the image data to the controller IC 815. Note that the controller IC 815 can reflect the touch information in the image data.

The clock generation circuit 855 has a function of generating a clock signal used in the controller IC 815. The controller 854 has a function of processing a variety of control signals transmitted from the host 840 through the interface 850 and controlling a variety of circuits in the controller IC 815. The controller 854 also has a function of controlling power supply to a variety of circuits in the controller IC 815. Hereinafter, temporary stop of power supply to a circuit that is not used is referred to as power gating. Note that a power supply line is not illustrated in FIG. 65.

The register 875 stores data used for the operation of the controller IC 815. The data stored in the register 875 includes a parameter used to perform correction processing in the image processing portion 860, parameters used to generate waveforms of a variety of timing signals in the timing controller 873, and the like. The register 875 is provided with a scan chain register including a plurality of registers.

The sensor controller 853 is electrically connected to the optical sensor 843. The optical sensor 843 senses light 845 and generates a sensor signal. The sensor controller 853 generates a control signal on the basis of the sensor signal. The control signal generated in the sensor controller 853 is output to the controller 854, for example.

The image processing portion 860 can adjust the luminance of the pixel depending on the brightness of the light 845 measured with the optical sensor 843 and the sensor controller 853. In other words, the luminance of the pixel can be reduced in an environment where the brightness of the light 845 is low to reduce glare and the power consumption. In an environment where the brightness of the light 845 is high, the luminance of the pixel can be increased to obtain a display quality with excellent visibility. The adjustment can be made on the basis of the luminance a user has set. Here, the adjustment can be referred to as dimming or dimming treatment. In addition, a circuit that performs the treatment is referred to as a dimming circuit.

The optical sensor 843 and the sensor controller 853 can have a function of measuring the tone of the light 845, so that the tone can be corrected. For example, in an environment with a reddish hue of sunset, the user of the display device 800 recognizes the reddish hue as white because of chromatic adaptation. In that case, the display of the display device 800 is seen bluish white. Thus, red (R) is emphasized in the display device 800 so that the tone can be corrected. Here, the adjustment can be referred to as toning or toning treatment. In addition, a circuit that performs the treatment is referred to as a toning circuit.

The image processing portion 860 might include another processing circuit such as an RGB-RGBW conversion circuit depending on the specifications of the display device 800. The RGB-RGBW conversion circuit has a function of converting image data of red, green, and blue (RGB) into image data of red, green, blue, and white (RGBW). That is, in the case where the display device 800 includes pixels of four colors of RGBW, power consumption can be reduced by displaying a white (W) component in the image data using the white (W) pixel. Note that in the case where the display device 800 includes pixels of four colors of RGBY (red, green, blue, and yellow), an RGB-RGBY conversion circuit can be used, for example.

<Parameter>

Image correction processing such as gamma correction, dimming, or toning corresponds to processing of generating output correction data Y with respect to input image data X. The parameter that the image processing portion 860 uses is a parameter for converting the image data X into the correction data Y.

Figure 66A:
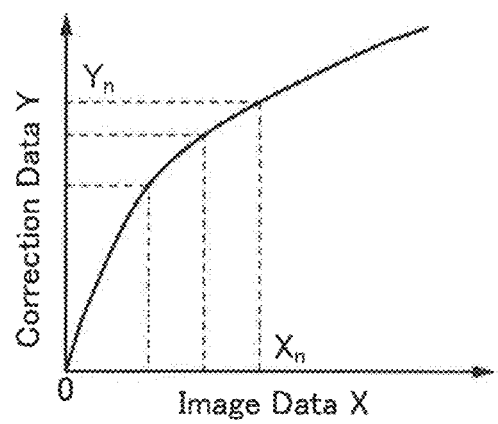
FIGS. 66A to 66C are diagrams for illustrating parameters.
Figure 66B:
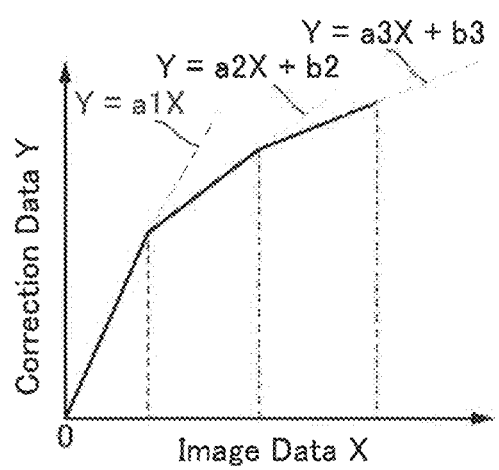

As a parameter setting method, there are a table method and a function approximation method. In a table method explained in FIG. 66A, correction data $Y_n$ with respect to image data $X_n$ is stored in a table as a parameter. In the table method, a number of registers for storing the parameters that correspond to the table is necessary; however, correction can be performed with high degree of freedom. In contrast, in the case where the correction data Y with respect to the image data X can be empirically determined in advance, it is effective to employ a function approximation method as explained in FIG. 66B. Note that a1, a2, b2, and the like are parameters. Although a method of performing linear approximation in every period is shown here, a method of performing approximation with a nonlinear function can be employed. In the function approximation method, correction is performed with low degree of freedom; however, the number of registers for storing parameters that defines a function can be small.

Figure 66C:
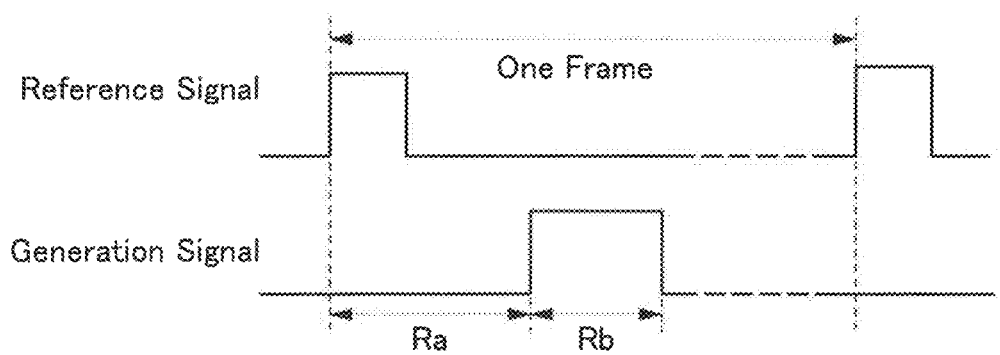

The parameter that the timing controller 873 uses indicates timing at which a generation signal of the timing controller 873 becomes "L" (or "H") with respect to a reference signal as explained in FIG. 66C. A parameter Ra (or Rb) indicates the number of clock cycles that corresponds to timing at which the parameter becomes "L" (or "H") with respect to the reference signal.

The above parameter for correction can be stored in the register 875. Other parameters that can be stored in the register 875 include luminance, tones, and energy saving settings (time taken to make display dark or turn off display) of the display device 800, sensitivity of the touch sensor controller 884, and the like.

<Power Gating>

In the case where image data transmitted from the host 840 is not changed, the controller 854 can perform power gating of some circuits in the controller IC 815. Specifically, for example, the operation of circuits (the frame memory 851, the decoder 852, the image processing portion 860, the memory 870, the timing controller 873, and the register 875) in a region 890 can be temporarily stopped. Power gating can be performed in the case where a control signal that indicates no change in the image data is transmitted from the host 840 to the controller IC 815 and detected by the controller 854.

Alternatively, a timer function may be incorporated into the controller 854 so that when the image data is not changed, the timing of the resumption of power supply to the circuits in the region 890 is determined on the basis of time measured by a timer, for example.

In addition to the power gating of the circuits in the region 890, power gating of the source driver 504b may be performed.

Note that in the configuration illustrated in FIG. 65, the source driver 504b may be provided in the controller IC 815. In other words, the source driver 504b and the controller IC 815 may be formed on the same chip.

Specific circuit configuration examples of the frame memory 851 and the register 875 will be described below.

<Frame Memory 851>

Figures 67A, 67B:
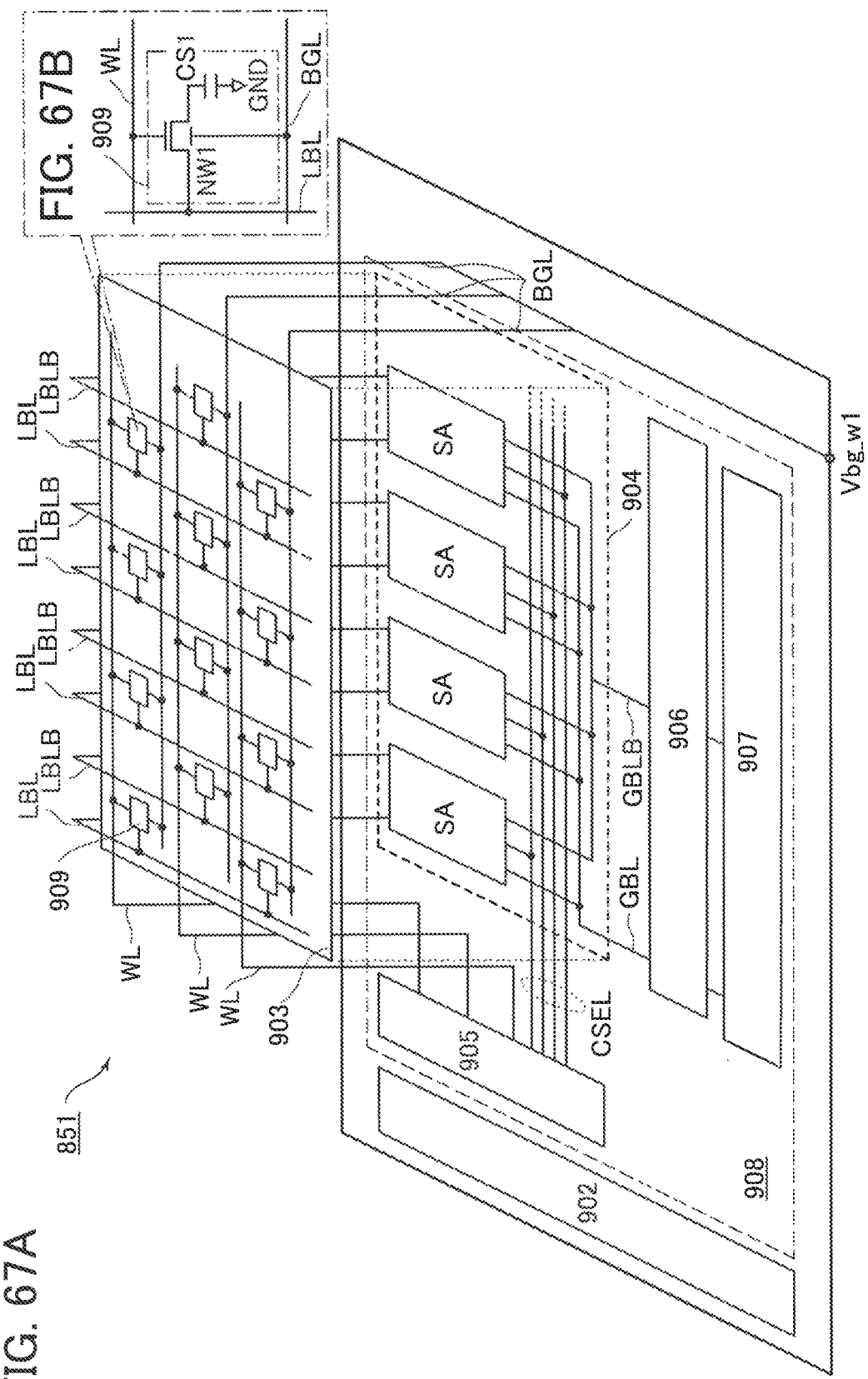
FIGS. 67A and 67B illustrate a configuration example of a frame memory.

FIG. 67A illustrates a configuration example of the frame memory 851. The frame memory 851 includes a control portion 902, a cell array 903, and a peripheral circuit 908. The periphery circuit 908 includes a sense amplifier circuit 904, a driver 905, a main amplifier 906, and an input/output circuit 907.

The control portion 902 has a function of controlling the frame memory 851. For example, the control portion 902 controls the driver 905, the main amplifier 906, and the input/output circuit 907.

The driver 905 is electrically connected to a plurality of wirings WL and CSEL. The driver 905 generates signals output to the plurality of wirings WL and CSEL.

The memory cell array 903 includes a plurality of memory cells 909. The memory cells 909 are electrically connected to wirings WL, LBL (or LBLB), and BGL. The wiring WL is a word line. The wirings LBL and LBLB are local bit lines. Although a folded-bit-line method is employed for the configuration of the cell array 903 in the example of FIG. 67A, an open-bit-line method can also be employed.

FIG. 67B illustrates a configuration example of the memory cell 909. The memory cell 909 includes a transistor NW1 and a capacitor CS1. The memory cell 909 has a circuit configuration similar to that of a memory cell for a dynamic random access memory (DRAM). The transistor NW1 in this example is a transistor having a back gate. The back gate of the transistor NW1 is electrically connected to a wiring BGL. A voltage $V_{bg\_}$w1 is input to the wiring BGL.

The transistor NW1 is an OS transistor. The use of the OS transistor in the memory cell 909 can inhibit leakage of charge from the capacitor CS1 owing to the extremely low off-state current of the OS transistor; thus, the frequency of refresh operation of the frame memory 851 can be reduced. The frame memory 851 can retain image data for a long time even when power supply is stopped. Moreover, by setting the voltage $V_{bg\_}$w1 to a negative voltage, the threshold voltage of the transistor NW1 can be shifted to the positive potential side and thus the retention time of the memory cell 909 can be increased.

Here, an off-state current refers to a current that flows between a source and a drain of a transistor in an off state. In the case of an n-channel transistor, for example, when the threshold voltage of the transistor is approximately 0 V to 2 V, a current flowing between a source and a drain when a voltage of a gate with respect to the source is negative can be referred to as an off-state current. An extremely low off-state current means that, for example, an off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), further preferably lower than or equal to 10 yA/μm (y represents yocto and denotes a factor of $10^{-24}$).

The transistors NW1 in the plurality of memory cells 909 included in the cell array 903 are OS transistors; thus, Si transistors formed over a silicon wafer can be used as transistors in other circuits, for example. Accordingly, the cell array 903 can be stacked over the sense amplifier circuit 904. Thus, the circuit area of the frame memory 851 can be reduced, which leads to miniaturization of the controller IC 815.

The cell array 903 is stacked over the sense amplifier circuit 904. The sense amplifier circuit 904 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 904, one wiring GBL is provided for four wirings LBL, and one wiring GBLB is provided for four wirings LBLB. However, the configuration of the sense amplifier circuit 904 is not limited to the configuration example of FIG. 67A.

The main amplifier 906 is connected to the sense amplifier circuit 904 and the input/output circuit 907. The main amplifier 906 has a function of amplifying the potential difference between the wirings GBL and GBLB. The main amplifier 906 is not necessarily provided.

The input/output circuit 907 has a function of outputting a potential corresponding to write data to the wirings GBL and GBLB or the main amplifier 906 and a function of outputting the potentials of the wirings GBL and GBLB or an output potential of the main amplifier 906 to the outside as read data. The sense amplifier SA from which data is read and the sense amplifier SA to which data is written can be selected using the signal of the wiring CSEL. Therefore, there is no need to provide a selection circuit such as a multiplexer in the input/output circuit 907. Thus, the input/output circuit 907 can have a simple circuit configuration and occupy a small area.

<Register 875>

Figure 68:
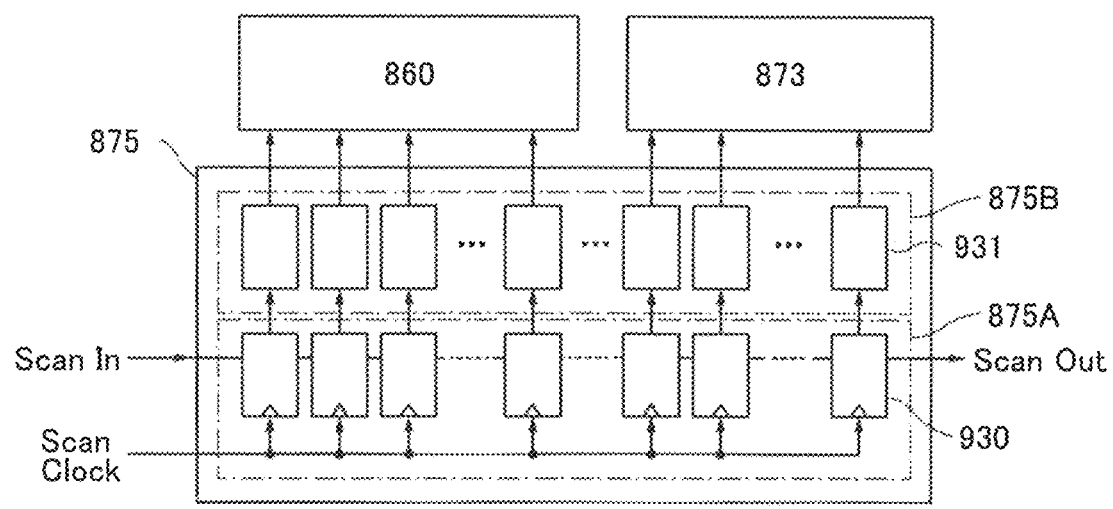
FIG. 68 is a block diagram illustrating a configuration example of a register.

FIG. 68 is a block diagram illustrating a configuration example of the register 875. The register 875 includes a scan chain register portion 875A and a register portion 875B. The scan chain register portion 875A includes a plurality of registers 930. The scan chain register is formed by the plurality of registers 930. The register portion 875B includes a plurality of registers 931.

The register 930 is a nonvolatile register which does not lose data even when power supply is stopped. Here, the register 930 is provided with a retention circuit including an OS transistor to be nonvolatile.

The other register 931 is a volatile register. There is no particular limitation on the circuit configuration of the register 931, and a latch circuit, a flip-flop circuit, or the like is used as long as data can be stored. The image processing portion 860 and the timing controller 873 access the register portion 875B and take data from the corresponding registers 931. Alternatively, the processing contents of the image processing portion 860 and the timing controller 873 are controlled by data supplied from the register portion 875B.

To update data stored in the register 875, first, data in the scan chain register portion 875A is changed. After the data in the registers 930 of the scan chain register portion 875A is rewritten, the data is loaded into the registers 931 of the register portion 875B at a time.

Accordingly, the image processing portion 860, the timing controller 873, and the like can perform various kinds of processing using the data collectively updated. The operation of the controller IC 815 can be stable because simultaneity can be maintained in updating data. By providing the scan chain register portion 875A and the register portion 875B, data in the scan chain register portion 875A can be updated even during the operation of the image processing portion 860 and the timing controller 873.

At the time of the power gating of the controller IC 815, power supply is stopped after data is stored (saved) in the retention circuit of the register 930. After the power supply is resumed, normal operation is restarted after data in the register 930 is restored (loaded) in the register 931. Note that in the case where the data stored in the register 930 and the data stored in the register 931 do not match each other, it is preferable to save the data of the register 931 in the register 930 and then store the data in the retention circuit of the register 930. The data in the register 930 and that in the register 931 do not match each other while updated data is being inserted in the scan chain register portion 875A, for example.

Figure 69:
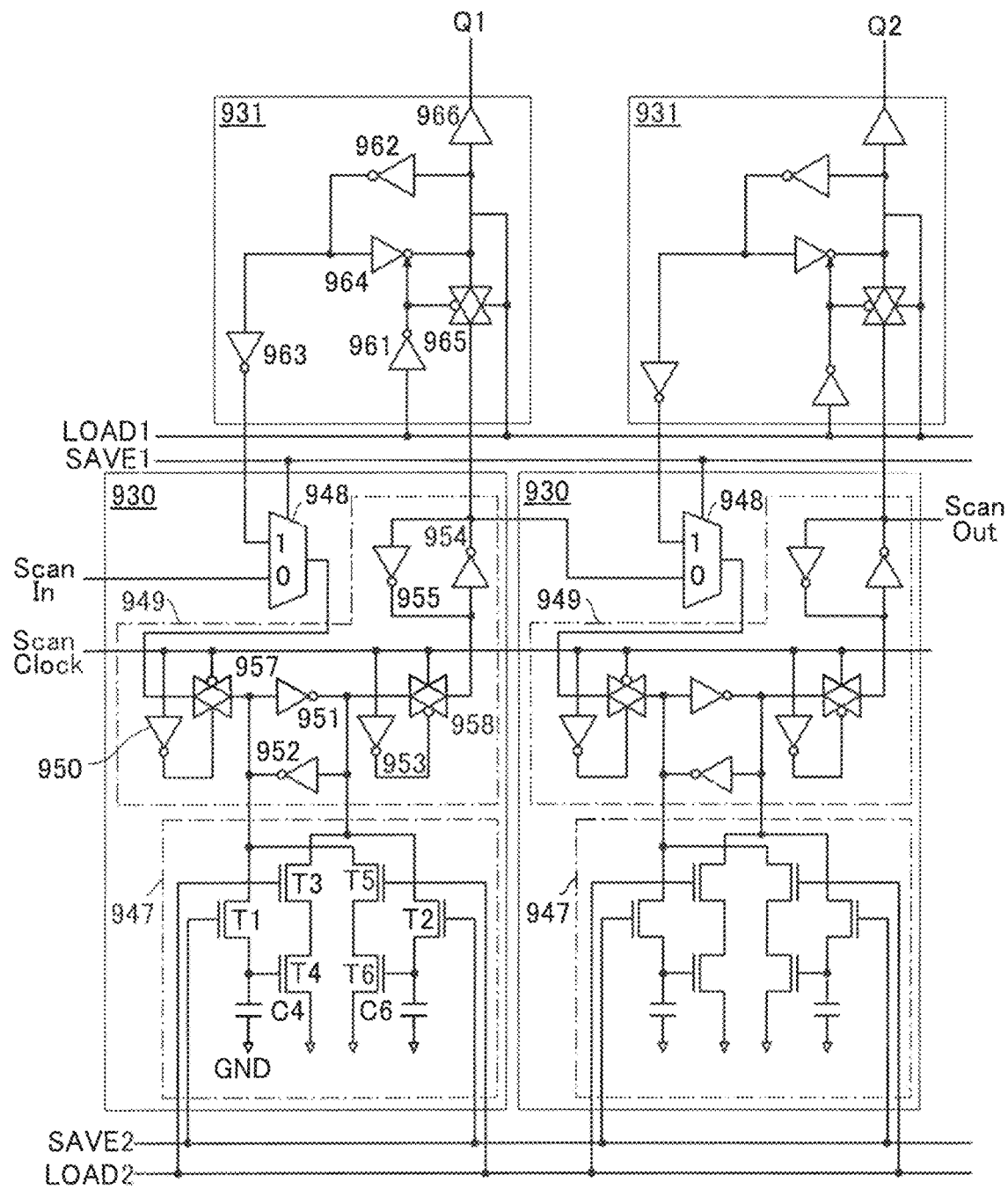
FIG. 69 is a circuit diagram illustrating a configuration example of a register.

FIG. 69 illustrates a circuit configuration example of the registers 930 and 931. FIG. 69 illustrates two registers 930 of the scan chain register portion 875A and corresponding two registers 931. A signal Scan In is input to one of the registers 930, and the other of the registers 930 outputs a signal Scan Out.

The registers 930 each include a retention circuit 947, a selector 948, and a flip-flop circuit 949. The selector 948 and the flip-flop circuit 949 form a scan flip-flop circuit. A signal SAVE1 is input to the selector 948.

A signal SAVE2 and a signal LOAD2 are input to the retention circuit 947. The retention circuit 947 includes a transistor T1, a transistor T2, a transistor T3, a transistor T4, a transistor T5, a transistor T6, a capacitor C4, and a capacitor C6. The transistor T1 and the transistor T2 are OS transistors. The transistor T1 and the transistor T2 may each be an OS transistor having a back gate, as with the transistor NW1 of the memory cell 909 (see FIG. 67B).

A 3-transistor gain cell is formed by the transistor T1, the transistor T3, the transistor T4, and the capacitor C4. In a similar manner, a 3-transistor gain cell is formed by the transistor T2, the transistor T5, the transistor T6, and the capacitor C6. The two gain cells store complementary data retained in the flip-flop circuit 949. Since the transistor T1 and the transistor T2 are OS transistors, the retention circuit 947 can retain data for a long time even when power supply is stopped. In the register 930, the transistors other than the transistor T1 and the transistor T2 may be formed using Si transistors.

The retention circuit 947 stores complementary data retained in the flip-flop circuit 949 in response to the signal SAVE2 and loads the retained data in the flip-flop circuit 949 in response to the signal LOAD2.

An output terminal of the selector 948 is electrically connected to an input terminal of the flip-flop circuit 949, and an input terminal of the register 931 is electrically connected to a data output terminal. The flip-flop circuit 949 includes an inverter 950, an inverter 951, an inverter 952, an inverter 953, an inverter 954, an inverter 955, an analog switch 957, and an analog switch 958. The on/off state of each of the analog switch 957 and the analog switch 958 is controlled by a scan clock signal. The flip-flop circuit 949 is not limited to the circuit configuration in FIG. 69 and a variety of flip-flop circuits 949 can be employed.

An output terminal of the register 931 is electrically connected to one of two input terminals of the selector 948, and an output terminal of the flip-flop circuit 949 in the previous stage is electrically connected to the other input terminal of the selector 948. Note that data is input from the outside of the register 875 to the input terminal of the selector 948 in the previous stage of the scan chain register portion 875A.

The register 931 includes an inverter 961, an inverter 962, an inverter 963, a clocked inverter 964, an analog switch 965, and a buffer 966. The register 931 loads the data of the flip-flop circuit 949 on the basis of a signal LOAD1. The transistors of the register 931 may be formed using Si transistors.

Operation Examples

Operation examples of the controller IC 815 and the register 875 of the display device 800 before shipment, at boot-up of an electronic device including the display device 800, and at normal operation will be described separately.

<Before Shipment>

Parameters relating to the specifications and the like of the display device 800 are stored in the register 875 before shipment. These parameters include, for example, the number of pixels, the number of touch sensors, and parameters used to generate waveforms of the variety of timing signals in the timing controller 873. In the case where the image processing portion 860 includes the correction circuit 864, the correction data therefrom is also stored as a parameter in the register 875. A dedicated ROM may be provided and the parameters may be stored in the ROM other than the register 875.

<At Boot-Up>

At boot-up of the electronic device including the display device 800, the parameters set by a user or the like which are transmitted from the host 840 are stored in the register 875. These parameters include, for example, luminance and tones of display, the sensitivity of a touch sensor, energy saving settings (time taken to make display dark or turn off display), and a curve or a table for gamma correction. Note that in storing the parameters in the register 875, a scan clock signal and data corresponding to the parameters in synchronization with the scan clock signal are transmitted from the controller 854 to the register 875.

<Normal Operation>

Normal operation can be classified into a state of displaying a moving image or the like, a state capable of performing IDS driving while a still image is displayed, a state of displaying no image, and the like. The image processing portion 860, the timing controller 873, and the like are operating in the state of displaying a moving image or the like; however, the image processing portion 860 and the like are not influenced because only the data of the register 875 in the scan chain register portion 875A is changed. After the data of the scan chain register portion 875A is changed, the data of the scan chain register portion 875A is loaded in the register portion 875B at a time, so that change of the data of the register 875 is completed. The operation of the image processing portion 860 and the like is switched to the operation corresponding to the data.

In the state capable of performing IDS driving while a still image is displayed, the power gating of the register 875 can be performed as in the other circuits in the region 890. In that case, the complementary data retained in the flip-flop circuit 949 is stored in the retention circuit 947 in response to the signal SAVE2 before the power gating in the register 930 included in the scan chain register portion 875A.

Before the power gating is stopped, the data retained in the retention circuit 947 is loaded in the flip-flop circuit 949 in response to the signal LOAD2 and the data in the flip-flop circuit 949 is loaded in the register 931 in response to the signal LOAD1. In this manner, the data of the register 875 becomes effective in the same state as before the power gating. Note that even when the register 875 is in a state of power gating, the parameter of the register 875 can be changed by stopping the power gating in the case where change of the parameter is requested by the host 840.

In the state of displaying no image, for example, the power gating of the circuits (including the register 875) in the region 890 can be performed. In that case, the operation of the host 840 might also be stopped. When the power gating is stopped, an image (still image) in a state before the power gating can be displayed without waiting for the resumption of the operation of the host 840 because the frame memory 851 and the register 875 are nonvolatile.

For example, in the case where the display device 800 is employed for a display portion of a foldable information terminal, when the information terminal is folded and a display surface of the display device 800 is detected to be unused by a signal from the open/close sensor 844, the power gating of the sensor controller 853, the touch sensor controller 884, and the like can be performed in addition to the power gating of the circuits in the region 890.

When the information terminal is folded, the operation of the host 840 might be stopped depending on the standard of the host 840. Even when the information terminal is unfolded while the operation of the host 840 is stopped, the image data in the frame memory 851 can be displayed before image data, a variety of control signals, and the like are transmitted from the host 840 because the frame memory 851 and the register 875 are nonvolatile.

When the register 875 includes the scan chain register portion 875A and the register portion 875B and the data of the scan chain register portion 875A is changed as described above, the data can be changed smoothly without influencing the image processing portion 860, the timing controller 873, and the like. Each register 930 in the scan chain register portion 875A includes the retention circuit 947, which enables smooth start and stop of power gating.

This embodiment can be implemented in appropriate combination with any of the other embodiments.

Embodiment 6

In this embodiment, display modules and electronic devices, each of which includes a semiconductor device of one embodiment of the present invention, will be described with reference to FIGS. 70A and 70B, FIGS. 71A to 71E, FIGS. 72A to 72G, FIG. 73, FIG. 74, FIG. 75, and FIGS. 76A to 76D.

<Display Module>

A display module that can be manufactured using one embodiment of the present invention will be described.

Figure 70A:
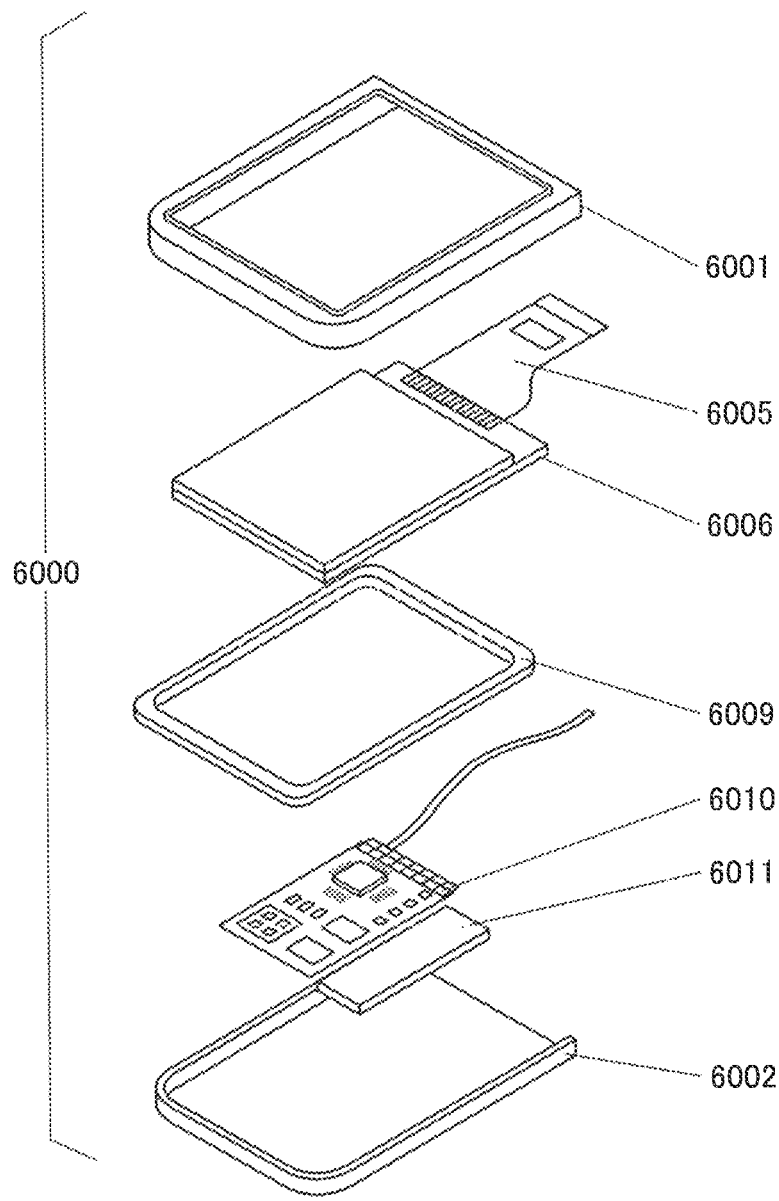
FIGS. 70A and 70B illustrate a structure example of a display module.

In a display module 6000 in FIG. 70A, a display panel 6006 connected to an FPC 6005, a frame 6009, a printed circuit board 6010, and a battery 6011 are provided between an upper cover 6001 and a lower cover 6002.

The display device manufactured using one embodiment of the present invention can be used for, for example, the display panel 6006. Thus, the display module can be manufactured with high yield.

The shapes and sizes of the upper cover 6001 and the lower cover 6002 can be changed as appropriate depending on the size of the display panel 6006.

A touch panel may be provided so as to overlap with the display panel 6006. The touch panel can be a resistive touch panel or a capacitive touch panel and may overlap with the display panel 6006. Instead of providing the touch panel, the display panel 6006 can be made to have a touch panel function.

The frame 6009 protects the display panel 6006 and also functions as an electromagnetic shield for blocking electromagnetic waves generated by the operation of the printed circuit board 6010. The frame 6009 may function as a radiator plate.

The printed circuit board 6010 is provided with a power supply circuit and a signal processing circuit for outputting a video signal and a clock signal. As a power source for supplying power to the power supply circuit, an external commercial power source or a power source using the battery 6011 provided separately may be used. The battery 6011 can be omitted in the case of using a commercial power source.

The display module 6000 may be additionally provided with a member such as a polarizing plate, a retardation plate, or a prism sheet.

Figure 70B:
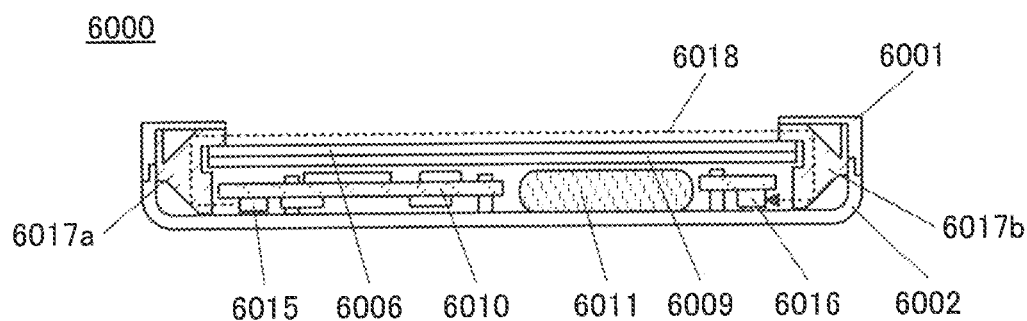

FIG. 70B is a schematic cross-sectional view of the display module 6000 including an optical touch sensor.

The display module 6000 includes a light-emitting portion 6015 and a light-receiving portion 6016 provided on the printed circuit board 6010. A pair of light guide portions (a light guide portion 6017a and a light guide portion 6017b) is provided in a region surrounded by the upper cover 6001 and the lower cover 6002.

For example, a plastic or the like can be used for the upper cover 6001 and the lower cover 6002. The upper cover 6001 and the lower cover 6002 can each be thin (e.g., more than or equal to 0.5 mm and less than or equal to 5 mm). In that case, the display module 6000 can be significantly lightweight. In addition, the upper cover 6001 and the lower cover 6002 can be manufactured with a small amount of material, and therefore, manufacturing cost can be reduced.

The display panel 6006 overlaps with the printed circuit board 6010 and the battery 6011 with the frame 6009 located therebetween. The display panel 6006 and the frame 6009 are fixed to the light guide portion 6017a and the light guide portion 6017b.

Light 6018 emitted from the light-emitting portion 6015 travels over the display panel 6006 through the light guide portion 6017a and reaches the light-receiving portion 6016 through the light guide portion 6017b. For example, blocking of the light 6018 by a sensing target such as a finger or a stylus can be detected as touch operation.

A plurality of light-emitting portions 6015 are provided along two adjacent sides of the display panel 6006, for example. A plurality of light-receiving portions 6016 are provided so as to face the light-emitting portions 6015. Accordingly, information about the position of touch operation can be obtained.

As the light-emitting portion 6015, a light source such as an LED element can be used. It is particularly preferable to use a light source that emits infrared light, which is not visually recognized by users and is harmless to users, as the light-emitting portion 6015.

As the light-receiving portion 6016, a photoelectric element that receives light emitted by the light-emitting portion 6015 and converts it into an electrical signal can be used. A photodiode that can receive infrared light can be favorably used.

For the light guide portions 6017a and 6017b, members that transmit at least the light 6018 can be used. With the use of the light guide portions 6017a and 6017b, the light-emitting portion 6015 and the light-receiving portion 6016 can be placed under the display panel 6006, and a malfunction of the touch sensor due to external light reaching the light-receiving portion 6016 can be prevented. It is particularly preferable to use a resin which absorbs visible light and transmits infrared light. This is more effective in preventing the malfunction of the touch sensor.

<Electronic Device 1>

Next, FIGS. 71A to 71E illustrate examples of electronic devices.

Figure 71A:
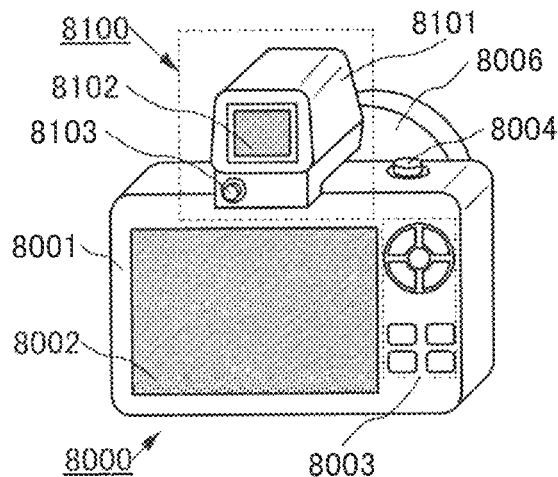
FIGS. 71A to 71E illustrate electronic devices.

FIG. 71A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 71A, the housing 8001 of the camera 8000 may include a finder having a display device.

Figure 71B:
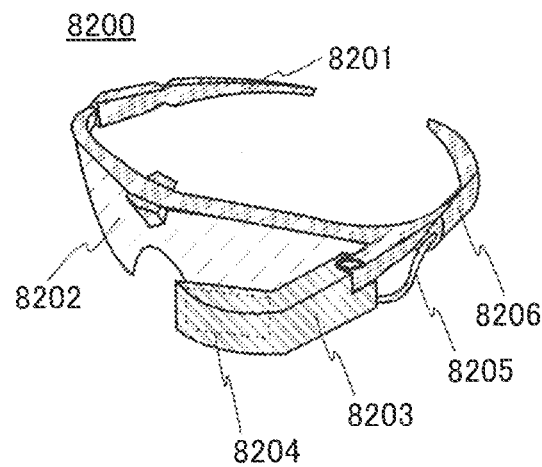

FIG. 71B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 71C:
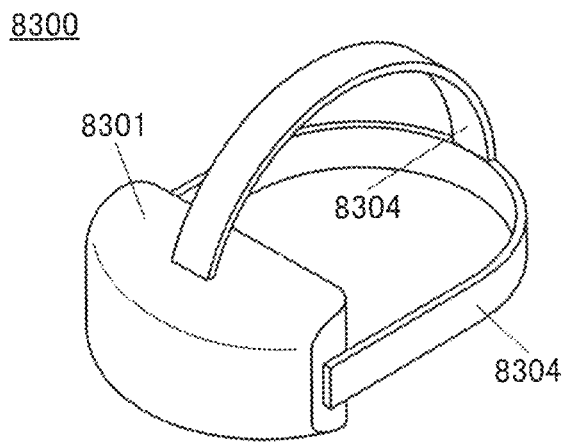
Figure 71D:
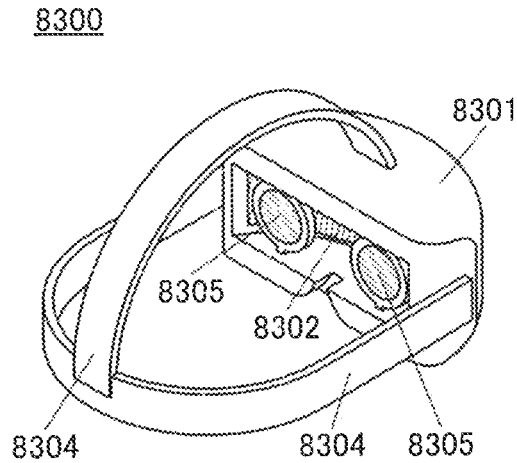
Figure 71E:
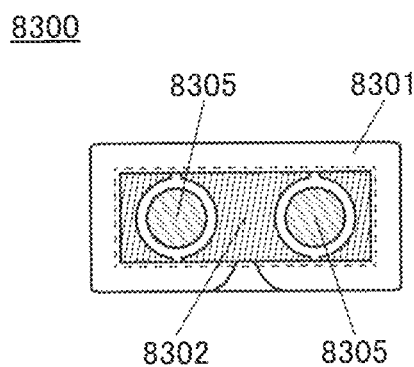
Figure 72A:
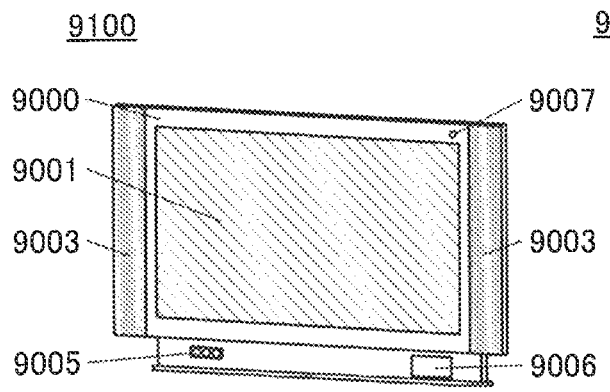
FIGS. 72A to 72G illustrate electronic devices.
Figure 72B:
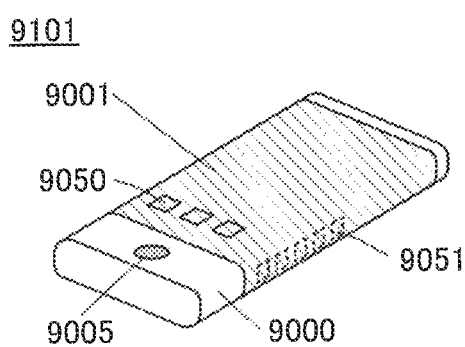
Figure 72C:
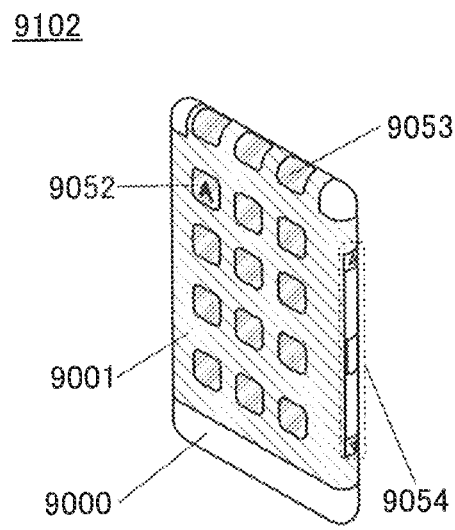
Figure 72D:
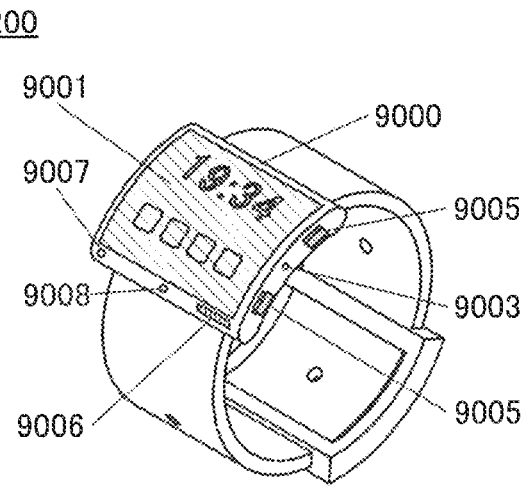
Figure 72E:
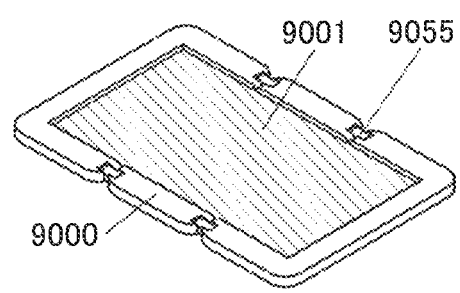
Figure 72F:
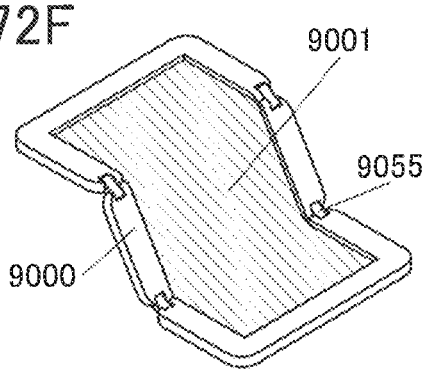
Figure 72G:
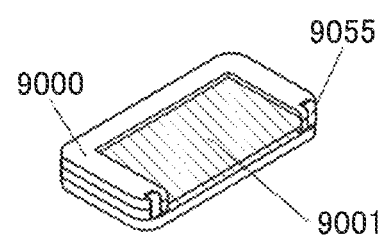

FIGS. 71C to 71E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is suitable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device of one embodiment of the present invention has an extremely high resolution; thus, even when an image is magnified using the lenses 8305 as illustrated in FIG. 71E, the user does not perceive pixels, and thus a more realistic image can be displayed.

<Electronic Device 2>

Next, FIGS. 72A to 72G illustrate examples of electronic devices that are different from those illustrated in FIGS. 71A to 71E.

The electronic devices illustrated in FIGS. 72A to 72G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 72A to 72G have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 72A to 72G are not limited thereto, and the electronic devices can have a variety of functions. Although not illustrated in FIGS. 72A to 72G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

At least part of this embodiment can be implemented in combination with any of the other embodiments described in this specification as appropriate.

Next, a broadcasting system including any of the electronic devices will be described. In particular, a system that transmits a broadcast signal will be described here.

<Broadcasting System>

Figure 73:
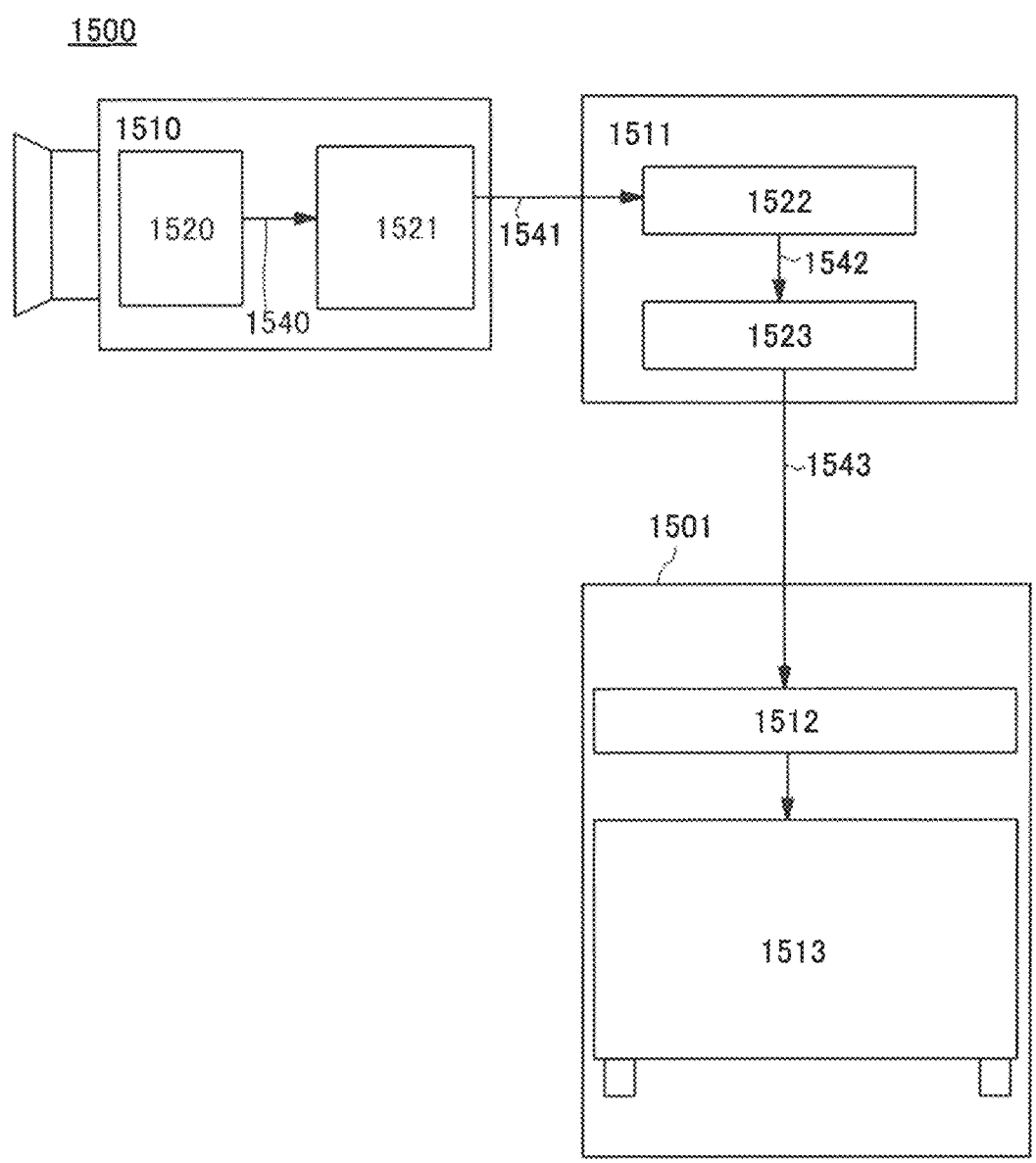
FIG. 73 is a block diagram illustrating a structure example of a broadcasting system.

FIG. 73 is a block diagram that schematically illustrates a structure example of the broadcasting system. The broadcasting system 1500 includes a camera 1510, a transmitter 1511, and an electronic device system 1501. The electronic device system 1501 includes a receiver 1512 and a display device 1513. The camera 1510 includes an image sensor 1520 and an image processor 1521. The transmitter 1511 includes an encoder 1522 and a modulator 1523.

The receiver 1512 and the display device 1513 consist of an antenna, a demodulator, a decoder, a logic circuit, an image processor, and a display unit included in the electronic device system 1501. Specifically, for example, the receiver 1512 includes the antenna, the demodulator, the decoder, and the logic circuit, whereas the display device 1513 includes the image processor and the display unit. The decoder and the logic circuit may be included not in the receiver 1512 but in the display device 1513.

When the camera 1510 is capable of capturing an 8K video, the image sensor 1520 has an adequate number of pixels for capturing a color image with 8K resolution. For example, when one red (R) subpixel, two green (G) subpixels, and one blue (B) subpixel are included in one pixel, the image sensor 1520 with an 8K camera needs at least 7680×4320×4 [R, G+G, and B] pixels, the image sensor 1520 with a 4K camera needs at least 3840×2160×4 pixels, and the image sensor 1520 with a 2K camera needs at least 1920×1080×4 pixels.

The image sensor 1520 generates Raw data 1540 which is unprocessed. The image processor 1521 performs image processing (such as noise removal or interpolation processing) on the Raw data 1540 and generates video data 1541. The video data 1541 is output to the transmitter 1511.

The transmitter 1511 processes the video data 1541 and generates a broadcast signal (carrier wave) 1543 that accords with a broadcast band. The encoder 1522 processes the video data 1541 and generates encoded data 1542. The encoder 1522 performs processing such as encoding of the video data 1541, addition of broadcast control data (e.g., authentication data) to the video data 1541, encryption, or scrambling (data rearrangement for spread spectrum).

A semiconductor device can be used for the encoder 1522 of the broadcasting system 1500 in FIG. 73. Alternatively, the encoder 1522 can be formed by combining a dedicated IC, a processor (e.g., GPU or CPU), and the like. Alternatively, the encoder 1522 can be integrated into one dedicated IC chip.

The modulator 1523 performs IQ modulation (orthogonal amplitude modulation) on the encoded data 1542 to generate and output the broadcast signal 1543. The broadcast signal 1543 is a composite signal including data on components of I (identical phase) and Q (quadrature phase). A TV broadcast station takes a role in obtaining the video data 1541 and supplying the broadcast signal 1543.

The broadcast signal 1543 is received by the receiver 1512 included in the electronic device system 1501.

Figure 74:
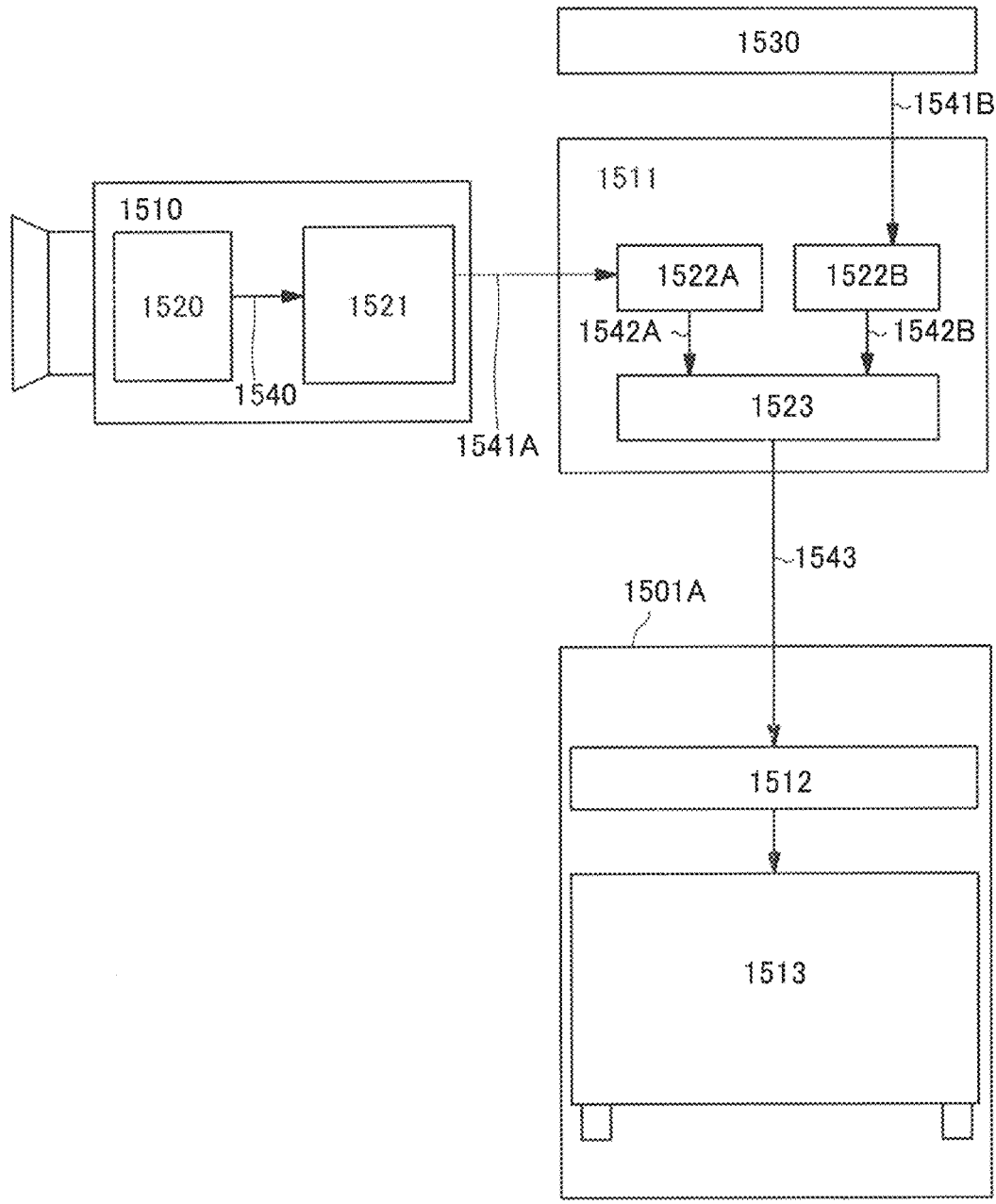
FIG. 74 is a block diagram illustrating a structure example of a broadcasting system.

FIG. 74 illustrates a broadcasting system 1500A including another electronic device system.

The broadcasting system 1500A includes the camera 1510, the transmitter 1511, the electronic device system 1501A, and an image generation device 1530. The electronic device system 1501A includes the receiver 1512 and the display device 1513. The camera 1510 includes the image sensor 1520 and the image processor 1521. The transmitter 1511 includes an encoder 1522A, an encoder 1522B, and the modulator 1523.

The receiver 1512 and the display device 1513 consist of an antenna, a demodulator, a decoder, an image processor, and a display unit included in the electronic device system 1501A. Specifically, for example, the receiver 1512 includes the antenna, the demodulator, and the decoder, whereas the display device 1513 includes the image processor and the display unit. The decoder may be included not in the receiver 1512 but in the display device 1513.

For the camera 1510, and the image sensor 1520 and the image processor 1521 included in the camera 1510, refer to the above descriptions. The image processor 1521 generates video data 1541A. The video data 1541A is output to the transmitter 1511.

The image generation device 1530 generates image data such as text, a figure, or a pattern added to the image data generated in the image processor 1521. The image data such as text, a figure, or a pattern is transmitted as video data 1541B to the transmitter 1511.

The transmitter 1511 processes the video data 1541A and the video data 1541B and generates the broadcast signal (carrier wave) 1543 that accords with a broadcast band. The encoder 1522A processes the video data 1541A and generates encoded data 1542A. The encoder 1522B processes the video data 1541B and generates encoded data 1542B. The encoder 1522A and the encoder 1522B perform processing such as encoding of the video data 1541A and the video data 1541B, respectively, addition of broadcast control data (e.g., authentication data) to the video data 1541A and the video data 1541B, encryption, or scrambling (data rearrangement for spread spectrum).

The broadcasting system 1500A may have a configuration in which one encoder is used, as in the broadcasting system 1500 illustrated in FIG. 73, for processing the video data 1541A and the video data 1541B.

The encoded data 1542A and the encoded data 1542B are transmitted to the modulator 1523. The modulator 1523 generates and outputs the broadcast signal 1543 by performing IQ modulation on the encoded data 1542A and the encoded data 1542B. The broadcast signal 1543 is a composite signal that has an I component and a Q component. A TV broadcast station takes a role in obtaining the video data 1541 and supplying the broadcast signal 1543.

The broadcast signal 1543 is received by the receiver 1512 included in the electronic device system 1501A.

Figure 75:
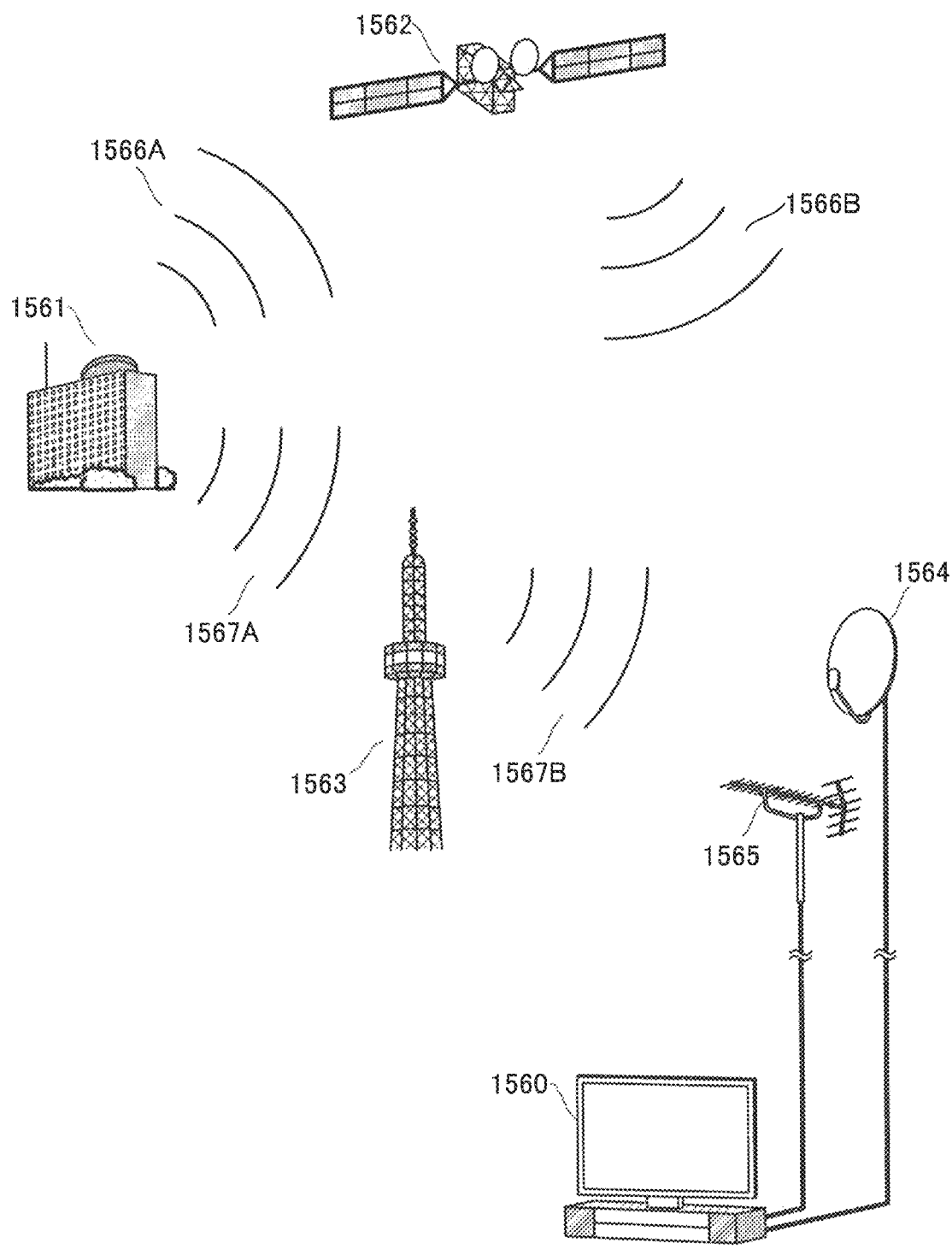
FIG. 75 is a schematic diagram illustrating data transmission in a broadcasting system.

FIG. 75 schematically illustrates data transmission in the broadcasting system. FIG. 75 illustrates a path in which a radio wave (a broadcast signal) transmitted from a broadcast station 1561 is delivered to a television receiver (TV) 1560 of every household. The TV 1560 is provided with the receiver 1512 and the display device 1513. As examples of an artificial satellite 1562, a communication satellite (CS) and a broadcast satellite (BS) can be given. As examples of an antenna 1564, a BS/110° CS antenna and a CS antenna can be given. Examples of the antenna 1565 include an ultra-high frequency (UHF) antenna.

Radio waves 1566A and 1566B are broadcast signals for a satellite broadcast. The artificial satellite 1562 transmits the radio wave 1566B toward the ground when receiving the radio wave 1566A. The antenna 1564 of every household receives the radio wave 1566B, and a satellite TV broadcast can be watched on the TV 1560. Alternatively, the radio wave 1566B is received by an antenna of another broadcast station, and a receiver in the broadcast station processes the radio wave 1566B into a signal that can be transmitted to an optical cable. The broadcast station transmits the broadcast signal to an input portion of the TV 1560 of every household using an optical cable network. Radio waves 1567A and 1567B are broadcast signals for a terrestrial broadcast. A radio wave tower 1563 amplifies the received radio wave 1567A and transmits it as the radio wave 1567B. A terrestrial TV broadcast can be watched on the TV 1560 of every household when the antenna 1565 receives the radio wave 1567B.

A video distribution system of this embodiment is not limited to a system for a TV broadcast. Video data to be distributed may be either moving image data or still image data.

Figure 76A:
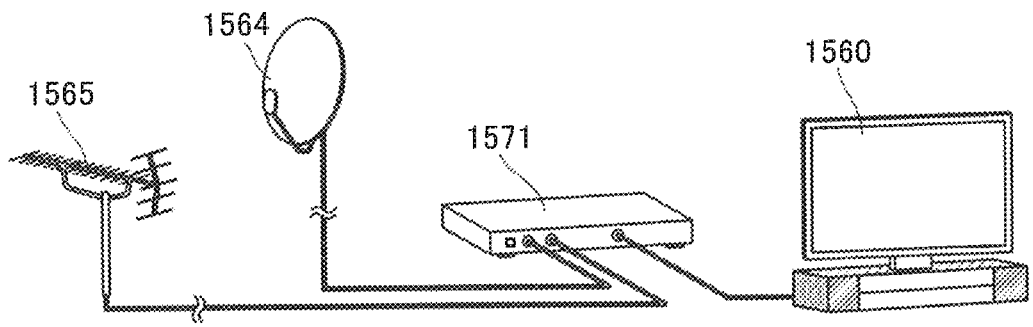
FIGS. 76A to 76D each illustrate a structure example of a receiver.
Figure 76B:
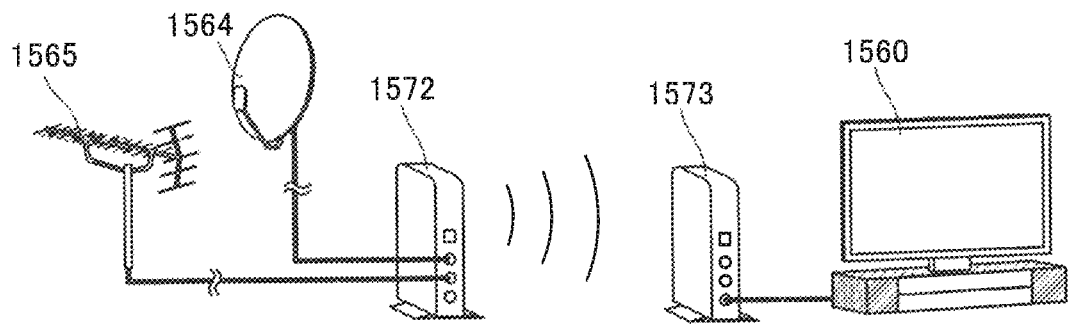
Figure 76C:
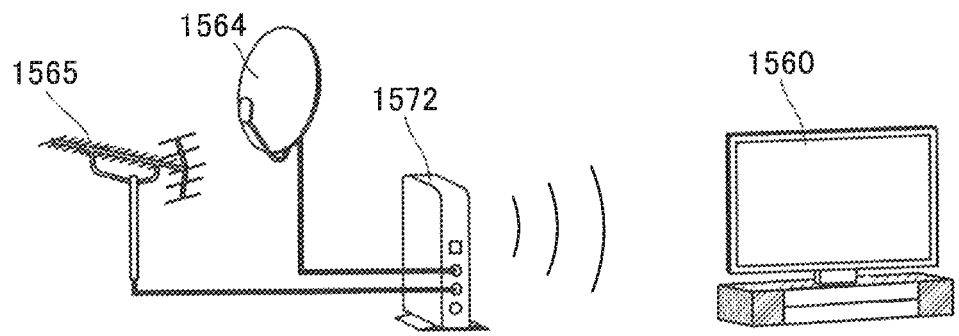
Figure 76D:
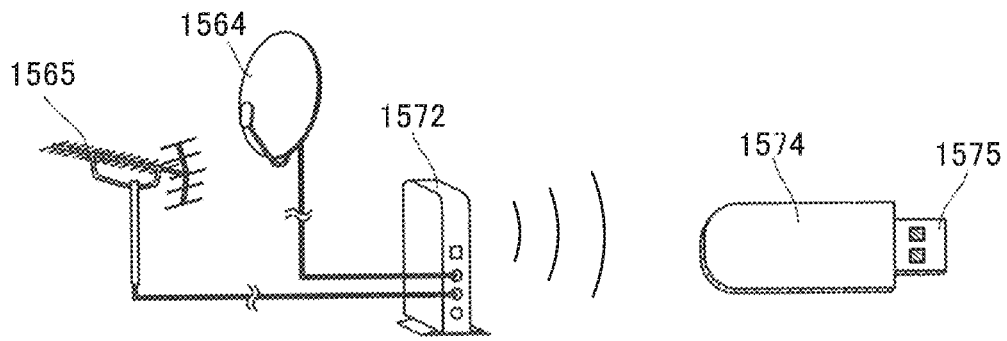

FIGS. 76A to 76D illustrate structure examples of a receiver. The TV 1560 can receive a broadcast signal with a receiver and perform display. FIG. 76A illustrates a case where a receiver 1571 is provided outside the TV 1560. FIG. 76B illustrates another case where the antennas 1564 and 1565 and the TV 1560 perform data transmission/reception through wireless devices 1572 and 1573. In this case, the wireless device 1572 or 1573 functions as a receiver. The wireless device 1573 may be incorporated in the TV 1560 (see FIG. 76C).

The size of a receiver can be reduced so that it can be portable. A receiver 1574 illustrated in FIG. 76D includes a connector portion 1575. If a display device and an electronic device such as an information terminal (e.g., a personal computer, a smartphone, a mobile phone, or a tablet terminal) include a terminal capable of being connected to the connector portion 1575, they can be used to watch a satellite broadcast or a terrestrial broadcast.

At least part of this embodiment can be implemented in combination with any of the other embodiments described in this specification as appropriate.

This application is based on Japanese Patent Application Serial No. 2016-199424 filed with Japan Patent Office on Oct. 7, 2016, and Japanese Patent Application Serial No. 2016-199426 filed with Japan Patent Office on Oct. 7, 2016, the entire contents of which are hereby incorporated by reference.

What is claimed is:
1. A display device comprising:
a pixel portion; and
a driver circuit for driving the pixel portion,
wherein the pixel portion comprises:
  a first transistor; and
  a pixel electrode electrically connected to the first transistor,
wherein the driver circuit comprises:
  a second transistor; and
  a connection portion,
wherein each of the first transistor and the second transistor comprises:
  a first gate electrode;
  a metal oxide film over the first gate electrode; and
  a source electrode and a drain electrode over and in contact with the metal oxide film, wherein an outer end portion of the source electrode and an outer end portion of the drain electrode are inward from end portions of the metal oxide film, wherein the connection portion comprises:
- a first wiring on the same surface as the first gate electrode; and
- a second wiring over the first wiring, the second wiring electrically connected to the first wiring, and wherein the source electrode, the drain electrode, and the second wiring comprise a same layer.

2. The display device according to claim 1,
wherein the first wiring and the second wiring are electrically connected via a third wiring, and
wherein the pixel electrode and the third wiring comprise a same layer.

3. The display device according to claim 1,
wherein the first gate electrode of the second transistor is electrically connected to a fourth wiring, and
wherein the pixel electrode and the fourth wiring comprise a same layer.

4. The display device according to claim 1, wherein the second transistor further comprises a second gate electrode over the metal oxide film.

5. The display device according to claim 4, wherein, in the second transistor, the first gate electrode and the second gate electrode are electrically connected to each other.

6. The display device according to claim 4,
wherein, in the second transistor, the first gate electrode and the second gate electrode are electrically connected to each other via a fourth wiring, and
wherein the pixel electrode and the fourth wiring comprise a same layer.

7. The display device according to claim 4, wherein the pixel electrode and the second gate electrode comprise a same layer.

8. The display device according to claim 1, wherein the metal oxide film comprises a first metal oxide layer and a second metal oxide layer on the first metal oxide layer.

9. The display device according to claim 1,
wherein the metal oxide film comprises indium, zinc, and an element M, and
wherein the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

10. A display device comprising:
a pixel portion; and
a driver circuit for driving the pixel portion,
wherein the pixel portion comprises:
- a first transistor; and
- a pixel electrode electrically connected to the first transistor, wherein the driver circuit comprises:
- a second transistor; and
- a connection portion, wherein each of the first transistor and the second transistor comprises:
- a first gate electrode;
- a metal oxide film overlapping with the first gate electrode; and
- a source electrode and a drain electrode over and in contact with the metal oxide film, wherein end portions of the metal oxide film extend beyond an outer end portion of the source electrode and an outer end portion of the drain electrode, wherein the connection portion comprises:
- a first wiring on the same surface as the first gate electrode; and
- a second wiring over the first wiring, the second wiring electrically connected to the first wiring, and wherein the source electrode, the drain electrode, and the second wiring comprise a same layer.

11. The display device according to claim 10,
wherein the first wiring and the second wiring are electrically connected via a third wiring, and
wherein the pixel electrode and the third wiring comprise a same layer.

12. The display device according to claim 10,
wherein the first gate electrode of the second transistor is electrically connected to a fourth wiring, and
wherein the pixel electrode and the fourth wiring comprise a same layer.

13. The display device according to claim 10, wherein the second transistor further comprises a second gate electrode over the metal oxide film.

14. The display device according to claim 13, wherein, in the second transistor, the first gate electrode and the second gate electrode are electrically connected to each other.

15. The display device according to claim 13,
wherein, in the second transistor, the first gate electrode and the second gate electrode are electrically connected to each other via a fourth wiring, and
wherein the pixel electrode and the fourth wiring comprise a same layer.

16. The display device according to claim 13, wherein the pixel electrode and the second gate electrode comprise a same layer.

17. The display device according to claim 10, wherein the metal oxide film comprises a first metal oxide layer and a second metal oxide layer on the first metal oxide layer.

18. The display device according to claim 10,
wherein the metal oxide film comprises indium, zinc, and an element M, and
wherein the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

* * * * *